United States Patent [19]
Hattori

[11] Patent Number: 5,566,190
[45] Date of Patent: Oct. 15, 1996

[54] APPARATUS AND METHODS FOR CORRECTING LOST DATA

[75] Inventor: Masayuki Hattori, Kanagawa, Japan

[73] Assignee: Sony Corporation, Tokyo, Japan

[21] Appl. No.: 145,201

[22] Filed: Oct. 27, 1993

[30] Foreign Application Priority Data

Oct. 30, 1992 [JP] Japan .................................. 4-315635
Mar. 16, 1993 [JP] Japan .................................. 5-081246

[51] Int. Cl.⁶ .............................................. H03M 13/00
[52] U.S. Cl. ................................................ 371/37.1
[58] Field of Search ............................. 371/37.1, 38.1, 371/39.1

[56] References Cited

U.S. PATENT DOCUMENTS

| | | | |
|---|---|---|---|
| 4,649,541 | 3/1987 | Lahmeyer | 371/37.1 |
| 4,665,523 | 5/1987 | Citron et al. | 371/37.1 |
| 4,868,828 | 9/1989 | Shao et al. | 371/39.1 X |
| 4,873,688 | 10/1989 | Maki et al. | 371/37.1 |
| 5,170,399 | 12/1992 | Cameron et al. | 371/37.1 |
| 5,323,402 | 6/1994 | Vaccaro et al. | 371/37.1 |
| 5,365,529 | 11/1994 | Mester | 371/37.1 |

FOREIGN PATENT DOCUMENTS

| | | |
|---|---|---|
| 63316525 | 12/1988 | European Pat. Off. . |
| 0295949A2 | 12/1988 | European Pat. Off. . |
| 0458285A1 | 11/1991 | European Pat. Off. . |
| 2673341A1 | 2/1991 | France . |

OTHER PUBLICATIONS

Shao, H. et al., "A VLSI Design of a Pipeline Reed–Solomon Decoder", *IEEE Trans. on Computers*, vol. C–34, No. 5, May 1985, pp. 393–403.

Maki, G. et al., "VLSI Reed–Solomon Decoder Design", *MILCOM '86*, 1986 pp. 46.5.1–46.5.6.

Demassieux, N. et al., "A 10MHz (255,223) Reed–Solomon Decoder", *1988 Custom Integrated Circuits Conf.*, pp. 17.6.1–17.6.4.

Tong, P., "A 40MHz Encoder–Decoder Chip Generated By a Reed–Solomon Code Compiler", *1990 Custom Integrated Circuits Conf.*, pp. 13.5.1–13.5.4.

Whitaker, S. et al., "Reed Solomon VLSI Code for Advanced Television", *IEEE Trans. on Circuits and Systems for Video Technology*, vol. 1, No. 2, Jun. 1991, pp. 230–236.

*Primary Examiner*—Stephen M. Baker
*Attorney, Agent, or Firm*—Limbach & Limbach L.L.P.

[57] ABSTRACT

A lost data correction circuit has a multiplication unit MLT having one dividing unit DIV performing division based on the Euclidean mutual division method, 4t (t is the number of symbols for which the error can be corrected and 2t is the number of the parity symbols) number of computation units PE and (8t+2) number of registers A and B provided in parallel. In this circuit, as the first stage, the lost data positions U are calculated from the error flags and the syndromes S are calculated from the received code; and then, as the second stage, the lost data position polynomial u and correction syndrome T are simultaneously calculated in $\epsilon$ steps ($\epsilon$ is the number of the lost data symbols); as the third stage, the error evaluation polynomial $\omega$ and error position polynomial $\sigma$ and the corrected error position polynomial $\sigma$ thereof are calculated in (2t–$\epsilon$) steps; as the fourth stage, the product polynomial U·X of them is calculated; and as the fifth stage, the error positions are calculated. That is, in this lost data correction circuit, the total error position polynomial and error evaluation polynomial are calculated in two steps.

16 Claims, 59 Drawing Sheets

[FIRST STEP]
REGISTER ALREADY INITIALIZED
FOR POLYNOMIAL COMPUTATION

POLYNOMIAL COMPUTATION
MODE PM $A' = B' = A \times S + B$

[SECOND STEP]
POLYNOMIAL
COMPUTATION·EUCLIDEAN
INITIALIZATION MODE PE $A' = A \times S + B$
$B' = 0$

[THIRD STEP]
$A_0 = \alpha^2 \neq 0$
$DR < DQ$

EUCLIDEAN MUTUAL
DIVISION COMPUTATION
CROSS MODE $A' = A \times S + B$
$B' = A$

[FOURTH STEP]
DR ≥ DQ

EUCLIDEAN MUTUAL DIVISION
COMPUTATION NORMAL MODE $A' = B \times S + A$
$B' = B$

[COMPUTATION RESULT]

$\omega(X)$ IN $A_0$ TO $A_2$ AND
$\delta(X)$ IN $A_4$ TO $A_7$

[FIRST STEP]
REGISTER ALREADY
INITIALIZED FOR
EUCLIDEAN MUTUAL
DIVISION COMPUTATION $A_0 = \alpha^8 \neq 0$
$DR < DQ$

EUCLIDEAN MUTUAL DIVISION
COMPUTATION CROSS MODE $A' = A \times S + B$
$B' = A$

[SECOND STEP]

DR ≧ DQ

EUCLIDEAN MUTUAL DIVISION COMPUTATION NORMAL MODE $A' = B \times S + A$
$B' = B$

[THIRD STEP]

$A_0 = \alpha^6 \neq 0$
$DR < DQ$

EUCLIDEAN MUTUAL
DIVISION COMPUTATION
CROSS MODE $A' = A \times S + B$
$B' = A$

[FOURTH STEP]

DR ≥ DQ

EUCLIDEAN MUTUAL
DIVISION COMPUTATION
NORMAL MODE $A' = B \times S + A$
$B' = B$

[COMPUTATION RESULT]

$\omega(X)$ IS FOUND IN $A_0$ TO $A_1$ AND $\delta(X)$ IS FOUND IN $A_4$ TO $A_6$

[FIRST STEP]

REGISTER ALREADY INITIALIZED FOR POLYNOMIAL COMPUTATION

POLYNOMIAL COMPUTATION MODE

PE≠1—3,8   $X'=Y'=X \cdot Z+Y$

PE≠4        $X'=Y'=Y$

PE≠5—7    $X'=X$
           $Y'=0$

[SECOND STEP]

POLYNOMIAL COMPUTATION·
EUCLIDEAN INITIALIZATION MODE $PE \neq 1-3, 7-8$   $X' = X \times Z + Y$
$Y' = 0$ $PE \neq 4$   $X' = Y$
$Y' = 0$ $PE \neq 5-6$   $X' = X$
$Y' = 0$

[THIRD STEP]

$A_0 = \alpha^2 \neq 0$ $DR < DQ$

EUCLIDEAN MUTUAL
DIVISION COMPUTATION
CROSS MODE $X' = X \times Z + Y$ $Y' = X$

[FOURTH STEP]

DR ≧ DQ

EUCLIDEAN MUTUAL
DIVISION COMPUTATION
NORMAL MODE $X' = Y \times Z + X$
$Y' = Y$

[COMPUTATION RESULT]
ω(X) IN $A_0$ TO $A_2$ AND
δ(X) IN $A_4$ TO $A_7$

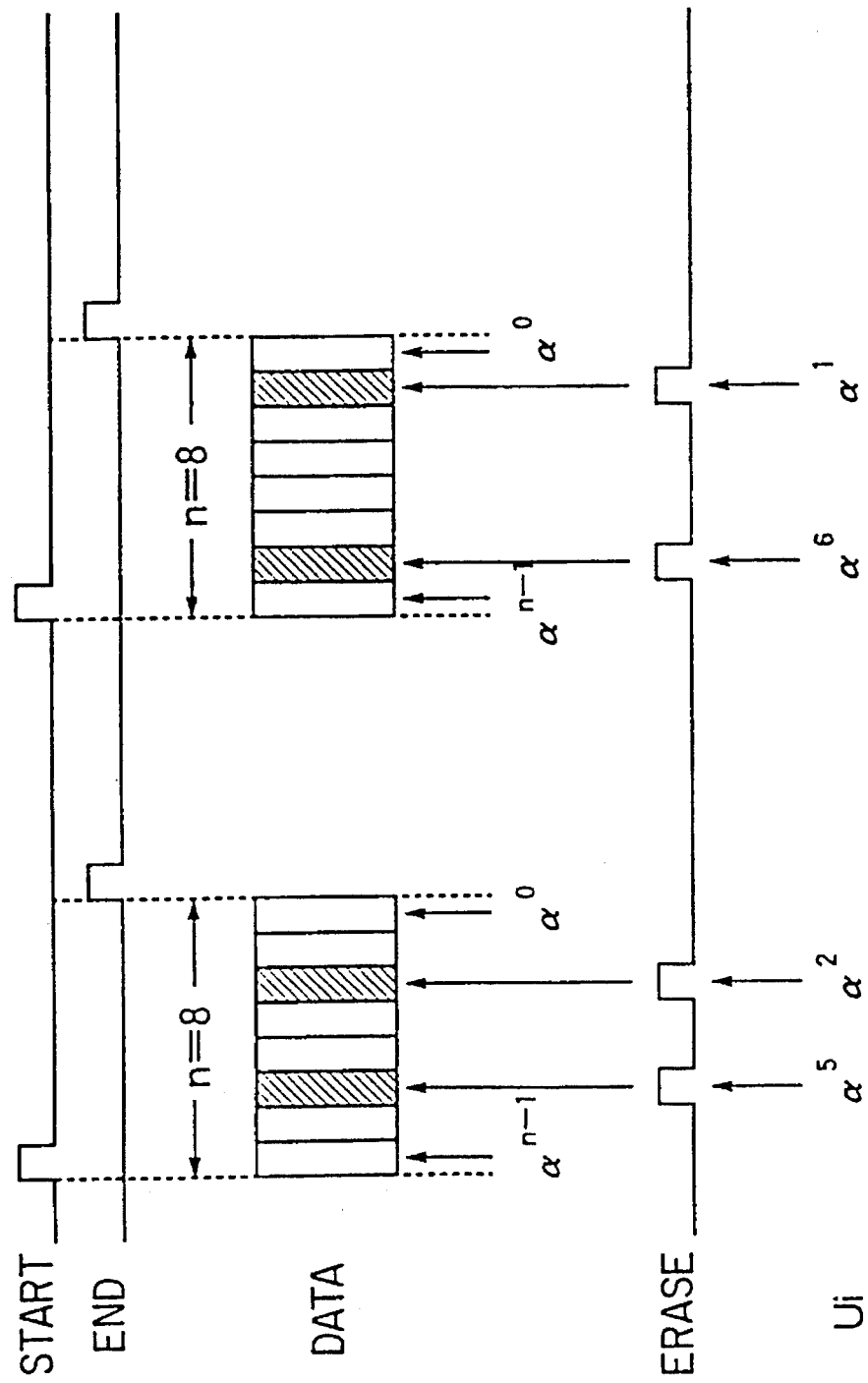

APPARATUS AND METHODS FOR CORRECTING LOST DATA

BACKGROUND OF THE INVENTION

1. Field of the Invention

The present invention relates to a method and apparatus for correcting for lost data, and more particularly, to a method of correcting for the loss of data encoded using a Reed-Solomon code etc., and a lost data correction circuit thereof.

2. Description of the Related Art

Error correction is an important basic technique for improvement of the reliability of data in various types of digital systems. Various error correction codes have been proposed. Among them, a BCH code is an extremely important code in practice and is used mainly in the field of satellite communications, magnetic recording, opto-magnetic recording, etc.

It has been known that, even among the BCH codes, if a non-two dimensional BCH code such as a Reed-Solomon code is used, correction of a larger number of errors is possible if the positions of the errors are already known when the decoding is carried out. This is referred to as "lost data correction".

When a decoding system (method) that performs the usual error correction using these codes is constructed in the form of a LSI etc., the procedure used for finding an error position polynomial from a syndrome polynomial during the decoding becomes important. As a method for addressing this problem, a the process of Euclidean mutual division is effective. Specific methods for this are disclosed in, for example, (1) "A VLSI Design of a Pipeline Reed-Solomon Decoder" by Howard M. Shao et. al., IEEE Trans. on Computers Vol. C-34, May 1985, and (2) Japanese Unexamined Patent Publication No. 3-195216 by the present inventor, Japanese Unexamined Patent Publication No. 3-195217 by the present inventor, and Japanese Patent Application No. 3-254183 by the present inventor.

However, when lost data correction is carried out, the number of computations is not changed in comparison with the case of the usual correction. Rather, the computation process becomes complex and the number of numerical values to be stored during the computation becomes larger, and therefore the implementation of the method becomes difficult.

The implementation of a lost data correction circuit has been discussed in the past (for example, "Small Circuit Constitution Method by Systolic Array and Application of the Same to Reed-Solomon Coder-Decoder" by Iwamura, Imai, and Doi in Shingakushi A Vol. J72-A, No. 3, pp. 577–584, Mar. 1989). Development of LSI's for optical disks incorporating lost data correction techniques has been underway as well (for example, "Error Correction LSI for Optical Disks" by Yoshida, Yamagishi, Inoue, Ishida, and Tanaka in Shingakushi, A Vol. J73-A, No. 2, pp. 261–268, Feb. 1990), but problems remain in terms of the processing speed, circuit size, etc.

In consideration of these circumstances, the present invention provides a method of computation that simplifies the process of calculating these polynomials, which is a problem when constructing a decoder of lost data correction, and makes the storage of the polynomial coefficients during intermediate steps of the computation unnecessary. Also, it has as its object to provide a system for realizing this method of computation and the structure of the computation unit thereof.

In using an error correction decoder, it is frequently necessary to use a single decoder to correct for errors where the data has been encoded using a plurality of codes having different numbers of parity symbols and code lengths. In a system using the usual error correction code, however, for the convenience in the configuration of the encoder, code symbols are input in an inverted order. Accordingly, where lost data correction is carried out, it is necessary to have a method of finding the lost data positions counted in a forward order from additional information such as lost data flags given to the symbols when input in an inverse order.

SUMMARY OF THE INVENTION

An object of the present invention is to provide an improved method of correcting lost data which can simply correct a plurality of codes having different numbers of parity symbols and code lengths.

Another object of the present invention is to provide an improved method of correcting lost data which can correct the lost data by a single decoder to which the method is applied.

Still another object of the present invention is to provide a circuit having a simple circuit configuration for executing the above methods.

According to the present invention, there is provided a method of correcting lost data which corrects lost data using a code established by a predetermined encoding system, wherein the error of the entire code is represented by lost data positions and lost data patterns of the lost data positions and error positions corresponding to errors other than those due to the lost data symbols, and lost data patterns of the error positions. The method includes a step of calculating a (2t−1)-th order syndrome polynomial having coefficients $S_i$ as a product of a received signal r and a parity inspection matrix H; a step of simultaneously calculating coefficients $u_i$ of a lost data position polynomial $u(X)$ and coefficients $T_i$ of the correction syndrome polynomial $T(X)$ by the lost data position $U_i$ which are known by an error flag and the coefficients of the syndrome polynomial described above; a step of deriving coefficients $\hat{o}_i$ of the product polynomial between an error position polynomial $\sigma(X)$ and the lost data position polynomial $u(X)$ by the coefficients $u_i$ of the above-described lost data position polynomial $u(X)$ and the coefficients $T_i$ of the above-described correction syndrome polynomial $T(X)$; and a step of correcting the received signal by an error evaluation polynomial $\omega(X)$ found from the above-described product polynomial $\hat{\sigma}(X)$ and the above-described syndrome polynomial $S(X)$.

In the method of the present invention, the total error position polynomial and error evaluation polynomial can be obtained by a 2t-step operation in total by using 4t number of computation units and (8+2) number of storage elements (registers).

Accordingly, the simplification (reduction) of the circuit size and high speed operation become possible.

It is desireable in practical use to be able to perform lost data correction of a plurality of codes having different numbers of parity symbols and code lengths by one code. When the number of parity symbols and code length are fixed, since the code length is usually known, it becomes easy to perform lost data correction and the circuit configuration becomes simpler by having the lost data correction carried out from the LSB (least significant bit) to the MSB (most significant bit). However, when lost data correction of a plurality of codes having different code lengths is carried out by one encoder, the code length is not clear, and therefore the incoming (input) data is subjected to the lost data correction from the MSB toward the LSB.

Also, according to the preset invention, there is provided a lost data correction circuit which corrects loss of data encoded by a predetermined encoding system, includes a division unit and a plurality of computation units operatively connected to the division unit, wherein provision is made of a plurality of registers as a storage region of the lost data positions and the lost data positions are supplied via a first switching unit S to the computation units by shifting the lost data positions stored therein one by one per step which becomes a multiplication coefficient.

The above-described encoding system is preferably a two-dimensional BCH code and particularly preferably a Reed-Solomon code.

The present invention further provides a method of obtaining a forward order lost data position by the division between an inverse order lost data position obtained by counting codes input in the inverse order as they are input and information obtained when all code words are input so as to enable the correction of a plurality of codes having different numbers of parity symbols and code lengths by one code.

The present invention further more provides a decoder which can perform the decoding of variable code lengths without a substantial increase in the scale of the circuit by executing the division in the Euclidean mutual division method by utilizing a divider which is not used when the polynomial computation necessary for the data loss correction is carried out.

BRIEF DESCRIPTION OF THE DRAWINGS

The above objects and features and other objects and features of the present invention will become clearer by the following description with reference to the accompanying drawings, in which:

FIG. 23 is a view of the mode of processing of a fixed length code;

FIG. 26 is a unit circuit view of the lost data position storage register shown in FIG. 25a;

DESCRIPTION OF THE PREFERRED EMBODIMENTS

Figure 1:
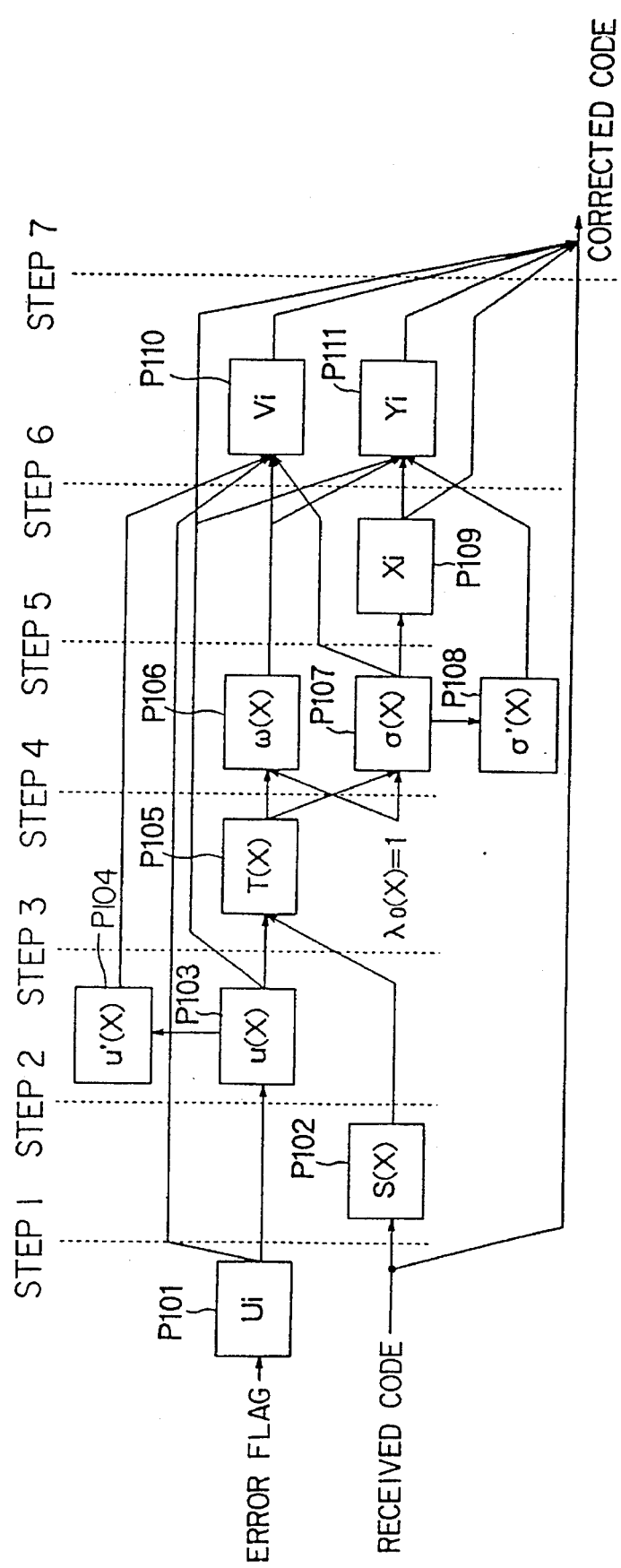
FIG. 1 is a view showing a conventional method of correcting lost data.

Before describing in detail preferred embodiments of the present invention, basic matters and the background art for the method of correcting lost data will be explained.

1.1. Explanation of Lost Data Correction

Lost data correction will first be explained.

It is known that when use is made of a non-two dimensional BCH code such as a Reed-Solomon code, when the degree of redundancy to be added, that is, the number of the parity symbols, is 2t (where, t denotes a positive integer), error correction of t symbols is possible.

A common situation is when 2t number of parity symbols are added and the position of some or all of the error symbols is known in advance from certain information. In this situation, it is known that t symbols or more of error can be corrected. This is referred to as lost data correction.

1.2. Explanation of Principle of Lost Data Correction

An explanation will be made next of the principle of lost data correction.

Here, the lost data correction will be considered using as an example a Reed-Solomon code having a code length of n given 2t number of parity symbols by using a finite field defined on a Galois field $GF(2^m)$.

In this case, in the usual error correction, the error correction of t symbols is possible. Assume that the error position and lost data position are represented by $\alpha^j$ when they exist at the j-th position counting the header of the code as the zero-th position. Assume that $\epsilon$ number of lost data symbols exist in the entire code and that $v$ number of error symbols exist at positions other than the lost data positions. Note that, it is assumed that the lost data positions are indicated by an indicator flag etc.

The error of the entire code can be described by the lost data positions $U_i$ ($0 \leq i \leq \epsilon$) and the lost data patterns $V_i$ ($0 \leq i \leq \epsilon$) of the lost data positions, and the error positions $X_i$ ($0 \leq i \leq v$) of symbols other than the lost data symbols and the error patterns $Y_i$ ($0 \leq i \leq v$) of the error positions $X_i$. That is, it is described by $\epsilon$ sets of $(U_i, V_i)$ and $v$ sets of $(X_i, Y_i)$ in total. At this time, when the relationship of equation 1 exists between $\epsilon$ and $v$, all lost data symbols and error symbols other than the lost data symbols can be corrected (see, "Error Correction LSI for Optical Disk" by Yoshida, Yamagishi, Inoue, Ishida, and Tanaka in Shingakushi, A Vol. J73-A, No. 2, pp. 261–268, Feb. 1990), but a problem remains in terms of the processing speed, circuit scale, etc.

$$2v + \epsilon \leq 2t \quad (v, \epsilon \geq 0) \tag{1}$$

Note that, where there is no lost data symbol, i.e., where $\epsilon=0$, this case becomes the same as the usual correction, and therefore the case of $\epsilon>0$ is assumed here.

Where $\epsilon$ number of lost data positions are already known from the equation 1 by error flags etc., the error symbols other than lost data can be corrected up to the number expressed by the following equation at the maximum:

$$\lfloor (2t-\epsilon)/2 \rfloor$$

where, $\lfloor (2t-\epsilon)/2 \rfloor$ is equal to the maximum integer which does not exceed $(2t-\epsilon)/2$.

Below, the symbols $\lfloor A \rfloor$ are used as symbols showing the maximum integer not exceeding A.

Accordingly, in the case of the lost data correction, up to the number of the lost data symbols and error symbols other than lost data shown below:

$$\lfloor (2t+\epsilon)/2 \rfloor$$

can be corrected in total.

Next, the polynomial u(X), referred to as a lost data position polynomial, is defined using the lost data position $U_i$ ($1 \leq i \leq \epsilon$).

The lost data position polynomial u(X) is defined by the following equation 2 as a polynomial of the $\epsilon$-th order which becomes 0 when $X=U_i^{-1}$ ($1 \leq i \leq \epsilon$) using the lost data position $U_i$.

$$u(X) = \prod_{k=1}^{\epsilon} (1 - XU_k) \tag{2}$$

The coefficients of u(X) are expressed by the following equation 3 with $u_i$ ($1 \leq i \leq \epsilon$):

$$\begin{aligned} u(X) &= 1 + u_1 X + u_2 X^2 + \ldots u_\epsilon X^\epsilon \\ &= \sum_{i=0}^{\epsilon} u_i X^i \quad (u_0 = 1) \end{aligned} \tag{3}$$

In the same way as the lost data position polynomial u(X), the polynomial $\sigma(X)$, referred to as an error position polynomial, is defined using an error position $X_i$ ($1 \leq i \leq v$) other than the lost data symbol. The error position polynomial $\sigma(X)$ is defined by the following equation 4 as the v-th order polynomial which becomes 0 when $X=X_i^{-1}$ ($1 \leq i \leq v$).

$$\sigma(X) = \prod_{k=1}^{v} (1 - XX_k) \tag{4}$$

The coefficients of the error position polynomial $\sigma(X)$ are expressed as shown in equation 5 with $\sigma_i$ ($0 \leq i \leq v$).

$$\begin{aligned} \sigma(X) &= 1 + \sigma_1 X + \sigma_2 X^2 + \ldots \sigma_v X^v \\ &= \sum_{i=0}^{v} \sigma_i X^i \quad (\sigma_0 = 1) \end{aligned} \tag{5}$$

On the other hand, a vector having 2t number of elements is obtained as the product between the received signal r and a parity inspection matrix H. The elements of this vector are expressed as $S_j$ ($1 \leq j \leq 2t$) and are referred to as syndromes. The syndrome $S_j$ is given by the following equations.

$$s = [S_1, S_2, \ldots, S_{2t}]^T \tag{6}$$

$$s = H r \tag{7}$$

The received signal r is expressed as in equation 8 as the sum of the transmission signal p and the error signal e.

$$r = p + e \tag{8}$$

Since the product of the transmission signal p and the parity inspection matrix H is 0, the following equation is obtained:

$$s = H\,r$$

$$s = H(p + e)$$

$$s = H\,e \tag{9}$$

Since the error signal e is a vector having values only at the positions corresponding to $(U_i, V_i)$ $(1 \leq i \leq \epsilon)$ and $(X_i, Y_i)$ $(1 \leq i \leq v)$, the syndrome $S_i$ is represented by equation 10 using them.

$$s_j = \sum_{i=1}^{v} Y_i X_i^j + \sum_{i=1}^{\epsilon} V_i U_i^j \qquad (1 \leq j \leq 2t) \tag{10}$$

Next, the syndrome polynomial S(X) is defined as the (2t−1)-th order polynomial having 2t number of syndromes $S_j$ as the coefficients.

$$\begin{aligned} S(X) &= S_1 + S_2 X + S_3 X^2 + \ldots + S_{2t} X^{2t-1} \\ &= \sum_{j=1}^{2t} S_j X^{j-1} \end{aligned} \tag{11}$$

The following equation is obtained when equation 10 is substituted in equation 11:

$$S(X) = \sum_{j=1}^{2t} \sum_{i=1}^{v} Y_i X_i^j X^{j-1} + \sum_{j=1}^{2t} \sum_{i=1}^{\epsilon} V_i U_i^j X^{j-1} \tag{12}$$

The polynomial of the (2t−1)-th order which becomes the remainder with respect to the product polynomial mod $X^{2t}$ between this syndrome polynomial S(X) and the lost data position polynomial u(X) is defined as the correction syndrome polynomial T(X).

The coefficients from the 0-th order to the (2t−1)-th order coefficient of the correction polynomial T(X) are referred to as correction syndrome polynomials and written as $T_1$, $T_2$, ..., $T_{2t}$.

$$\begin{aligned} T(X) &= S(X)\,u(X) \pmod{X^{2t}} \\ &= T_1 + T_2 X + T_3 X^2 + \ldots + T_{2t} X^{2t-1} \\ &= \sum_{j=1}^{2t} T_j X^{j-1} \end{aligned} \tag{13}\tag{14}$$

Since the coefficients of the lost data position polynomial u(X) and the syndrome polynomial S(X) are represented by equation 3 and equation 11, respectively, the coefficients of the correction syndrome polynomial T(X) are represented by the following equation 15.

$$T_j = \sum_{k=0}^{\epsilon} u_k S_{j-k} \qquad (1 \leq j \leq 2t) \tag{15}$$

By substituting equation 15 in equation 10, the following is obtained:

$$\begin{aligned} T_j &= \sum_{k=0}^{\epsilon} u_k \left[ \sum_{i=1}^{v} Y_i X_i^{j-k} + \sum_{i=1}^{\epsilon} V_i U_i^{j-k} \right] \\ &= \sum_{k=0}^{\epsilon} u_k \sum_{i=1}^{v} Y_i X_i^{j-k} + \sum_{k=0}^{\epsilon} u_k \sum_{i=1}^{\epsilon} V_i U_i^{j-k} \\ &= \sum_{i=1}^{v} Y_i X_i^j \sum_{k=0}^{\epsilon} u_k X_i^{-k} + \sum_{i=1}^{\epsilon} V_i U_i^j \sum_{k=0}^{\epsilon} u_k U_i^{-k} \end{aligned} \tag{16}$$

$$(1 \leq j \leq 2t)$$

Here, since the lost data position polynomial u(X) is a polynomial using $U_i^{-1}$ $(1 \leq i \leq \epsilon)$ as a root, when $X = U_i^{-1}$ $(1 \leq i \leq \epsilon)$ is substituted in equation 3, "0" is obtained.

$$\sum_{k=0}^{\epsilon} u_k U_i^{-k} = 0 \qquad (1 \leq i \leq \epsilon) \tag{17}$$

When equation 17 is substituted in equation 16, the second term becomes 0, and the following equation is obtained:

$$T_j = \sum_{i=1}^{v} Y_i X_i^j \sum_{k=0}^{\epsilon} u_k X_i^{-k} \qquad (1 \leq j \leq 2t) \tag{18}$$

The second term of equation 18 is nothing more than one obtained by substituting $X = X_i^{-1}$ for the lost data position polynomial u(X). Accordingly, the equation 19 is obtained:

$$T_j = \sum_{i=1}^{v} Y_i X_i^j u(X_i^{-1}) \tag{19}$$

Further, when the following relationship stands:

$$E_i = Y_i u(X_i^{-1}) \tag{20}$$

the equation 21 is obtained from equation 19.

$$T_j = \sum_{i=1}^{v} E_i X_i^j \tag{21}$$

Accordingly, the correction syndrome polynomial T(X) is expressed by the following equation:

$$T(X) = \sum_{j=1}^{2t} \sum_{i=1}^{v} E_i X_i^j X^{j-1} \tag{22}$$

Here, the equation 21 shows that, when the correction syndrome $T_i$ is considered to be the usual syndrome $S_i$ and the $E_i$ defined in equation 20 is regarded as an error pattern $Y_i$, if the correction syndrome is used in place of the syndrome even in the case of the lost data correction, the result can be treated in exactly the same way as the case of the usual correction.

Accordingly, it becomes possible to find an error position polynomial σ(X) by the Euclidean mutual division method between the correction syndrome polynomial T(X) having the correction syndrome $T_i$ as the coefficient and $X^{2t}$.

In the same way as the case of usual correction, the error evaluation polynomial ω(X) is detected by the following equation 23 as the remainder with respect to $X^{2t}$ which is the product between the error position polynomial σ(X) and the correction syndrome polynomial T(X):

$$\omega(X) = \sigma(X)\,T(X) \pmod{X^{2t}} \tag{23}$$

Equation 2 and equation 22 are substituted in the equation 23.

$$\begin{aligned} \omega(X) &= \left[ \prod_{k=1}^{v} (1 - XX_k) \right] \sum_{j=1}^{2t} \left[ \sum_{i=1}^{v} E_i X_i^j \right] X^{j-1} \\ &= \left[ \prod_{k=1}^{v} (1 - XX_k) \right] \left[ \sum_{i=1}^{v} E_i X_i \sum_{j=1}^{2t} (XX_i)^j \right] \\ &= \left[ \prod_{k=1}^{v} (1 - XX_k) \right] \left[ \sum_{i=1}^{v} E_i X_i \frac{1 - (XX_i)^{2t}}{1 - XX_i} \right] \\ &= \sum_{i=1}^{v} E_i X_i [1 - (XX_i)^{2t}] \frac{1}{1 - XX_i} \left[ \prod_{k=1}^{v} (1 - XX_k) \right] \end{aligned} \tag{24}$$

-continued $$= \sum_{i=1}^{v} E_i X_i [1 - (XX_i)^{2t}] \left[ \prod_{\substack{k=1 \\ k \neq i}}^{v} (1 - XX_k) \right] -$$

$$X^{2t} \sum_{i=1}^{v} E_i X_i^{2t+1} \left[ \prod_{\substack{k=1 \\ k \neq i}}^{v} (1 - XX_k) \right] \pmod{X^{2t}}$$

Here, since the second term is clearly a polynomial with a degree (an order) of 2t or more, the only thing needed is the first term.

$$\omega(X) = \sum_{i=1}^{v} E_i X_i \prod_{\substack{k=1 \\ k \neq i}}^{v} (1 - XX_k) \quad (25)$$

When the error evaluation polynomial $\omega(X)$ is obtained, in the same way as the case of the usual correction, the error pattern can be obtained from a Forney's algorithm. First, when a first order differentiation $\sigma'(X)$ of $\sigma(X)$ is obtained from equation 4, the following equation is obtained:

$$\sigma'(X) = \left[ \prod_{k=1}^{v} (1 - XX_k) \right]' \quad (26)$$

$$= - \sum_{i=1}^{v} X_i \prod_{\substack{k=1 \\ k \neq i}}^{v} (1 - XX_k)$$

When $X = X_j^{-1}$ is substituted in equation 26, the equation 27 is obtained:

$$\sigma'(X_j^{-1}) = - \sum_{i=1}^{v} X_i \prod_{\substack{k=1 \\ k \neq i}}^{v} (1 - X_j^{-1} X_k) \quad (27)$$

$$= - X_j \prod_{\substack{k=1 \\ k \neq j}}^{v} (1 - X_j^{-1} X_k)$$

On the other hand, when $X = X_j^{-1}$ is substituted in $\omega(X)$ of equation 25, the equation 28 is obtained:

$$\omega(X_j^{-1}) = \sum_{i=1}^{v} E_i X_i \prod_{\substack{k=1 \\ k \neq i}}^{v} (1 - X_j^{-1} X_k) \quad (28)$$

$$= E_j X_j \prod_{\substack{k=1 \\ k \neq j}}^{v} (1 - X_j^{-1} X_k)$$

Equation 29 is obtained from equation 27 and equation 28:

$$\omega(X_j^{-1}) = -E_j \sigma'(X_j^{-1}) \quad (1 \leq j \leq v) \quad (29)$$

Since the pattern $E_j$ is defined in equation 20, equation 29 can be rewritten as follows:

$$\omega(X_j^{-1}) = -Y_j u(X_j^{-1}) \sigma'(X_j^{-1}) \quad (1 \leq j \leq v) \quad (30)$$

Accordingly, the error pattern $Y_j$ is obtained as follows:

$$Y_j = - \frac{\omega(X_j^{-1})}{u(X_j^{-1}) \sigma'(X_j^{-1})} \quad (1 \leq j \leq v) \quad (31)$$

Here, considering that all error positions $X_i$ ($1 \leq i \leq v$) are already known, exactly the same assumption stands even if $\sigma(X)$ is replaced by $u(X)$. Accordingly, also the lost data pattern can be obtained by the following equation in the same way as the error pattern:

$$V_j = - \frac{\omega(U_j^{-1})}{u'(U_j^{-1}) \sigma(U_j^{-1})} \quad (1 \leq j \leq \epsilon) \quad (32)$$

1.3. Procedure of Lost Data Correction

The process of lost data correction will be explained. The lost data correction can be carried out by the following algorithm from the principle of the lost data correction mentioned in the previous section.

Lost Data Correction Algorithm

Step 1: Calculation of Syndrome

As the product between the received signal r and the parity inspection matrix H, 2t number of syndromes $S_j$ ($1 \leq j \leq 2t$) are found.

$$s = [S_1, S_2, \ldots, S_{2t}]^T$$
$$= Hr$$

The polynomial of the (2t−1)-th order having the coefficients as the obtained syndrome $S_j$ is referred to as the syndrome polynomial $S(X)$ and defined by the following equation:

$$S(X) = \sum_{j=1}^{2t} S_j X^{j-1}$$

Step 2: Calculation of Coefficients of Lost Data Position Polynomial

The $\epsilon$-th order lost data position polynomial $u(X)$ is defined from already known $\epsilon$ number of lost data positions $U_i$ ($1 \leq i \leq \epsilon$) from the information such as error flags etc., and the coefficients $U_i$ ($0 \leq i \leq \epsilon$) thereof are obtained.

$$u(X) = \prod_{k=1}^{\epsilon} (1 - X U_k)$$

$$= \sum_{i=1}^{\epsilon} u_i X^i \ (u_0 = 1)$$

Step 3: Calculation of Coefficients of Correction Syndrome Polynomial

The correction syndrome polynomial $T(X)$ is obtained as the remainder with respect to the product $X^{2t}$ between the lost data position polynomial $u(X)$ and the syndrome polynomial $S(X)$:

$$T(X) = S(X) u(X) \pmod{X^{2t}}$$

The coefficients $T_i$ ($1 \leq i \leq 2t$) from the 0-th order to (2t−1)-th order of the correction syndrome polynomial $T(X)$ are obtained by the following equation:

$$T_j = \sum_{k=0}^{\epsilon} u_k S_{j-k} \ (1 \leq j \leq 2t)$$

Step 4: Derivation of Error Position Polynomial

An error position polynomial σ(X) and an error evaluation polynomial ω(X) are obtained from the correction syndrome polynomial T(X). Various procedures for realizing this process have been proposed. The method of solution using the Euclidean mutual division method is the most powerful. A detailed description will be given later.

Step 5: Detection of Error Position

The error position $X_i$, which is the solution of the error position polynomial σ(X), is found by searching all data. It is seen that the position at which $\sigma(X^{-1})$ becomes equal to 0 becomes $X_i$ ($i \leq i \leq v$), when all elements $\alpha^i$ ($0 \leq i \leq n-1$) contained in the finite field $GF(2^m)$ is substituted in the error position polynominal σ(X) using the coefficients of the error position polynomial σ(X) obtained at step 4. Usually, this substitution process is carried out using the procedure referred to as a "Chien search".

Step 6: Calculation of Error Pattern and Lost Data Pattern

When the error position polynomial σ(X), the error evaluation polynomial ω(X), and all error positions $X_i$ ($1 \leq i \leq v$) are obtained, error patterns $Y_i$ ($1 \leq i \leq v$) and $Y_i$ ($1 \leq i \leq \epsilon$) are obtained by the following equation (Forney's algorithm):

$$Y_i = -\frac{\omega(X_i^{-1})}{\sigma'(X_i^{-1})u(X_i^{-1})}$$

$$V_i = -\frac{\omega(U_i^{-1})}{\sigma(U_i^{-1})u'(U_i^{-1})}$$

Step 7: Execution of Correction

Correction is performed on the received signal using the obtained error positions and patterns ($X_i$, $Y_i$) ($1 \leq i \leq v$) and lost data positions and patterns ($U_i$, $V_i$) ($1 \leq i \leq \epsilon$).

The "lost data correction algorithm" is ended above.

1.4. Error Position Polynomial Derivation Method

Here, an explanation will be made of a process of finding an error position polynomial σ(X) and an error evaluation polynomial ω(X) from the correction syndrome polynomial T(X) of step 4 which becomes a problem in the procedure of lost data correction mentioned in the previous section.

The process of derivation of the error position polynomial in the lost data correction is the same as the process of derivation of the error position polynomial in usual correction except for the stopping condition. The derivation process of the error position polynomial in the usual error correction has already been proposed by the present inventor (for example, Japanese Patent Application No. 3-254183).

In general, the Euclidean mutual division method has been known as an algorithm for finding the greatest common divisor (hereinafter referred to as a "GCD") of two polynomials. The error position polynomial σ(X) can be obtained from the correction syndrome polynomial T(X) using this computation process.

Method of Solution Using Euclidean Mutual Division Method

Now, it is defined that $r_{-1}(X) = X^{2t}$ and that $r_0(X) = T(X)$. Also, suppose that the degree (order) of the polynomial f(x) is represented as deg(f(x)). Since the degree of T(X) is (2t−1)-th order, $\deg(r_0(X)) < \deg(r_{-1}(X))$.

Division using the polynomial $q_i(X)$ as the quotient is repeatedly carried out using these $r_{-1}(X)$ and $r_0(X)$. This is the same computation as the Euclidean mutual division method. When this computation is repeated, the following equations are sequentially obtained:

$$r_{-1}(X) = q_1(X)r_0(X) + r_1(X), \deg(r_1(X)) < \deg(r_0(X))$$
$$r_0(X) = q_2(X)r_1(X) + r_2(X), \deg(r_2(X)) < \deg(r_1(X))$$
$$\vdots$$
$$r_{j-2}(X) = q_j(X)r_{j-1}(X) + r_j(X), \deg(r_j(X)) < \deg(r_{j-1}(X))$$
$$\vdots$$

Note, contrary to a case where the computation is continued until the polynomial can be completely divided in the usual computation for finding the GCD, the computation is stopped when the conditions of the following equation are satisfied in the process of finding the error position polynomial.

$$\deg(r_j(X)) \leq t + \epsilon - 1$$

At this time, $r_j(X)$ can be expressed as in the following equation using the initially defined $r_{-1}(X) = X^{2t}$ and $r_0(X) = T(X)$ by sequentially substituting the same in the equations of $r_1(X), r_2(X), \ldots, r_{j-1}(X)$ obtained in the process of division from the lowest position.

$$r_j(X) = T(X)A(X) + X^{2t}B(X)$$

$r_j(X)$ and A(X) obtained at this time become ω(X) and σ(X), respectively.

This ends the explanation of the "method of solution using the Euclidean mutual division method".

An important issue in implementing this procedure in an efficient manner by hardware and/or software is to efficiently execute the division process to find $q_j(X)$ and $r_j(X)$. In addition, how efficiently the procedure of finding σ(X) by sequentially substituting the same in an inverse order from $r_1(X), r_2(X), \ldots, r_j(X)$ is carried out is also important.

Also, it is necessary to note that there is a case where the degree of the remainder polynomial is lowered by a second order or more as a result of one division in the process of the Euclidean mutual division method. In the hardware, software, or the like for realizing the Euclidean mutual division method, the construction must be one which operates without crashing even in such a case.

Various matters concerning the Euclidean mutual division method in usual error or lost data correction schemes have been proposed by the present inventor (for example, in Japanese Unexamined Patent Publication No. 3-195216, Japanese Unexamined Patent Publication No. 3-195217, Japanese Patent Application No. 3-254183, etc.)

In the same way as in these proposals, the method of solution using the above-mentioned Euclidean mutual division method can be realized using the following systematic algorithm by rewriting the same into a method of solution in which the degree (order) is reduced by one order at a time. This is obtained by a modification by the present inventor of the algorithm disclosed in the reference "A VLSI Design of a Pipeline Reed-Solomon Decoder", Howard M. Shao et. al., IEEE Trans. on Computers Vol. C-34, May 1985".

Modified Euclidean Mutual Division Method

Initialization $R_0(X)=T(X)$, $Q_0(X)=X^{2t}$ $\lambda_0(X)=1$, $\mu_0(X)=0$ $dR_0=2t-1$, $dQ_0=2t$

Repeated Computation

In the i-th repetition, assuming that the most significant coefficients of $R_{i-1}(X)$ and $Q_{i-1}(X)$ are $a_{i-1}$ and $b_{i-1}$, respectively, $l_{i-1}$ is defined by the following equation:

$l_{i-1}(X)=dR_{i-1}-dQ_{i-1}$ (1) Where $l_{i-1} \geq 0$ (normal mode):

$K=a_{i-1}/b_{i-1}$ $R_i(X)=R_{i-1}(X)+KQ_{i-1}(X) \cdot X^{l_{i-1}}$ $\lambda_i(X)=\lambda_{i-1}(X)+K\mu_{i-1}(X)X^{l_{i-1}}$ $Q_i(X)=Q_{i-1}(X)$ $\mu_i(X)=\mu_{i-1}(X)$ $dR_i=dR_{i-1}-1$ $dQ_i=dQ_{i-1}$ (2) In the case of $l_{i-1}<0$ and $a_{i-1} \neq 0$ (cross mode):

$K=b_{i-1}/a_{i-1}$ $R_i(X)=Q_{i-1}(X)+KR_{i-1}(X) \cdot X^{-l_{i-1}}$ $\lambda_i(X)=\mu_{i-1}(X)+K\lambda_{i-1}(X) \cdot X^{-l_{i-1}}$ $Q_i(X)=R_{i-1}(X)$ $\mu_i(X)=\lambda_{i-1}(X)$ $dR_i=dQ_{i-1}-1$ $dQ_i=dR_{i-1}$ (3) In the case of $l_{i-1}<0$ and $a_{i-1}=0$ (shift mode):

$R_i(X)=R_{i-1}(X)$ $\lambda_i(X)=\lambda_{i-1}(X)$ $Q_i(X)=Q_{i-1}(X)$ $\mu_i(X)=\mu_{i-1}(X)$ $dR_i=dR_{i-1}-1$ $dQ_i=dQ_{i-1}$

Results $\sigma(X)$ and $\omega(X)$ are obtained as in the following equations by $i=(2t-\epsilon)$ times of repeated computation.

$\sigma(X)=\lambda_{2t-\epsilon}(X)$ $\omega(X)=R_{2t-\epsilon}(X)$

This ends the explanation of the "Modified Euclidean mutual division method".

It should be noted that the stopping condition in this algorithm is set up so that the computation process is carried out $(2t-\epsilon)$ times without fail. Where the number $\epsilon$ of lost data symbols and the number $v$ of error symbols other than lost data satisfy the correctable condition $2v+\epsilon \leq t$ ($v$, $\epsilon \geq 0$), as a result of this $(2t-\epsilon)$ times of repeated computations, the coefficients of the correct error position polynomial and error evaluation polynomial are obtained. The finally obtained $dR_{(2t-\epsilon)}$ indicates the degree of $\omega(X)$, and the degree of $\sigma(X)$ becomes the $[dR_{(2t-\epsilon)}-\epsilon+1]$-th order.

$dR_{(2t-\epsilon)}$ finally expresses $dR_{(2t-\epsilon)}(X)$, that is, the degree of $\omega(X)$. Also, in the case of the computation of the normal mode and cross mode for which the usual computation is carried out, $dR_i$ and $dQ_i$ in the middle of the process of computation expresses the number of degree of $R_i(X)$ and $Q_i(X)$, respectively, but it should be noted that they do not express the degree at the time of the shift mode in which the most significant coefficient of $R_i(X)$ becomes 0. This is derived from the fact that $dR_i$ is reduced only by "1" in the present algorithm even in a case where the degree of the remainder polynomial is lowered by two orders or more by one division in the process of the Euclidean mutual division method.

1.5. Example of Lost Data Correction

Here, an explanation will be given of a concrete example of the most important step 2 to step 4 in the process until the lost data correction and error position polynomial mentioned in the previous section are found.

In this example, a code given $2t=4$ parities is used by using the finite field $GF(2^4)$ defined using the irreducible polynomial $g(X)=X^4+X+1$. In the case of the usual correction, error correction of 2 symbols at the maximum is possible, but in the case of the lost data correction, the correction is possible within a range satisfying $\epsilon+2v \leq 2t$.

Here, an example of $\epsilon=2$ and $v=1$ will be explained. Two lost data positions are:

$U_0=\alpha^{+0}$ $U_1=\alpha^{+1}$

Now, assume that the syndrome polynomial $S(X)$ is found as follows:

$S(X)=\alpha^2 X^3 + \alpha^{14} X^2 + \alpha^4 X + \alpha^9$

When the error position polynomial $\sigma(X)$ is derived from this syndrome polynomial $S(X)$ using the modified Euclidean mutual division method (2), the following is obtained.

Step 2: Calculation of Lost Data Position Polynomial Coefficients

The coefficients of the lost data position polynomial $u(X)$ are obtained from the lost data position $U_i$.

$$u(X) = \prod_{k=1}^{\epsilon} (1-XU_k)$$
$$= (1-XU_1)(1-XU_2)$$
$$= \alpha^1 X^2 + \alpha^4 X + 1$$

Step 3: Calculation of Coefficients of Correction Syndrome Polynomial

The coefficients with the correction syndrome polynomial $T(X)$ are found:

$$\begin{aligned} T(X) &= S(X)u(X) \pmod{X^{2t}} \\ &= (\alpha^2 X^3 + \alpha^{14} X^2 + \alpha^4 X + \alpha^9)(\alpha^1 X^2 + \alpha^4 X + 1) \pmod{X^{2t}} \\ &= \alpha^9 X^3 + \alpha^7 X^2 + \alpha^{11} X + \alpha^9 \end{aligned}$$

Step 4: Derivation of Error Position Polynomial

The modified Euclidean mutual division method is computed between $T(X)$ and $X^{2t}$ using the $T(X)$ obtained at step 3. Note, when the degree (order) of the remainder polynomial $r_i$ becomes:

$\lfloor 2t+\epsilon/2 \rfloor - 1 = $ 2nd order or less, the computation is stopped.

$$r_{-1}(X) = X^{2t}$$

$$r_0(X) = T(X) = \alpha^9 X^3 + \alpha^7 X^2 + \alpha^{11} X + \alpha^9$$

$$r_{-1}(X) = (\alpha^6 X + \alpha^4) r_0(X) + (\alpha^{13} X^2 + \alpha^9)$$

As a result of this, the degree (order) of the remainder polynomial $r_1(X)$ becomes the second order, and therefore the computation is stopped. At this time, since $\sigma(X)$ and $\omega(X)$ can be rewritten to:

$$\alpha^{13} X^2 + \alpha^9 = r_0(X) + (\alpha^6 X + \alpha^4) r_0(X)$$

the coefficients are obtained as in the following equation:

$$\begin{aligned} \omega(X) &= r_1(X) \\ &= \alpha^9 X^2 + \alpha^{13} \\ \sigma(X) &= \alpha^6 X + \alpha^4 \end{aligned}$$

1.6. Formation of Conventional Euclidean Mutual Division Method Algorithm by Hardware An example of realizing the algorithm of the Euclidean mutual division method by hardware using a systolic array architecture is indicated by Shao et. al. in "A VLSI Design of a Pipeline Reed-Solomon Decoder", Howard M. Shao et. al., IEEE Trans. on Computers Vol. C-34, May 1985 (method of configuration A), but in this method of configuration, there are drawbacks that two finite field multipliers are necessary for each computation unit, and in addition, a control circuit becomes necessary for each computation unit.

As a method for improvement, the present inventor proposed two methods (method of configuration B) in Japanese Unexamined Patent Publication No. 3-195216 and Japanese Unexamined Patent Publication No. 3-195217. In the method of configuration B, the two finite field multipliers in the computation unit indicated by the method of configuration A are replaced by one finite field multiplier and one finite field divider. Next, a reduction of the circuit size is realized by sharing one finite field divider for the finite field dividers in a plurality of computation units which are cascade-connected.

Further, as a method of configuration realizing the above by quite a different structure from the method of configuration B, the present inventor proposed a method of configuration (method of configuration C) in which just one control circuit or addition circuit is sufficient in the configuration (for example, in Japanese Patent Application No. 3-254183).

In the method of configuration C, different from the conventional procedure, the data to be subjected to division can be always taken out from the same position, and therefore a circuit for sharing the divider and a control circuit thereof become unnecessary. Further, since the circuit for judging the operation from the degree of the polynomial and the control circuit can be realized in a single circuit, the circuit size is reduced.

Here, a case where one computation unit performs only one computation in one repeated computation of the modified Euclidean mutual division method will be considered. That is, consideration will be given to the case of the number of the computation units which are essentially needed except in the case where two or more computations are carried out by one computation unit by performing multiplexing such as a time divisional multiplexing.

In this case, in the methods of configuration A, B, and C, the necessary numbers of the multiplication units are 8t, 4t, and 4t−1, respectively. Here, t denotes the number of correctable symbols, and 2t denotes the number of parity symbols. In the methods of configuration B and C, half the numbers of computation units are sufficient in comparison with the method of configuration A. This is because the configurations are modified to ones using one divider and one multiplier in place of the use of two multipliers, whereby the number of multipliers required for each computation unit is reduced to one.

However, contrary to the case where the total number of times of multiplications in each step required in the algorithm itself of the modified Euclidean mutual division method is always 2t times or less, in these three methods of configuration, at least double the number of computation units are required, and thus these are extremely wasteful configurations. Moreover, also regarding the number of the storage registers for storing the polynomial coefficients, at least double the number of storage regions compared with (4t+3), which is the originally required number, are needed.

Therefore, the present inventor further proposed a method of configuration (method of configuration D) in which two important ideas were applied to the storage method of the register and the method of configuration of the computation unit in the algorithm of the modified Euclidean mutual division method, whereby an algorithm is realized by a (2t+1) number of computation units, which is 1 larger than the minimum computation time 2t per repetition in the modified Euclidean mutual division method and by a (4t+3) number of registers, which is the minimum storage region.

By this method of configuration D, it has become possible to realize the Euclidean mutual division method with a number of computation units greatly smaller than those in the conventionally proposed methods of configuration A, B, and C.

However, even in a case where processing with respect to the successively input data requiring the highest speed processing is carried out, in a process of finding the error position polynomial from the syndrome, it is sufficient if the processing is carried out during a time for which the data of one code length is input. Usually, the code length n is sufficiently large with respect to 2t. Accordingly, if a circuit of the method of configuration D is used as is for the error correction system of a specification in which the code length n is sufficiently long, the circuit performing the Euclidean mutual division method is idle during (n−2t) clock cycles, and therefore the circuit configuration becomes redundant.

Also, irrespective of the fact that it is sufficient if processing with respect to the data which is not successively input is ended in a certain predetermined time, it is not necessary to obtain an answer in 2t clock cycles by the circuit configuration as in the method of configuration D, which is extremely wasteful.

The present inventor further proposed a method of configuration solving these problems (method of configuration E). In the method of configuration E, the (2t−1) computations per step required in a case where the configuration is realized by the method of configuration D of the modified Euclidean mutual division method are used while performing time sharing multiplexing for the computation units, whereby a method of configuring the same by a number of computation units smaller than (2t+1) is given.

By using the method of configuration E, it becomes possible to freely set the degree of the multiplexing in accordance with the specifications of speed, throughput, etc. required by the error correction system method to be configured while maintaining the number of computations per step at 2t+1 times. Accordingly, it is possible to satisfy the design specifications and systematically obtain a circuit configuration having the minimum number of computation units.

1.7. Number of Computations Required for Lost Data Correction

The number of computations required for the lost data correction will be explained next. As mentioned in the section of the procedure of the lost data correction, there is a problem of the number of computations in each step of the lost data correction algorithm in the three processes from Step 2 to Step 4. The numbers of computations required in these processes are summarized below.

2.1. Number of Computations Required for Calculation of Coefficients of the Lost Data Position Polynomial (Step 2)

When it is now assumed that the lost data position $U_i$ ($1 \leq i \leq \epsilon$) is already known, a process for finding the coefficients $u_i$ ($0 \leq i \leq \epsilon$, $u_0=1$) of the $\epsilon$-th order lost data position polynomial $u(X)$ from the lost data position is realized by developing equation 2 in equation 3:

$$u(X) = \prod_{k=1}^{\epsilon} (1 - XU_k) \quad (2\text{-}1)$$

$$= 1 + u_1X + u_2X^2 + \ldots u_\epsilon X^\epsilon$$

$$= \sum_{i=0}^{\epsilon} u_i X^i \quad (u_0 = 1)$$

So as to sequentially execute this computation, a polynomial like $u^{(k)}(X)$ is prepared, and after an initialization that:

$$u^{(0)}(X)=1 \quad (3\text{-}1)$$

the repetition that:

$$u^{(i)}(X)=u^{(i-1)}(X)\cdot(1-XU_i) \quad (33)$$

is executed until i becomes $\epsilon$, whereby $u(X)$ is obtained by the following equation:

$$u(X)=u^{(\epsilon)}(X) \quad (34)$$

Simultaneously with this repeated computation, by performing the same sequential computation while changing the initial value from "1" to S(X) as shown in equation 16, T(X) can be found. The multiplication and addition operations for finding $u^{(1)}(X)$ from equation 34 are carried out 0 times each, while one time with respect to $u^{(2)}(X)$, so (i−1) times of multiplication and addition become necessary with respect to an i-th repetition. Accordingly, the total computation numbers (times) $N_u(\epsilon)$ where the computations are carried out with respect to $\epsilon$ number of lost data symbols in total are obtained by the following equation:

$$N_u(\epsilon) = \sum_{i=1}^{\epsilon} (i-1) \quad (35)$$

$$= \frac{\epsilon}{2}(\epsilon - 1) \quad (36)$$

Accordingly, $N_u(\epsilon)$ becomes the maximum when $\epsilon=2t$, and the maximum value is obtained by following equation:

$$N_u(2t)=2t^2-t \quad (37)$$

2.2. Number of Computations Required for Calculation of Coefficients of Correction Syndrome Polynomial (Step 3)

The correction syndrome polynomial T(X), which is the remainder with respect to $X^{2t}$ of the product of the lost data position polynomial u(X) and syndrome polynomial S(X), is found. Only the less significant 2t number of the coefficients $T_i$ ($1 \leq i \leq 2t$) of the required correction syndrome polynomial are necessary. The coefficients are obtained by equation 15 by performing the multiplication of two polynomials:

$$T_j = \sum_{k=0}^{\epsilon} u_k S_{j-k} \quad (1 \leq j \leq 2t) \quad (15)$$

An actual computation is expressed as in the following equation:

$$\begin{aligned} T_1 &= S_1 \\ T_2 &= S_2 + S_1\sigma_1 \\ T_3 &= S_3 + S_2\sigma_1 + S_1\sigma_2 \\ T_4 &= S_4 + S_3\sigma_1 + S_2\sigma_2 + S_1\sigma_3 \\ &\vdots \end{aligned} \quad (38)$$

The number of required coefficients is 2t. When it is noted that u(X) is the $\epsilon$-th order at the highest in contrast with the fact that S(X) is the (2t−1)-th order, the number of the multiplication and addition operations which are actually carried out may be up to the ($\epsilon+1$)-th term in the right side of equation 38. When it is noted that the lowest significant coefficient of u(X) is $u_0=1$, the number of the multiplication and addition operations which are actually necessary become 0 when $\epsilon=0$; (2t−1) times when $\epsilon=1$; and $\{(2t-1)+(2t-2)\}$ times when $\epsilon=2$.

In general, the number of times $N_T(\epsilon)$ for finding the correction syndrome polynomial T(X) when $\epsilon$ number of lost data symbols exist is given by the following equation:

$$N_T(\epsilon) = \sum_{i=1}^{\epsilon} (2t-i) \quad (39)$$

$$= 2t\epsilon - \frac{\epsilon(\epsilon+1)}{2}$$

$N_T(\epsilon)$ becomes the maximum when $\epsilon=2t$ in the same way as $N_u(\epsilon)$, and the maximum value is represented by equation 40:

$$N_T(2t)=2t^2-t \tag{40}$$

2.3. Calculation of Coefficients Required for Derivation of Error Position Polynomial (Step 4)

In the process for finding the error position polynomial $\sigma(X)$ and error evaluation polynomial $\omega(X)$ from the correction syndrome polynomial $T(X)$, an algorithm of the Euclidean mutual division method almost the same as the case of the usual correction can be used.

As mentioned in the specification of Japanese Patent Application No. 3-254183 by the present inventor, the number of computations required for one repetition in the "modified Euclidean mutual division method" is one time for division and 2t times for multiplication and addition, respectively. Accordingly, in the case of the usual correction, repetition of 2t times in total was carried out, and therefore 2t times of division and $4t^2$ times of multiplication and addition were necessary.

In the case of the lost data correction, the stopping condition has become "stop after $(2t-\epsilon)$ times of repetition", and therefore the number of computations is the same as that in the case of the usual correction method except that the number of times of repetition is changed. Accordingly, the total number of divisions $N\sigma_{DIV}(\epsilon)$ and the total number of multiplication and addition operations $N\sigma(\epsilon)$ are represented by equation 41 and equation 42, respectively.

$$N_{\sigma Div}(\epsilon)=2t-\epsilon \tag{41}$$

$$N_\sigma(\epsilon)=2t(2t-\epsilon) \tag{42}$$

The number of times of computation becomes the maximum when $\epsilon=0$. The maximum value is represented by equation 43 and equation 44:

$$N_{\sigma Div}(2t)=2t \tag{43}$$

$$N_\sigma(2t)=4t^2 \tag{44}$$

2.4. Total Number of Computations

As mentioned in item 2.3., it is seen that the number of computations needed at each stage of the lost data correction method becomes a function of the number $\epsilon$ of lost data symbols. When $\epsilon$ is increased, $N_u(\epsilon)$ and $N_T(\epsilon)$ are increased, but $N\sigma(\epsilon)$ is reduced. The total number of multiplication and addition operations required in three computation processes are represented by equation 45:

$$\begin{aligned} N_{all}(\epsilon) &= N_u(\epsilon)+N_T(\epsilon)+N_\sigma(\epsilon) \\ &= \frac{\epsilon}{2}(\epsilon-1)+2t\epsilon-\frac{\epsilon(\epsilon+1)}{2}+2t(2t-\epsilon) \\ &= 4t^2+(1-t)\epsilon \leq 4t^2 \end{aligned} \tag{45}$$

It is seen from this result that the total number of multiplication and addition operations in the lost data correction method of the present invention has a maximum value of $4t^2$, which is the same as the case of the usual correction.

3.1. Problem of Realization of Lost Data Correction

As already explained, the number of computations itself which is required for the lost data correction is $4t^2$ times at the highest in the same way as the case of the usual correction. In the case of the usual correction, the error position polynomial $\sigma(X)$ can be found directly from the syndrome $S_i$, and therefore the main issue was how efficiently the algorithm of the Euclidean mutual division method can be realized.

Contrary to this, in the case of the lost data correction, after passing the routine of:

1. $r \to$ coefficients $S_i(1 \leq i \leq 2t)$ of $S(X)$
2. $U_i(1 \leq i \leq \epsilon) \to$ coefficients $u_i(0 \leq i \leq \epsilon, u_0=1)$ of $u(X)$ 3. $\left.\begin{array}{l} S_i(1 \leq i \leq 2t) \\ u_i(1 \leq i \leq \epsilon, u_i=1) \end{array}\right\} \to$ coefficients $T_i(1 \leq i \leq 2t)$ of $T(X)$ 4. $T_i(1 \leq i \leq 2t) \to$ coefficients $\sigma_i(1 \leq i \leq v)$ of $\sigma(X)$
5. correction using $\omega(X)$, $\sigma(X)$ and $u(X)$ the coefficients of the error position polynomial $\sigma(X)$ are found at first, and the correction is carried out. A method of configuration of the hardware for realizing this process by the minimum number of computation units in an efficient manner is an important issue to address.

Various methods have been proposed for configuring the hardware to implement the usual correction (for example, "A VLSI Design of a Pipeline Reed-Solomon Decoder" by Howard M. Shao et. al. in IEEE Trans. on Computers Vol. C-34, May 1985, Japanese Unexamined Patent Publication No. 3-195216 by the present inventor, Japanese Unexamined Patent Publication No. 3-195217 by the present inventor, Japanese Patent Application No. 3-254183 by the present inventor, etc.), but a method of configuration of hardware for lost data correction has not been discussed so much. The only thing has been an attempt for realizing all computations required for the lost data correction by using the same processing unit as discussed in "Small Circuit Constitution Method by Systolic Array and Application of the Same to Reed-Solomon Coder.Decoder" by Iwamura, Imai, and Doi in Shingakushi A, Vol. J72-A, No. 3, pp. 577–584, Mar. 1989, but it is redundant and poor in feasibility. Moreover, a lost data correction circuit has been realized as an error correction LSI for an optical disk (for example, "Error Correction LSI for Optical Disk" by Yoshida, Yamagishi, Inoue, Ishida, and Tanaka in Shingakushi A, Vol. J73-A, No. 2, pp. 261–268, on Feb. 1990), but the configuration itself is not directed to real time processing.

The problems in the routine of the lost data correction mentioned above will be summarized.

Problem 1: Method of Calculation of Lost Data Position Polynomial

In the usual case, information concerning the lost data positions is given together with the received signal by the error flags etc. Where the code length is already known, the lost data positions $U_i$ can be easily found from the error flags. However, to develop the equation 2 from the already known $U_i$, to find the coefficients $u_i$ $(0 \leq i \leq \epsilon)$ of the lost data position polynomial $u(X)$, multiplication and addition computation on a finite field become necessary.

The number of the lost data positions is 2t at the largest, and therefore there arises a problem of how efficiently the computation for finding the coefficient from the root of the polynomial which becomes this maximum 2t-th order is to be carried out.

Problem 2: Method of Calculation of Correction Syndrome Polynomial

In the lost data correction, it is necessary to find the coefficients of the correction syndrome polynomial $T(X)$ before the computation of the Euclidean mutual division method. This computation is obtained by calculating the coefficient up to the (2t–1)-th order of the product polynomial of the syndrome polynomial S(X) and lost data position polynomial u(X), but how efficiently it is to be found becomes the problem.

Problem 3: Method of Storing Lost Data Positions and Lost Data Position Polynomial Coefficients To calculate the lost data pattern $V_i$, a numerical value obtained by substituting $U_i$ in U'(X), σ(X), and ω(X) is necessary. This substitution can be carried out at first after σ(X) and ω(X) are found by the Euclidean mutual division method. During the period in which these polynomial coefficients are found, it is necessary to provide a means of storing the lost data positions $U_i$ and coefficients $u_i$ of the lost data position polynomial u(X).

Problem 4: Method of Calculation of Error Patterns

While the error pattern of data other than the lost data is calculated by equation 31, the lost data pattern is calculated by equation 32. Since these two equations are different, the correction processing becomes different between the error positions and lost data positions, and therefore a method of realizing the same with a high efficiency becomes important.

FIRST EMBODIMENT

A first embodiment of the present invention will be explained below.

The present invention provides a method of configuring a lost data correction circuit having a high efficiency, which can obtain a lost data polynomial u(X) and correction syndrome polynomial T(X) using a computation unit performing the Euclidean mutual division method, by improving the routine of the above-mentioned conventional lost data correction.

4-1. Improvement of Method of Calculation of u(X) and T(X)

The calculation routine where the coefficients of u(X) and T(X) are calculated in a usual order of $U_i$, u(X), and T(X) was already mentioned. Where the correction is carried out by this routine, however, a mechanism (circuit) for holding the lost data positions $U_i$ and the coefficients $u_i$ of the lost data position polynomial becomes necessary. Therefore, in the present invention, first of all, a change is made so that the correction syndrome polynomial T(X) is found simultaneously with the lost data position polynomial u(X).

As already mentioned, a process of sequentially finding the coefficients of the lost data position polynomial u(X) is realized by preparing a polynomial such as the following $u^{(k)}(X)$, and after initialization of equation 33, by repeating the recurrence formula given by equation 33 until i teaches ε.

$$u^{(0)}(X)=1 \qquad (33\text{-}1)$$

$$u^{(i)}(X)=u^{(i-1)}(X)\cdot(1-XU_i) \qquad (34\text{-}1)$$

$$u(X)=u^{(\epsilon)}(X) \qquad (35\text{-}1)$$

As already mentioned, a total of [ε(ε–1)/2] multiplication and addition operations are required for one repetition of equation 34 for finding u(X) since the number of times of the same is 0 with respect to $u^{(0)}(X)$ and is increased one by one along with each increase of degree (order) of u(X).

When the computation is carried out by changing the initial value from "1" to S(X) as shown in equation 1 in the same sequential computation simultaneously with the repeated computation for finding this u(X), T(X) can be found.

$$T^{(0)}(X)=S(X) \qquad (46)$$

$$T^{(i)}(X)=T^{(i-1)}(X)\cdot(1-XU_i) \qquad (47)$$

$$T(X)=T^{(\epsilon)}(X) \qquad (48)$$

Since S(X) is the (2t–1)-th order polynomial from the first and also the T(X) found by the repetition of equation 47 is the (2t–1)-th order, (2t–1) multiplication and addition operations are carried out in one repetition of equation 47. Accordingly, the number of multiplication and addition operations, $N_{\underline{T}}(\epsilon)$ (underline indicates that a hat is attached to T, the same for the following) for finding T(X) is expressed by the following equation:

$$N_{\underline{T}}(\epsilon)=\epsilon(2t-1) \qquad (49)$$

As apparent from the comparison between equation 49 and equation 39, where this method of calculation is used, the number of computations is increased in comparison with a case where the calculation is carried out in an order from S(X) to T(X), but the calculation for finding the u(X) and T(X) can be simultaneously carried out.

4-2. Improvement of Euclidean Mutual Division Method

σ(X) (underline indicates that a hat is attached to σ, the same for the following), the product polynomial between the error position polynomial σ(X) and the lost data position polynomial u(X) is defined by equation 50:

$$\partial(X)=u(X)\sigma(X) \qquad (50)$$

σ(X) becomes the (ε+ν)-th order total error position polynomial having "0" at all positions at which an error is generated, contained in the code. The following equation is obtained from equation 50 and equation 23:

$$\omega(X)=\hat{\sigma}(X)S(X) \pmod{X^{2t}} \qquad (51)$$

When σ(X) is used, the lost data pattern $V_i$ and the error pattern $Y_i$ are represented by equation 52 and equation 53:

$$Y_i = -\frac{\omega(X_i^{-1})}{\hat{\sigma}'(X_i^{-1})} \qquad (52)$$

$$V_i = -\frac{\omega(U_i^{-1})}{\hat{\sigma}'(U_i^{-1})} \qquad (53)$$

This will be clear since when both sides of equation 50 are subjected to first order differentiation and substituted in equation 52 and equation 53, the result becomes $u(U_i^{i-1})=0$ with respect to the lost data positions and becomes $\sigma(X_i^{-1})=0$ with respect to error positions, and therefore the result coincides with equation 11 and equation 12.

Since equation 52 and equation 53 are the same equation, if σ(X) can be found by a certain method, by using σ(X) as the total error position polynomial, all error patterns and lost data patterns can be calculated by the same equation.

Therefore, a method of finding σ(X) becomes important. The routine merely increases and calculation becomes complicated when obtaining σ(X) by merely finding σ(X) and u(X) using equation 19 and then further performing the multiplication of two polynomials.

However, where the correction is carried out using only $\hat{\sigma}(X)$ and ω(X), u(X), and σ(X) become unnecessary at Step 6 of the lost data correction routine. Accordingly, it is sufficient if $\hat{\sigma}(X)$ can be directly found without finding σ(X).

Therefore, a method of directly obtaining $\hat{\sigma}(X)$ by improving the Euclidean mutual division method of Step 4 of the lost data correction routine becomes necessary. In actuality, if the initialization value of $\lambda_i(X)$ in the algorithm of the Euclidean mutual division method is changed as in equation 54, $\hat{\sigma}(X)$ can be directly found from u(X) and T(X) with no change of the algorithm of Step 4.

$$\lambda_0(X)=u(X) \tag{54}$$

Note, where such an initial value is set up, the relationship which is established among the variables $dR_i$, $dQ_i$, $d\lambda_i$, and $d\mu_i$ indicating the degree of the polynomials in the computation process of modified Euclidean mutual division method is expressed by equation 55:

$$dR_i+d\mu_i<dQ_i+d\lambda_i=2t+\epsilon \tag{55}$$

As apparent from equation 55, in the case of usual correction, (2t+ε) multiplication and addition operations per step are repeated by (2t−ε) steps in the modified Euclidean mutual division method changing the initial value for the lost data correction, contrary to the fact that 2t repetitions were carried out for 2t multiplication and addition operations per step of the modified Euclidean mutual division method in the case of the usual correction.

Figure 2:
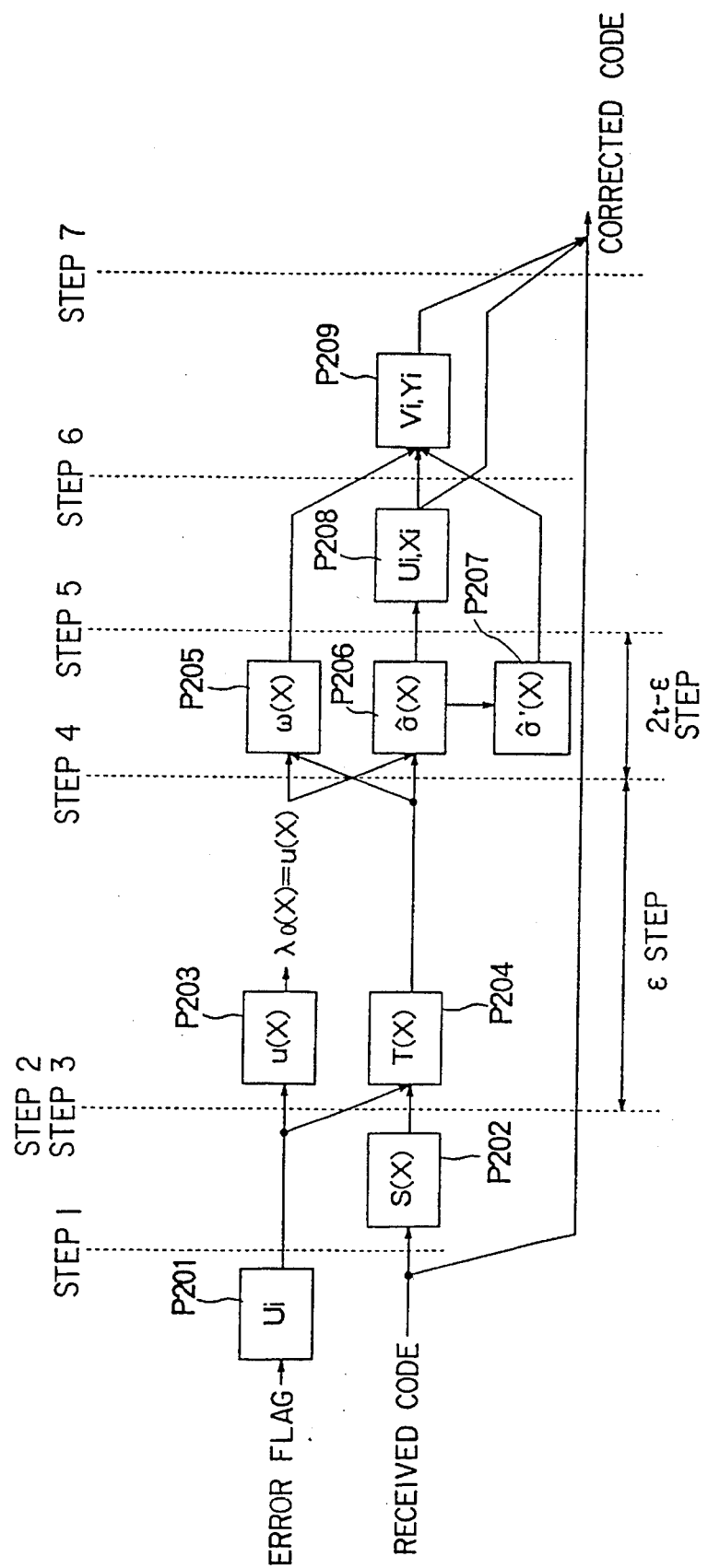
FIG. 2 is a view showing a first embodiment of a method of correcting lost data of the present invention.

FIG. 1 shows the flow of data of coefficients and lost data positions of polynomials in the above-mentioned usual lost data correction procedures. FIG. 2 shows the flow of data of coefficients and lost data positions of polynomials for the present invention.

As apparent from the illustration of FIG. 1, in the usual procedure, when the processing of Step 6 is carried out, the lost data positions $U_i$ and the coefficients of the lost data position polynomial u(X) become necessary, and therefore a mechanism for holding the lost data positions and coefficients up to Step 6 becomes necessary until the processing of Step 2 is carried out. Further, the calculations of the error pattern and the lost data pattern are found by different equations, and therefore the processing of Step 6 becomes complex.

Contrary to this, in the case of the method of calculation in the present invention shown in FIG. 2, the sequence of operations:

1. r→coefficients $S_i(1 \leq i \leq 2t)$ of S(X)

2. $U_i(1 \leq i \leq \epsilon)$ } coefficients $u_i(0 \leq i \leq \epsilon, u_0 = 1)$ of u(X)
   $S_i(1 \leq i \leq 2t)$ → coefficients $T_i(1 \leq i \leq 2t)$ of T(X)

3. $u_i(0 \leq i \leq \epsilon, u_0 = 1)$ } → coefficients $\hat{\sigma}_i(1 \leq i \leq v)$ of $\hat{\sigma}(X)$
   $T_i(1 \leq i \leq 2t)$ 4. correction using ω(X) and $\hat{\sigma}(X)$ is adopted. In this routine, u(X) and T(X) are simultaneously found by the first ε step of computation, and ω(X) and $\hat{\sigma}(X)$ are found by the next (2t−ε) step of computation. In this routine, the coefficients of the lost data position polynomial and lost data positions are not used when finding the error pattern, and therefore the mechanism for holding coefficients etc. during the computation of the Euclidean mutual division method becomes unnecessary, and the routine becomes simpler.

4-3. Method of Configuration of Lost Data Correction Circuit Which is Proposed The present embodiment provides a method of configuration with which the calculation procedures in the conventional lost data correction algorithm are changed as described above, so that the cumbersome processing of the polynomial coefficients peculiar to the lost data correction and the holding mechanism can be simplified.

An explanation will be made first of the principle of the present method of configuration.

The present method of configuration obtains ω(X) and $\hat{\sigma}(X)$ by simultaneously executing the repetition of multiplications of primary polynomials of ε step indicated by equation 34 and equation 47 from the already known $U_i$ to find u(X) and T(X), and next replace the initial value by $\lambda_0(X)=u(X)$, so that the algorithm of the Euclidean mutual division method of Step 4 is repeated by (2t−ε) steps.

At the first ε step, the calculations of T(X) and u(X) are simultaneously carried out by repeating the multiplication of the primary polynomial, and therefore a computation ability for performing 2t multiplication and addition operations per step with respect to each polynomial and a region for storing 2t number of coefficients at the maximum become necessary.

Since the degree (order) of initial value of $\lambda_0(X)$ is increased from the 0-th order to the ε-th order in the Euclidean mutual division method of the next (2t−ε) step, a computation ability for performing multiplication and addition with respect to (2t−1) of polynomials at the maximum becomes necessary also with respect to $\lambda_i(X)$, and a region corresponding to almost 2t-th orders with respect to each polynomial is necessary also for the storage region of the coefficients. These are about two times the values in a case where the usual correction is realized by the methods of configuration D and E.

That is, in the present method of configuration, $4t^2$ multiplication and addition operations in total, which were originally necessary in the lost data correction, are realized by using (8t+2) number of registers by repeating 4t multiplication and addition operations per step by 2t steps. Accordingly, the number of computations is increased about two-fold, but there are several advantages more than compensating for this.

Figure 3A:
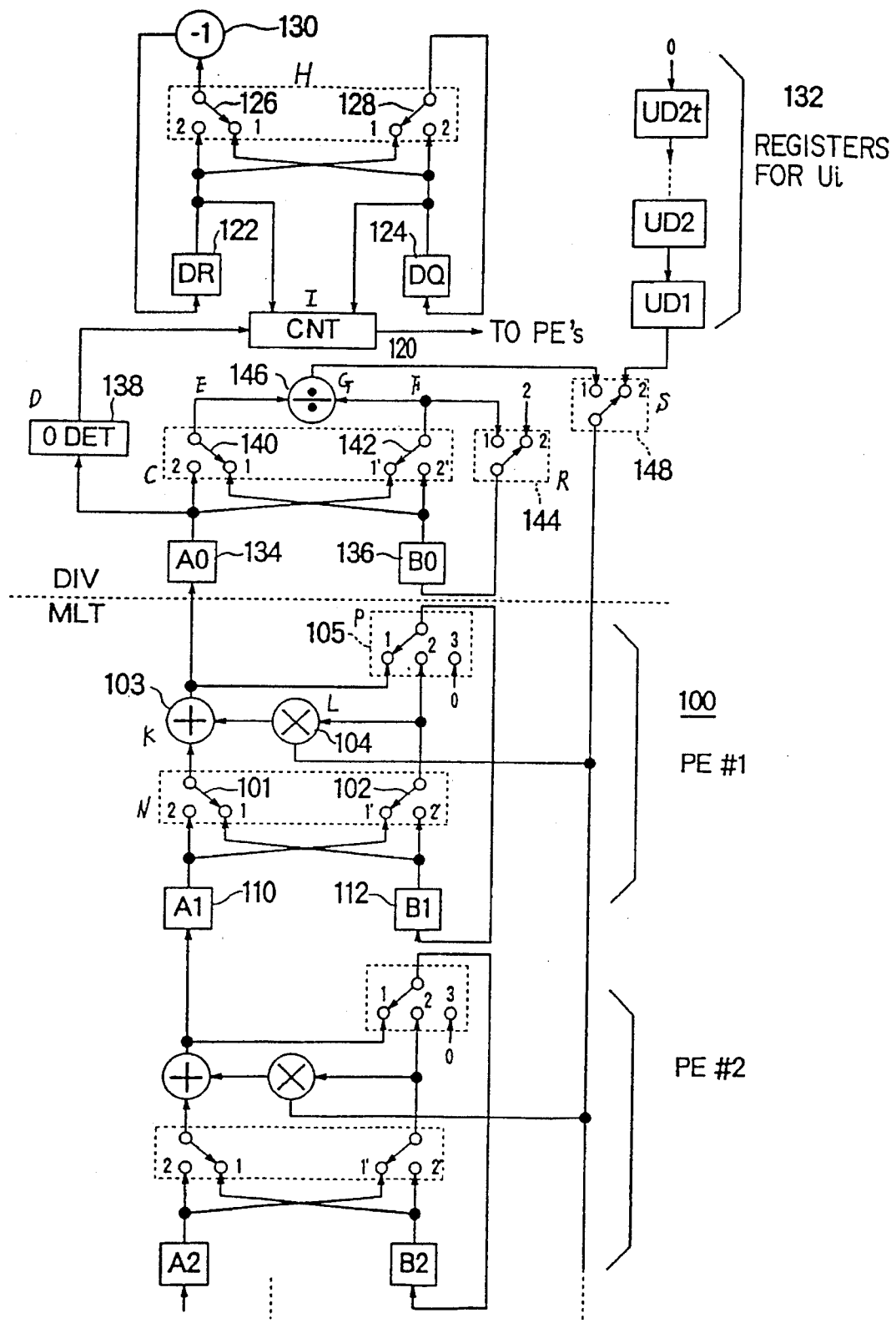
FIG. 3a to 3c are views showing the basic circuit configuration of a first embodiment of a lost data correction circuit of the present invention.
Figure 3B:
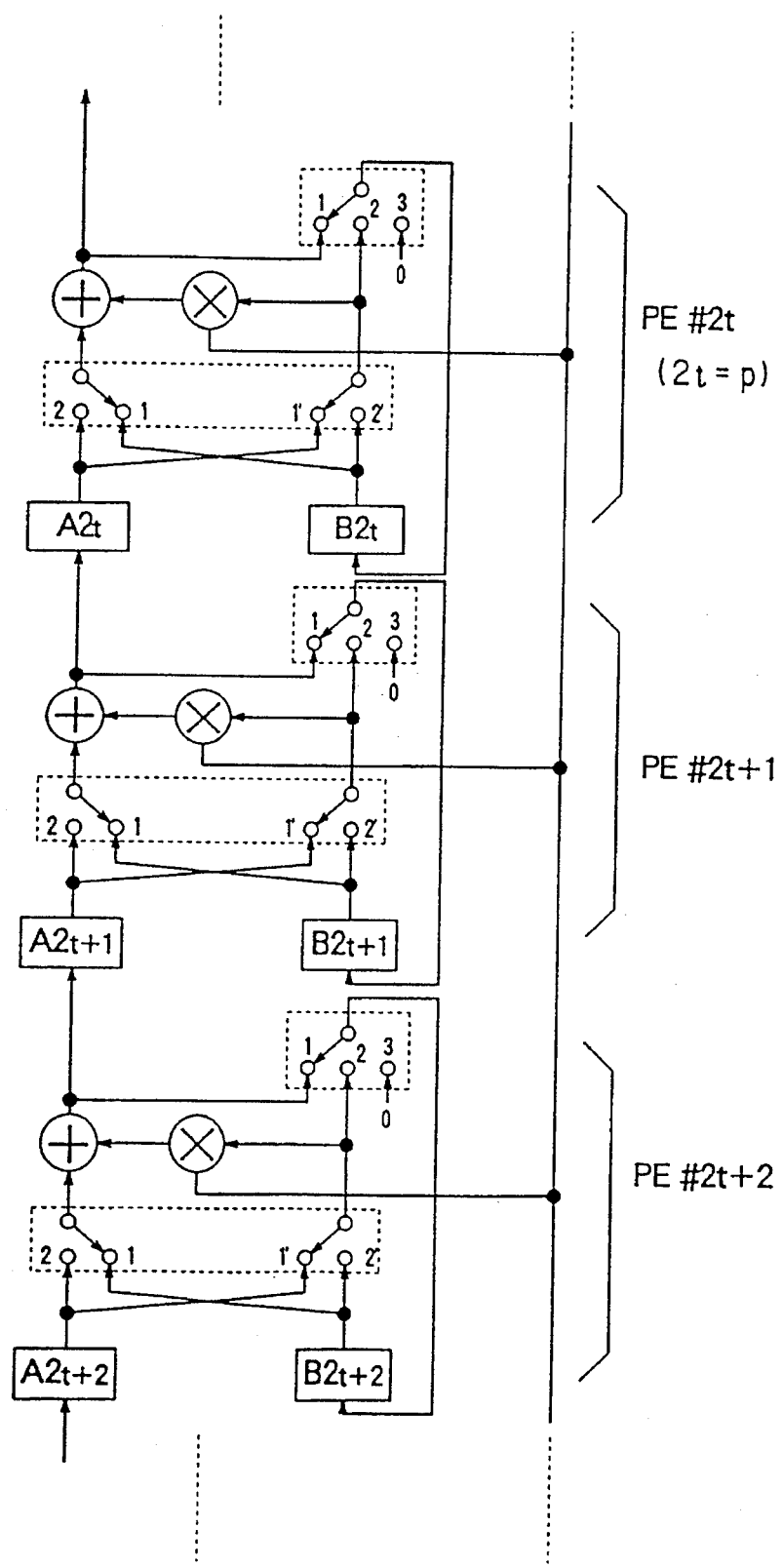
Figure 3C:
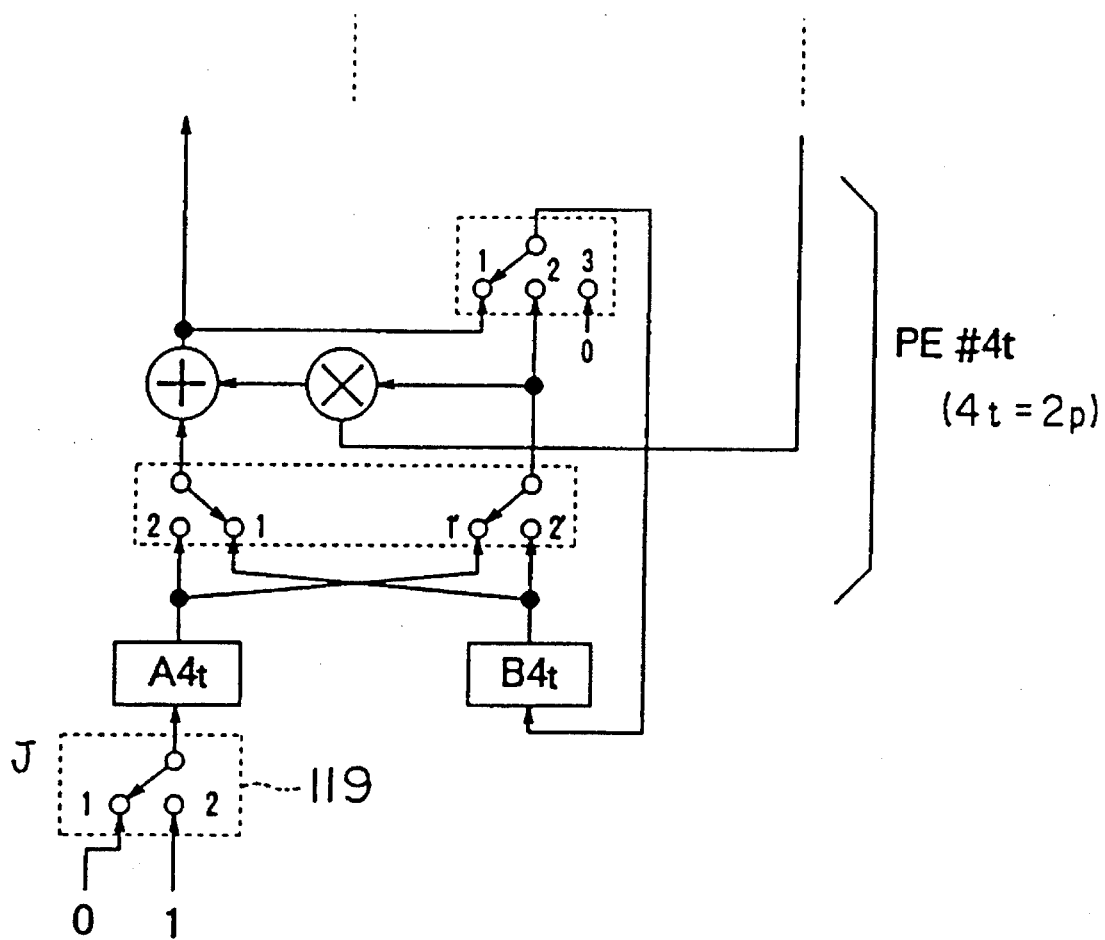

FIG. 3a to 3c are conceptual structural views of the present method of configuration.

As indicated by the figures, the configuration of the present invention includes two primary functional blocks, a division unit DIV, and a multiplication and addition computation unit, MLT.

The division unit 148 (G) in the division unit DIV performs a division of E/F between the most significant coefficients of two polynomials in the Euclidean mutual division method. The result of this division is supplied to the computation units (processing elements) PE in the multiplier unit MLT while being switched to the held data of the register unit 132 comprising the storage registers $UD_1$ to $UD_2$ at the lost data positions at the switching unit 148(S). The switching unit 144(R) is a switching unit for performing the initialization for the computation of the Euclidean mutual division method. The registers 122(DR) and 124(DQ) store the degrees (orders) $dR_i$ and $dQ_i$ of the most significant coefficients of the polynomials $R_i(X)$ and $Q_i(X)$ stored in the registers 134($A_0$) and 136($B_0$) when performing the computation of the modified Euclidean mutual division method. When the computation is actually carried out, they represent the degrees (orders) of $R_i(X)$ and $Q_i(X)$.

The control signal generation unit (CNT) 120 in the division unit DIV decides the operation of the computation which should be carried out in the computation units PE in the multiplication and addition computation unit MLT from information such as the result of comparison of the registers 122 (DR) and 124 (DQ), the result of detection of "0" of the register 134 ($A_0$) in the zero detector 138 (D), and the current computation process number, etc., and independently controls the computation units PE.

The multiplication and addition computation unit MLT requires 4t number of computation units with respect to a system to which 2t parities in the present structure are added even in the computation of the first $\epsilon$ step and in the computation of the next (2t–$\epsilon$) step. Note, it is assumed that the computation unit is not used in the form of multiplexing and only one multiplication and addition operation is carried out by each computation unit with respect to one step of repetition.

The multiplication and addition computation unit MLT has computation units PE#1 to PE#4t.

Figure 4:
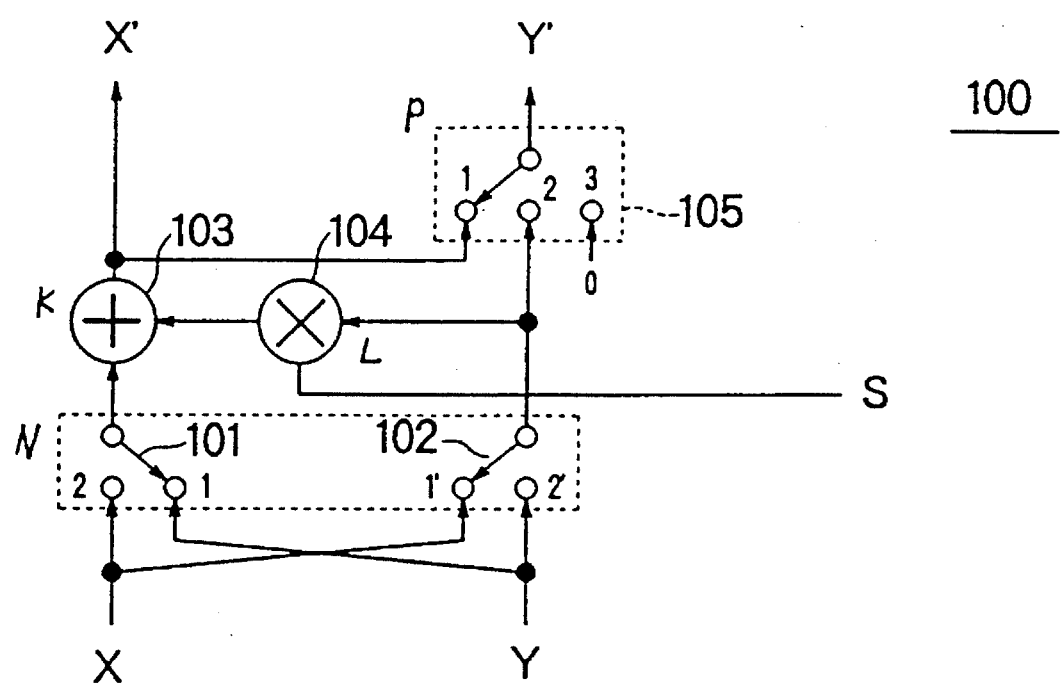
FIG. 4 is a detailed circuit diagram of a computation unit shown in FIGS. 3a to 3c.

As shown in FIG. 4, each computation unit PE (100) is usually constituted by the multiplier 104 (L), adder 103 (K), switching units 101 and 102 (N), and a switching unit 105 (P), and performs the computation on the finite field particularly where the Reed-Solomon code is used. The computation unit PE may have a structure in which the following:

1) $X'=X \cdot S+Y$ $Y'=X$ \hfill (56)

2) $X'=Y \cdot S+X$ $Y'=Y$ \hfill (57)

3) $X'=Y'=X \cdot S+Y$ \hfill (58)

4) $X'=X \cdot S+Y$ $Y'=0$ \hfill (59)

four types of computations can be performed.

Any configuration can be used for the method of configuration of the computation unit PE per se so far as the configuration can perform the above-described four types of computation. Where it is realized by a method of configuration different from those in FIGS. 3a to 3c, the configuration of the computation unit PE is changed.

It is assumed that, among the registers in FIGS. 3a to 3c, a group of registers $A_0, A_1, \ldots, A_{4t}$ on the left side in the figure is referred to as the A side registers, and the group of registers $B_0, B_1, \ldots, B_{4t}$ on the right side is referred to as B side registers.

When the division unit DIV and multiplication and addition computation unit MLT are combined, a total of (4t+1) A side registers and a total of (4t+1) B side registers, i.e., (8t+2) in total registers, are provided. 4t computation units PE are provided.

Note that, the input of the A side register at the final stage of the multiplication and addition computation unit MLT, "0" or "1" is input by the switching unit 119 (J). Also, during the operation, the computation unit PE#4t at the final stage does not actually perform the computation. Accordingly, by a slight change of control, the register $A_{4t}$ and computation unit PE#4 are reduced, and further simplification of the circuit is possible. However, these circuits are also provided for the explanation of the principle of the present configuration.

Example of the Proposed Method for Lost Data Correction

An explanation will be made next of the method of storage of coefficients of polynomials performing the computation and the initialization and method of computation. In the routine, the operation is different between a case where a lost data symbol exists ($\epsilon$>0) and a case where no lost data symbol exist ($\epsilon$=0). In the latter case, the same computation as that in the case of the usual error correction is carried out based on the method previously proposed by the present inventor (for example, an example of operation disclosed in Japanese Patent Application No. 3-254183).

Operation 1: Where Lost Data Symbol Exists ($\epsilon$>0)

Where a lost data symbol exists, first, the calculations of u(X) and T(X) are simultaneously carried out during the first $\epsilon$ steps, u(X) and T(X) found as a result of this are used as the initial values, and the computation of the modified Euclidean mutual division method changing the initial value is carried out during the next (2t –$\epsilon$) steps. In the present configuration, these two independent computations can be continuously carried out.

The computation of the first $\epsilon$ step is carried out according to equation 34 and equation 47. The computation given by the recurrence formulae of equation 34 and equation 47 can be rewritten to those as in equation 56 and equation 57.

$$u^{(i)}(X)=u^{(i-1)}(X)-X \cdot U_i \cdot u^{(i-1)}(X) \tag{60}$$

$$T^{(i)}(X)=T^{(i-1)}(X)-X \cdot U_i \cdot T^{(i-1)}(X) \;(\mathrm{mod}\; X^{2t}) \tag{61}$$

This means that a polynomial obtained by multiplying the lost data position $U_i$ with the polynomial obtained by shifting the polynomials per se and coefficients by one order to a higher position is added to $u^{(i-1)}(X)$ and $T^{(i-1)}(X)$.

Therefore, in the conceptual configuration view shown in FIGS. 3a to 3c and FIG. 4, it is assumed that the coefficients of $u^{(i)}(X)$ and $T^{(i)}(X)$ are stored in the A side registers and the coefficients obtained by shifting the coefficients which have been stored in the A side registers by the amount of one order to a lower significant position are stored in the B side registers.

The T(X) which is finally required is the (2t–1)-th order polynomial, and therefore also the coefficients of $T^{(i)}(X)$ which should be held in the middle of the computation can be the coefficients of the (2t–1)-th order. Accordingly, the coefficients of $T^{(i)}(X)$ are stored in the registers $A_0, A_1, \ldots, A_{2t-1}$ in a descending power (order) from the (2t–1)-th order coefficient at the highest position.

The coefficients of $u^{(i)}(X)$ are stored in the A side registers following $T^{(i)}(X)$ from the register $A_{2t}$ to the register $A_{4t}$ similarly in a descending order. The maximum degree of $u^{(i)}(X)$ is the 2t-th order, and therefore the number of coefficients becomes (2t+1), and they are stored in (2t+1) registers from the register $A_{2t}$ to the register $A_{4t}$ in a descending power (order) with respect to T(X).

On the other hand, in the group of the B side registers, the coefficients stored in the A side registers are shifted to the lower significant positions by the amount of one order and stored. Namely, the coefficients stored in the register $A_0$ are stored also in the register $B_1$ and all coefficients stored in the register $A_i$ are stored in the register $B_{i+1}$. Note that, it is assumed that 0 is put in the register $B_0$.

First, the initialization will be mentioned.

Since $T_{(0)}(X)=S(X)$, $S_{2t}$ is stored in the register $A_0$ as the initial value, and subsequently all syndromes are stored until $S_{2t-1}$ is stored in the register $A_{2t-1}$.

On the other hand, since $u^{(0)}(X)=1$, as the actual initialization, the set up of initial values to "0" is carried out in all of the registers from the register $A_{2t}$ to the register $A_{4t-1}$, and "1" is given as the initialization value only to the register $A_{4t}$.

It is assumed that the coefficients of the group of A side registers are stored in the B side register group while shifting the same to the lower significant position by the amount of one order. Note that, the circuit for the fine initialization is omitted since it is not essential.

The operation will be explained next.

After the coefficients storage and initialization as mentioned above, the polynomial computation of $T^{(i)}(X)$ and $u^{(i)}(X)$ is carried out by the computation of the first ϵ step. Now assume that the coefficients of $T^{(i-1)}(X)$ and $u^{(i-1)}(X)$ are stored in the register. In the first ϵ step of polynomial computation, the switching unit 148 (S) is switched to the contact point position 2 side, and one lost data positions $U_i$ per step is supplied from the register $UD_1$. The switching unit N of each computation unit is switched to the contact point position 1–1' side, and the switching unit 105 (P) is switched to the contact point position 1 side.

From the above setup, in each computation unit PE, the following computation is carried out:

3) $X'=Y'=X·S+Y$ (62)

Accordingly, with respect to the coefficients stored in the j-th register, a computation such as the following is carried out:

$A_j \times U_i + B_j$

In actuality, the same value as that in register $A_{j-1}$ has been inserted into the register $B_j$, and therefore a computation such as the following is carried out:

$A_j \times U_i + A_{j-1}$

The outputs of this are simultaneously stored in two registers of the register $A_{j-1}$ and the register $B_j$. As a result of this computation, the coefficients of $T^{(i)}(X)$ and $u^{(i)}(X)$ are stored in the A side register, and the coefficients obtained by shifting the same to lower significant positions by the amount of one order are stored also in the B side.

This ends the polynomial computation of one step.

After this repetition is performed ϵ times, in the A side register group, the following is obtained:

$T^{(\epsilon)}(X), u^{(\epsilon)}(X)$

That is, $T_{2t}$ is stored in the register $A_0$, and the coefficients of the correction syndrome polynomial T(X) are stored in the A side registers up to the register $A_{2t-1}$ in a descending power (order). Also, as the coefficients of the lost data position polynomial u(X), the 2t-th order coefficients are stored in the register $A_{2t}$, and subsequently the (2t+1) coefficients are stored in a descending order until 0-th order coefficients are stored in the register $A_{4t}$.

When the polynomial computation of the first ϵ step mentioned above is ended, the repetition of modified Euclidean mutual division method is carried out next using the stored coefficients as the initial values. This computation is carried out by basically the same method as the computation proposed in "Euclidean mutual division method" in Japanese Patent Application No. 3-154183 by the present inventor.

In the present configuration, the coefficients of $R_i(X)$ and $\lambda_i(X)$ in the computation of the modified Euclidean mutual division method are stored in the group of the A side registers, and the coefficients of $Q_i(X)$ and $\lambda_i(X)$ are stored in the group of B side registers in a descending order. At this time, the coefficients of $R_i(X)$ and $Q_i(X)$ are stored so that the coefficients of the $dR_i$-th order are located at the higher significant positions.

The initialization in the computation of this Euclidean mutual division method is to store the coefficients of the initial value $R_0(X)=T(X)$ of $R_1(X)$ in the group of A side registers in a descending order. The $T_{2t}$ is stored in the register $A_0$ and subsequently the 2t number of coefficients are stored up to the register $A_{2t-1}$. Subsequent to $R_0(X)$, in the A side registers, the coefficients of $\lambda_i(X)$ are stored.

In the case of the usual correction, as proposed in the specification of "Euclidean mutual dividing circuit" of Japanese Patent Application No. 3-154183, the initial value $\lambda_0(X)$ of $\lambda_i(X)$ is equal to 1, and therefore it was sufficient if the initial values of the register $A_{2t}$ to the register $A_{4t-1}$ were set to "0" and the initial values of only the register $A_{4t}$ were set to "1".

In the changed lost data correction algorithm, since $\lambda_0(X)=u(X)$, it is sufficient if the initial values of the register $A_{2t}$ to the register $A_{4t}$ are replaced by the coefficients of u(X). The 2t-th order coefficients of u(X) are stored in the register $A_{2t}$ and subsequently the coefficients of u(X) are stored in a descending power (order) until "1's (ones)" which are the 0-th order coefficients of u(X) are stored in the register $A_{4t}$.

On the other hand, the initialization of the B side registers is to store the coefficients of the initial value $Q_0(X)=X^{2t}$ of the $Q_i(X)$ in the descending power (order) in the same way as the group of the A side registers. This can be realized if "1" is stored in the register $B_0$ and the coefficients of register 1 to register 2t other than this are brought to "0". Subsequent to $Q_0(X)$, in the B side registers, the coefficients of $\mu_i(X)$ are stored. Since $\mu_0(X)=0$, it is sufficient if $B_0$ is changed to "1" among the B side registers and registers other than this are all brought to "0".

From the above description, it is seen that the computation of the Euclidean mutual division method can be continued after the first ϵ step of computation is ended by using the coefficients remaining in the A side register as they are. However, if the ϵ-th step polynomial computation is carried out as it is, the coefficients which have been stored in the A side register, but shifted by the amount of one order, are stored in the group of B side registers.

Therefore, at the time of ϵ-th step repetition, which becomes the last of the polynomial computations, it is necessary to simultaneously perform the operation of preparing coefficients of $X^{2t}$ and 0 which are the initial values of $Q_0(X)$ $\mu_0(X)$ for performing the next computation of the modified Euclidean mutual division method in the B side registers. This can be realized in the computation of repetition of the ϵ-th step in such a manner that the coefficients of T(X) of the results of computation are not stored in the B side register, $B_0$ is made equal to 1, and the registers subsequent to $B_1$ are all initialized to 0.

In actuality, by switching the switching unit 105 (P) to the contact point 3 side, a computation such as the following is performed with respect to the computation unit:

4) $X'=X·S+Y$ $$Y'=0 \quad (63)$$

whereby the above can be easily realized. At this time, the switching unit 144 (R) is switched to the contact point 2 side and "1" is stored in the register $B_0$, so that also the registers 122 and 124 (DR and DQ) for storing the $dR_i$ and $dQ_i$ are simultaneously initialized by (2t−1) and 2t, respectively.

In this way, after the initial values for the modified Euclidean mutual division method are set at the ϵ-th step, the computation of the modified Euclidean mutual division method is sequentially carried out over (2t−ϵ) steps one step by one step.

An explanation will be made of the computation of the i-th step for performing the computation of the Euclidean mutual division method.

When the number of lost data symbols is 2t, ω(X) and σ(X) are found by just 2t polynomial computations, and therefore computation of the Euclidean mutual division method of more than this becomes unnecessary. Therefore, it is assumed here a case where the lost data symbols of from 1 to 2t exist. In such a case, at least one Euclidean mutual division is carried out after the polynomial computation.

First, it is detected whether or not the $dR_{i-1}$-th order coefficient of $R_{i-1}(X)$ is "0" at the 0-detector 138 (D). From the result of this and the magnitude relationship between $DR_{i-1}$ and $DQ_{i-1}$, the operation mode is determined.

Where $DR_{i-1} < DQ_{i-1}$ and the state of $A_0 \neq 0$ is known, the mode becomes the cross mode, while becomes the normal mode in the other cases. This is because, as mentioned in the specification of the application by the present applicant mentioned before, the shift mode in the modified Euclidean mutual division method can be treated as a normal mode where the quotient from the divider 146 (G) is "0" in actuality.

When the mode is determined, two switching units 140:142 (C) and 126:128 (H) in the division unit DIV are switched to the cross (1–1') contact point or normal (2–2') contact point in accordance with the operation mode.

The value of the register $A_0$, that is, the $dR_{i-1}$-th order coefficient of $R_{i-1}(X)$, and the value of the register $B_0$, that is, the $dQ_{i-1}$-th order coefficients of $Q_{i-1}(X)$, pass through 140:142 (C) and are input to the divider 146 (G). In this divider, the division of E/F is carried out with respect to the input of data E and F in the diagram, and the result of this is output to the switching unit 148 (S). During the computation of the Euclidean mutual division method, for the signal S, the contact point 1 on the divider G side is selected.

On the other hand, in each computation unit PE in the multiplication and addition computation unit MLT, the computation is carried out in accordance with the operation mode decided in the division unit DIV. During the computation of the Euclidean mutual division method, the contact point 2 side is selected for the switching unit 105 (P). In the case of the cross mode, for the switching unit 101:102 (N), a cross side contact point (1–1') is selected, and if the output of the divider is represented by S in the computation unit PE shown in FIG. 4, a computation such as the following is carried out:

1) $X'=X\cdot S+Y$ $$Y'=X \quad (64)$$

In the case of one normal mode, for the switching unit 101:102 (N) in the computation unit PE, the normal side contact point (2–2') is selected, and a computation such as the following is performed:

2) $X'=Y\cdot S+X$ $$Y'=Y \quad (65)$$

The coefficients computed in each computation unit PE are stored in the registers, and the computation of one step is ended. In the j-th register, as the storage of coefficient, the X' output of the (j+1)-th computation unit PE#j+1 is stored in the A side register, while the output of the j-th computation unit PE#j is stored in the B side register. Namely, it is represented as in the following equation:

$$A'_j = X_{j+1}$$

$$B'_j = Y_j$$

By repeating this routine (2t−ϵ) times, it can be found as:

$$R_{2t-\epsilon}(X) = \omega(X)$$

$$\lambda_{2t-\epsilon}(X) = \hat{\sigma}(X)$$

The degrees (orders) of polynomial are $dR_i$ and $dR_i+1$, respectively. As the coefficients of ω(X), a $dR_i$-th order coefficient is stored in the register $A_0$ and subsequently the lower significant coefficients are stored in a descending power (order). Also for the coefficients of σ(X), a $(dR_i+1)$-th order coefficient is similarly stored in the register $A_{2t}$, and the lower significant coefficients are subsequently stored in the descending power (order).

An example of operation where the lost data correction is carried out will be explained next with reference to a concrete example.

In this example, by using the finite field GF $(2^4)$ defined by using the irreducible polynomial $g(X)=X+X^4+1$, a code given 2t=4 parities is used. In the case of the usual correction, the maximum symbol error correction is possible, but in the case of a lost data correction, the correction is possible within a range satisfying $(\epsilon+2v) \leq 2t$.

An explanation will be made here of an example where ϵ=2 and v=1. Two lost data positions are:

$$U_0 = \alpha^{+0}$$

$$U_1 = \alpha^{+1}$$

It is now assumed that the syndrome polynomial S(X) is found as:

$$S(X) = \alpha^2 X^3 + \alpha^{14} X^2 + \alpha^4 X + \alpha^9$$

When the error position polynomial σ(X) is derived from this syndrome polynomial S(X) using the modified Euclidean mutual division method, the following is obtained:

Step 1: Polynomial Computation

The coefficients of the lost data position polynomial u(X) and the correction syndrome polynomial T(X) are found from the lost data positions $U_i$. The initialization is carried out as follows:

$$T^{(0)}(X) = S(X) = \alpha^2 X^3 + \alpha^{14} X^2 + \alpha^4 X + \alpha^9$$

$$u^{(0)}(X) = 1$$

and the following computation is carried out:

$$\begin{aligned} u^{(1)}(X) &= u^{(0)}(X) - X \cdot U_1 \cdot u^{(0)}(X) \\ &= 1 - X \cdot \alpha^{+0} \cdot 1 \\ &= \alpha^0 X + 1 \end{aligned}$$

-continued $$T^{(1)}(X) = T^{(0)}(X) - X \cdot U_1 \cdot T^{(0)}(X) \pmod{X^4}$$
$$= \alpha^2 X^3 + \alpha^{14} X^2 + \alpha^4 X + \alpha^9 - X \cdot \alpha^{+0} \cdot (\alpha^2 X^3 + \alpha^{14} X^2 + \alpha^4 X + \alpha^9)$$
$$= \alpha^2 X^3 + \alpha^{14} X^2 + \alpha^4 X + \alpha^9 - (\alpha^2 X^4 + \alpha^{14} X^3 + \alpha^4 X^2 + \alpha^9 X)$$
$$= \alpha^{13} X^3 + \alpha^9 X^2 + \alpha^{14} X + \alpha^9$$

Step 2: Polynomial Computation $$u^{(2)}(X) = u^{(1)}(X) - X \cdot U_2 \cdot u^{(1)}(X)$$
$$= \alpha^0 X + 1 - X \cdot \alpha^{+1} \cdot (\alpha^0 X + 1)$$
$$= \alpha^1 X^2 + \alpha^4 X + 1$$

$$T^{(2)}(X) = T^{(1)}(X) - X \cdot U_2 \cdot T^{(1)}(X) \pmod{X^4}$$
$$= \alpha^{13} X^3 + \alpha^9 X^2 + \alpha^{14} X + \alpha^9 - X \cdot \alpha^{+1} \cdot (\alpha^{13} X^3 + \alpha^9 X^2 + \alpha^{14} X + \alpha^9)$$
$$= \alpha^{13} X^3 + \alpha^9 X^2 + \alpha^{14} X + \alpha^9 - (\alpha^{14} X^3 + \alpha^{10} X^2 + \alpha^0 X + \alpha^{10})$$
$$= \alpha^9 X^3 + \alpha^7 X^2 + \alpha^{11} X + \alpha^9$$

Step 3: Euclidean Mutual Division Method and Cross Mode Computation

The computation of the modified Euclidean mutual division method is carried out using the T(X) and u(X) found at Steps 1 and 2. The initialization is carried out as follows:

$$dR_0 = 3$$
$$dQ_0 = 4$$
$$R_0(X) = T(X) = \alpha^9 X^3 + \alpha^7 X^2 + \alpha^{11} X + \alpha^9$$
$$Q_0(X) = X^4$$
$$\lambda_0(X) = u(X) = \alpha^0 X + 1$$
$$\mu_0(X) = 0$$

After the decision of the computation mode, the computation of repetition is carried out as follows:

$$\left.\begin{array}{l} dR_0 - dQ_0 = 3 - 4 = -1 < 0 \\ \text{next coefficient } \alpha^9 \text{ of } dR_0 - \text{order of } R_0(X), \alpha^9 \neq 0 \\ \rightarrow \text{cross mode} \end{array}\right\}$$

$$R_1(X) = Q_0(X) + (1/\alpha^9) \cdot R_0(X) \cdot X$$
$$= X^4 + \alpha^6(\alpha^9 X^3 + \alpha^7 X^2 + \alpha^{11} X + \alpha^9) \cdot X$$
$$= \alpha^{13} X^3 + \alpha^2 X^2 + \alpha^0 X$$

$$\lambda_1(X) = \mu_0(X) + (1/\alpha^9)\lambda_0(X)X$$
$$= 0 + \alpha^6 \cdot (\alpha^1 X^2 + \alpha^4 X + 1) \cdot X$$
$$= \alpha^7 X^3 + \alpha^{10} X^2 + \alpha^6 X$$

$$Q_1(X) = R_0(X)$$
$$= \alpha^9 X^3 + \alpha^7 X^2 + \alpha^{11} X + \alpha^9$$

$$\mu_1(X) = \lambda_0(X)$$
$$= \alpha^1 X^2 + \alpha^4 X + 1$$

$$dR_1 = dQ_0 - 1 = 4 - 1 = 3$$

-continued $$dQ_1 = dR_0 = 3$$

Step 4: Euclidean Mutual Division Method and Normal Mode Computation $$dR_1 - dQ_1 = 3 - 3 = 0 \geq 0 \rightarrow \text{normal mode}$$

$$R_2(X) = R_1(X) + (\alpha^{13}/\alpha^9) Q_1(X)$$
$$= \alpha^{13} X^3 + \alpha^2 X^2 + \alpha^0 X + \alpha^4(\alpha^9 X^3 + \alpha^7 X^2 + \alpha^{11} X + \alpha^9)$$
$$= \alpha^9 X^2 + \alpha^{13}$$

$$\lambda_2(X) = \lambda_1(X) + (\alpha^{13}/\alpha^9)\mu_1(X)$$
$$= \alpha^7 X^3 + \alpha^{10} X^2 + \alpha^6 X + \alpha^4 \cdot (\alpha^1 X^2 + \alpha^4 X + 1)$$
$$= \alpha^7 X^3 + \alpha^0 X^2 + \alpha^{14} X + \alpha^4$$

$$Q_2(X) = Q_1(X)$$
$$= \alpha^9 X^3 + \alpha^7 X^2 + \alpha^{11} X + \alpha^9$$

$$\mu_2(X) = \mu_1(X)$$
$$= \alpha^1 X^2 + \alpha^4 X + 1$$

$$dR_2 = dR_1 - 1 = 3 - 1 = 2$$
$$dQ_2 = dQ_1 = 3$$

Above, by repeated computation of four steps, $\hat{\sigma}(X)$ and $\omega(X)$ are found as in the following equations:

$$\omega(X) = R_2(X)$$
$$= \alpha^9 X^2 + \alpha^{13}$$
$$\hat{\sigma}(X) = \lambda_2(X)$$
$$= \alpha^7 X^3 + \alpha^0 X^2 + \alpha^{14} X + \alpha^4$$

$\sigma(X)$ and $\omega(X)$ are found by the above-mentioned four steps of computation. This computation process is sequentially shown in FIG. 5a to FIG. 9b.

Figure 5A:
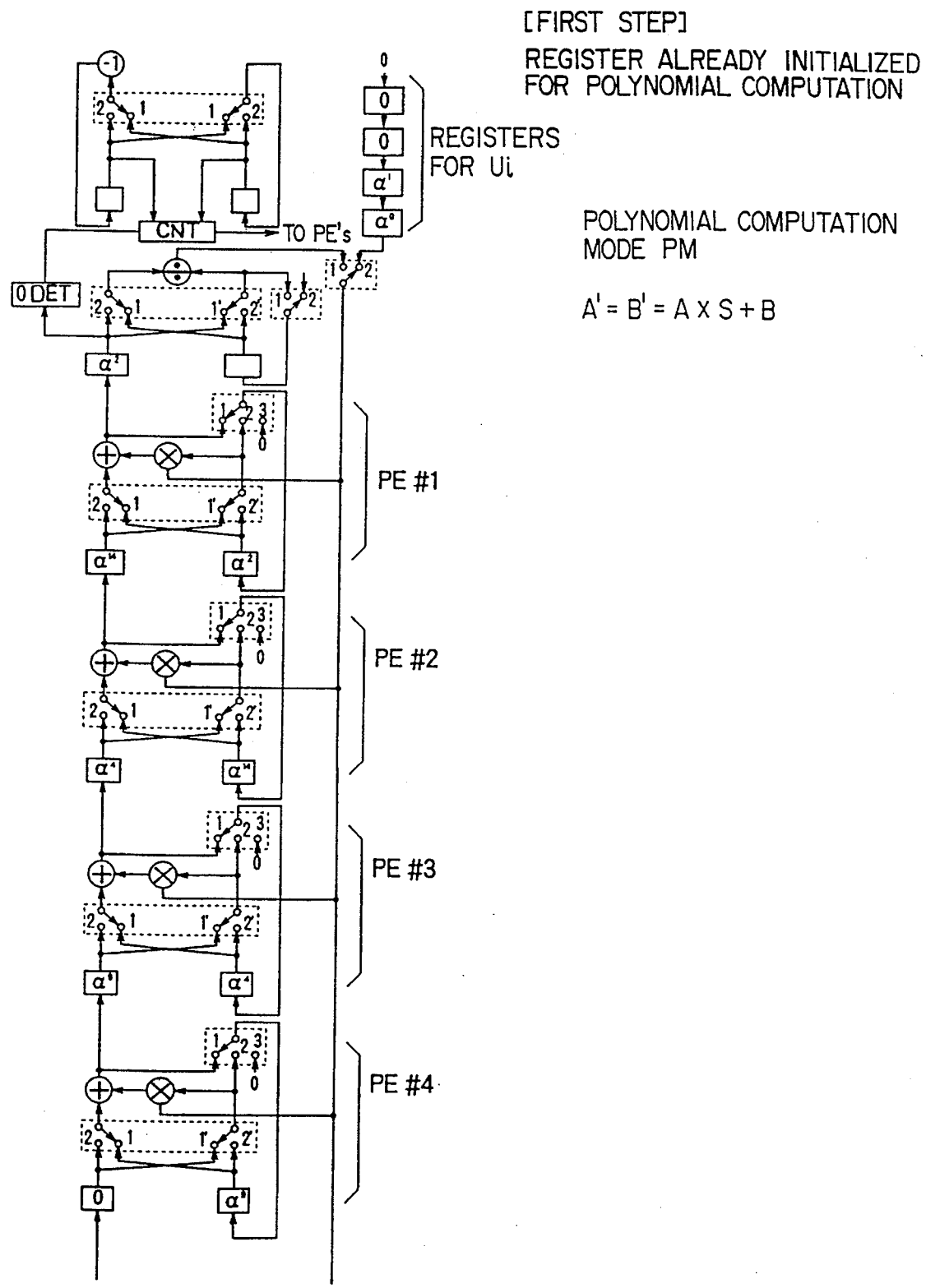
FIGS. 5a and 5b are views illustrating an operation mode of a first step in a first operation example in the lost data correction circuit of the first embodiment of the present invention.
Figure 5B:
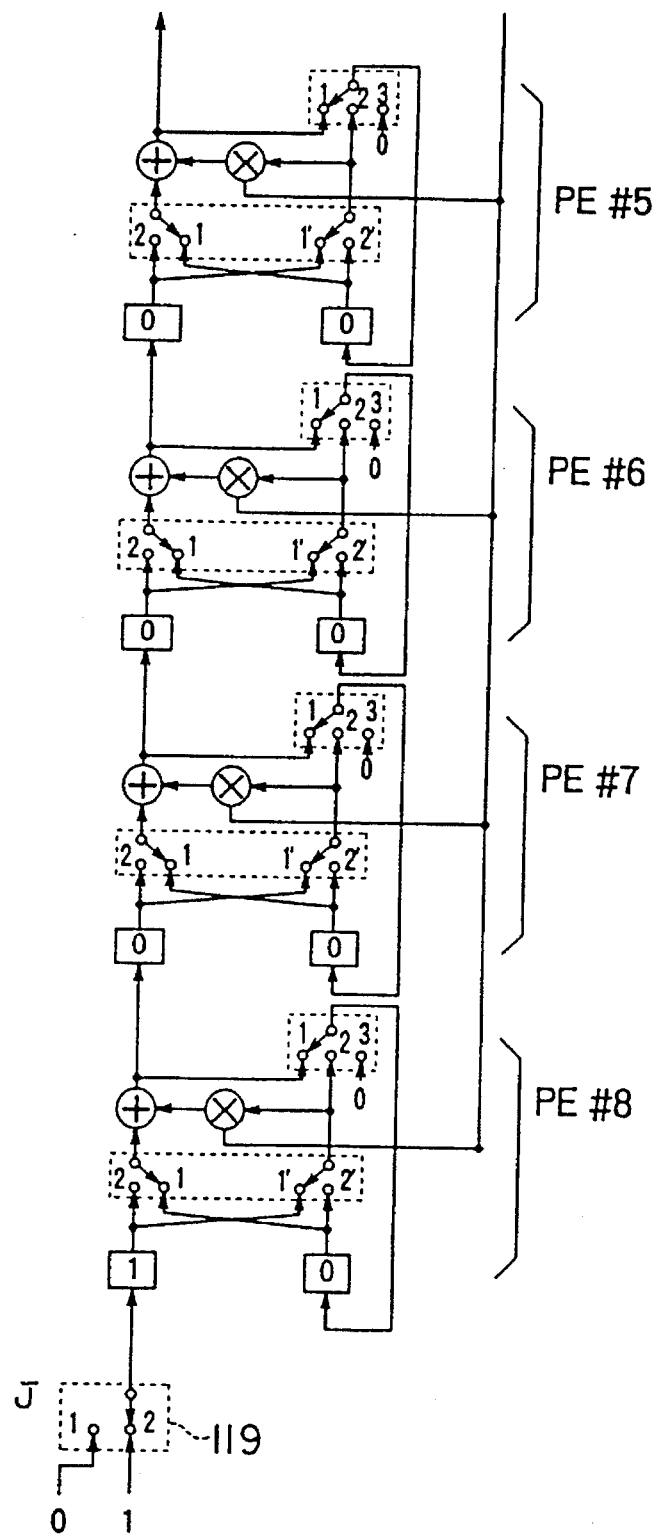

In FIGS. 5a and 5b indicating the operation state of first step, the register has been already initialized. In this example, since $\epsilon = 2$, the initialization for polynomial computation is carried out. The lost data positions $U_1 = \alpha^0$ and $U_2 = \alpha^1$ are sequentially stored in the register $UD_i$. Syndromes $S_i$ to $S_4$ which are coefficients of $T^{(0)}(X)$ are stored in registers $A_0$ to $A_3$, and these coefficients are shifted to one order of a lower position and stored there in the group of B side registers. $A_4$ to $A_7$ and $B_5$ to $B_8$ are all "0", and "1" is stored in $A_8$.

The operation of the first step shown in FIGS. 5a and 5b is the switching of the switching unit N to the cross side contact point 1-1'. By using the lost data position $U_1 = \alpha^{+0}$ supplied from the register UD, a computation such as the following is performed:

$$T^{(1)}(X) = T^{(0)}(X) + \alpha^0 \cdot X \cdot T^{(0)}(X)$$

Since X is multiplied at the second term in the right side, it is not necessary to calculate the coefficients of the term of $X^3$ of $T^{(0)}(X)$. Accordingly, for the actually computed coefficients, four computations of:

$$\alpha^3 = \alpha^{14} \times \alpha^0 + \alpha^2$$
$$\alpha^9 = \alpha^4 \times \alpha^0 + \alpha^{14}$$
$$\alpha^{14} = \alpha^9 \times \alpha^0 + \alpha^4$$
$$\alpha^9 = 0 \times \alpha^0 + \alpha^9$$

are carried out in the computation units PE#1 to PE#4, and the results are simultaneously stored in the registers $A_0$ to $A_3$ and registers $B_1$ to $B_4$.

The computation of $u^{(1)}(X)$ is carried out in the same way. The computation of:

$$u^{(1)}(X) = u^{(0)}(X) + \alpha^0 \cdot X \cdot u^{(0)}(X)$$

$u^{(0)}(X) = 1$, and therefore a computation of:

$$\alpha^0 = \alpha^0 \times \alpha^0 + 0$$

is carried out at the computation unit PE#8, and the results are stored simultaneously in the register $A_7$ and the register $B_8$. At the polynomial computation, "1" is supplied from the switching unit 119 (J) in the computation unit PE at the final stage to the register $A_8$.

Figure 6A:
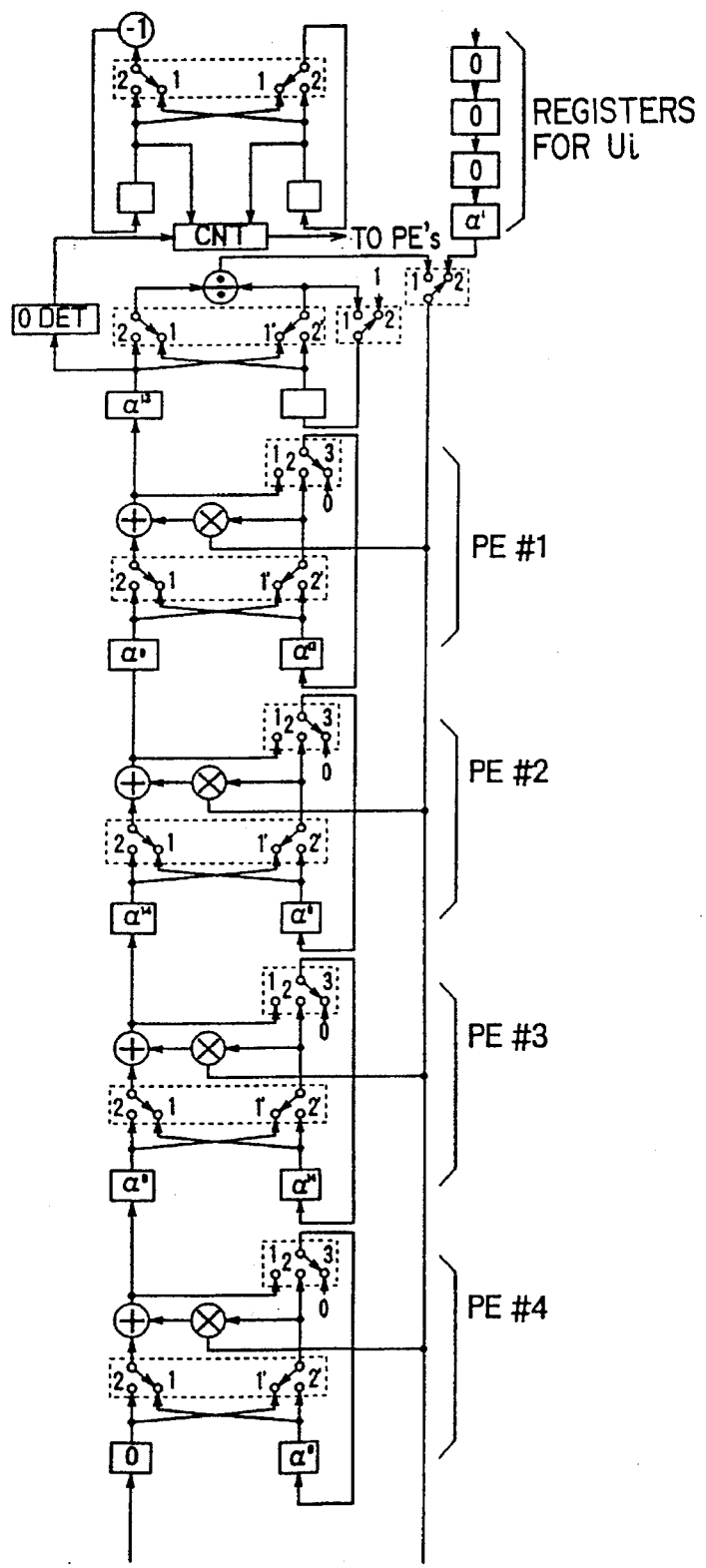
FIGS. 6a and 6b are views illustrating the operation mode of a second step in the first operation example in the lost data correction circuit of the first embodiment of the present invention.
Figure 6B:
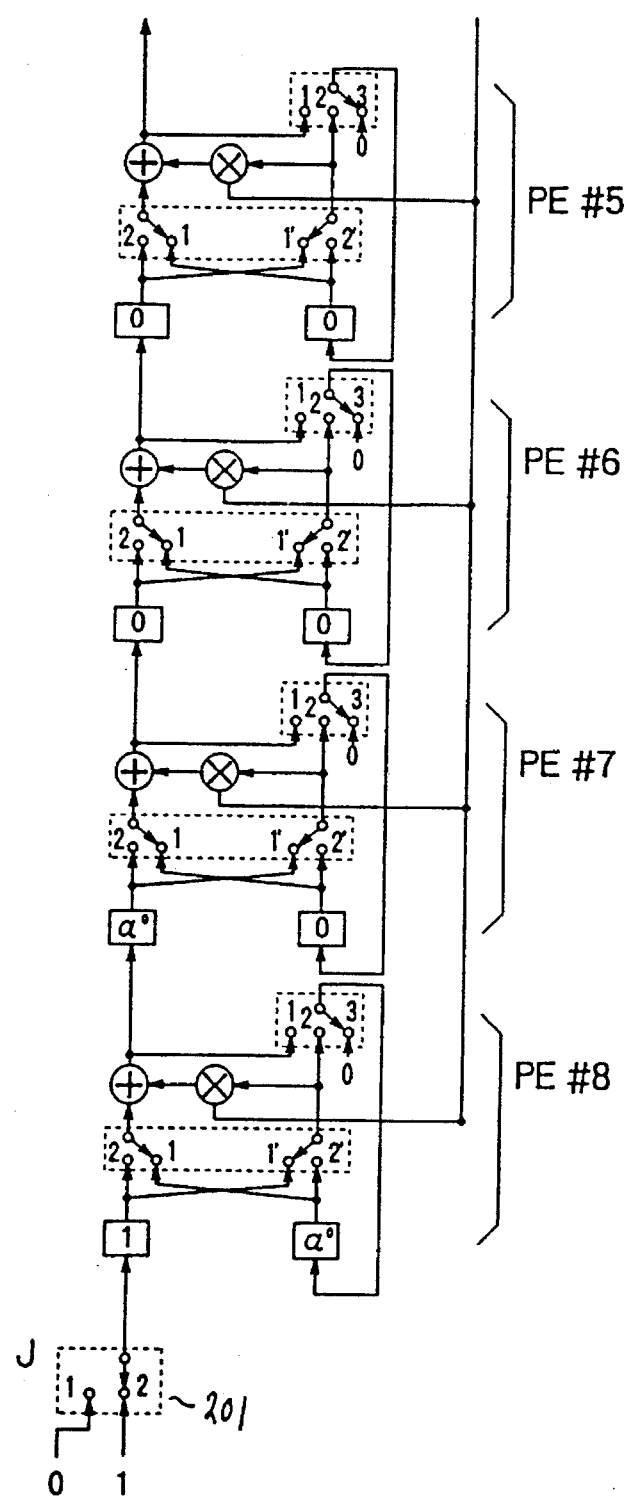

When the computation of the first step is ended, the coefficients are stored as shown in FIGS. 6a and 6b.

Also for the second step shown in FIGS. 6a and 6b, the polynomial computation is carried out in the same way as the first step, but $\epsilon=2$, and therefore it becomes the final step of the polynomial computation, and thus the B side register is initialized simultaneously for the computation of the Euclidean mutual division method.

At the time when the second step is ended, the polynomial computation is ended, and $T(X)$ and $u(X)$ are found.

Figure 7A:
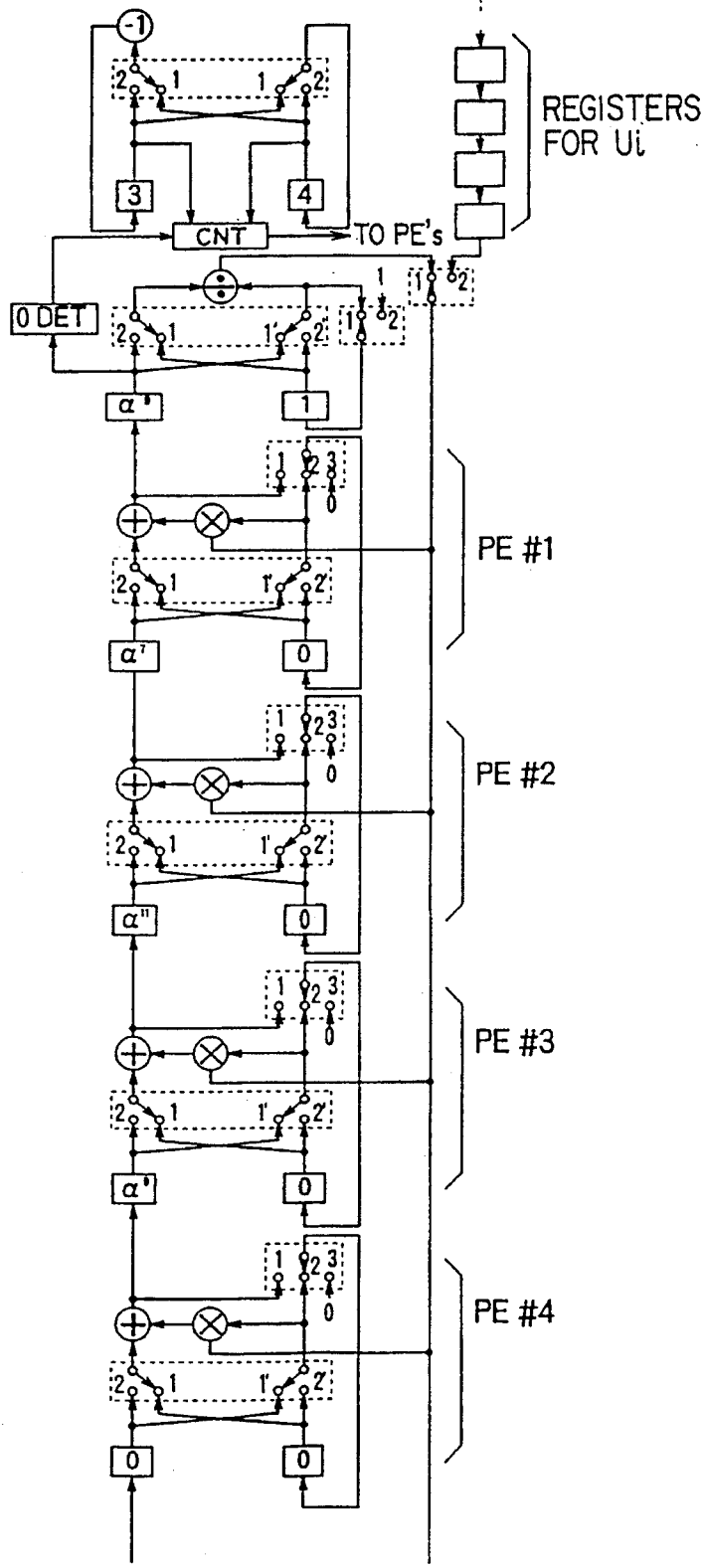
FIGS. 7a and 7b are views illustrating the operation mode of a third step in the first operation example in the lost data correction circuit of the first embodiment of the present invention.
Figure 7B:
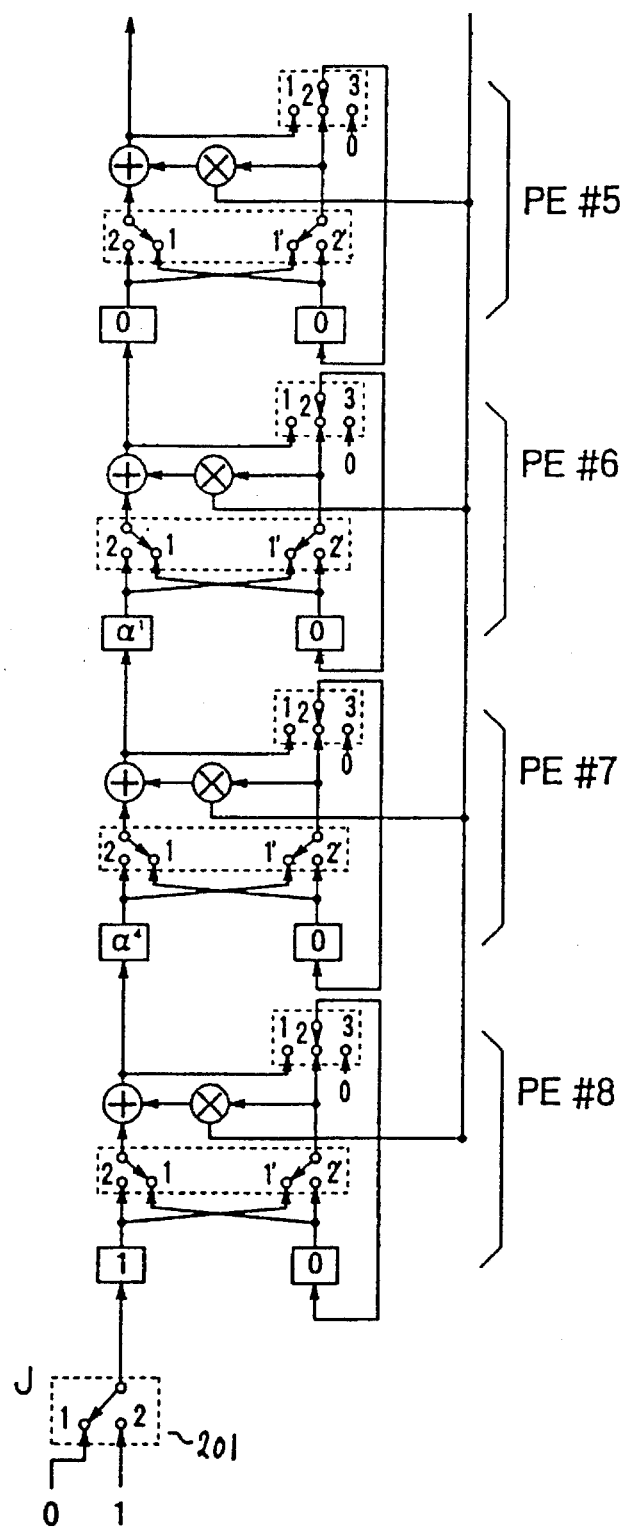

In FIGS. 7a and 7b, the coefficients at the time of ending the second step are stored in the registers. The coefficients of $R_0(X)=T(X)$ are stored in the registers $A_0$ to $A_3$ and the coefficients of $\lambda_0(X)=u(X)$ are stored in the registers $A_4$ to $A_8$. On the other hand, the B side register is initialized so that $Q_0(X)=X^{2t}$ and $\mu_0(X)=0$.

In the registers 122 (DR) and 124 (DQ) in the division unit DIV, the values of $dR_0$ and $dQ_0$ are stored. In the computation process where the computation is actually carried out in the algorithm of the modified Euclidean mutual division method, $dR_0$ and $dQ_0$ represent the degrees of $R_0(X)$ and $Q_0(X)$, respectively. At the initialization of computation of the Euclidean mutual division method, the initial values of the registers DR and DQ are brought to $(2t-1)$ and $2t$.

The computation of the third step indicated in FIGS. 7a and 7b is the same as the computation of the modified Euclidean mutual division method in the case of the usual correction. Since the value ($dR_0$) of the register 122 (DR) is "3" and the value ($dQ_0$) of the register 124 (DQ) is "4", the condition of DR<DQ is satisfied, and since the $dR_0$-th order coefficient of $R_0(X)$ is not zero, i.e., $\alpha^9$, the operation mode becomes the cross mode. Therefore, switching units 140:142 (C), 126:128 (H), and 101:102 (N) are switched to the cross side contact point 2–2', and a computation such as $1/\alpha^9$ is carried out in the divider 146 (G) in the division unit DIV, so that the division result $\alpha^6$ passes through the switching unit 148 (S) and is output to the computation units PE.

The computation of the cross mode is carried out in the multiplication and addition computation unit MLT. The computation for finding the $R_1(X)$ is expressed by:

$$\begin{aligned} R_1(X) &= Q_0(X) + (1/\alpha^9) \cdot R_0(X) \cdot X \\ &= X^4 + \alpha^6(\alpha^9 X^3 + \alpha^7 X^2 + \alpha^{11} X + \alpha^9) \cdot X \\ &= \alpha^{13} X^3 + \alpha^2 X^2 + \alpha^0 X \end{aligned}$$

These three coefficients are realized when the following computation is carried out at the computation units PE#1 to PE#3:

$$\alpha^3 = \alpha^7 \times \alpha^6 + 0$$

$$\alpha^9 = \alpha^{11} \times \alpha^6 + 0$$

$$\alpha^{14} = \alpha^9 \times \alpha^6 + 0$$

Similarly, a calculation such as:

$$\begin{aligned} \lambda_1(X) &= \mu_0(X) + (1/\alpha^9)\lambda_0(X)X \\ &= 0 + \alpha^6 \cdot (\alpha^1 X^2 + \alpha^4 X + 1) \cdot X \\ &= \alpha^7 X^3 + \alpha^{10} X^2 + \alpha^6 X \end{aligned}$$

for finding $\lambda_1(X)$ is realized when the following three coefficient computations are carried out at computation units PE#6 to PE#8:

$$\alpha^3 = \alpha^1 \times \alpha^6 + 0$$

$$\alpha^9 = \alpha^4 \times \alpha^6 + 0$$

$$\alpha^{14} = 1 \times \alpha^6 + 0$$

Figure 8A:
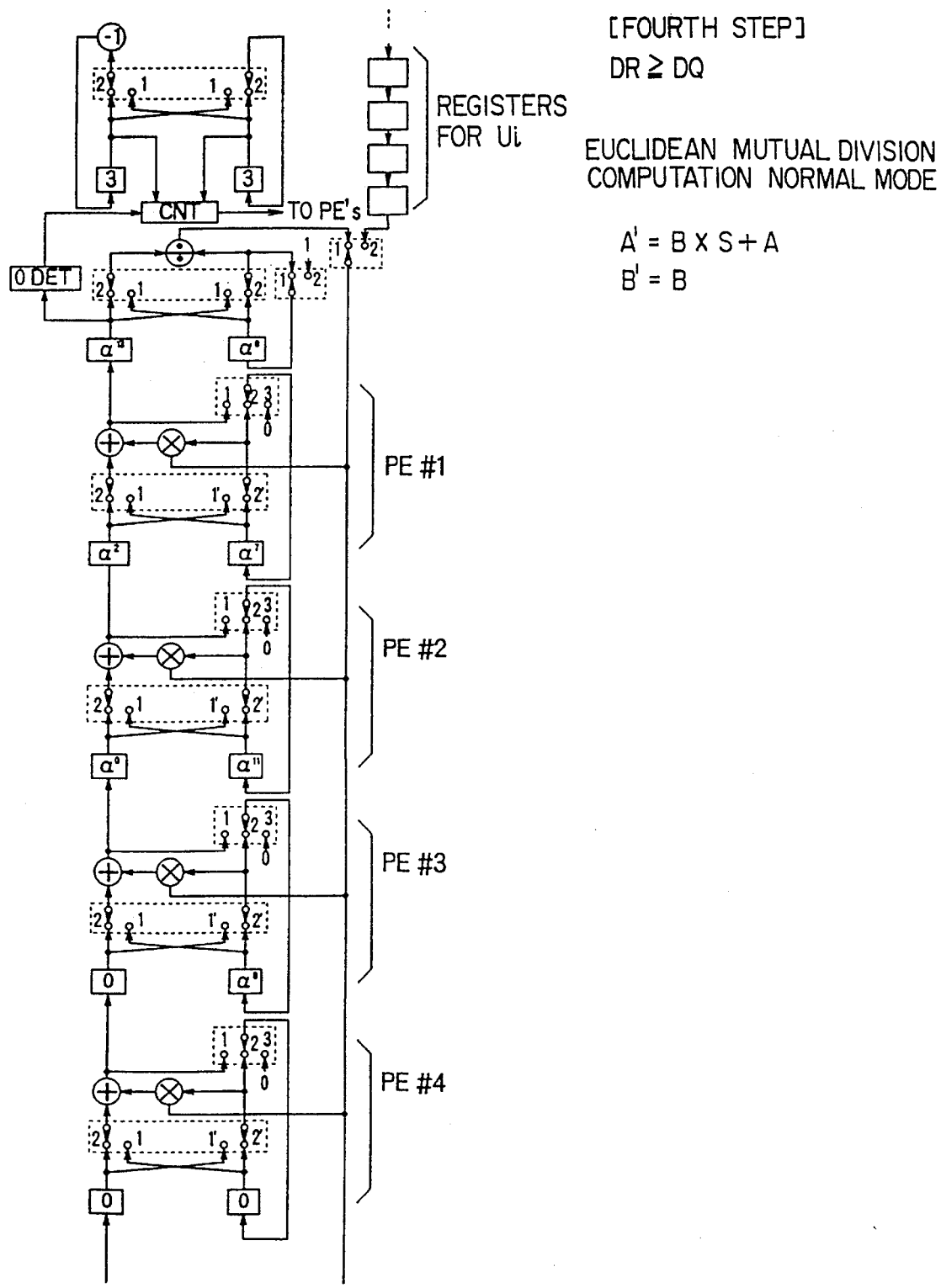
FIGS. 8a and 8b are views illustrating the operation mode of a fourth step in the first operation example in the lost data correction circuit of the first embodiment of the present invention.
Figure 8B:
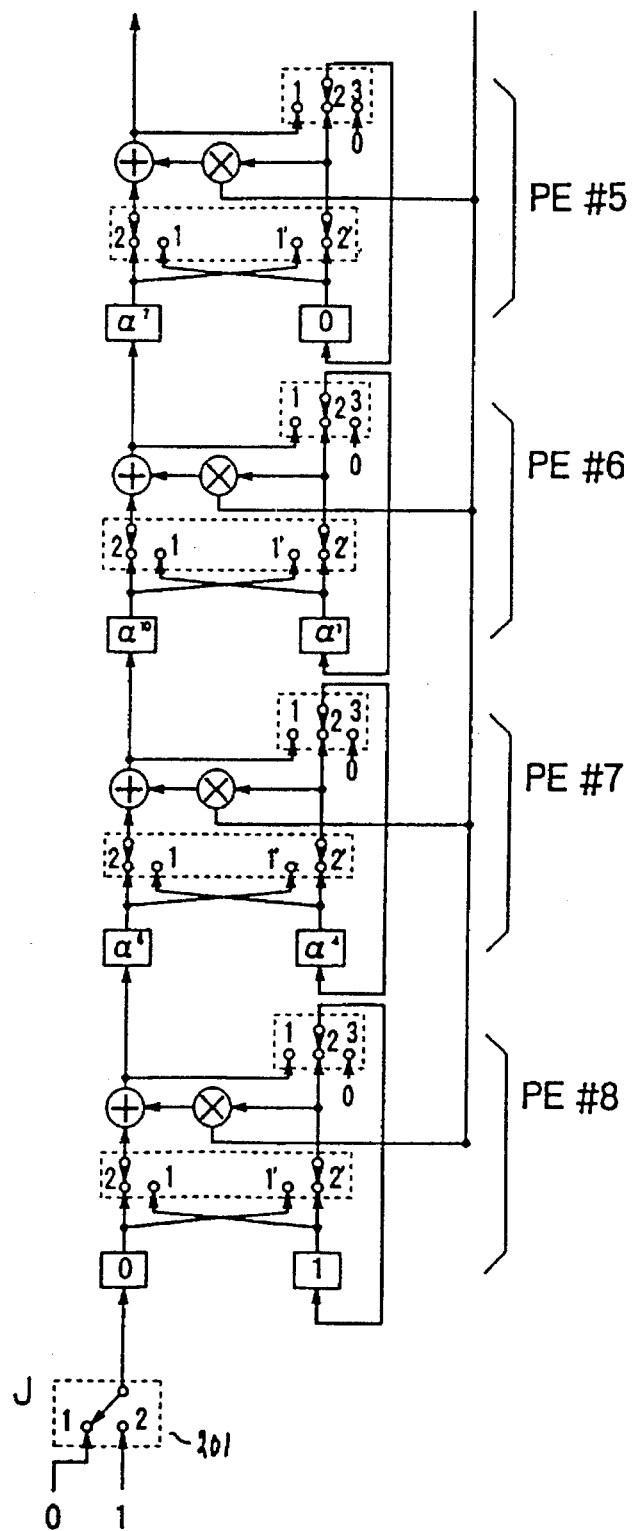

These computed coefficients of $R_1(X)$ and $\lambda_1(X)$ are stored in the A side registers as shown in FIGS. 8a and 8b, and the coefficients of $Q_1(X)=R_0(X)$ and $\mu_1(X)=\lambda_0(X)$ are stored in the group of the B side registers.

Subsequently, in the four steps of computations shown in FIGS. 8a and 8b, the value ($dR_1$) of the register DR is "3" and the value ($dR_i$) of the register DQ is "3", and therefore DR becomes equal to DQ, and the computation of a normal mode is carried out. Therefore, the switching units C, H, and N are switched to the normal side contact point 1–1', and a computation such that $\alpha^{13}/\alpha^9$ is carried out in the divider G in the division unit DIV. The division result $\alpha^4$ passes through the switching unit S and is output to the computation units PE.

The multiplication and addition computation unit MLT performs the computation of a normal mode. The calculation for finding $R_2(X)$ is:

$$\begin{aligned} R_2(X) &= R_1(X) + (\alpha^{13}/\alpha^3) Q_1(X) \\ &= \alpha^{13} X^3 + \alpha^2 X^2 + \alpha^0 X + \alpha^4(\alpha^9 X^3 + \alpha^7 X^2 + \alpha^{11} X + \alpha^9) \\ &= \alpha^9 X^2 + \alpha^{13} \end{aligned}$$

To find these coefficients, in the computation units PE#1 to PE#3, the following three coefficient computations are carried out:

$$\alpha^3 = \alpha^7 \times \alpha^6 + 0$$

$$\alpha^9 = \alpha^{11} \times \alpha^6 + 0$$

$$\alpha^{14} = \alpha^9 \times \alpha^6 + 0$$

Similarly, $\lambda_1(X)$ is found by a computation such as:

$$\begin{aligned} \lambda_2(X) &= \lambda_1(X) + (\alpha^{13}/\alpha^9) \mu_1(X) \\ &= \alpha^7 X^3 + \alpha^{10} X^2 + \alpha^6 X + \alpha^4 \cdot (\alpha^1 X^2 + \alpha^4 X + 1) \\ &= \alpha^7 X^3 + \alpha^0 X^2 + \alpha^{14} X + \alpha^4 \end{aligned}$$

and therefore it is realized by performing the following four coefficient computations in the computation units PE#5 to PE8.

$$\alpha^7 = \alpha^0 \times \alpha^6 + \alpha^7$$

$$\alpha^0 = \alpha^1 \times \alpha^6 + \alpha^{10}$$

$$\alpha^{14} = \alpha^4 \times \alpha^6 + \alpha^6$$

$$\alpha^4 = \alpha^0 \times \alpha^6 + 0$$

Figure 9A:
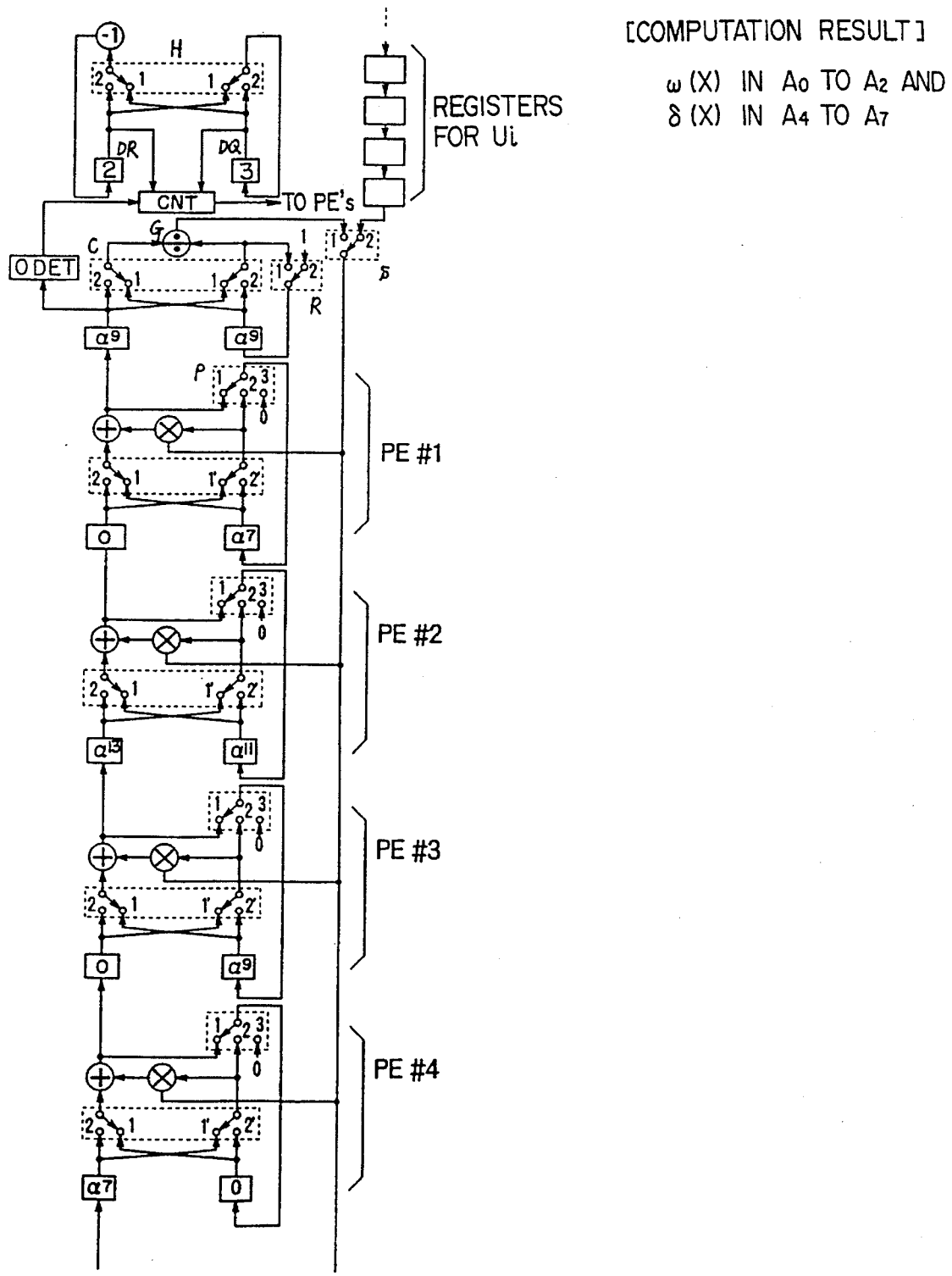
FIGS. 9a and 9b are views illustrating the operation mode of a final step in the first operation example in the lost data correction circuit of the first embodiment of the present invention.
Figure 9B:
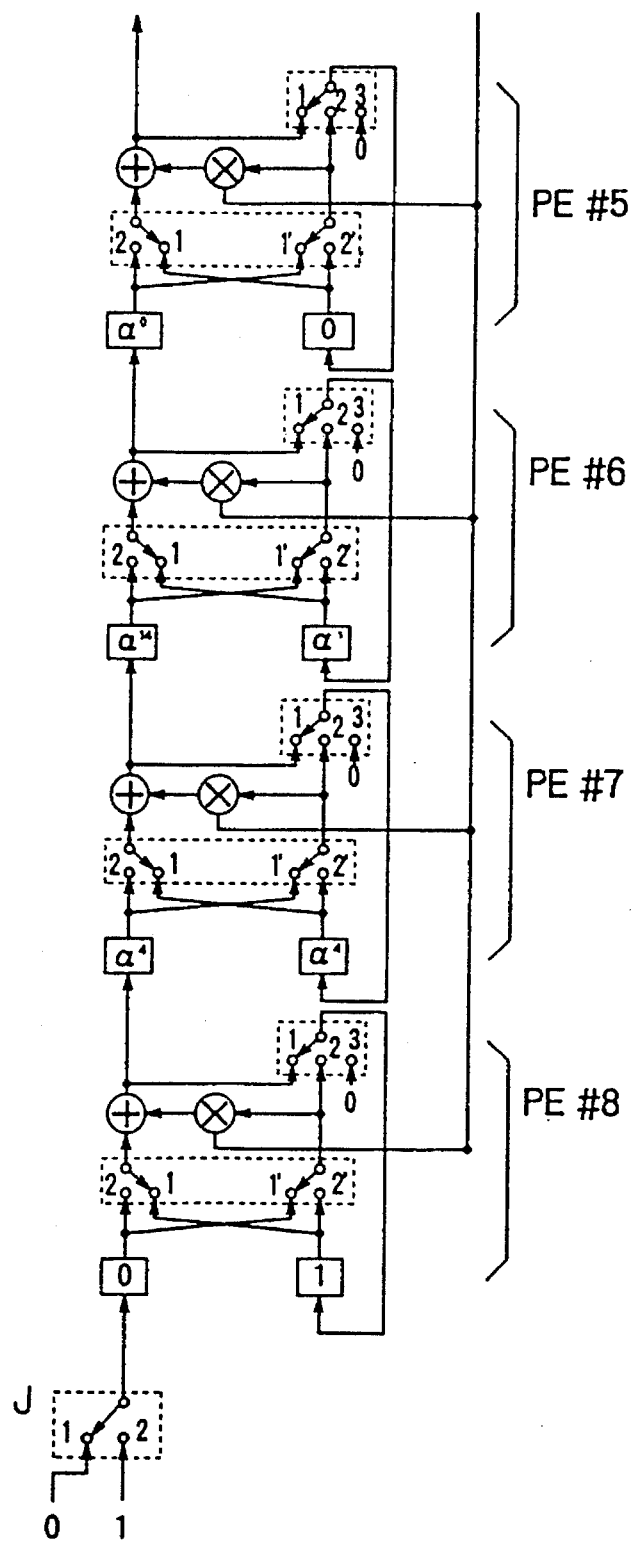

At the point of time when the four steps of computations are ended, the coefficients stored in the registers become those as shown in FIGS. 9a and 9b. It is seen that the coefficient $\alpha^9$, 0, and $\alpha^3$ of $\omega(X)$ are found in the registers $A_0$ to $A_2$ and the coefficients $\alpha^7$, $\alpha^0$, $\alpha^{14}$, and $\alpha^4$ of $\underline{\sigma(X)}$ are found in the registers $A_4$ to $A_7$.

Operation 2: Where Lost Data Symbol Does Not Exist ($\epsilon$=0)

As already mentioned, where there are no lost data symbols, the same computation as the case of the usual error correction mentioned in the specification of Japanese Patent Application No. 3-254183 by the present inventor is carried out.

The initialization will be explained. The coefficients of $R_0(X)=S(X)$ are substituted in a descending order in the registers $A_0$ to $A_{2t-1}$. Similarly, the coefficients of $Q_0(X)=X^{2t}$ are substituted in a descending order to the registers $B_0$ to $B_{2t}$ from the upper significant position. That is, the most significant register $A_0$ becomes "1" and all the remaining registers become "0". Among the registers $A_{2t}$ to $A_{4t}$ storing the coefficients of $\lambda_0(X)=1$, the least significant register $A_{4t}$ is brought to "1", and the others are all brought to "0". Also, registers $B_{2t+1}$ to $B_{4t}$ storing the coefficients of $\mu_0(X)=0$ are all brought to "0".

In the registers DR and DQ in the division unit DIV, $dR_i$ and $dQ_i$ are respectively stored. The initial values are 2t−1 and 2t, respectively.

The switching unit 119 (J) on the input side of the least significant register of the B side registers is selected on its "1" side during the Euclidean mutual division method, and "0" is always input to the input terminal thereof.

Note that a circuit for setting the initial value is necessary and is not shown in the structural view. However, it is not fundamental and a simple circuit and therefore will be omitted here.

The operation will be explained next.

The $dR_i$-th order coefficient of $R_i(X)$ stored in the register is detected in its "0" state at the 0-detector D. According to the modified Euclidean mutual division method, the values of the registers are compared, and where DR<DQ and the state that the register $A_0$ is not equal to 0 is notified from the 0-detector 138 (D), the switching units C, H, and N are switched to the cross side of the contact point 1–1', so that the computation of the cross mode is carried out. Where this condition is not satisfied, the switching units are switched to the normal side of the contact point 2–2', so that the computation of the normal mode is carried out.

In the division unit DIV, after the switching unit C is switched, the $dR_i$-th order coefficients of $R_{i-1}(X)$ and the $dQ_{i-1}$-th order coefficients of the $Q_{i-1}(X)$ are input through the switching unit C to the divider G. In the divider G, with respect to the inputs of E and F in the figure, the division of E/F is carried out, and the result thereof is passed through the switching unit S and supplied to the computation units PE.

The computation is carried out in each computation unit PE by using the result of this divider G. At the computation of the cross mode, according to this procedure, the coefficients of the $dR_i$-th order to the coefficients of the 0-th order of the polynomial $R_i(X)$ are sequentially stored in the register $RR_{2t-1}$ to the register $RR_0$ in an order from the most significant coefficient. Also for the polynomial $Q_i(X)$, similarly, the coefficients from the $dQ_i$-th order to the 0-th order are sequentially stored in the register $RQ_{2t}$ to the register $RQ_0$. Also for polynomials of $\lambda_i(X)$ and $\mu_i(X)$, similarly coefficients are stored in the registers.

By the above-mentioned procedure, one step of the computation of the modified Euclidean mutual division method is carried out. Accordingly, by repeating this procedure 2t times, in the same way as the method of configuration B, $\underline{\sigma(X)}$ and $\omega(X)$ are found.

An explanation will be made of an operation where there is no lost data symbol using an example. In this example, the t=2 symbol error correction was carried out using the finite field GF ($2^4$) defined by using the irreducible polynomial $g(X)=X^4+X+1$, and the same as an example disclosed in the specification of Japanese Patent Application No. 3-254183 by the present inventor.

Now, the syndrome polynomial S(X) is found as:

$$S(X)=\alpha^8 X^3+\alpha^{10}X^2+\alpha^5 X+\alpha^{12}$$

When the error position polynomial $\sigma(X)$ is derived from this syndrome polynomial S(X) by using the modified Euclidean mutual division method, the following is obtained:

Initialization $$R_0(X)=S(X),\ Q_0(X)=X^4$$

$$dR_0=3,\ dQ_0=4$$

$$\lambda_0(X)=,\ \mu_0(X)=0$$

Step 1

$dR_0-dQ_0=3-4=-1<0$, and $dR_0$-th order coefficient $\alpha^8$ of $R_0(X)$ is not equal to 0, and therefore, in the cross mode, it becomes as follows:

$$\begin{aligned}
R_1(X) &= Q_0(X) + (1/\alpha^8)\, R_0(X)X \\
&= X^4 + \alpha^7(\alpha^8 X^3 + \alpha^{10}X^2 + \alpha^5 X + \alpha^{12})X \\
&= \alpha^2 X^3 + \alpha^{12}X^2 + \alpha^4 X \\
\lambda_1(X) &= \mu_0(X) + (1/\alpha^8)\lambda_0(X)X \\
&= 0 + \alpha^7 \cdot 1 \cdot X \\
&= \alpha^7 X \\
Q_1(X) &= R_0(X) \\
&= \alpha^8 X^3 + \alpha^{10}X^2 + \alpha^5 X + \alpha^{12} \\
\mu_1(X) &= \lambda_0(X) \\
&= 1 \\
dR_1 &= dQ_0 - 1 = 4 - 1 = 3 \\
dQ_1 &= dR_0 = 3
\end{aligned}$$

Step 2

$dR_1-dQ_1=3-3=0\geq 0$, and therefore, in the normal mode, it becomes as follows:

$$\begin{aligned}
R_2(X) &= R_1(X) + (\alpha^2/\alpha^8)\, Q_1(X) \\
&= \alpha^2 X^3 + \alpha^{12}X^2 + \alpha^4 X + \alpha^9(\alpha^8 X^3 + \alpha^{10}X^2 + \alpha^5 X + \alpha^{12}) \\
&= \alpha^6 X^2 + \alpha^9 X + \alpha^6 \\
\lambda_2(X) &= \lambda_1(X) + (\alpha^2/\alpha^8)\mu_1(X) \\
&= \alpha^7 X + \alpha^9 1 \\
&= \alpha^7 X + \alpha^9
\end{aligned}$$

-continued $$Q_2(X) = Q_1(X)$$
$$= \alpha^8 X^3 + \alpha^{10} X^2 + \alpha^5 X + \alpha^{12}$$

$$\mu_2(X) = \mu_1(X)$$
$$= 1$$

$$dR_2 = dR_1 - 1 = 3 - 1 = 2$$

$$dQ_2 = dQ_1 = 3$$

Step 3

$dR_2 - dQ_2 = 2 - 3 = -1 < 0$, and the $dR_2$-th order coefficient $\alpha^6$ of $R_2(X)$ is not equal to 0, and therefore, in the cross mode, it becomes as follows:

$$R_3(X) = Q_2(X) + (\alpha^8/\alpha^6) R_2(X) X$$
$$= \alpha^8 X^3 + \alpha^{10} X^2 + \alpha^5 X + \alpha^{12} + \alpha^2(\alpha^6 X^2 + \alpha^9 X + \alpha^6) X$$
$$= \alpha^{14} X^2 + \alpha^4 X + \alpha^{12}$$

$$\lambda_3(X) = \mu_2(X) + (\alpha^8/\alpha^6)\lambda_2(X) X$$
$$= 1 + \alpha^2(\alpha^7 X + \alpha^3) X$$
$$= \alpha^9 X^2 + \alpha^{11} X + 1$$

$$Q_3(X) = R_2(X)$$
$$= \alpha^6 X^2 + \alpha^9 X + \alpha^6$$

$$\mu_3(X) = \lambda_2(X)$$
$$= \alpha^7 X + \alpha^9$$

$$dR_3 = dQ_2 - 1 = 3 - 1 = 2$$

$$dQ_3 = dR_2 = 2$$

Step 4

$dR_3 - dQ_3 = 2 - 2 = 0 \geq 0$, and therefore, in the normal mode, it becomes as follows:

$$R_4(X) = R_3(X) + (\alpha^{14}/\alpha^6) Q_3(X)$$
$$= \alpha^{14} X^2 + \alpha^4 X + \alpha^8(\alpha^6 X^2 + \alpha^9 X + \alpha^6)$$
$$= \alpha^{10} X + \alpha^5$$

$$\lambda_4(X) = \lambda_3(X) + (\alpha^{14}/\alpha^6)\mu_3(X)$$
$$= \alpha^9 X^2 + \alpha^{11} X + 1 + \alpha^8(\alpha^7 X + \alpha^9)$$
$$= \alpha^9 X^2 + \alpha^{12} X + \alpha^8$$

$$Q_4(X) = Q_3(X)$$
$$= \alpha^6 X^2 + \alpha^9 X + \alpha^6$$

$$\mu_4(X) = \mu_3(X)$$
$$= \alpha^7 X + \alpha^9$$

$$dR_4 = dR_3 - 1 = 2 - 1 = 1$$

$$dQ_4 = dQ_3 = 2$$

Figure 10A:
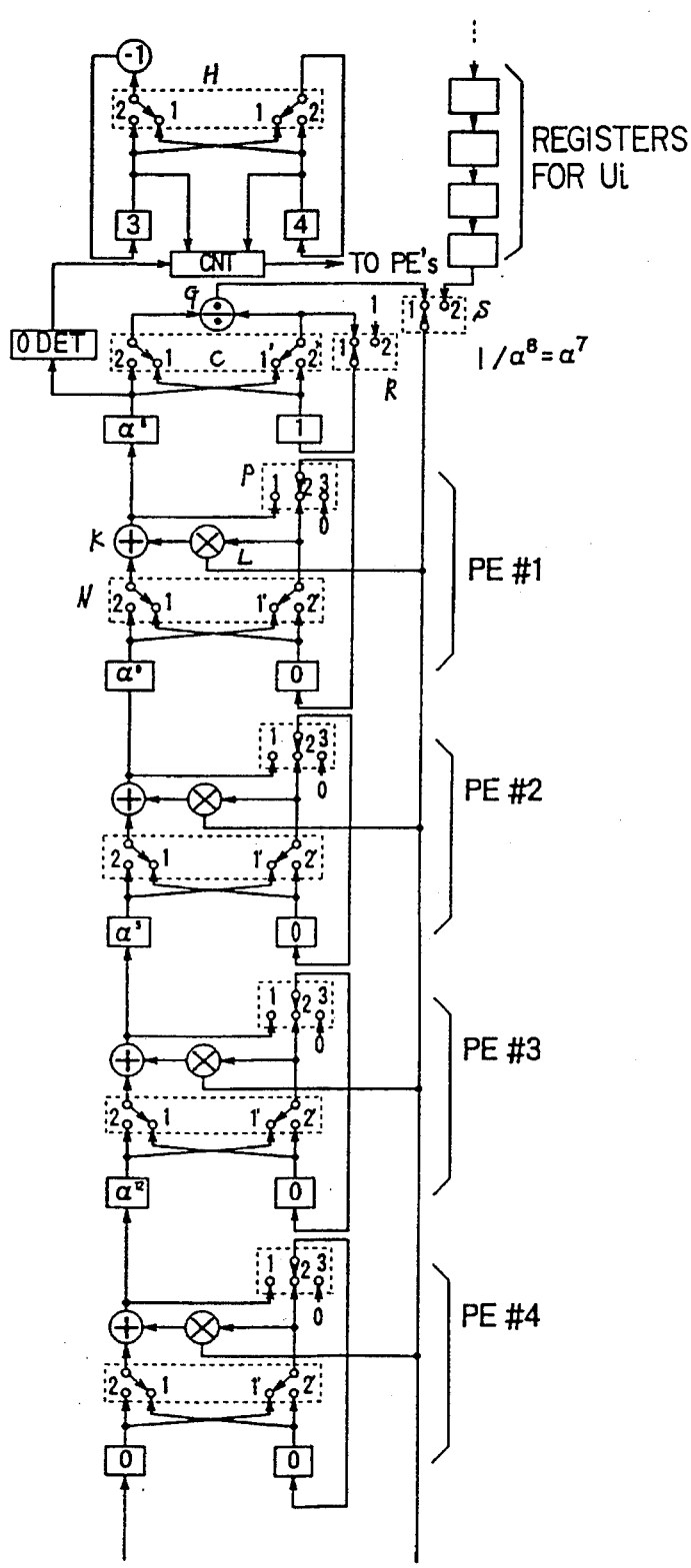
FIGS. 10a and 10b are views illustrating the operation mode of a first step in a second operation example in the lost data correction circuit of the first embodiment of the present invention.
Figure 10B:
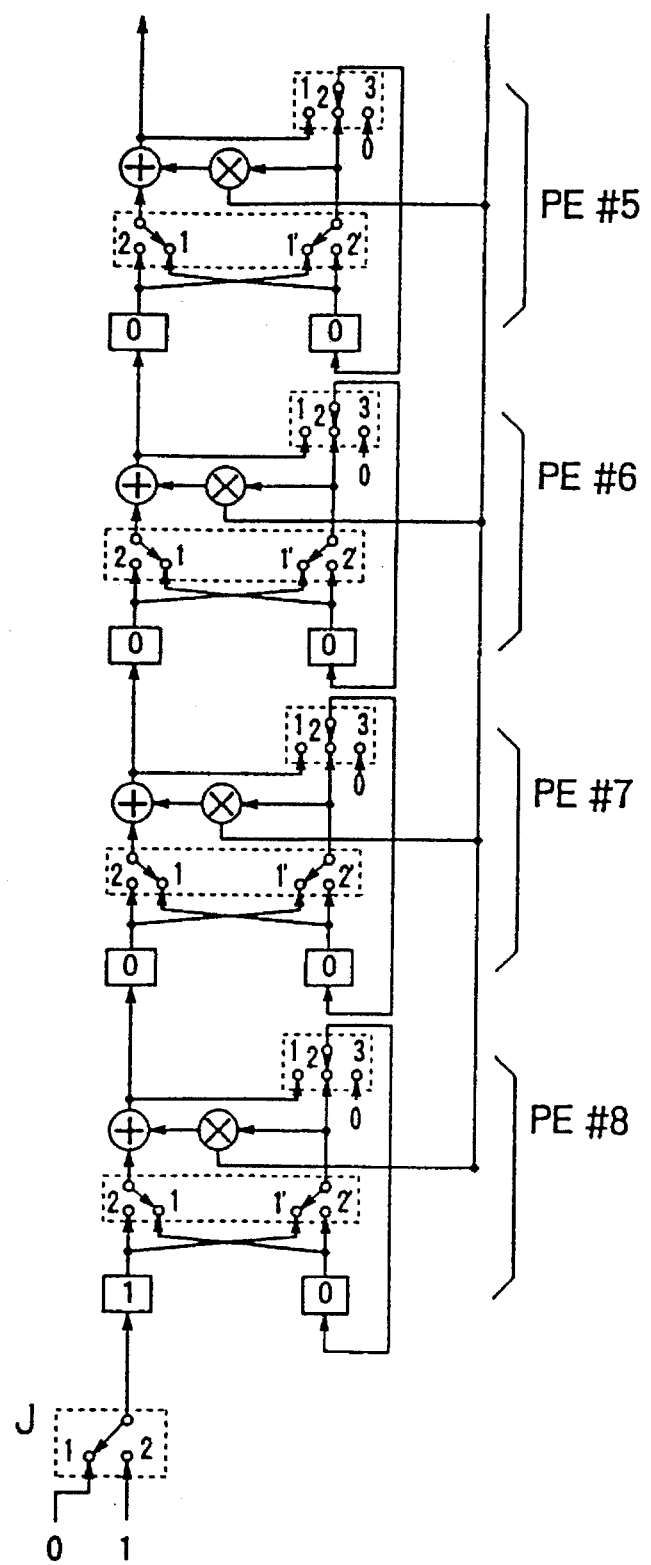

The above-mentioned four steps of computations are shown in FIGS. 10a and 10b. Initialization is carried out for all of the registers shown in FIGS. 10a and 10b. Since the conditions that $dR_0=3$, $dQ_0=4$, and the $dR_0$-th order coefficient of $R_0(X)$ crosses $\alpha^8$ are satisfied, all switching units are switched to the cross side. In the divider G, a computation $1/\alpha^8$ is carried out, and the result of division $\alpha^7$ is input to the computation units.

Figure 11A:
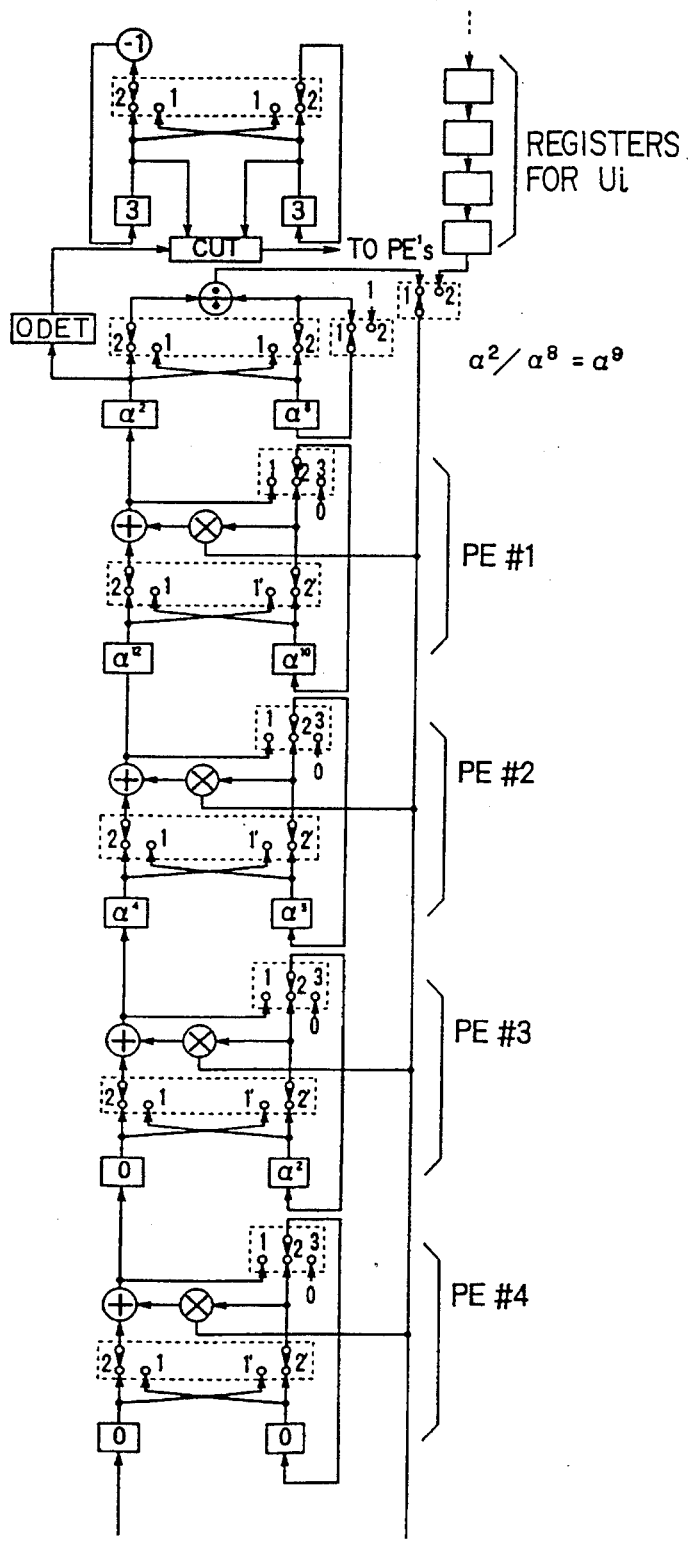
FIGS. 11a and 11b are views illustrating the operation mode of a second step in a second operation example in the lost data correction circuit of the first embodiment of the present invention.
Figure 11B:
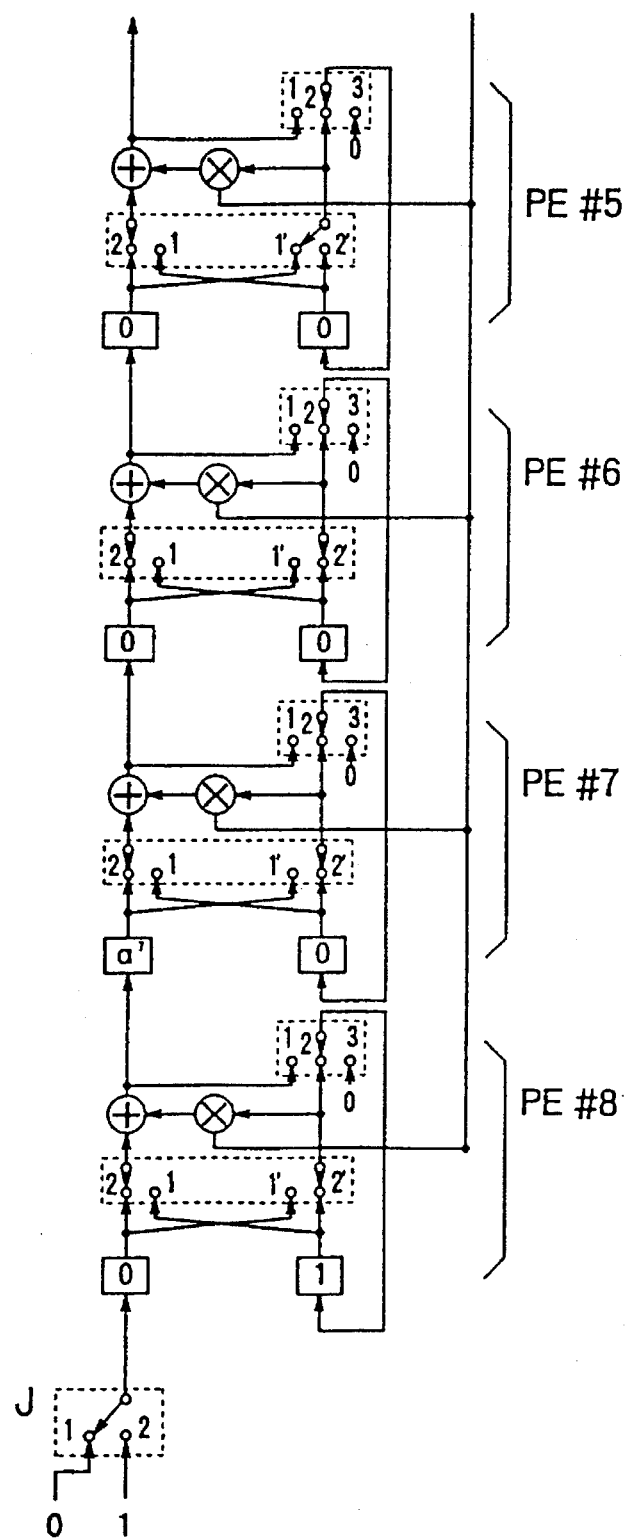
Figure 12A:
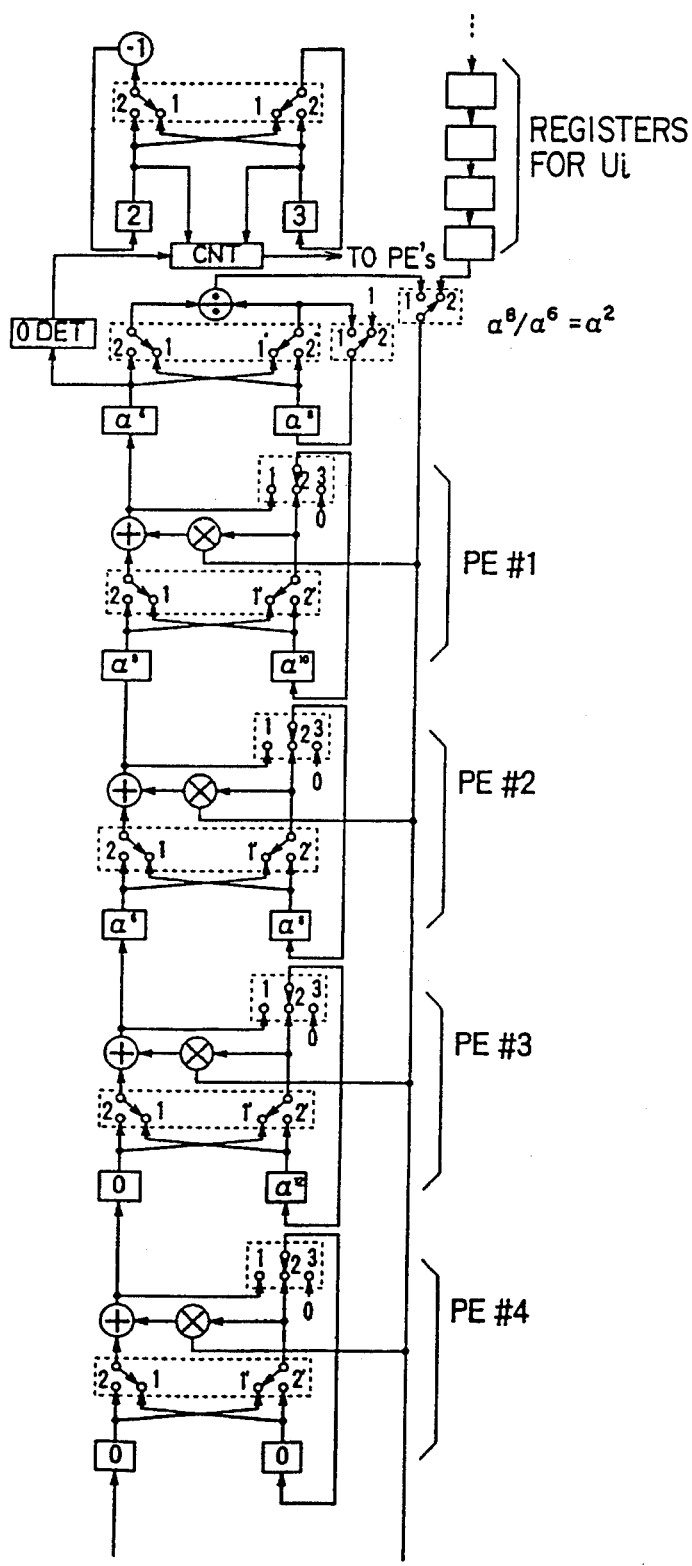
FIGS. 12a and 12b are views illustrating the operation mode of a third step in a second operation example in the lost data correction circuit of the first embodiment of the present invention.
Figure 12B:
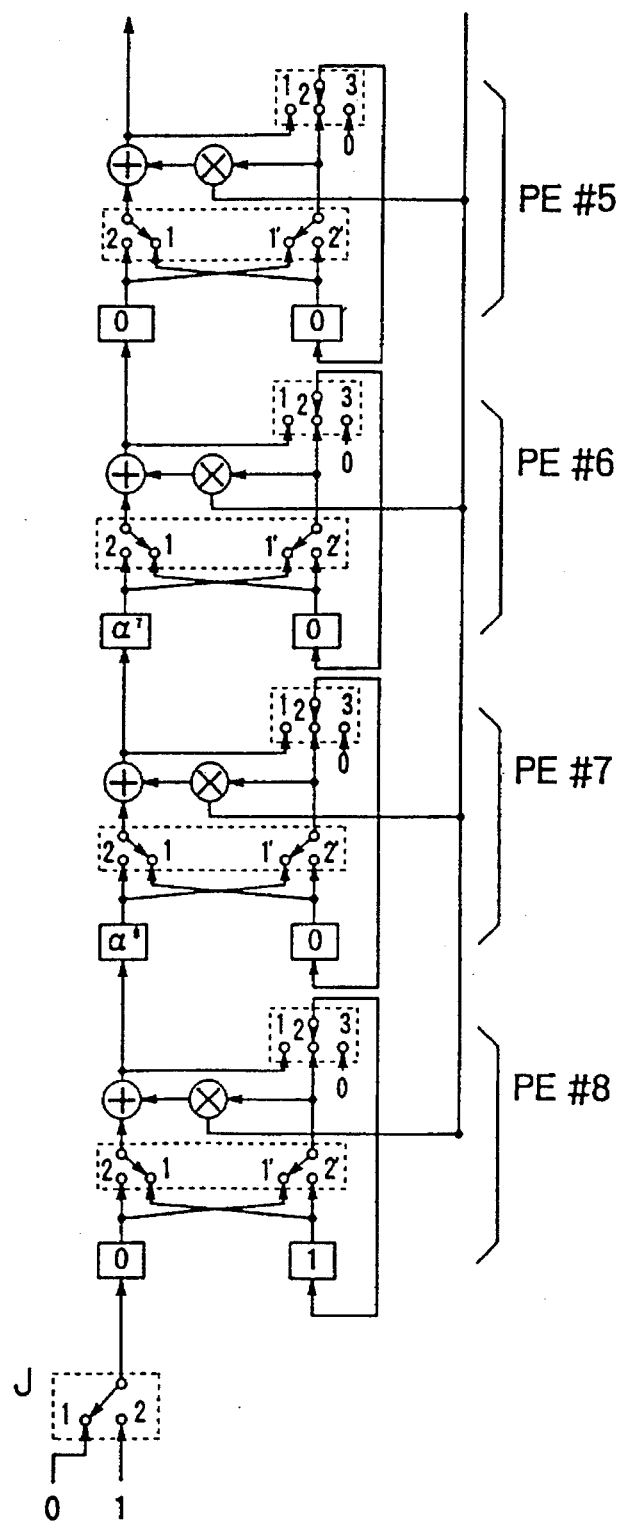
Figure 13A:
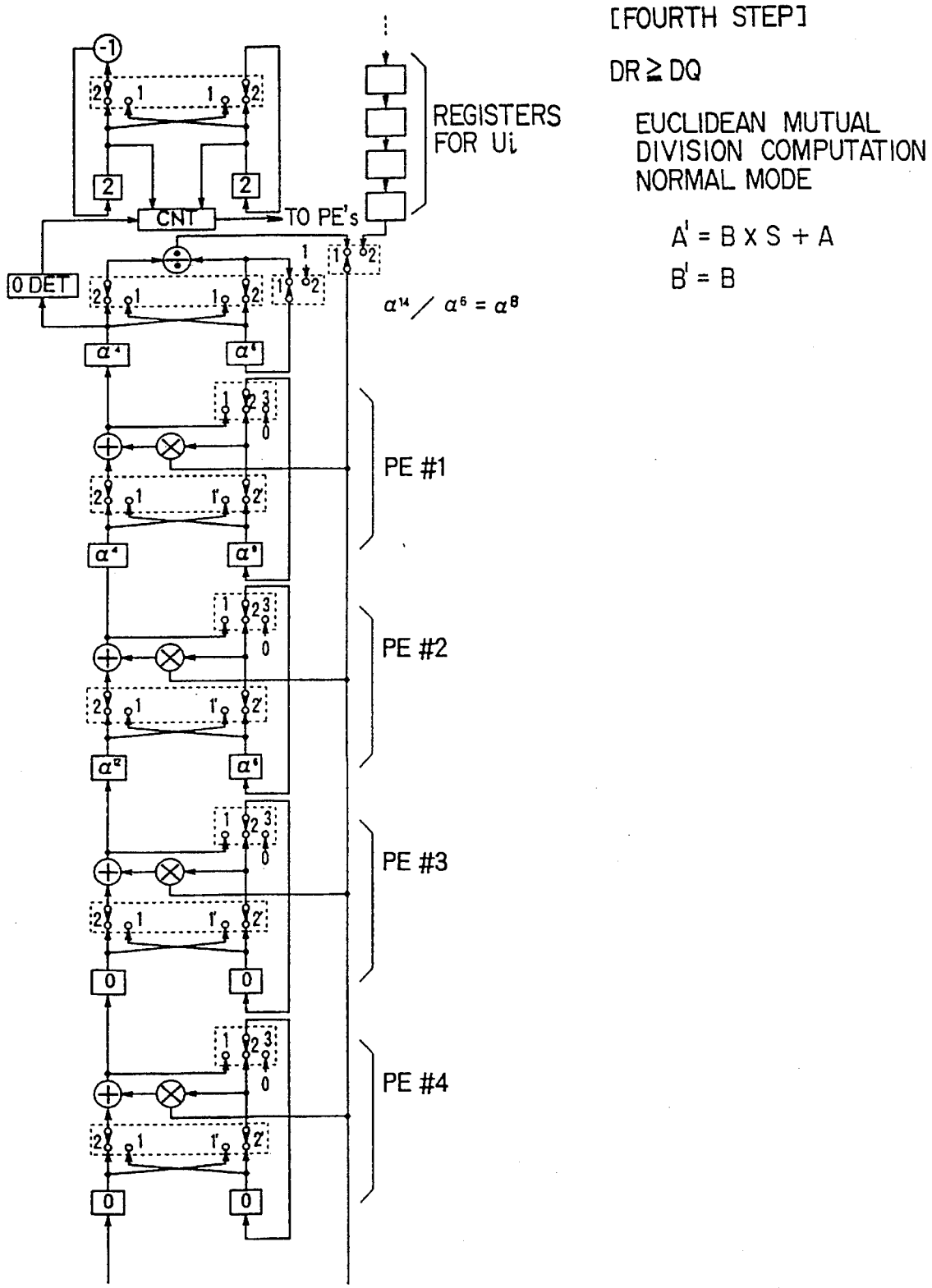
FIGS. 13a and 13b are views illustrating the operation mode of a fourth step in a second operation example in the lost data correction circuit of the first embodiment of the present invention.
Figure 13B:
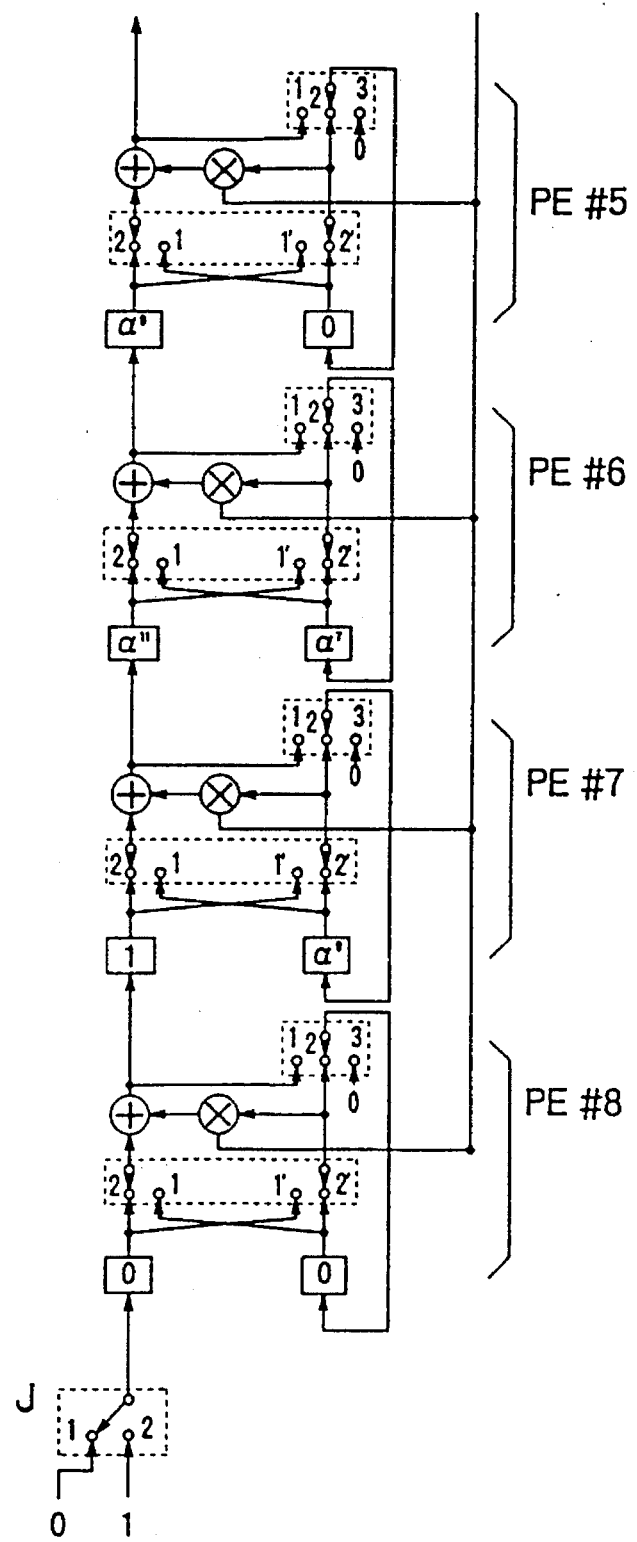

The results of the computations performed in the computation units PE are stored in the registers at the next step and become the results shown in FIGS. 11a and 11b.

Figure 14A:
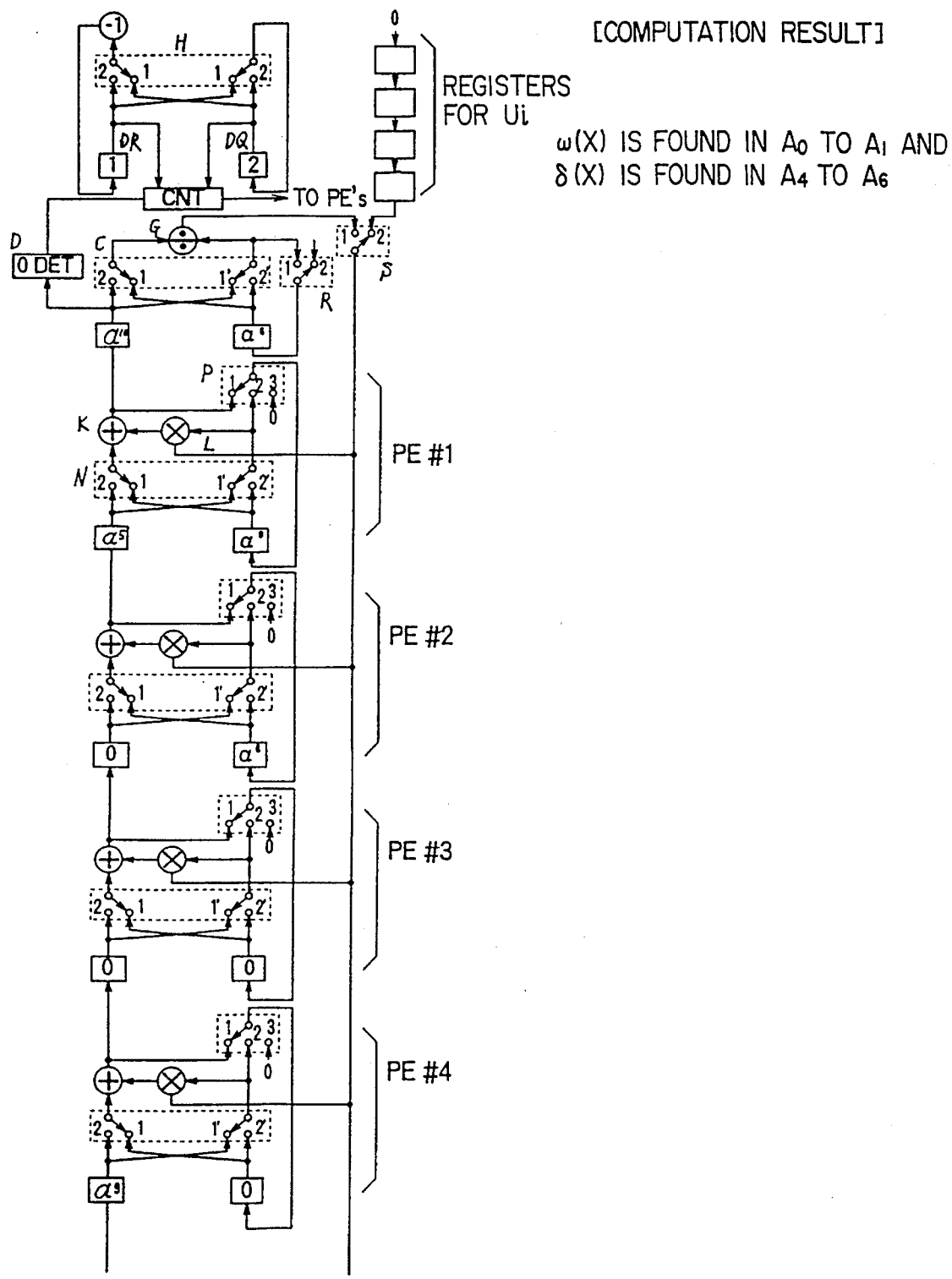
FIGS. 14a and 14b are views illustrating the operation mode of a final step in a second operation example in the lost data correction circuit of the first embodiment of the present invention.
Figure 14B:
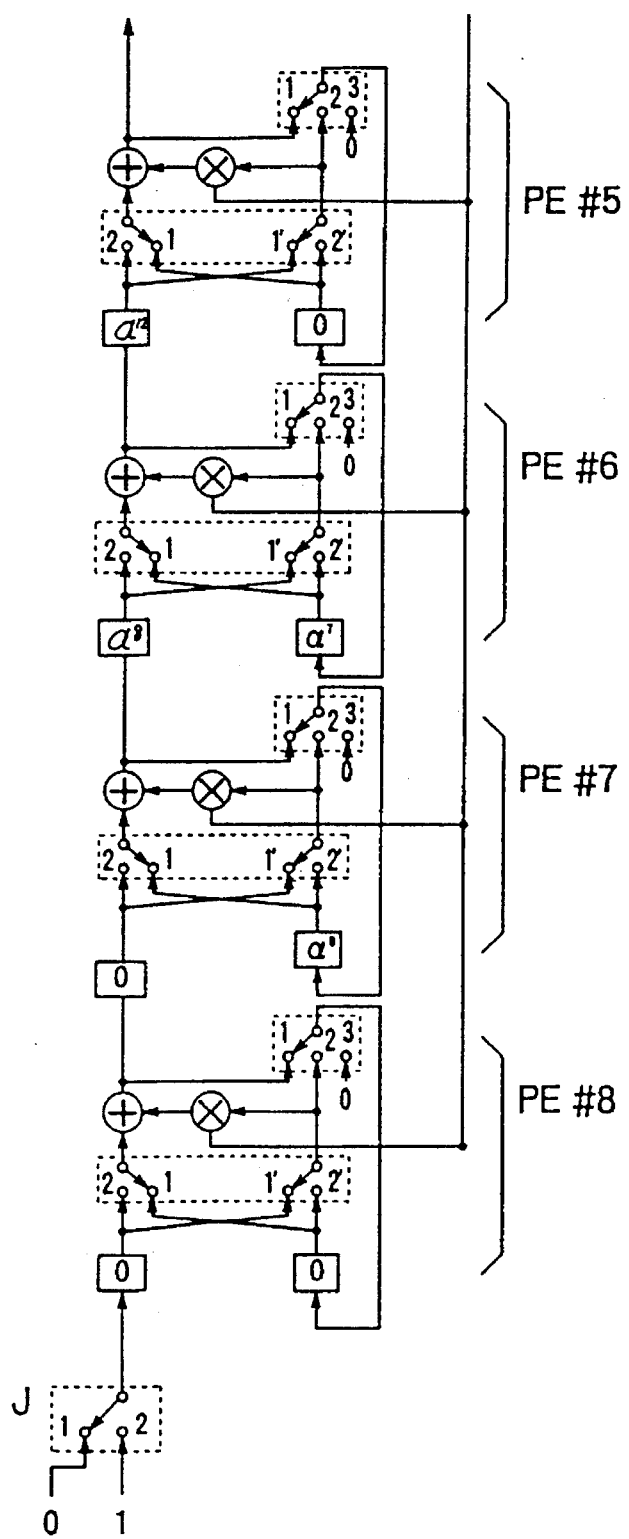

After all, subsequent to FIG. 6b, the computation is carried out in the cross mode at first and third steps, and the computation is carried out in the normal mode at the second and fourth steps, and finally, in FIGS. 14a and 14b, for $\omega(X)$, the coefficients of the ($dR_4=1$)-th order at the most significant position are stored in the register $A_0$, and the lower significant coefficients are stored in the descending power (order). Also for $\sigma(X)$, similarly, ($dR_4+1$)-th order coefficients are stored, and the lower significant coefficients are stored in a descending power (order).

As already mentioned, this $\sigma(X)$ is treated in the same way as $\underline{\sigma(X)}$ in a case where the lost data symbol exists.

The above operation will be explained in summary. To summarize the above-mentioned computation processing, it will be represented as in the next table. Here, the case of $\epsilon=0$ explained as a specific example where the lost data symbol exists is taken up.

TABLE 1

| Step | Condition | Content of operation |
| --- | --- | --- |
| Initialization | | PI: Polynomial computation initialization |
| 1 ... $\epsilon-1$ | | PM: Polynomial multiplication |
| $\epsilon$ | | PE: Polynomial multiplication.Euclidean mutual division computation initialization |
| $\epsilon+1$ ... 2t | $dR_i<dQ_i$ or $A_0 \neq 0$ | EC: Euclidean mutual division.cross mode |
| $\epsilon+1$ ... 25 | $dR_i \geq dQ_i$ or $A_0=0$ | EN: Euclidean mutual division.normal mode |

TABLE 2

| Step | Condition | Content of operation |
| --- | --- | --- |
| Initialnation | | PI: Polynomial computation initialization |
| 1 ... 2t-1 | | PM: Polynomial multiplication |
| 2t | | PE: Polynomial multiplication. Euclidean mutual division computation initialization |

TABLE 3

| Case of $\epsilon = 0$ | | |
| --- | --- | --- |
| Step | Condition | Content of operation |
| Initialnation | | EI: Euclidean mutual division computation initialization |
| 1 ... 2t | $dR_i<dQ_i$ and $A_0 \neq 0$ | EC: Euclidean mutual division computation. cross mode |
| 1 ... 2t | $dR_i \geq dQ_i$ or $A_0=0$ | EN: Euclidean mutual division computation. normal mode |

As mentioned above, in each case, as a result of repetition of 2t steps of computation in total, $\omega(X)$ and $\underline{\sigma(X)}$ can be obtained.

Next, the operation of the switching unit in the computation processings in the examples of configuration shown in FIGS. 3a to 3c will be summarized. Note that, the present example of configuration is merely one example, and various other configurations can be considered.

TABLE 4

| Operation Code | Switching unit | | | | | | |
|---|---|---|---|---|---|---|---|
| | 140 142 | 126 128 | 101 102 | 148 | 201 | 105 | 144 |
| PM | — | — | 1-1' | 2 | 2 | 1 | — |
| PE | — | — | 1-1' | 2 | 2 | 3 | 2 |
| EC | 1-1' | 1-1' | 1-1' | 1 | 1 | 2 | 1 |
| EN | 2-2' | 2-2' | 2-2' | 1 | 1 | 2 | 1 |

In this example, a circuit for storing in the registers the syndrome $S_i$ acting as the initial value with respect to the group of registers, the lost data positions $U_i$, and (2t−1), 2t, etc., which are initial values of the registers DR and DQ when the computation of Euclidean mutual division method is carried out is omitted.

As the circuit for initializing the syndrome $S_i$, various methods, for example, a method of simultaneously storing coefficients in all registers, a method of gradually storing coefficients from the last register, etc. can be thought of. In the former case, it is necessary to add an input switching unit to each register, but all registers can be initialized at one time. However, these circuits can be constituted by extremely simple circuits and are not essential to the computation, and therefore are omitted here.

Figure 15A:
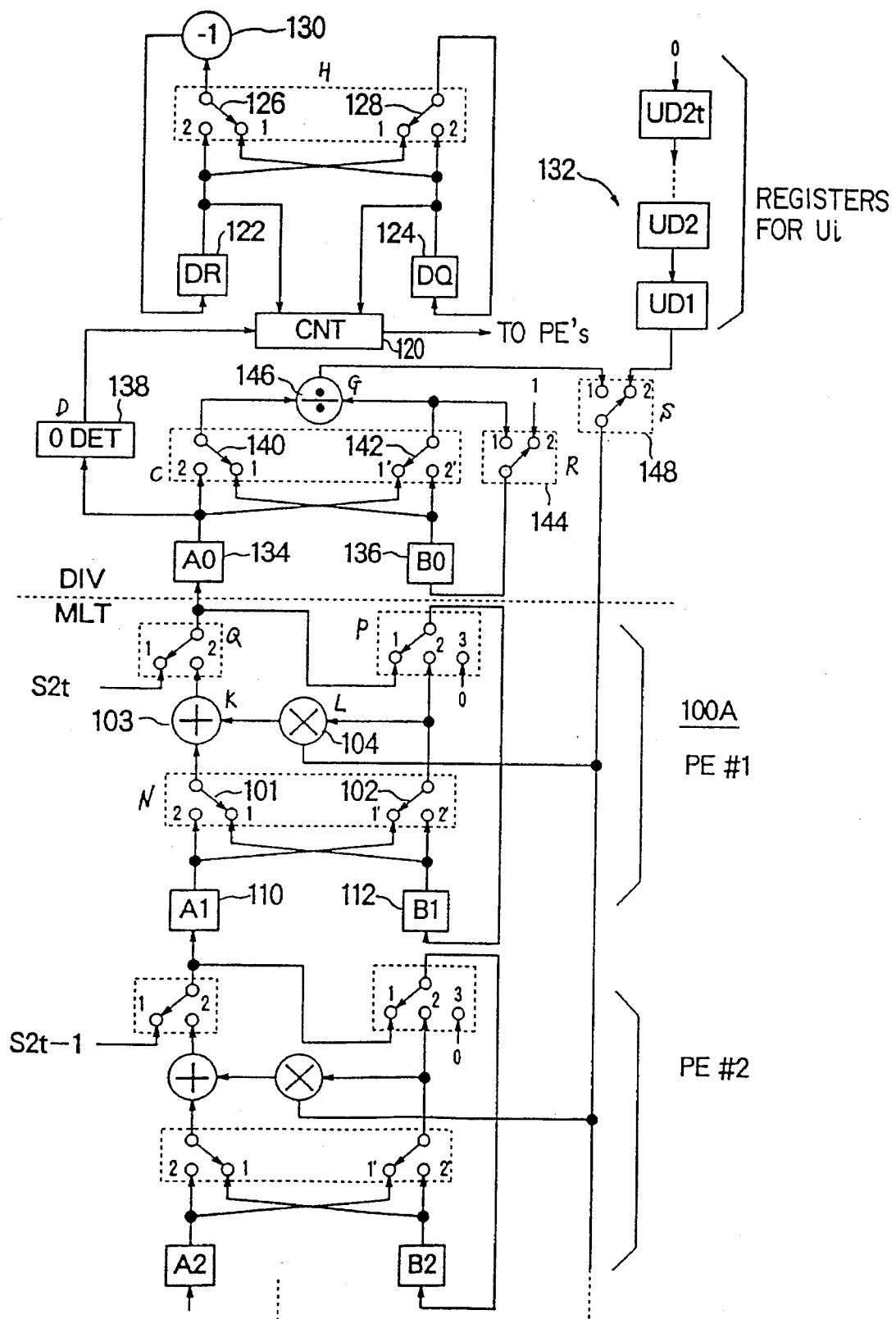
FIGS. 15a to 15c are views showing the basic circuit configuration of a second embodiment of the lost data correction circuit of the present invention.
Figure 15B:
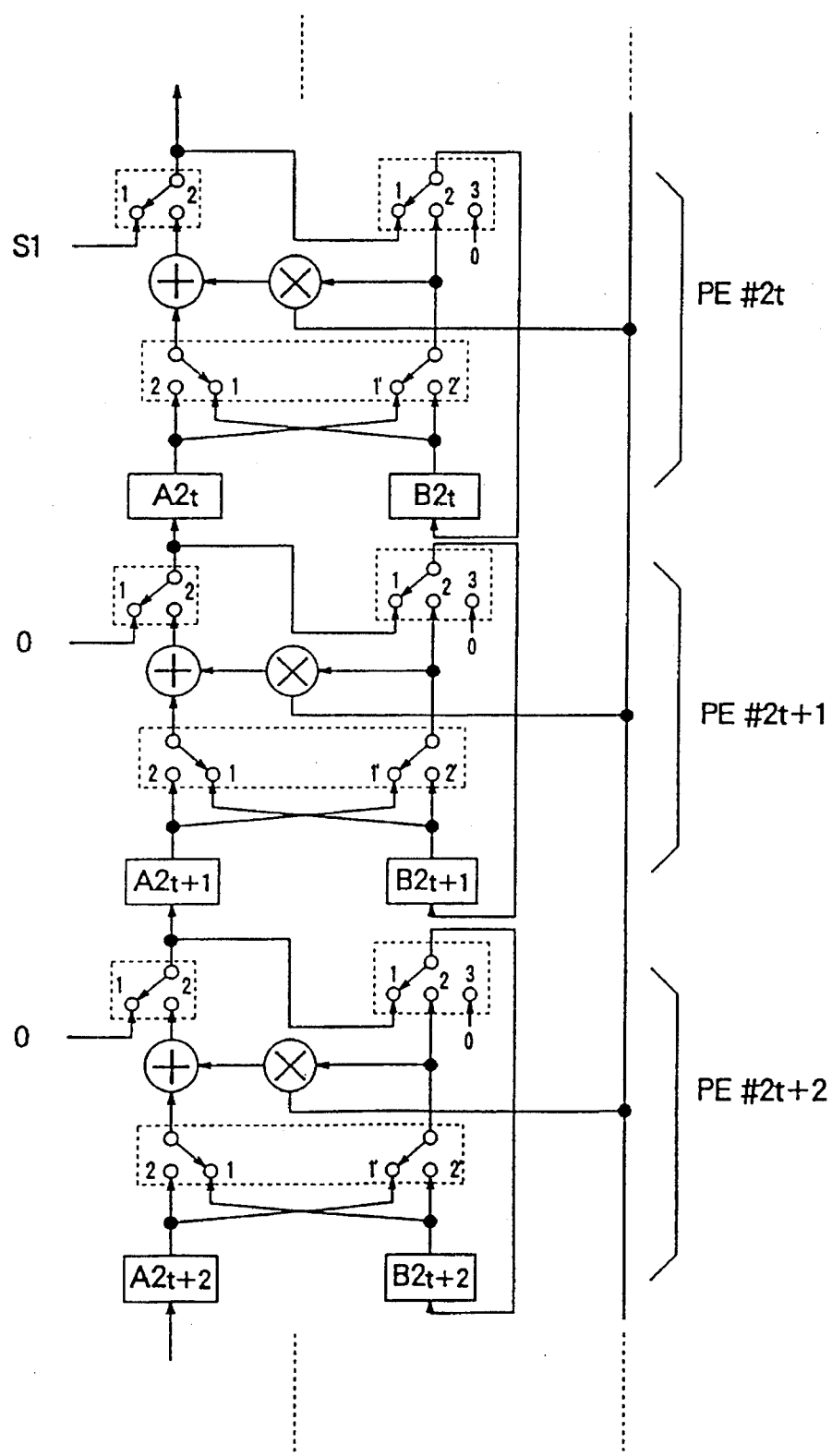
Figure 15C:
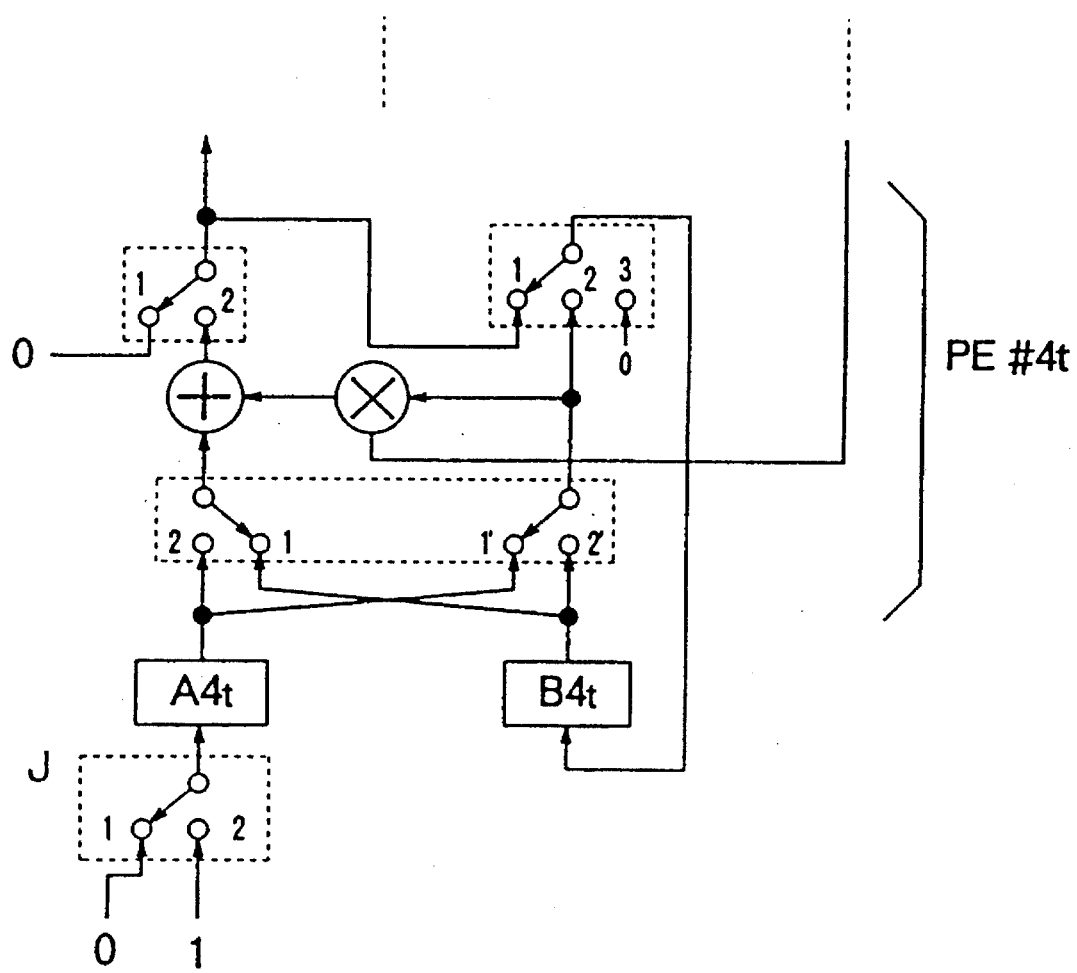

For example, as an example of a method storing the syndromes $S_i$ at one time in all registers, the methods of configuration shown in FIGS. 15a to 15c can be thought. In these methods of configuration, in the computation mode (P1) for performing the initialization of the polynomial computation, by switching the switching unit Q to the contact point 1 side and switching the switching unit P to the contact point 1 side, it is possible to store the same coefficient as the initial value in the register $A_j$ and the register $B_{j+1}$.

On the other hand, in the initialization operation mode (EI) where the computation of the Euclidean mutual division method is carried out, by switching the switching unit Q to the contact point 1 side and switching the switching unit P to the 3 side, it is possible to store the syndromes in the A side registers and store "0" in the B side registers.

In the present method of configuration, 4t multiplication and addition operations per step of polynomial computation of a lost data position polynomial u(X) and correction syndrome polynomial T(X) which become necessary accompanied with the lost data correction are simultaneously carried out by ε steps. Next, by performing the computation of the modified Euclidean mutual division method in which the initial value of $\lambda_0(X)$ is changed to u(X) by (2t−ε) steps, a total error position polynomial $\sigma(X)$ acting as the product polynomial between the error position polynomial σ(X) and lost data position polynomial u(X) is directly found.

As a result of the change of the method of computation, the computation process is simplified as shown in FIG. 2. Namely, u(X) and T(X) are simultaneously found by the first ε steps of computation, and $\sigma(X)$ and ω(X) are found at the next (2t−ε) steps. In this way, in comparison with the conventional computation process shown in FIG. 1, it is seen that the computation process shown in FIG. 2 can perform the computation without the use of the coefficients of $U_i$ and u(X) obtained during the initial computation process in the subsequent computation process.

The first polynomial computation and subsequent computation of the modified Euclidean mutual division method can be continuously executed without stop, and therefore irrespective of the number of lost data symbols, the $\sigma(X)$ and ω(X) can be found by the computation of 2t steps in total. Also, σ(X) where the lost data symbol is not present and the usual correction is carried out can be treated in quite the same way as the $\sigma(X)$ where the lost data correction is carried out.

In the present structure, two types of operation are carried out regardless of the presence or absence of the lost data symbols; the most significant coefficient of the $dR_{2t}$-th order polynomial ω(X) which is obtained in any case is stored in $A_0$, and subsequently coefficients are sequentially stored in a descending order. Also, both of $\sigma(X)$ obtained where the lost data symbol such as ε>0 exists and σ(X) obtained where the lost data symbol of ε=0 does not exist become a $(dR_{2t}+1)$-th order polynomial and are obtained when the coefficients are sequentially stored in $A_{2t}$ to $A_{4t}$ from the most significant coefficient in a descending power (order).

Also, when the error pattern is calculated in the lost data correction, the correction is carried out using $\sigma(X)$ and ω(X), whereby it becomes possible to use a common equation as a calculation equation of error patterns with respect to the lost data positions $U_i$ and error positions $X_i$. Also, the most significant coefficients among the coefficients of ω(X) and σ(X) are stored in the registers $A_0$ and $A_{2t}$, respectively and therefore the error pattern calculation becomes extremely easy.

In this way, in the present structure, the computation of the lost data correction can be realized by repeating 4t multiplication and addition operations per step by 2t steps. The number of multiplication and addition operations necessary in the present method of configuration is larger than the number of computations originally necessary in the lost data correction, but there are many characteristic features such that the process of computation is simplified at the same time; a region for storing the coefficients of the lost data position $U_i$ and lost data position polynomial u(X), etc. becomes unnecessary, and so on.

From the above-mentioned characteristic features, a decoder realizing lost data correction with a smaller circuit scale can be constituted when the present method of configuration is used. Also, since the configuration of the computation unit itself is simple, a high speed operation becomes possible. Further, the computation can be successively carried out, and therefore a throughput time required for the computation can be reduced.

Note that, the following will be added: in the present configuration, the computation unit at the final stage does not actually perform the computation, and therefore the computation unit PE#4t and register $A_{4t}$ in FIG. 3a to 3c can be simplified by a simple change of the control circuit.

SECOND EMBODIMENT

A second embodiment of the method of correcting lost data of the present invention will now be explained.

In the method of configuration F explained as the first embodiment, a method of computation was effected in which the polynomial calculation process, which becomes a problem when constituting the decoder of the lost data correction, was simplified, and the polynomial coefficients to be held in the middle of the computation became unnecessary. Also, as an example of a system realizing this method of computation, a system configuration as shown in FIGS. 3a to 3c and a computation unit configuration shown in FIG.

4 as an example of the configuration of its computation unit were mentioned.

In the method of configuration F, it is possible to obtain a total error position polynomial and error evaluation polynomial by continuous computation of as small as 2t steps in total using 4t number of computation units and 8t+2 storage elements (registers). Accordingly, the reduction of circuit scale and high speed operation become possible.

In the method of configuration F, they are simultaneously carried out by $\epsilon$ steps by 4t multiplication and addition operations per step of polynomial computation of the lost data position polynomial u(X) and correction syndrome polynomial T(X), which become necessary along with lost data correction. Next, the computation of the modified Euclidean mutual division method in which the initial value of $\lambda_0(X)$ is changed to u(X) is carried out by 2t–$\epsilon$ steps, whereby a total error position polynomial $\underline{\sigma(X)}$ which becomes a product polynomial of the error position polynomial $\sigma(X)$ and lost data position polynomial u(X) is directly found.

As the result of change of the method of computation, as shown in FIG. 2, the computation process is simplified. Namely, u(X) and T(X) are simultaneously found by the first $\epsilon$ steps of computation, and $\underline{\sigma(X)}$ and $\omega(X)$ are found in the next (2t–$\epsilon$) steps. In this way, in comparison with the computation process shown in FIG. 1, the computation process shown in FIG. 2 can perform the computation without the use of the coefficients of $U_i$ and u(X) obtained in the initial computation process in the subsequent computation process.

This first polynomial computation and the subsequent computation of the modified Euclidean mutual division method can be successively executed without interruption, and therefore, irrespective of the number of lost data symbols, $\underline{\sigma(X)}$ and $\omega(X)$ can be always found by 2t steps of computation in total.

Also, $\sigma(X)$ where the lost data symbol does not exist and the usual correction is carried out and the $\underline{\sigma(X)}$ where the lost data correction is carried out can be treated in the same manner.

In the present method of configuration, two types of operations are carried out depending on the presence or absence of the lost data symbols. The most significant coefficient of the $dR_{2t}$-th order polynomial $\omega(X)$ which is obtained in any case is stored in $A_0$, and subsequently coefficients are sequentially stored in a descending order.

Also, both of $\underline{\sigma(X)}$ obtained where a lost data symbol such as $\epsilon>0$ exists and $\sigma(X)$ obtained where a lost data symbol of $\epsilon=0$ does not exist become the $(dR_{2t}+1)$-th order polynomial and are obtained when the coefficients are sequentially stored in $A_{2t}$ to $A_{4t}$ shown in FIGS. 3a to 3c from the most significant coefficient in the descending order.

Also, when the error pattern is calculated in the lost data correction, the correction is carried out using $\underline{\sigma(X)}$ and $\omega(X)$, whereby it becomes possible to use a common equation as the calculation equation of error patterns with respect to the lost data positions $U_i$ and error positions $X_i$. Also, the most significant coefficients among the coefficients of $\omega(X)$ and $\sigma(X)$ are stored in the registers $A_0$ and $A_{2t}$, respectively and therefore the error pattern calculation becomes extremely easy.

In this way, in the method of configuration F, the computation of the lost data correction can be realized by repeating 4t multiplication and addition operations per step by 2t steps. The number of multiplication and addition operations necessary in the present method of configuration is larger than the number of computations originally necessary in the lost data correction, but there are many characteristic features such that the process of computation is simplified at the same time; a region for storing the coefficients of the lost data position $U_i$ and lost data position polynomial u(X), etc. becomes unnecessary, and so on.

From the characteristic features as mentioned above, a decoder realizing the lost data correction with a smaller circuit scale can be constituted when the present method of configuration is used. Also, since the structure of the computation unit itself is simple, high speed operation becomes possible. Further, the computation can be successively carried out, and therefore a throughput time required for the computation can be reduced.

However, the method of configuration F had a defect such that registers for storing lost data positions such as $UD_1$ to $UD_{2t}$ in the example shown in FIGS. 3a to 3c became separately necessary, and therefore the circuit scale was enlarged.

The second embodiment of the present invention provides a configuration in which the method of configuration F of the lost data correction circuit of the above-described first embodiment is improved, as a region for storing the lost data position which becomes necessary when performing the calculation of coefficients of the lost data position polynomial u(X) and the correction syndrome polynomial T(X), a register for storing the coefficients of the lost data position polynomial u(X) is used, whereby registers $UD_1$ to $UD_{2t}$ for lost data position storage which have been required in the method of configuration F can be omitted.

5.1. Consideration of Calculation Routine of Lost Data Position Polynomial u(X)

In the method of configuration F of the lost data correction circuit shown in the first embodiment, the process for sequentially finding the coefficients of the lost data position polynomial u(X) and the correction syndrome polynomial T(X) is realized by preparing polynomials such as $u^{(k)}(X)$ and $T^{(k)}(X)$ as shown in the following and after performing the initialization of the above-described equation 33 and equation 46, repeating the recurrence formula obtained by equation 34 and equation 47 until i becomes equal to $\epsilon$.

The syndrome polynomial S(X) which becomes the initial value $T^{(0)}(X)$ of the computation for finding the T(X) is the (2t–1)-th order polynomial from the first. The finally found T(X) may be the remainder polynomial with respect to $X^{2t}$, and therefore, it is sufficient if the coefficients which should be utilized by the polynomial $T^{(i)}(X)$ which is necessary in the middle of repetition of equation 47 are the coefficients of the (2t–1)-th order.

Also, it is apparent from equation 47 that the computation with respect to the coefficients of the least significant coefficient of $T^{(i)}(X)$ is not necessary, and therefore, in one repeated computation indicated in equation 47, (2t–1) multiplication and addition operations are always carried out with respect to the (2t–1) coefficient.

On the other hand, as shown in equation 33, the initial value $u^{(0)}(X)$ for finding the lost data position polynomial u(X) is the 0-th order polynomial, and $u^{(i)}(X)$ obtained by the repetition of the i-th time of equation 34 becomes the i-th order polynomial.

In the same way as the case of repeated computation with respect to $T^{(i)}(X)$, the computation with respect to the coefficient of the least significant position of $u^{(i)}(X)$ is not necessary. Accordingly, in the i-th computation indicated in equation 34, it is sufficient if i multiplication and addition operations with respect to i number of coefficients at the largest are carried out. Also, as the number of the registers for storing $u^{(i)}(X)$, it is sufficient if (i+1) number of coefficient storage regions at the largest exist since the degree of $u^{(i)}(X)$ obtained by the i-th computation indicated in equation 34 is the i-th order.

In the method of configuration F, the calculation of the correction syndrome polynomial T(X) and the calculation of the lost data position polynomial u(X) are simultaneously carried out. When the i-th repetition is carried out, the lost data position $U_i$ is used for the computations of equation 34 and equation 47 for calculating $u^{(i)}(X)$ and $T^{(i)}(X)$, but it is used only one time during ε repetitions. Accordingly, if it is now assumed that the computation is carried out in an order of $U_1, U_2, \ldots, U_\epsilon$, as the computation proceeds, the information of the lost data position becomes unnecessary in an order of from $U_i$, and therefore every time when one step of computation is ended, the lost data position for which the computation is ended can be sequentially abandoned.

In actuality, in the method of configuration F of FIGS. 3a to 3c, the lost data positions stored in the registers are shifted one by one during the process of polynomial multiplication and supplied to all the computation units through the switching unit S, but it is seen that the once calculated lost data position is not stored.

As mentioned above, the polynomial $u^{(i)}(X)$ becomes the polynomial of the 2t-th order at the maximum, and therefore registers which can store the (2t+1) number of coefficients are necessary, but although the degree of $u^{(i)}(X)$ is increased as computation is advanced, conversely the lost data position $U_i$ to be stored is reduced along with progress in computation. Accordingly, there is a possibility that the polynomial $u^{(i)}(X)$ and the lost data position $U_i$ used in finding the lost data position polynomial can share a storage region.

5.2. Method of Configuration of Lost Data Correction Circuit to be Proposed

In the second embodiment, with respect to the method of configuration F shown as the first embodiment, the circuit construction and the method of constituting the computation unit are improved, whereby a method of configuration sharing the storage region of the polynomial $u^{(i)}(X)$ and the lost data position $U_i$ used in finding the lost data position polynomial is proposed.

According to the present method of configuration, the lost data position storage register $UD_i$ which was necessary in the method of configuration F of FIGS. 3a to 3c becomes unnecessary.

A conceptual view of the configuration of the method of configuration of the second embodiment will be shown in FIGS. 15a to 15c.

The basic construction of the present method of configuration is based on the construction of the method of configuration F shown in FIGS. 3a to 3c. In the method of configuration F, registers $UD_1$ to $UD_{2t}$ were provided as the storage regions of the lost data positions, and the lost data positions $U_i$ stored therein were shifted step per step, whereby the lost data positions acting as the multiplication coefficients were supplied to the computation units through the switching unit S.

Contrary to this, in the present configuration, the registers for this lost data position storage are deleted from the method of configuration F, and registers $A_{2t}$ to $A_{4t-1}$ for storing the coefficients of the 2t-th order to first order of the polynomial $u^{(i)}(X)$ for calculating the lost data position polynomial u(X) are shared as the registers for storing the lost data positions in their place.

In the method of configuration F, the process of computation was considered as divided into two according to the presence or absence of lost data symbols. In the case of ε=0:

TABLE 5

| | Case of ε = 0 | | |
|---|---|---|---|
| Step | Content of operation | | Code |
| Initialization | Euclidean mutual division computation initialization | | EI |
| 1 ... 2t | Euclidean mutual division computation | $dR_i < dQ_i$ and $A_0 \neq 0$ | Cross mode | EC |
| | | $dR_i \geq dQ_i$ or $A_0 = 0$ | Normal mode | EN |

TABLE 6

| | Case of 2t ≥ ε > 0 | | |
|---|---|---|---|
| Step | Content of operation | | Code |
| Initialization | Polynomial computation initialization | | PI |
| 1 ... ε−1 | Polynomial multiplication | | PM |
| ε | | Euclidean mutual division computation initialization | PE |
| 1 ... 2t | Euclidean mutual division computation | $dR_i < dQ_i$ and $A_0 \neq 0$ | Cross mode | EC |
| | | $dR_i \geq dQ_i$ or $A_0 = 0$ | Normal mode | EN |

Note that, the case of ε=2t can be considered to be the specific case where the computation of the Euclidean mutual division method is not executed even once in a case where the lost data symbol exists. This is summarized in this table.

Also, in the operation of the present method of configuration proposed as the second embodiment, four operation modes of the initialization (EI) for the computation of Euclidean mutual division method, initializations for Euclidean mutual dividing computation (EC, EN), and initialization for polynomial computation (PI) perform quite the same processings as the method of configuration F.

On the other hand, since the registers $A_{2t}$ to $A_{4t-1}$ act also as storage regions of lost data positions, the operations of steps (PM, PE) for executing the polynomial computation performed at the first ε steps in the case where ε>0 where a lost data symbol exists are different. Along with this, in the computation unit, in addition to four types of computations indicated by equation 66 to equation 69, which were necessary in the method of configuration F, three types of computations indicated by equation 70 to equation 72 become necessary.

1) $X' = X \cdot Z + Y$ $Y' = X$ (66)

2) $X' = Y \cdot Z + X$ $Y' = Y$ (67)

3) $X' = Y' = X \cdot Z + Y$ (68)

4) $X' = X \cdot Z + Y$ $Y' = 0$ (69)

5) X'=Y'=Y  (70)

6) X'=X

Y'=0  (71)

7) X'=Y

Y'=0  (72)

Figure 16A:
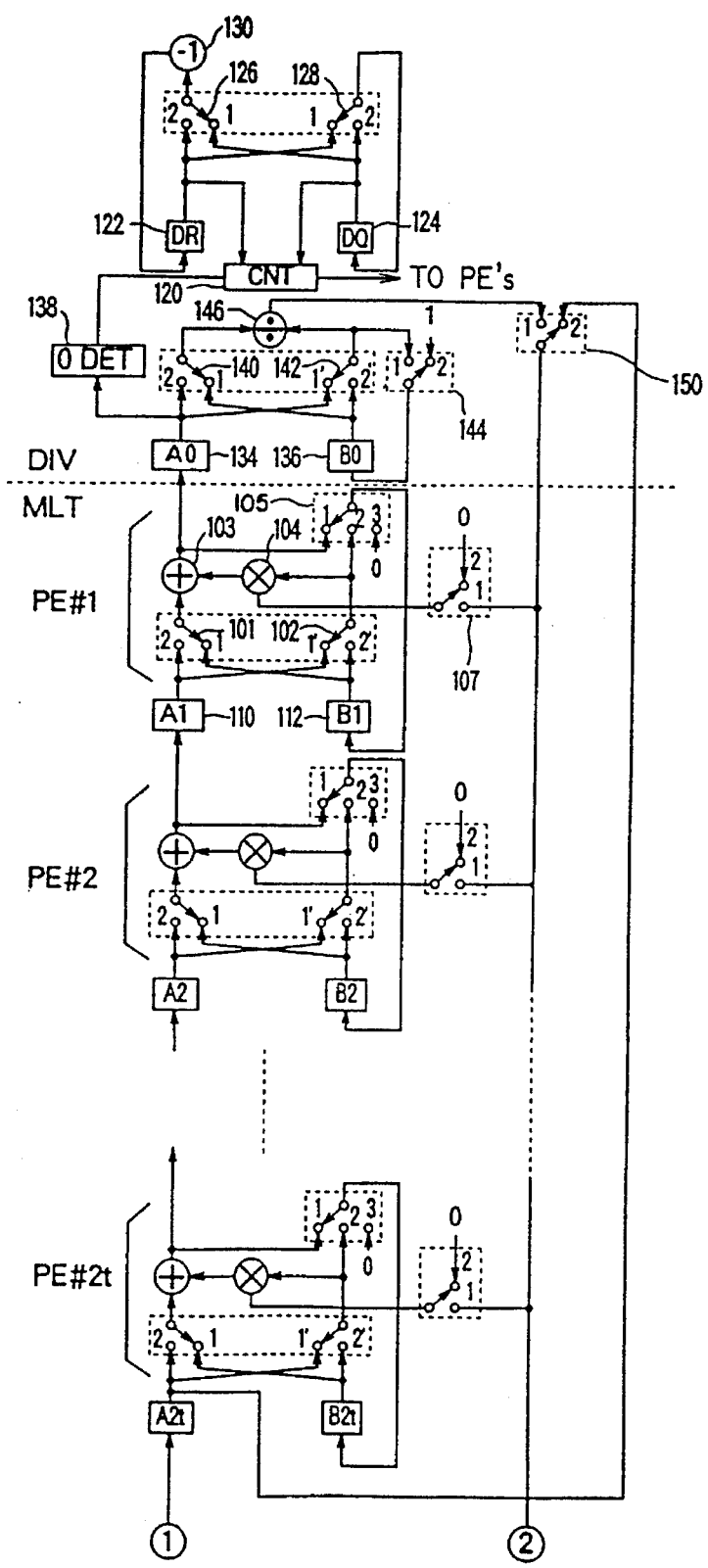
FIGS. 16a and 16b are views of an entire circuit configuration of the lost data correction circuit shown in FIGS. 15a to 15c.
Figure 16B:
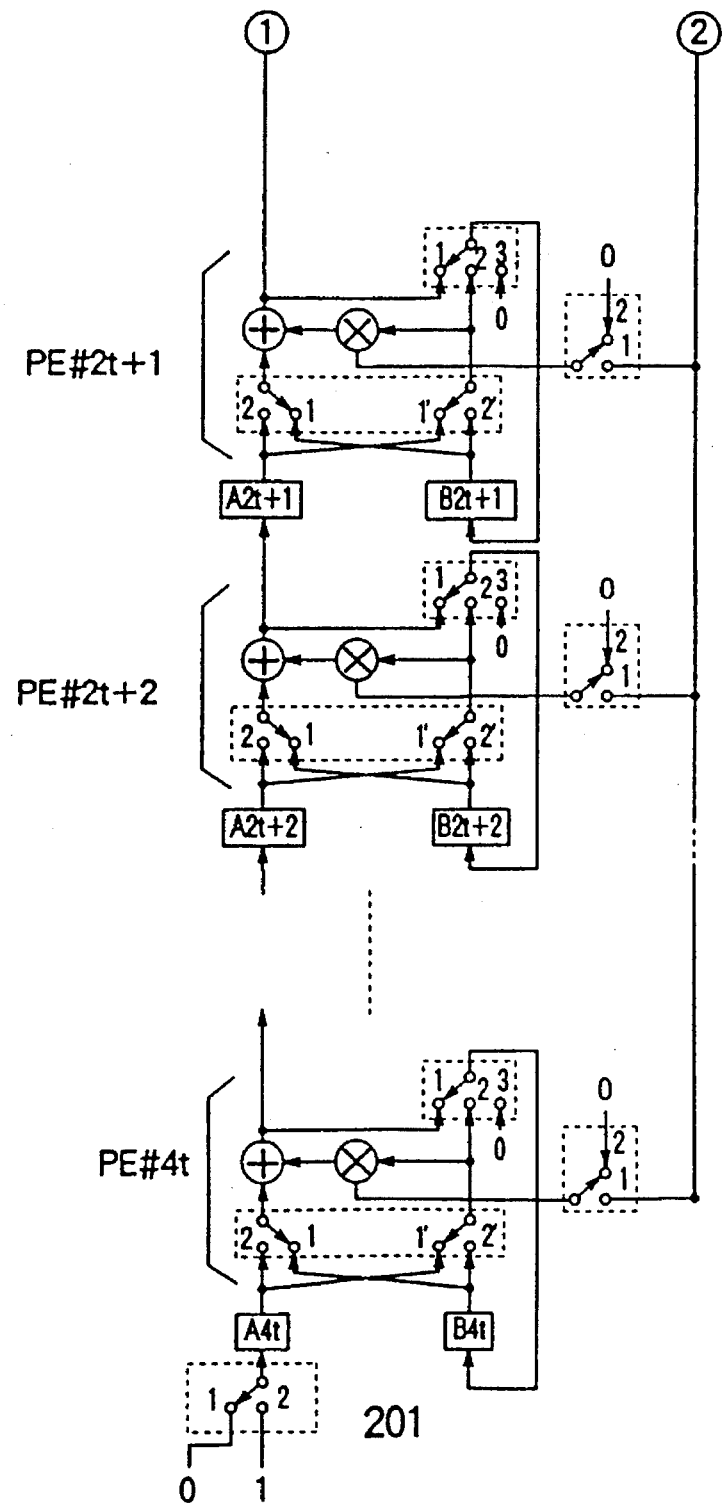
Figure 17:
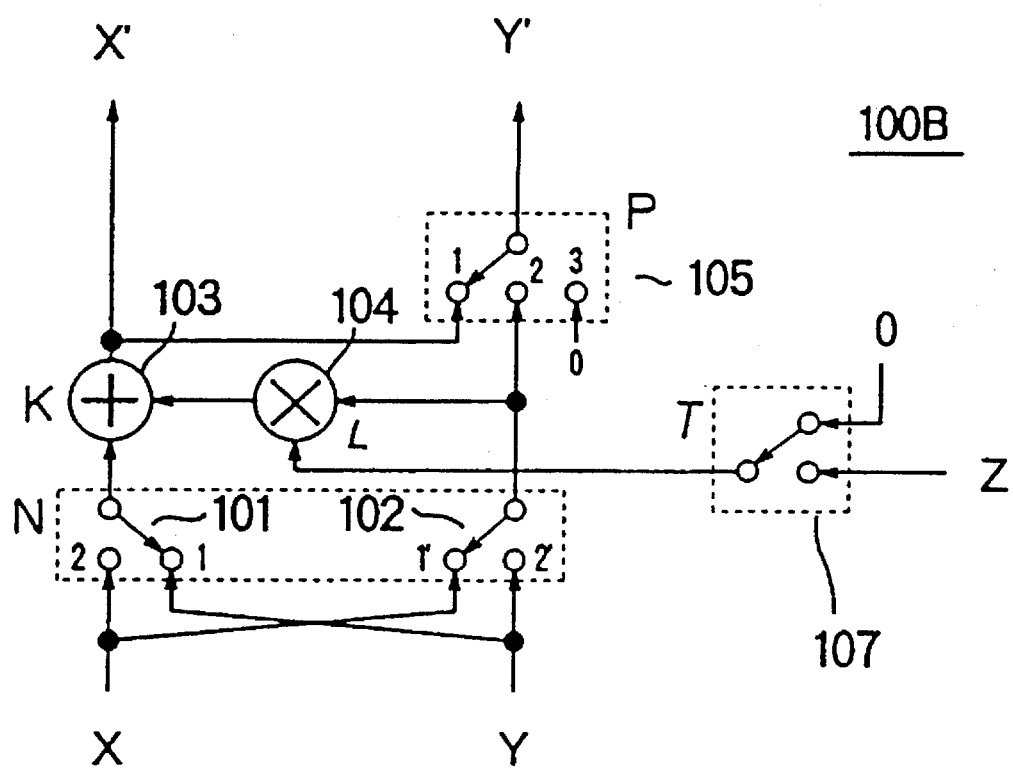
FIG. 17 is a detailed circuit diagram of a computation unit shown in FIGS. 16a and 16b.

Accordingly, concerning the configuration of the computation unit, a configuration which can perform these seven types of computations becomes necessary, but this can be realized by the simple structure of the computation unit PE as shown in FIG. 17 used in the configuration of, for example, FIGS. 15a to 15c and FIGS. 16a and 16b.

In the computation unit PE of FIG. 17, three switching units 101:102 (N) and 105 (P):107 (T) are switched as shown in the next table, whereby the computations of 1) to 7) mentioned above can be realized.

TABLE 7

| | | Switching unit | | |
|---|---|---|---|---|
| No. | Computation | 101 102 | 105 | 107 |
| 1 | X'=X·Z+Y, Y'=X | 1-1' | 2 | 1 |
| 2 | X'=Y·Z+X, Y'=Y | 2-2' | 2 | 1 |
| 3 | X'=Y'=X·Z+Y | 1-1' | 1 | 1 |
| 4 | X'=X·Z+Y, Y'=0 | 1-1' | 3 | 1 |
| 5 | X'=Y'=Y | 1-1' | 1 | 2 |
| 6 | X'=X, Y'=0 | 2-2' | 3 | 2 |
| 7 | X'=Y, Y'=0 | 1-1' | 3 | 2 |

Note that, in FIGS. 15c to 17, this is realized by the configuration of the computation unit comprising the multiplier 104 (L), adder 103 (K), and the above-described switching units N, P, and T as shown in FIG. 17. The configuration of the computation unit per se can be any configuration so far as the configuration can perform the above seven types of computation.

The views of the configuration in FIGS. 15c to 16b will be simply explained.

Only one division unit DIV exists in the configuration. G in the diagram is the division unit. A division such as E/F is carried out between the most significant coefficients of two polynomials in the Euclidean mutual division method. The results of this division are switched to the values supplied from the registers $A_{2t}$ which store the lost data positions at the time of computation of the polynomial by the switching unit S and are supplied to the computation units PE#1 to PE#2t. The switching unit R is the switching unit which performs the initialization for the computation of the Euclidean mutual division method.

The registers DR and DQ in the division unit DIV store the degrees $dR_i$ and $dQ_i$ of the most significant coefficients of the polynomials $R_i(X)$ and $Q_i(X)$ stored in the registers $A_0$ and $B_0$ when the computation of the modified Euclidean mutual division method is carried out. When the computation is actually carried out, the degrees of $R_i(X)$ and $Q_i(X)$ are expressed.

The control signal generation unit (controller) 120 of the division unit DIV decides the operation of the computation which should be carried out in computation units from the information such as the result of comparison of the registers DR and DQ, result of detection of "0" of the register $A_0$, the number of the computation processes at present, etc., and independently controls the respective computation units PE of the multiplication and addition computation unit MLT.

In the multiplication and addition computation unit MLT, 4t number of computation units are necessary with respect to a system to which 2t number of parities are added in the present configuration in both of the computation of the first $\epsilon$ step and in the computation of the next (2t–$\epsilon$) step. Note, a case where the computation unit in the multiplexed manner is not used, and each computation unit performs only one multiplication and addition with respect to one step of repetition is assumed.

Assume that, among the registers in FIGS. 15c to 16b, a group of registers $A_0, A_1, \ldots, A_{4t}$ on the left side in the diagram is referred to as A side registers, and a group of registers $B_0, B_1, \ldots, B_{4t}$ on right side is referred to as B side registers. When the division unit DIV and multiplication and addition computation unit MLT are combined, a total (4t+1) A side registers and a total of (4t+1) B side registers, i.e., (8t+2) in total registers, are used. Simultaneously a 4t number of computation units are used. During the computation, coefficients of various polynomials are stored in the respective registers. The storage method of important coefficients will be explained in the next section while dividing the same into a case where a lost data symbol exists and a case where it does not.

Note that, as the input of the A side register at the final stage of the multiplication and addition computation unit MLT, "0" or "1" is input by the switching unit 119 (J), and therefore the computation unit PE#4t at the final stage does not actually perform the computation during the operation. Moreover, also the computation unit PE#2t does not actually perform computation since the coefficient supplied from the register $A_{2t}$ is always "0".

Accordingly, the register $A_{4t}$ and computation unit PE#2t and the computation unit PE#4t can be reduced by a slight change of control, and further simplification of the circuit is possible. However, they are entered into for the explanation of the principle of the present configuration.

5-3. Example of Operation of Lost Data Correction Circuit Which is Proposed

An explanation will be made next of the method of storage of coefficients of polynomials performing the computation, the initialization, and the computation method. In the routine, the operation is different between a case where the lost data symbol exists ($\epsilon>0$) and a case where the lost data symbol does not exist ($\epsilon=0$), but in the latter case, the same computation as that in the case of the already reported method of configuration F is carried out, and therefore a detailed explanation will be omitted here.

Note that, when the lost data symbol exists, equation 34 and equation 47 can be rewritten to the following equations:

$$u^{(i)}(X)=u^{(i-1)}(X)-X \cdot U_i \cdot u^{(i-1)}(X) \tag{73}$$

$$T^{(i)}(X)=T^{(i-1)}(X)-X \cdot U_i \cdot T^{(i-1)}(X) \pmod{X^{2t}} \tag{74}$$

Also in the conceptual configuration views of FIGS. 15c to 16b, in the same way as in the case of the method of configuration F, it is assumed that the coefficients of $u^{(i)}(X)$ and $T^{(i)}(X)$ are stored in the A side registers and the coefficients obtained by shifting the coefficients which have been stored in the A side registers shifted by the amount of one order to the lower significant position are stored in the B side registers.

The T(X) which is finally required is the (2t–1)-th order polynomial, and therefore also the coefficient of $T^{(i)}(X)$ which should be held in the middle of the computation can be the coefficient of the (2t–1)-th order. Accordingly, the coefficients of $T^{(i)}(X)$ are stored in the registers $A_0, A_1, \ldots$ $A_{2t-1}$ in a descending order from the (2t−1)-th order coefficient at the highest position.

The coefficients of $u^{(i)}(X)$ are stored in the A side registers following $T^{(i)}(X)$ from the register $A_{2t}$ to the register $A_{4t}$ similarly in a descending order. The maximum degree of $u^{(i)}(X)$ is the 2t-th order, and therefore the number of coefficients becomes 2t+1 at the maximum, and they are stored in (2t+1) registers from register $A_{2t}$ to the register $A_{4t}$ in the descending order.

Certainly, the lost data position polynomial u(X) which is finally found is the ε-th order, and therefore it becomes the polynomial of the 2t-th order at the largest, and (2t+1) registers for storing u(X) are necessary at the largest. However, the degree of the polynomial $u^{(i)}(X)$ which should be stored during the step of finding the lost data position polynomial u(X) becomes the i-th order after the computation of the i-th step and therefore, it is sufficient if there are registers for storing (i+1) number of coefficients at the largest.

Therefore, at the computation of the polynomial, the lost data positions $U_1$ to $U_\epsilon$ of ε number of positions (2t positions at the largest) are stored as the initial values in 2t number of registers from the register $A_{2t}$ to $A_{4t-1}$. Then, they are sequentially shifted and output from the register $A_{2t}$ for every polynomial computation and supplied to the computation units through the switching unit S.

Now, the polynomial computation of the i-th step will be considered. In the i-th step of the polynomial computation, a computation for multiplying the first order polynomial 1−$XU_i$ with respect to the (1−i)-th order polynomial $u^{(i-1)}(X)$ is carried out.

The coefficients of the polynomial $u^{(i-1)}(X)$ are stored in i number of registers of from the register $A_{4t-i+1}$ to $A_{4t}$. At this time, lost data positions $U_i$ to $U_{2t}$ are stored in the (2t−i+1) registers of from the register $A_{2t}$ to $A_{4t-1}$. It is not necessary to store the (i−1) number of lost data positions from $U_i$ to $U_{i-1}$ since they become unnecessary at a point of time when i−1 times computation which have been already executed are ended.

On the other hand, the group of the B side registers store the coefficients stored in the A side registers while shifting the same to lower significant positions by one order's worth. Namely, all coefficients stored in $A_0$ are stored in $B_{i+1}$. Note that, it is assumed that "0" is put in $B_0$. Note that, in the i-th step of computation, it is assumed that "0" is input to the B side registers $B_{2t+1}$ to $B_{4t-i+1}$ corresponding to the registers $A_{2t}$ to $A_{4t-i}$ in which the lost data positions are stored for convenience.

An initialization will be explained.

Since $T_{(0)}(X)=S(X)$, $S_{2t}$ is stored as the initial value in the register $A_0$, and subsequently all syndromes are stored until $S_1$ is stored in the register $A_{2t-1}$.

Also, since $u^{(0)}(X)=1$, "1" is given as the initialization value to the register $A_{4t}$. Further, the lost data positions $U_1$ to $U_{2t}$ of 2t at the largest are stored in the registers $A_{2t}$ to $A_{4t-1}$ as the initialization values. Where the number ε of the lost data symbols is smaller than 2t, any can be stored but it is assumed that "0" is stored for convenience.

On the other hand, it is assumed that the coefficients of the group of A side registers are stored in the B side register group while shifting the same to the lower significant position by the amount of one order. "0" is stored in the registers $B_{2t+1}$ to $B_{4t-i+1}$ corresponding to the lost data positions. Note that, the circuit for the fine initialization is omitted since it is not essential.

The operation will be explained.

After the coefficient storage and initialization as mentioned above, the polynomial computations of $T^{(i)}(X)$ and $u^{(i)}(X)$ are carried out by the computation of the first ε steps by using lost data positions $U_1$ to $U_{2t}$ supplied to the registers $A_{2t}$ to $A_{4t-1}$.

Now, the polynomial computation in the i-th step (i≤ε) is considered. The coefficients of $T^{(i-1)}(X)$ are stored in the registers $A_0$ to $A_{2t-1}$. Also, the coefficients of $u^{(i-1)}(X)$ are stored in the registers $A_{4t-i+1}$ to $A_{4t}$.

In the polynomial computation up to the first ε step with respect to the coefficients of the polynomials, a computation for multiplying the primary order polynomial 1−$XU_i$ with the (2t−1)-th order polynomial $T^{(i-1)}(X)$ and (i−1)-th order polynomial $u^{(i-1)}(X)$ is carried out.

Accordingly, the computation same as that in the method of configuration F is carried out with respect to the registers in which the coefficients of these polynomials are stored. Namely, the signal S is switched to the 2 side, and each one lost data position $U_i$ per step is sequentially supplied from the register $A_{2t}$. In the computation units of PE#1 to PE#2t and PE#4t−i+1 to PE#4t performing the computation with respect to the registers storing the polynomials, the switching unit N is switched to the 1−1' side, the switching unit P is switched to the 1 side, and the switching unit T is switched to the 1 side.

From the above setup, in each computation unit, a computation such as the following is carried out:

3) $X'=Y'=X \cdot Z+Y$       (75)

Here, a lost data position such as:

$Z=U_i$ is supplied, and, with respect to the coefficients stored in the j-th register, a computation such as the following is carried out:

$A_j \times U_i + B_j$

In actuality, the same value as that in the register $A_{j-1}$ is input to the register $B_j$, and therefore a computation such as:

$A_j \times U_i + A_{j-1}$ is carried out. These outputs are simultaneously stored in two registers of the register $A_{j-1}$ and the register $B_j$. As a result of this computation, the coefficients of $T^{(i)}(X)$ and $u^{(i)}(X)$ are stored in the A side registers, and coefficients obtained by the shift of the same by one order to a lower significant position are stored also in the B side.

Note, contrary to a fact that the "0" was stored in the register $A_{2t}$ at the first ε steps of polynomial computation in the method of configuration F, the lost data position is stored in the present method of configuration. For this reason, it becomes impossible to perform the computation in the computation unit PE#2t ordinarily. Therefore, the processing in the computation unit PE#2t at the computation of polynomial is changed as follows:

5) $X'=Y'=Y$       (76)

By this change, the computation unit PE#2t performs the same operation as that where "0" is supplied from the registers $A_{2t}$.

On the other hand, there is no need for computation for the registers $A_{2t}$ to $A_{4t-i}$ storing the lost data positions. The stored coefficients are merely shifted to the registers having smaller register numbers to make the register $A_{2t}$ output $U_{i+1}$ in the next computation process. Accordingly, a processing of the computation unit PE#2t+1 to the computation unit PE#4t–i with respect to the registers storing the lost data positions may be performed as follows:

6) X'=X

Y'=0 (77)

Note that, "1" is supplied from the switching unit 119 (J) at the final stage at the time of polynomial computation.

As mentioned above, in the first $\epsilon$ steps of polynomial computation, the processing in accordance with the number of computation processes is carried out in the computation unit PE#2t+1 to the computation unit PE#4t–i, whereby the lost data position storage register can be made to act also as the coefficient storage region of the polynomial $u^{(i)}(X)$ for finding the lost data position polynomial.

After this repetition is performed $\epsilon$ times, in the A side register group, the $T^{(\epsilon)}(X)$ and $u^{(\epsilon)}(X)$ are obtained. That is, $T_{2t}$ is stored in the register $A_0$, and the coefficients of the correction syndrome polynomial $T(X)$ are stored in the A side registers up to the register $A_{2t-1}$ in a descending order. Also, as the coefficients of the lost data position polynomial $u(X)$, the 2t-th order coefficients are stored in the register $A_{2t}$, and subsequently the (2t+1) coefficients are stored in a descending order until the 0-th order coefficients are stored in the register $A_{4t}$.

At this point of time, all lost data positions which were stored at first are abandoned since they will not be used in the subsequent stages.

In this way, when the polynomial computation of the first $\epsilon$ steps is ended, the coefficients stored in the registers become quite the same as those of the case of the method of configuration F. Therefore, the repetition of the modified Euclidean mutual division method is carried out using these stored coefficients as the initial values, but the subsequent processing is the same as that of the method of configuration F.

Also in the configuration of the present embodiment, the coefficients of $R_i(X)$ and $\lambda_i(X)$ in the computation of the modified Euclidean mutual division method are stored in the group of the A side registers, and the coefficients of $Q_i(X)$ and $\mu_i(X)$ are stored in the group of B side registers in a descending order. At this time, the coefficients of $R_i(X)$ and $Q_i(X)$ are stored so that the coefficients of the $dR_i$-th order are located at the higher significant position.

The initialization in the computation of this Euclidean mutual division method is to store the coefficients of the initial value $R_0(X)=T(X)$ of $R_1(X)$ in the group of A side registers in a descending order. The $T_{2t}$ is stored in the register $A_0$ and subsequently the 2t coefficients are stored up to the register $A_{2t-1}$. Subsequent to $R_0(X)$, in the A side register, the coefficients of $\lambda_i(X)$ are stored. Since $\lambda_0(X)=u(X)$, it is sufficient if the initial values from the register $A_{2t}$ to the register $A_{4t}$ are replaced by the coefficients of the $u(X)$. 2t-th order coefficients of $u(X)$ are stored in the register $A_{2t}$, and subsequently the coefficients of $u(X)$ are stored in the descending order until "1", which is the 0-th order coefficient of $u(X)$, is stored in the register $A_{4t}$.

On the other hand, for the initialization of the B side registers, the coefficients of the initial values $Q_0(X)=X^{2t}$ of the $Q_i(X)$ are stored in a descending order in the same way as the group of the A side registers. This can be realized if "1" is stored in the register $B_0$, and the coefficients from the register 1 to the register 2t other than this are brought to "0". Subsequent to $Q_0(X)$, the coefficients of $\mu_i(X)$ are stored in the B side registers. Since $\mu_0(X)=0$, it is sufficient if $B_0$ of the B side register is brought to "1" and the registers other than this are all brought to "0".

From the above description, so as to continue the computation of the Euclidean mutual division method using the coefficients remaining in the A side registers as they are after the computation of the first $\epsilon$ steps is ended, in the same way as the method of configuration F, also in the present method of configuration, at the repetition of the $\epsilon$-th step which is the last of the polynomial computations, it is necessary to perform the operation of preparing the coefficients of $X^{2t}$ and "0" which are the initial values of $Q_0(X)$ and $\mu_0(X)$ for performing the next computation of the modified Euclidean mutual division method in the B side registers.

This can be realized in the computation of repetition of the $\epsilon$-th step, the coefficients of $T(X)$ as the computation result are not stored in the B side registers, $B_0$ is brought to equal to 1, and the registers subsequent to $B_1$ are all initialized to "0". For example, in the configuration of the computation unit of FIG. 4, this can be easily realized by switching the switching unit P, which is the switching unit of the input signal of the B side register, to the 3 side in the polynomial computation mode.

At this time, with respect to the computation units PE#1 to PE#2t–1 and the computation units PE#4t–1+1 to PE#4t, the computation such as the following is carried out:

4) X'=X·Z+Y

Y'=0 (78)

With respect to the computation unit PE#2t, a computation such as the following is carried about:

7) X'=Y

Y'=0 (79)

With respect to the computation units PE#2t+1 to PE#4t–1, a computation such as the following is carried out:

6) X'=X

Y'=0 (80)

At this time, the switching unit R is switched to the 2 side and "1" is stored in the register $B_0$. Also, DR and DQ, which are the registers for storing the $dR_i$ and $dQ_i$, are simultaneously initialized by 2t–1 and 2t, respectively.

In this way, after the initialization for the modified Euclidean mutual division method at the $\epsilon$-th step, the computation of the modified Euclidean mutual division method is sequentially carried out step by step over 2t–$\epsilon$ steps. This process is the same as that in the method of configuration F, but will be explained again.

An explanation will be made of the operation of computation of the (i$\epsilon$<i$\leq$2t)-th step for performing the computation of the Euclidean mutual division method. Where the number $\epsilon$ of the lost data symbols is 2t, $\omega(X)$ and $\sigma(X)$ are found by just 2t polynomial computations, and therefore computation of the Euclidean mutual division method of more than this becomes unnecessary. Therefore, assume here a case where there are more than one but less than 2t lost data symbols. In such a case, at least one Euclidean mutual division is carried out after the computation of polynomials.

First, it is detected whether or not the $(dR_{i-1})$-th order coefficient of $R_{i-1}(X)$ is "0" at the 0-detector D. The operation mode is determined from this result and the magnitude relationship of the registers $DR_{i-1}$ and $DQ_{i-1}$.

When $DR_{i-1}<DQ_{i-1}$ and where the state of $A_0\neq 0$ is notified, it becomes the cross mode, while becomes the normal mode in other cases. This is because, as mentioned in the specification of Japanese Patent Application No. 3-254183 by the present inventor, the shift mode in the modified Euclidean mutual division method can be treated as the normal mode where the quotient from the divider is "0" in actuality.

When the mode is determined, two switching units C and H existing in the division unit DIV are switched to the cross contact point (1–1') or normal contact point (2–2') in accordance with the operation mode.

The value of the register $A_0$, that is, the $(dR_{i-1})$-th order coefficient of $R_{i-1}(X)$, and the value of the register $B_0$, that is, the $(dQ_{i-1})$-th order coefficient of $Q_{i-1}(X)$, pass through the switching unit C and are input to the divider G. In the divider D, the division of E/F is carried out with respect to the inputs of E and F in the diagram, and the result S thereof is output. During the computation of the Euclidean mutual division method, the divider side contact point "1" is selected as the switching unit S.

On the other hand, in the computation units PE of the multiplication and addition computation unit MLT, the computation is carried out in accordance with the operation mode decided at the division unit DIV. During the computation of the Euclidean mutual division method, the 2 side is selected for the switching unit P, and the 1 side is selected for the switching unit T.

In the case of the cross mode, a cross side contact point (1–1') is selected for the switching unit N. If the output of the divider is represented by Z in the computation unit PE shown in FIG. 17, a computation such as the following is carried out:

6) $X'=X\cdot Z+Y$ $Y'=X$ (81)

In the case of the normal mode, the normal side contact point (2–2') is selected for the switching unit N, and a computation such as the following is carried out:

2) $X'=Y\cdot Z+X$ $Y'=Y$ (82)

The coefficients computed in each computation unit are stored in the registers, and one step of computation is ended. For the storage of coefficients in the j-th register, the X' output of the (j+1)-th computation unit is stored in the A side registers, and the Y' output of the j-th computation unit is stored in the B side registers. Namely, this is represented as in the following equation:

$A'_j = X_{j+1}$ $B'_j = Y_j$

By repeating this procedure by $(2t-\epsilon)$ times, this can be found as:

$R_{2t-\epsilon}(X)=\omega(X)$ $\lambda_{2t-\epsilon}(X)=\hat{\sigma}(X)$

The degrees of the polynomials are $dR_i$ and $(dR_i+1)$, respectively. For the coefficients of $\omega(X)$, the $dR_i$-th order coefficient is stored in the register $A_0$, and subsequently the lower significant coefficients are stored in the descending order. Also for the coefficient of $\underline{\sigma(X)}$, the $(dR_i+1)$-th order coefficient is similarly stored in the register $A_{2t}$, and subsequently the lower significant coefficients are stored in a descending order.

An example of the operation where the lost data correction is carried out will be explained using an example.

In this example, a code given 2t=4 parities using the finite field GF ($2^4$) defined by using the irreducible polynomial $g(X)=X^4+X+1$ is used. In the case of the usual correction, the error correction of two symbols at the largest is possible, but in the case of the lost data correction, the correction is possible within a range satisfying $(\epsilon+2\nu)\leq 2t$.

Here, an example of $\epsilon=2$ and $\nu=1$ the same as an example shown in the method of configuration F will be explained. Two lost data positions are:

$U_0=\alpha^{+0}$ $U_1=\alpha^{+1}$

It is now assumed that the syndrome polynomial S(X) is found as:

$S(X)=\alpha^2 X^3 + \alpha^{14} X^2 + \alpha^4 X + \alpha^9$

When the error position polynomial $\sigma(X)$ is derived from this syndrome polynomial S(X) by using the modified Euclidean mutual division method, the following is obtained:

Step 1: Polynomial Computation

The coefficients of the lost data position polynomial u(X) and correction syndrome polynomial T(X) are found from the lost data positions $U_i$. By performing the initialization as:

$T^{(0)}(X)=S(X)=\alpha^2 X^3 + \alpha^{14} X^2 + \alpha^4 X + \alpha^9$ $u^{(0)}(X)=1$ the next computation is carried out:

$$\begin{aligned}
u^{(1)}(X) &= u^{(0)}(X) - X\cdot U_1\cdot u^{(0)}(X) \\
&= 1 - X\cdot \alpha^{+0}\cdot 1 \\
&= \alpha^0 X + 1 \\
T^{(1)}(X) &= T^{(0)}(X) - X\cdot U_1\cdot T^{(0)}(X) \pmod{X^4} \\
&= \alpha^2 X^3 + \alpha^{14} X^2 + \alpha^4 X + \alpha^9 - X\cdot \alpha^{+0}\cdot \\
&\quad (\alpha^2 X^3 + \alpha^{14} X^2 + \alpha^4 X + \alpha^9) \\
&= \alpha^2 X^3 + \alpha^{14} X^2 + \alpha^4 X + \alpha^9 - \\
&\quad (\alpha^2 X^4 + \alpha^{14} X^3 + \alpha^4 X^2 + \alpha^9 X) \\
&= \alpha^{13} X^3 + \alpha^9 X^2 + \alpha^{14} X + \alpha^9
\end{aligned}$$

Step 2: Polynomial Computation $$\begin{aligned}
u^{(2)}(X) &= u^{(1)}(X) - X\cdot U_2\cdot u^{(1)}(X) \\
&= \alpha^0 X + 1 - X\cdot \alpha^{+1}\cdot (\alpha^0 X + 1) \\
&= \alpha^1 X^2 + \alpha^4 X + 1 \\
T^{(2)}(X) &= T^{(1)}(X) - X\cdot U_2\cdot T^{(1)}(X) \pmod{X^4} \\
&= \alpha^{13} X^3 + \alpha^9 X^2 + \alpha^{14} X + \alpha^9 - X\cdot \alpha^{+1}\cdot \\
&\quad (\alpha^{13} X^3 + \alpha^9 X^2 + \alpha^{14} X + \alpha^9) \\
&= \alpha^{13} X^3 + \alpha^9 X^2 + \alpha^{41} X + \alpha^9 - \\
&\quad (\alpha^{14} X^3 + \alpha^{10} X^2 + \alpha^0 X + \alpha^{10}) \\
&= \alpha^9 X^3 + \alpha^7 X^2 + \alpha^{11} X + \alpha^9
\end{aligned}$$

Step 3: Euclidean Mutual Division Method and Cross Mode Computation

The computation of the modified Euclidean mutual division method is carried out using $T(X)$ and $u(X)$ found at Steps 1 and 2. The initialization is carried out as follows.

$dR_0=3$ $dQ_0=4$ $R_0(X)=T(X)=\alpha^9 X^3+\alpha^7 X^2+\alpha^{11} X+\alpha^9$ $Q_0(X)=X^4$ $\lambda_0(X)=u(X)=\alpha^0 X+1$ $\mu_0(X)=0$ After the decision of the computation mode, repeated computation is carried out as follows:

$$\left.\begin{array}{l} dR_0 - dQ_0 = 3 - 4 = -1 < 0 \\ \text{coefficient } \alpha^9 \text{ of } dR_0 - \text{order of } R_0(X), \alpha^9 \neq 0 \end{array}\right\}$$
$$\rightarrow \text{cross mode}$$

$$\begin{aligned}
R_1(X) &= Q_0(X) + (1/\alpha^9) \cdot R_0(X) \cdot X \\
&= X^4 + \alpha^6(\alpha^9 X^3 + \alpha^7 X^2 + \alpha^{11} X + \alpha^9) \cdot X \\
&= \alpha^{13} X^3 + \alpha^2 X^2 + \alpha^0 X \\
\lambda_1(X) &= \mu_0(X) + (1/\alpha^9)\lambda_0(X)X \\
&= 0 + \alpha^6 \cdot (\alpha^1 X^2 + \alpha^4 X + 1) \cdot X \\
&= \alpha^7 X^3 + \alpha^{10} X^2 + \alpha^6 X \\
Q_1(X) &= R_0(X) \\
&= \alpha^9 X^3 + \alpha^7 X^2 + \alpha^{11} X + \alpha^9 \\
\mu_1(X) &= \lambda_0(X) \\
&= \alpha^1 X^2 + \alpha^4 X + 1
\end{aligned}$$

$dR_1 = dQ_0 - 1 = 4 - 1 = 3$ $dQ_1 = dR_0 = 3$

Step 4: Euclidean Mutual Division Method and Normal Mode Computation $dR_1 - dQ_1 = 3 - 3 = 0 \geq 0 \rightarrow$ normal mode $$\begin{aligned}
R_2(X) &= R_1(X) + (\alpha^{13}/\alpha^9)Q_1(X) \\
&= \alpha^{13} X^3 + \alpha^2 X^2 + \alpha^0 X + \\
&\quad \alpha^4(\alpha^9 X^3 + \alpha^7 X^2 + \alpha^{11} X + \alpha^9) \\
&= \alpha^9 X^2 + \alpha^{13} \\
\lambda_2(X) &= \lambda_1(X) + (\alpha^{13}/\alpha^9)\mu_1(X) \\
&= \alpha^7 X^3 + \alpha^{10} X^2 + \alpha^6 X + \alpha^4 \cdot (\alpha^1 X^2 + \alpha^4 X + 1) \\
&= \alpha^7 X^3 + \alpha^0 X^2 + \alpha^{14} X\, \alpha^4 \\
Q_2(X) &= Q_1(X) \\
&= \alpha^9 X^3 + \alpha^7 X^2 + \alpha^{11} X + \alpha^9 \\
\mu_2(X) &= \mu_1(X) \\
&= \alpha^1 X^2 + \alpha^4 X + 1
\end{aligned}$$

$dR_2 = dR_1 - 1 = 3 - 1 = 2$ $dQ_2 = dQ_1 = 3$

Above, by the repeated computation of four steps, $\sigma(X)$ and $\omega(X)$ are found as in the following equations:

$$\begin{aligned}
\omega(X) &= R_2(X) \\
&= \alpha^9 X^2 + \alpha^{13} \\
\hat{\sigma}(X) &= \lambda_2(X) \\
&= \alpha^7 X^3 + \alpha^0 X^2 + \alpha^{14} X + \alpha^4
\end{aligned}$$

$\sigma(X)$ and $\omega(X)$ to be found are found by the above-mentioned four steps of computation. The computation process in the case where this computation process is realized by the method of configuration which is proposed will be sequentially shown in FIGS. 18a and 18b to FIGS. 21a and 21b.

Figure 18A:
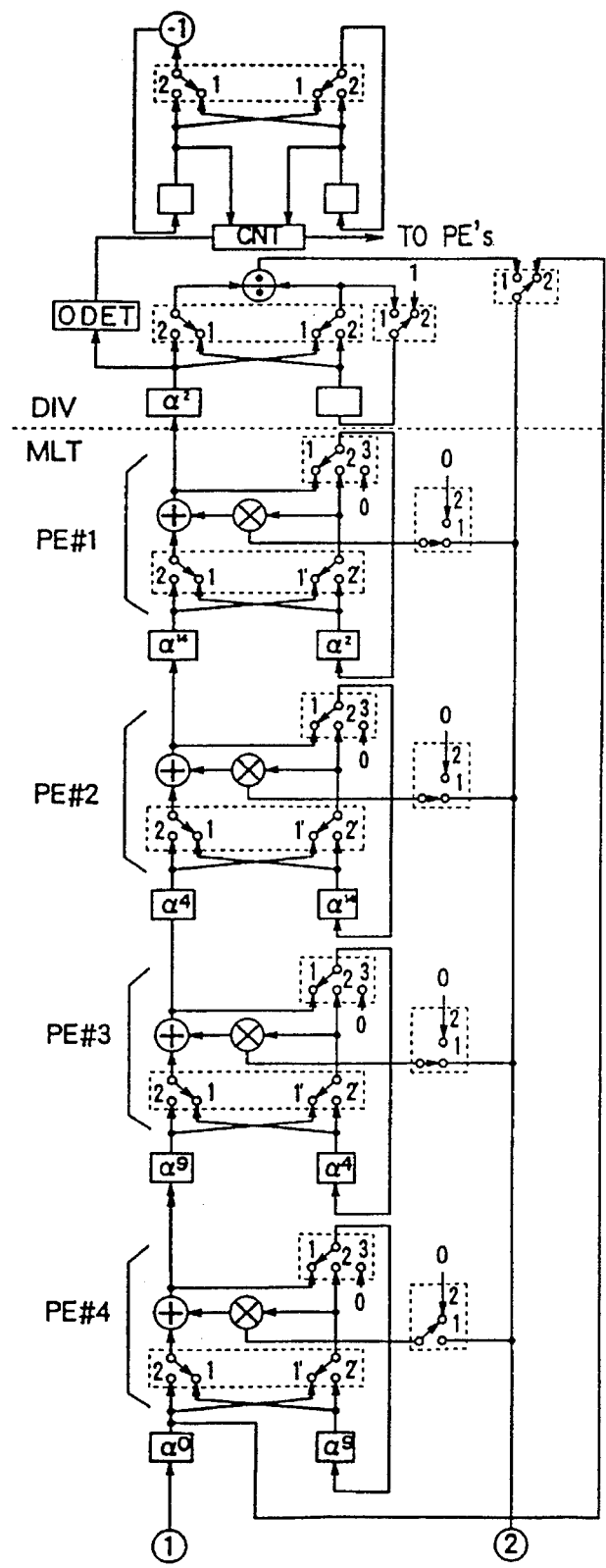
FIGS. 18a and 18b are views illustrating the operation mode of a first step in a third operation example in the lost data correction circuit of the second embodiment of the present invention.
Figure 18B:
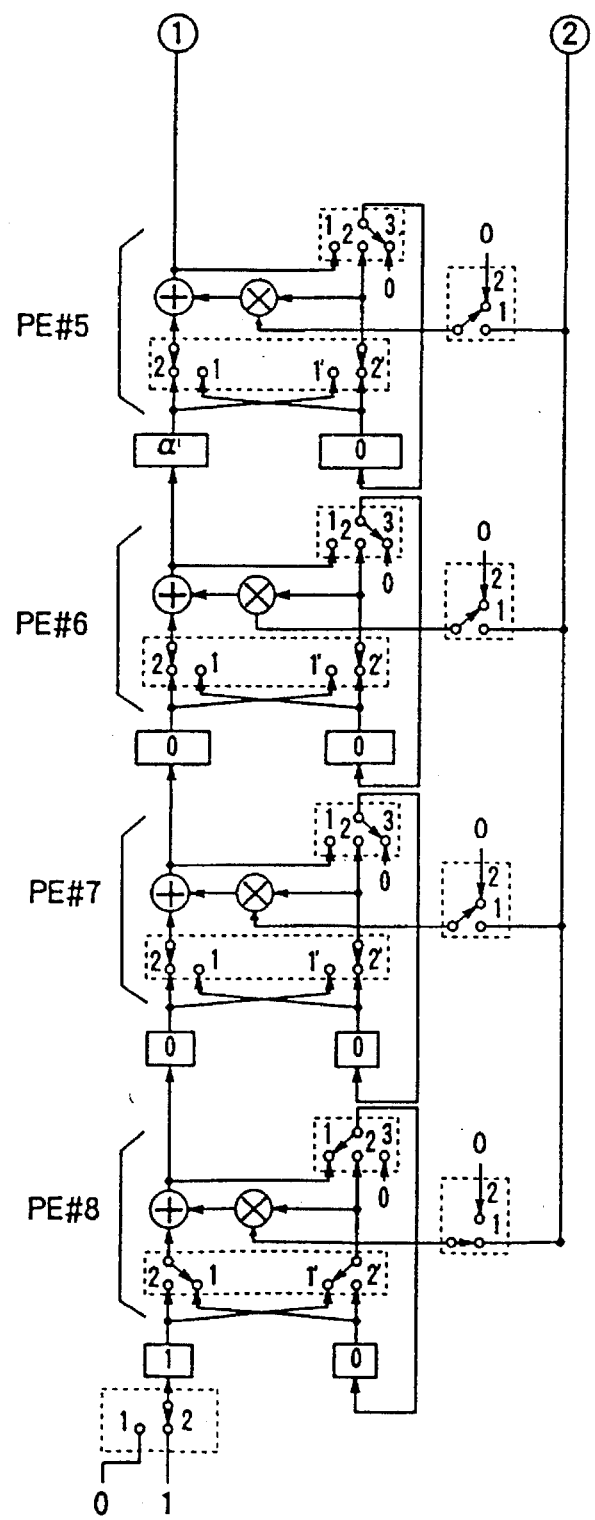

The registers in FIGS. 18a and 18b have been already initialized. In this example, since $\epsilon=2$, the initialization for polynomial computation is carried out. The lost data positions $U_1=\alpha^9$ and $U_2=\alpha^1$ are sequentially stored in the registers $A_4$ to $A_5$. Syndromes $S_1$ to $S_4$, which are coefficients of $T^{(0)}(X)$, are stored in the registers $A_0$ to $A_3$, and "1", which is the coefficient of $u^{(0)}(X)$, is stored in $A_8$. The coefficients of $T^{(0)}(X)$ are shifted to a lower significant position by one order and stored in the registers $B_2$ to $B_{2t}$ in the group of B side registers. $U_3$ and $U_4$ are originally stored in the registers $A_6$ to $A_7$, but $\epsilon=2$ here, so "0" is stored. "0" is stored in all of the registers $B_5$ to $B_8$.

In the operation of the first step shown in FIGS. 18a and 18b, the switching unit N is switched to the cross side contact point 1–1' at the computation units PE#1 to PE#3. By using the lost data position $U_1=\alpha^{+0}$ supplied from the register $A_4$, a computation such as the following is performed:

$$T^{(1)}(X)=T^{(0)}(X)+\alpha^0 \cdot X \cdot T^{(0)}(X)$$

Since X is multiplied at the second term in the right side, it is not necessary to calculate the coefficients of the term of $X^3$ of $T^{(0)}(X)$. Accordingly, for the actually computed coefficients, three computations of:

$\alpha^3=\alpha^{14}\times\alpha^0+\alpha^2$ $\alpha^9=\alpha^4\times\alpha^0+\alpha^{14}$ $\alpha^{14}=\alpha^9\times\alpha^0+\alpha^4$ are carried out in the computation units PE#1 to PE#3, and the results are simultaneously stored in registers $A_0$ to $A_2$ and registers $B_1$ to $B_3$.

Also in the computation unit PE#4, a computation such as the following is carried out:

$\alpha^9=0\times\alpha^0+\alpha^9$

However, since the lost data position is output from the register $A_4$, the same computation as the computation units PE#1 to PE#3 cannot be carried out. However, since this merely stores the contents of the register $B_4$ in the register $A_3$ and the register $B_4$, in the computation unit PE#4, a computation such as the following is carried out:

5) X'=Y'=Y and in the configuration of the computation unit shown in FIG. 32, this can be realized if the switching unit S is switched to the contact point 2 side while maintaining the switching unit N on the contact point 1–1' side, and maintaining the switching unit P on the contact point 1 side as they are.

This is true also for the computation concerning $u^{(t)}(X)$.

With respect to a computation such as:

$$u^{(1)}(X) = u^{(0)}(X) + \alpha^0 \cdot X \cdot u^{(0)}(X)$$

$u^{(0)}(X)=1$, and therefore, a computation of:

$$\alpha^0 = \alpha^0 \times \alpha^0 + 0 \tag{83}$$

is carried out at PE#1, and simultaneously stored in $A_7$ and $A_8$. "1" is supplied from the switching unit J to $A_8$ at the time of polynomial computation.

However, since the lost data positions are stored in the registers $A_5$ to $A_7$, the same computation must not be carried out in PE#5 to PE#7. In the computation units PE#5 to PE#7, it is sufficient if a computation for merely shifting the lost data position to the higher significant register, that is:

6) X'=X $$Y'=0 \tag{84}$$

is carried out.

The configuration of the computation unit of FIG. 17 is realized by switching the switching unit N to the contact point 2–2' side, switching the switching unit P to the contact point 3 side, and switching the switching unit T to the contact point 2 side.

Figure 19A:
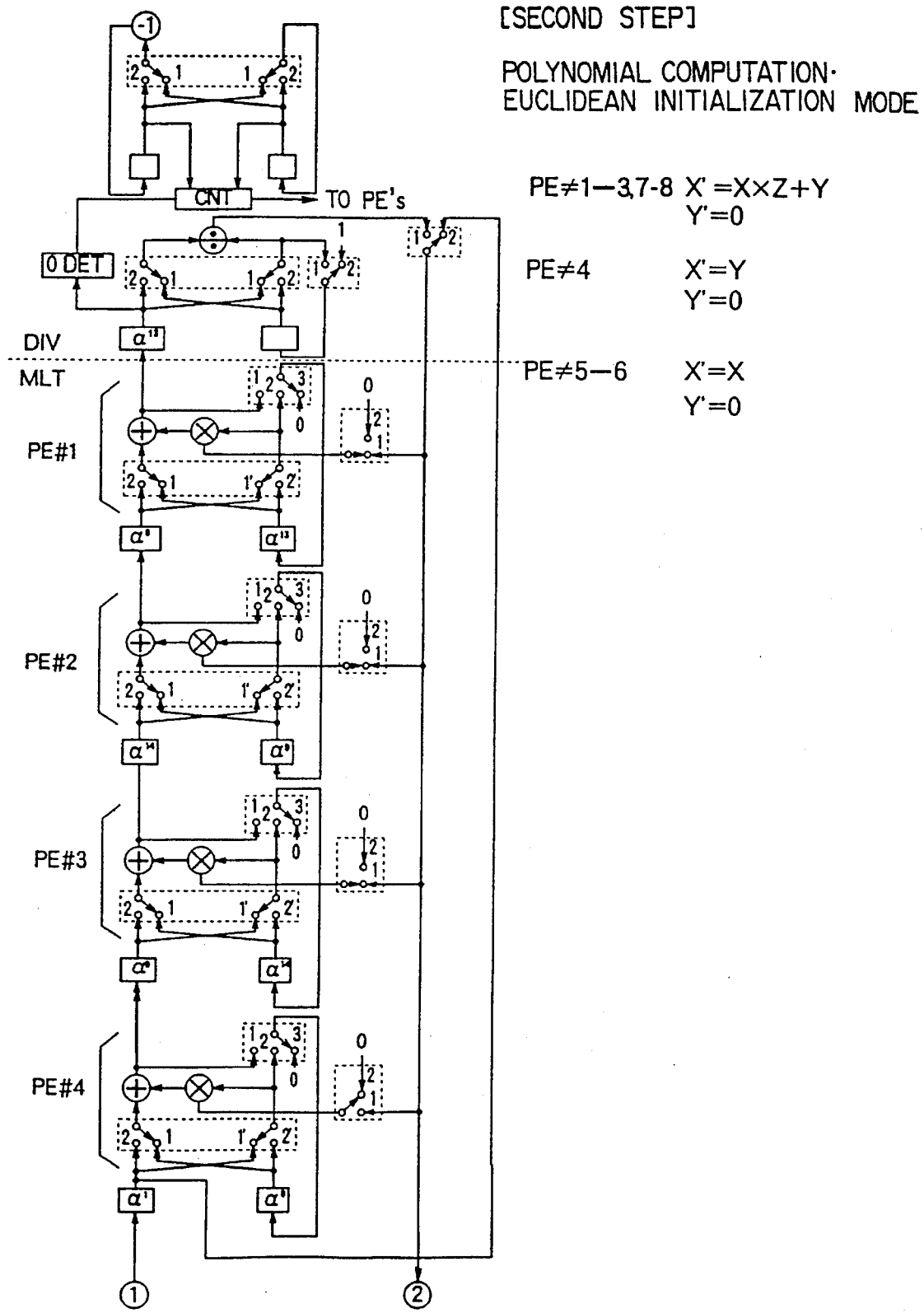
FIGS. 19a and 19b are views illustrating the operation mode of a second step in the third operation example in the lost data correction circuit of the second embodiment of the present invention.
Figure 19B:
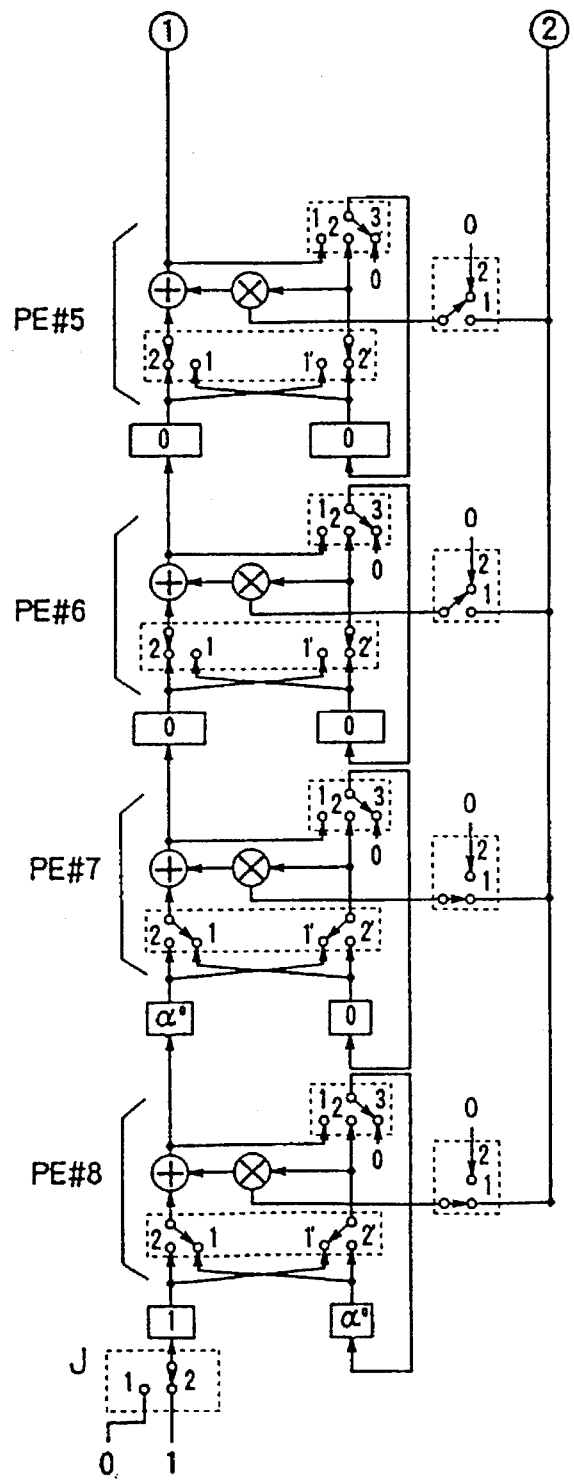

When the first step of computation is ended, as shown in FIGS. 19a and 19b, the coefficients are stored. Next, it should be noted that the lost data position $U_2$ which should be computed next has been stored in the register $A_4$.

Also at the second step, in the same way to the first step, a polynomial computation is carried out, but since ε=2, it becomes the final step of the polynomial computation, and therefore simultaneously the B side registers are initialized to those for computation of the Euclidean mutual division method.

In the second step of computation, the same computation as that at the first step is carried out at PE#1 to PE#4 with respect to the $T^{(1)}(X)$. Contrary to this, in the computation with respect to $u^{(1)}(X)$, since the $u^{(1)}(X)$ is the primary order polynomial, the coefficients are stored only in two registers of $A_7$ and $A_8$, and therefore the same computation as that at the first step is carried out in the PE#7 to PE#8.

In the computation units PE#5 to PE#6, in the same way as the first step, the shift computation is carried out. Note, in any computation, for initializing the B side register, the 3 side is selected for the switching unit P.

At the point of time when the second step is ended, T(X) and u(X) are found.

Figure 20A:
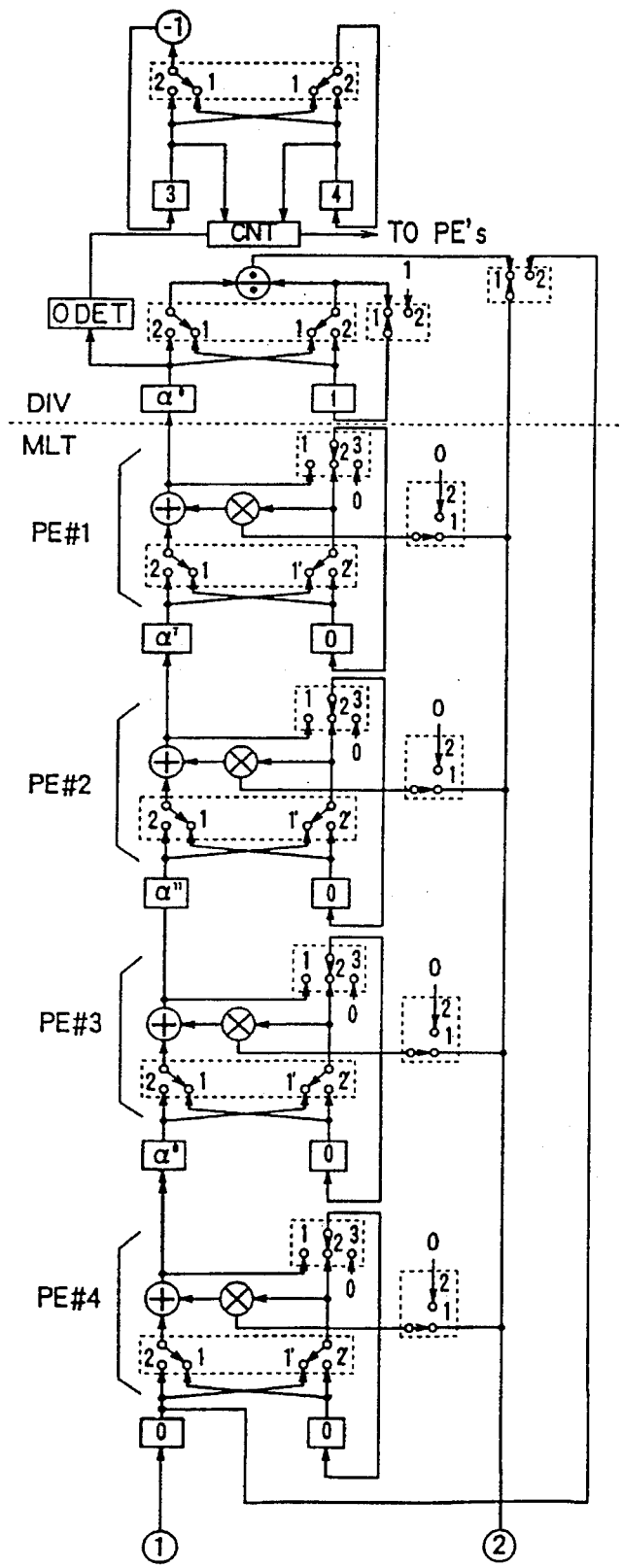
FIGS. 20a and 20b are views illustrating the operation mode of a third step in the third operation example in the lost data correction circuit of the second embodiment of the present invention.
Figure 20B:
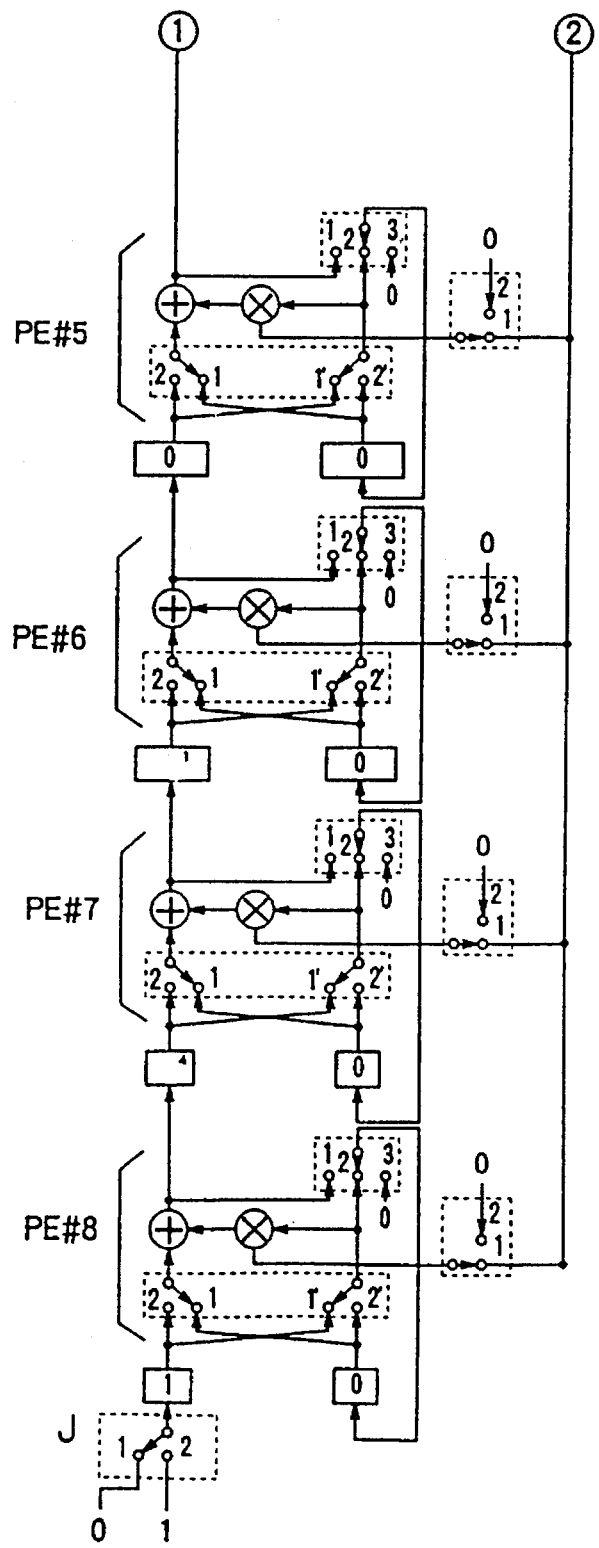

In FIGS. 20a and 20b, the coefficients at the time of end of the second step are stored in the registers. The coefficients of $R_0(X)=T(X)$ are stored in the registers of from $A_0$ to $A_3$, and the coefficients of $\lambda_0(X)=T(X)$ are stored in the registers of from $A_4$ to $A_8$. On the other hand, the B side registers are initialized so that $Q_0(X)$ becomes equal to $X^{2t}$, and $\mu_0(X)$ becomes equal to 0.

In the registers DR and DQ, the values of $dR_0$ and $dQ_0$ are stored. At the computation process at which the computation is actually carried out in the algorithm of the modified Euclidean mutual division method, $dR_0$ and $dQ_0$ represent the degrees of $R_0(X)$ and $Q_0(X)$, respectively. At the initialization of computation of the Euclidean mutual division method, the initial values of DR and DQ are brought to (2t−1) and 2t. In the computation of the Euclidean mutual division method performed in the subsequent computation process, the 1 side is always selected for the switching unit T and the 1 side is always selected for the switching unit 119 (J).

The third step of the computation performed in FIGS. 20a and 20b is the same as the computation of the modified Euclidean mutual division method in the case of the usual correction. In FIG. 6a, since the value ($dR_0$) of the register DR is "3" and the value ($dQ_0$) of the register DQ is "4", the condition of DR<DQ is satisfied, and since the dR0-th order coefficient of $R_0(X)$ is not zero, i.e. $\alpha^9$, the computation mode becomes the cross mode. Therefore, the switching units C, H, and N are switched to the cross side contact point 2–2', a computation such as $1/\alpha^9$ is carried out in the divider G, and the division result $\alpha^6$ passes through the switching unit S and is output to the computation units.

In one multiplication and addition computation unit MLT, the computation of the cross mode is carried out. A computation for finding the $R_1(X)$ is represented by:

$$\begin{aligned} R_1(X) &= Q_0(X) + (1/\alpha^9) \cdot R_0(X) \cdot X \\ &= X^4 + \alpha^6(\alpha^9 X^3 + \alpha^7 X^2 + \alpha^{11} X + \alpha^9) \cdot X \\ &= \alpha^{13} X^3 + \alpha^2 X^2 + \alpha^0 X \end{aligned}$$

These three coefficients are realized when the following computations are carried out in the computation units of computation units PE#1 to PE#3:

$$\alpha^3 = \alpha^7 \times \alpha^6 + 0$$

$$\alpha^9 = \alpha^{11} \times \alpha^6 + 0$$

$$\alpha^{14} = \alpha^9 \times \alpha^6 = 0$$

Similarly, the calculation for finding the $\lambda_1(X)$ such as:

$$\begin{aligned} \lambda_1(X) &= \mu_0(X) + (1/\alpha^9) \lambda_0(X) X \\ &= 0 + \alpha^6 \cdot (\alpha^1 X^2 + \alpha^4 X + 1) \cdot X \\ &= \alpha^7 X^3 + \alpha^{10} X^2 + \alpha^6 X \end{aligned}$$

is realized when the following computations of coefficients are carried out in the computation units PE#6 to PE#8:

$$\alpha^3 = \alpha^1 \times \alpha^6 + 0$$

$$\alpha^9 = \alpha^4 \times \alpha^6 = 0$$

$$\alpha^{14} = 1 \times \alpha^6 + 0$$

The coefficients of $R_1(X)$ and $\lambda_1(X)$ which are computed are stored in the A side registers as shown in FIG. 10, and the coefficients of $Q_1(X)=R_0(X)$ and $\mu_1(X)=\lambda_0(X)$ are stored in the group of registers of B side.

Figure 21A:
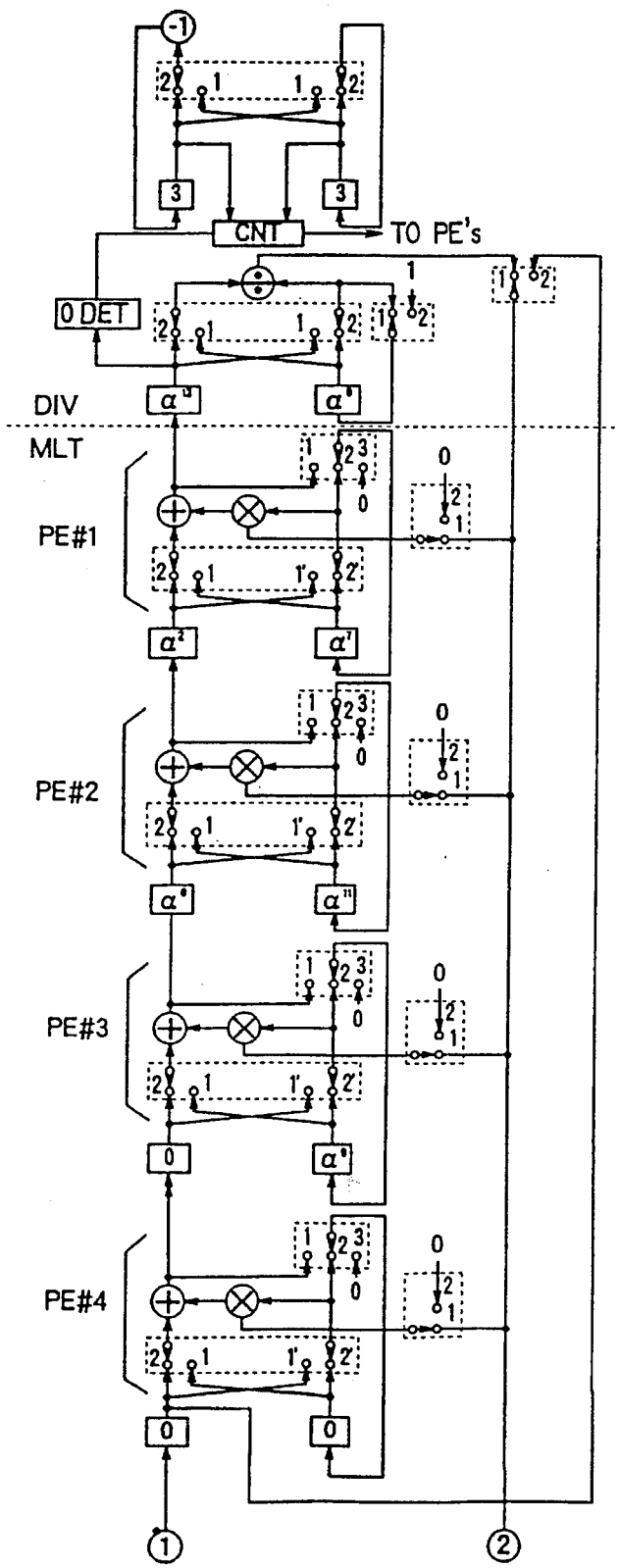
FIGS. 21a and 21b are views illustrating the operation mode of a fourth step in the third operation example in the lost data correction circuit of the second embodiment of the present invention.
Figure 21B:
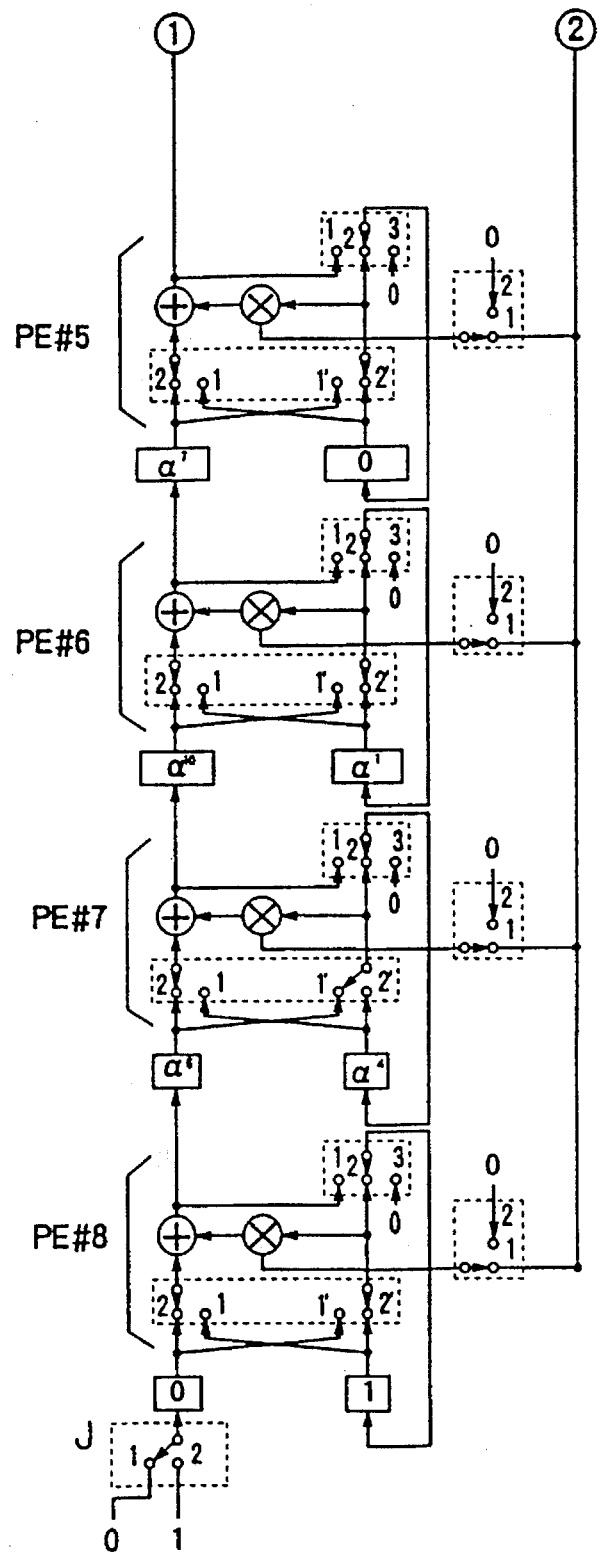
Figure 22A:
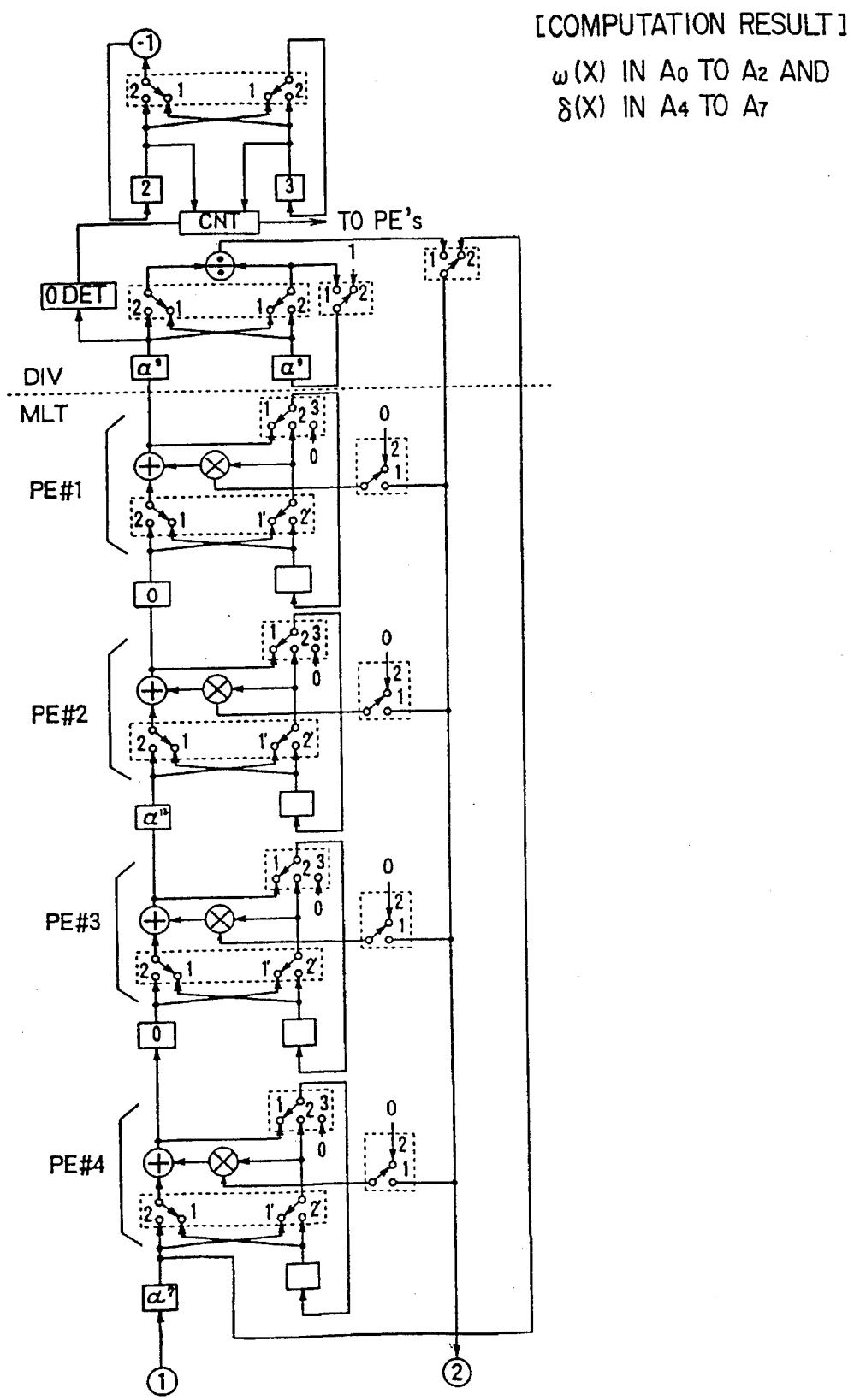
FIGS. 22a and 22b are views illustrating the operation mode of a final step in the third operation example in the lost data correction circuit of the second embodiment of the present invention.
Figure 22B:
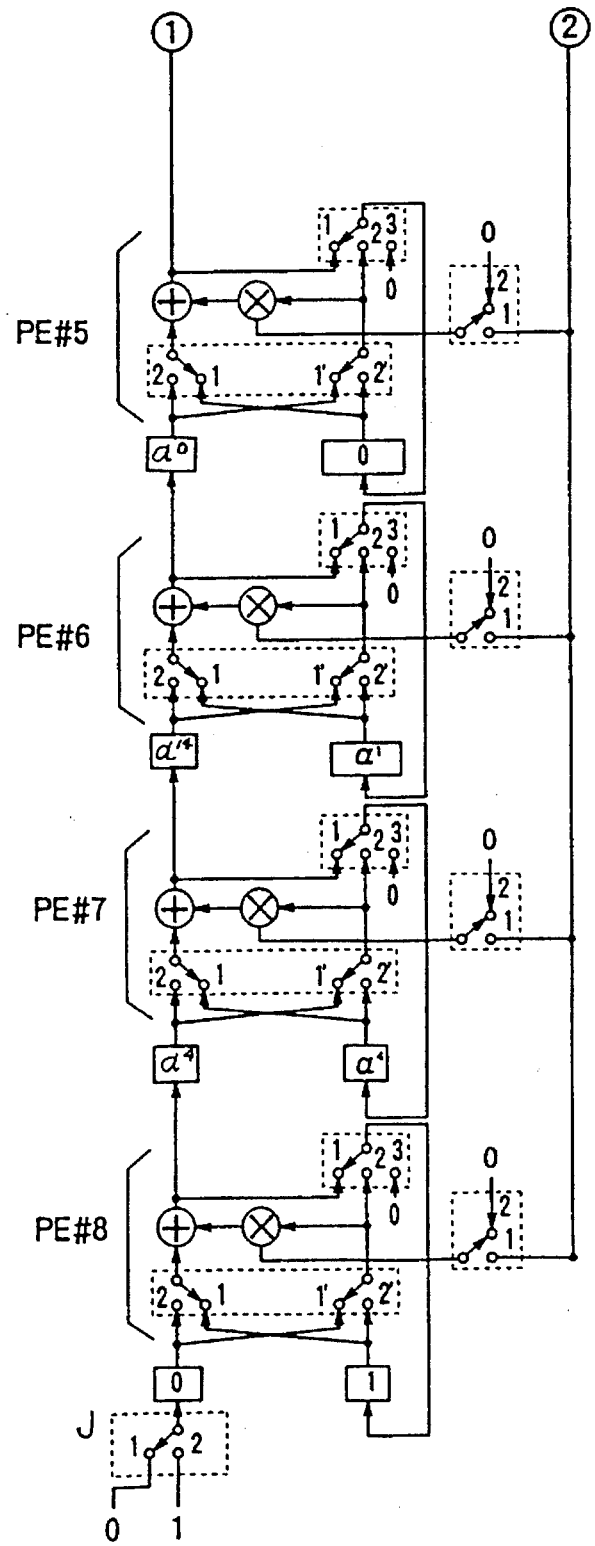

Subsequently, in the four step of computation performed in FIGS. 21a and 21b, the value ($dR_1$) of the register DR is "3" and the value ($dQ_1$) of the register DQ is "3", and therefore DR becomes equal to or larger than DQ, and the computation of the normal mode is carried out. Therefore, the switching units C, H and N are switched to the normal side 1–1', a computation such as $\alpha^{13}/\alpha^9$ is carried out in the divider G, and the division result $\alpha^4$ passes through the switching unit S and is output to the computation units.

One multiplication and addition computation unit MLT performs the computation of the normal mode. A calculation for finding the $R_2(X)$ is:

$$\begin{aligned} R_2(X) &= R_1(X) + (\alpha^{13}/\alpha^9) Q_1(X) \\ &= \alpha^{13} X^3 + \alpha^2 X^2 + \alpha^0 X + \alpha^4(\alpha^9 X^3 + \alpha^7 X^2 + \alpha^{11} X + \alpha^9) \\ &= \alpha^9 X^2 + \alpha^{13} \end{aligned}$$

So as to find these coefficients, in the computation units of from PE#1 to PE#3, the following three coefficient computations are carried out.

$\alpha^3 = \alpha^7 \times \alpha^6 + 0$ $\alpha^9 = \alpha^{11} \times \alpha^6 + 0$ $\alpha^{14} = \alpha^9 \times \alpha^6 + 0$ Similarly, $\lambda_1(X)$ is found by a computation such as:

$$\begin{aligned}\lambda_2(X) &= \lambda_1(X) + (\alpha^{13}/\alpha^9)\mu_1(X) \\ &= \alpha^7 X^3 + \alpha^{10} X^2 + \alpha^6 X + \alpha^4 \cdot (\alpha^1 X^2 + \alpha^4 X + 1) \\ &= \alpha^7 X^3 + \alpha^0 X^2 + \alpha^{14} X \, \alpha^4\end{aligned}$$

and therefore, it is realized when the following four coefficient computations are carried out in the computation units PE#5 to PE#8:

$\alpha^7 = \alpha^0 \times \alpha^6 + \alpha^7$ $\alpha^0 = \alpha^1 \times \alpha^6 + \alpha^{10}$ $\alpha^{14} = \alpha^4 \times \alpha^6 + \alpha^6$ $\alpha^4 = \alpha^0 \times \alpha^6 + 0$ At the point of time when the four steps of computation are ended, the coefficients stored in the registers become as shown in FIG. 41 and FIG. 42. It is seen that the coefficients $\alpha^9$, 0, and $\alpha^3$ of $\omega(X)$ are found in the registers $A_0$ to $A_2$, and the coefficients $\alpha^7$, $\alpha^0$, $\alpha^{14}$, and $\alpha^4$ of $\sigma(X)$ are found in the registers $A_4$ to $A_7$.

Operation 2: Where the Lost Data Symbol Does Not Exist

As already mentioned, the operation where the lost data symbol does not exist is the same as that in the case of the method of configuration F. This can be realized by always selecting the 1 side for the switching unit T and performing the same computation as that in the method of configuration F. Since they are quite the same, the explanation will be omitted.

The above-mentioned processing steps may be summarized as shown in the next tables.

TABLE 8

| | Case of $\epsilon = 0$ | | |
|---|---|---|---|
| Step | Content of operation | | Code |
| Initialization | Euclidean mutual division computation initialization | | EI |
| 1 ... 2t | Euclidean mutual division computation | $dR_i < dQ_i$ and $A_0 \neq 0$ | Cross mode | EC |
| | | $dR_i \geq dQ_i$ or $A_0 = 0$ | Normal mode | EN |

TABLE 9

| | Case of $2t \geq \epsilon > 0$ | | |
|---|---|---|---|
| Step | Content of operation | | Code |
| Initialization | Polynomial computation initialization | | PI |
| 1 ... $\epsilon$−1 | Polynomial multiplication | | PM |
| $\epsilon$ | | Euclidean mutual division computation initialization | PE |
| 1 ... 2t | Euclidean mutual | $dR_i < dQ_i$ and $A_0 \neq 0$ | Cross mode | EC |

TABLE 9-continued

| | Case of $2t \geq \epsilon > 0$ | | |
|---|---|---|---|
| Step | Content of operation | | Code |
| | division computation | $dR_i \geq dQ_i$ or $A_0 = 0$ | Normal mode | EN |

Also in the operation of the present method of configuration proposed in this way, four operation modes of the initialization (EI) for the computation of Euclidean mutual division method, initializations for Euclidean mutual dividing computation (EC, EN), and initialization for polynomial computation (PI) perform quite the same processings as those in the method of configuration F, but in the operation mode of the case of the polynomial computation (PM, PE), the computation performed in each computation unit is changed in accordance with the number of computation processes.

Note that, the case where $\epsilon = 2t$ can be considered to be a special case where not even one computation of Euclidean mutual division method is carried out in the case where the lost data symbol exists. This is summarized in the tables.

Where the present proposal is realized by the configuration as in FIGS. 16a and 16b using the configuration of the computation unit shown in FIG. 17, seven types of computations indicated by the following equations become necessary in the computation unit.

1) $X' = X \cdot Z + Y$ $Y' = X$ \hfill (85)

2) $X' = Y \cdot Z + X$ $Y' = Y$ \hfill (86)

3) $X' = Y' = X \cdot Z + Y$ \hfill (87)

4) $X' = X \cdot Z + Y$ $Y' = 0$ \hfill (88)

5) $X' = Y' = Y$ \hfill (89)

6) $X' = X$ $Y' = 0$ \hfill (90)

7) $X' = Y$ $Y' = 0$ \hfill (91)

Accordingly, concerning the configuration of the computation unit, a configuration which can perform these seven types of computations becomes needed. This can be achieved by the configuration of the computation unit shown in FIG. 17, used in the configuration of FIGS. 16a and 16b.

In the computation unit of FIG. 17, by switching three switching units N, P, and T as shown in the following table, the computations of 1) to 7) can be carried out.

The computations in the computation processes will be shown in the next table. In this way, in the operation of PM and PE at which the polynomial computation is carried out, it should be noted that the operation of the computation units of PE#2t+1 to PE#4t−1 is changed by the number i of computation processes.

TABLE 10

| No. | Computation | Switching unit 101 102 | 105 | 107 |
|---|---|---|---|---|
| 1 | X'=X·Z+Y, Y'=X | 1-1' | 2 | 1 |
| 2 | X'=Y·Z+X, Y'=Y | 2-2' | 2 | 1 |
| 3 | X'=Y'=X·Z+Y | 1-1' | 1 | 1 |
| 4 | X'=X·Z+Y, Y'=0 | 1-1' | 3 | 1 |
| 5 | X'=Y'=Y | 1-1' | 1 | 2 |
| 6 | X'=X, Y'=0 | 2-2' | 3 | 2 |
| 7 | X'=Y, Y'=0 | 1-1' | 3 | 2 |

Also, in the operation of the PE mode, the values stored in the group of the B side registers are merely changed to "0" acting as the initial values of the Euclidean mutual division method in the operation of the PM mode.

TABLE 11

| Abbr. | Operation of i-th computation unit i | Computation | Switching unit 140 142 | 126 128 | 101 102 | 105 | 107 | 144 | 150 | 201 |
|---|---|---|---|---|---|---|---|---|---|---|
| PM | 1 to 2t-1 4t-i to 4t | 3 | — | — | 1-1' | 1 | 2 | — | 2 | 2 |
|  | 2t | 5 | — | — | 1-1' | 1 | 2 |  |  |  |
|  | 2t+1 to 4t-i | 6 | — | — | 2-2' | 3 | 2 |  |  |  |
| PE | 1 to 2t-1 4t-i+1 to 4t | 4 | — | — | 1-1' | 3 | 1 | 2 | 2 | 2 |
|  | 2t | 7 | — | — | 1-1' | 3 | 2 |  |  |  |
|  | 2t+1 to 4t-i | 6 | — | — | 2-2' | 3 | 2 |  |  |  |
| EC | 1 to 4t | 1 | 1-1' | 1-1' | 1-1' | 2 | 1 | 1 | 1 | 1 |
| EN | 1 to 4t | 2 | 2-2' | 2-2' | 2-2' | 2 | 1 |  |  |  |

Note that, the present example shown in FIG. 15c to FIGS. 16a and 16b is merely one example. Various structural examples can be considered other than this. Also, along with this, also the method of configuration of the computation unit greatly differs.

For example, it is not inherently necessary to connect the register $A_{2t}$ and the computation unit PE#2t. It is also possible to separate them. In this case, there is an advantage such that the input of the A side of the computation unit PE#2t may be "0", and it becomes unnecessary to specifically treat only the computation unit of the computation unit PE#2t.

Accordingly, in this configuration, it is sufficient if the same processing is carried out for the computation units PE#1 to PE#2t even at the time of the polynomial computation.

Moreover, also for the configuration of the computation unit PE, various configurations can be considered other than FIG. 17. Basically, as the configuration in FIG. 15c to 18a, any type of configuration can be adopted so far as the seven types of computation shown in equation 85 to equation 91 are realized.

Also, in the configuration mentioned in the above-described modified aspects, the computations shown in equation 62 and equation 64 become unnecessary.

As will be seen from the above table, a configuration where all types of computations are possible is not needed in all the computation units in practice. For example, it is sufficient if the computation units PE#1 to PE#2t-1 have the configuration of the computation unit of FIG. 4.

Similarly, in the computation units PE#2t+1 to PE#4t-1, the computation 5) and computation 7) become unnecessary. In this way, the types of the computation are reduced, whereby the configuration of the computation unit can be further simplified.

Further, as already mentioned, in actuality the computation of multiplication is not carried out in the computation unit PE#2t and the computation unit PE#4t, and therefore, it is possible to further simplify the configuration by replacing the computation unit by a simple control circuit.

In FIG. 15c to 16b, a circuit for storing syndromes $S_i$ and lost data positions $U_i$ acting as the initial values with respect to the group of registers and the values such as (2t-1), 2t which are the initial values of the DR and DQ when performing the computation of the Euclidean mutual division method is omitted. As a circuit for initializing the syndrome $S_i$, various methods for example a method of simultaneously storing the coefficients in all registers, a method of gradually storing the coefficients from the last register, etc., can be considered. In the former case, it is necessary to add an input switching unit to each register, but all registers can be simultaneously initialized. However, these circuits can be constituted by an extremely simple circuit and are not fundamental to the computation and therefore are omitted here.

According to the second embodiment, a method of correcting lost data and a lost data correction circuit for performing the lost data correction more efficiently than the first embodiment can be provided.

In the present method of configuration, the same operation as that in the method of configuration F is basically carried out, but the lost data position storage region which was redundant in the method of configuration F and the coefficient storage region of polynomial for calculating the lost data position polynomial u(X) are shared, whereby the reduction of the storage region is made possible. For example, in the proposed method of configuration as shown in FIG. 15c to 16b, the registers $UD_1$ to $UD_{2t}$ in the structural views shown in FIGS. 3a to 3c are deleted, and registers $A_{2t}$ to $A_{4t-1}$ are shared.

By commonly using the storage region in this way, it is sufficient if a slight change is made to the configuration of the computation unit, and it is sufficient if the change is made also to the operation in each computation unit at the time of the polynomial computation.

From the above-mentioned characteristic features, when the present method of configuration is used, a decoder which realizes the lost data correction with a smaller circuit scale while maintaining the high speed operation property of the method of configuration F can be constituted. Of course, the characteristic feature that the computation can be successively carried out is retained as it is.

THIRD EMBODIMENT

A third embodiment of the present invention will now be explained.

The above-mentioned embodiment described lost data correction in a case of a fixed length code as illustrated in FIG. 23. In the case of a fixed length code, the code length thereof is known, therefore the lost data correction processing is carried out from the LSB (least significant bit), that is, the $\alpha^0$ side, to the MSB (most significant bit).

Figure 24:
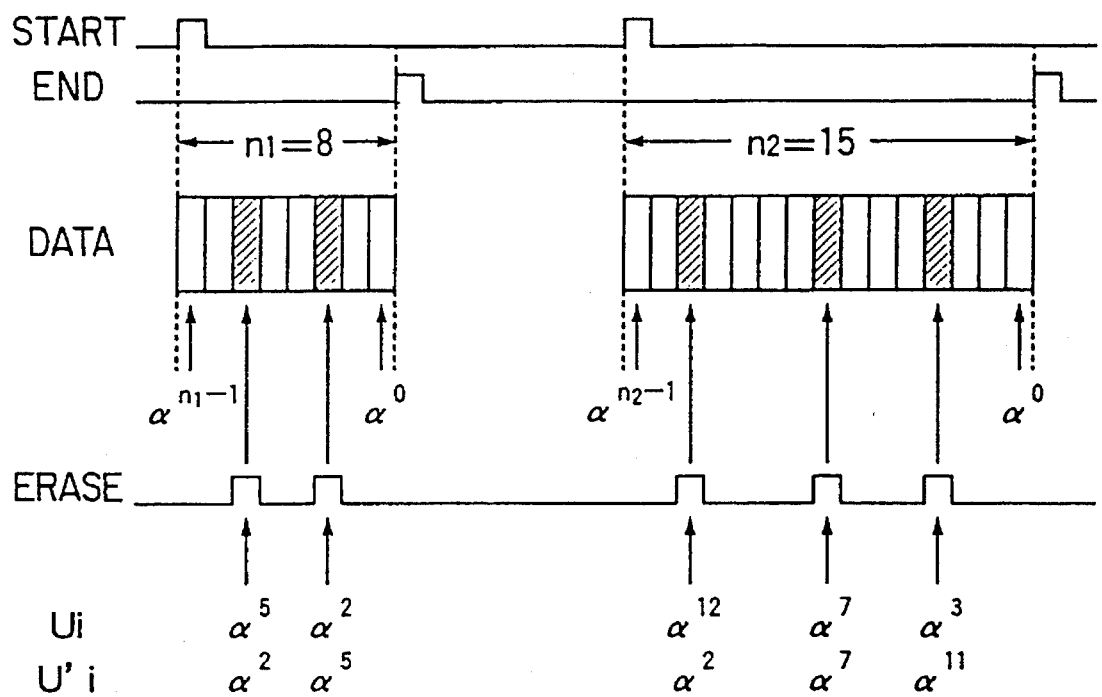
FIG. 24 is a view of the mode of processing of a variable length code.

Contrary to this, in the third embodiment, as shown in FIG. 24, lost data correction of variable length codes, in other words, codes having various symbol lengths, is carried out. In the case of a variable length code, the length of the incoming code is not clear, and therefore the lost data correction is carried out from the MSB to the LSB. Accordingly, in the third embodiment, inverse order lost data positions $U'_i$ having an inverse order with respect to the lost data positions $U_i$ in the case of the fixed length code will be dealt with.

Also, for the third embodiment, the operation of a circuit configuration suitable for when processing of inverse order lost data positions $U'_i$ is carried out will be explained.

Below, the third embodiment will be explained in relation with the method of configuration F.

In the method of configuration F, there was proposed a method of computation that simplifies the process of calculation of these polynomials, which becomes a problem when constructing a lost data correction decoder, so the polynomial coefficients to beheld in the middle of the computation become unnecessary. Also, as an example of a system realizing this computation method, a method of configuration as shown in FIGS. 3a to 3c and a configuration of a processing element as shown in FIG. 3b are proposed.

In the method of configuration F, 4t number of processing elements and (8t+2) number of storage elements (registers) are used, and a total error position polynomial and error evaluation polynomial can be obtained by only 2t steps of successive computation in total. Accordingly, reduction of the circuit size and high speed operation become possible.

In the method of configuration F, they are simultaneously carried out by $\epsilon$ steps by 4t times multiplication and addition per step of polynomial computation of the lost data position polynomial u(X) and correction syndrome polynomial T(X) which become necessary along with lost data correction. Next, the computation of the modified Euclidean mutual dividing method in which the initial value of $\gamma_0(X)$ is changed to u(X) is carried out by 2t–$\epsilon$ steps, whereby a total error position polynomial $\underline{\sigma(X)}$, which is the product polynomial of the error position polynomial $\sigma(X)$ and lost data position polynomial u(X) is directly found.

As the result of the change of the method of computation, as shown in FIG. 2, the computation process is simplified. Namely, u(X) and T(X) are simultaneously found by the first $\epsilon$ steps of computation, and $\underline{\sigma(X)}$ and $\omega(X)$ are found in the next (2t–$\epsilon$) steps. In this way, in comparison with the conventional process shown in FIG. 1, the computation process shown in FIG. 2 can perform computation without the use, in the subsequent computation process, of the coefficients of $U_i$ and u(X) obtained in the initial computation process.

This first polynomial computation and the subsequent computation of the modified Euclidean mutual division method can be successively executed without interruption, and therefore, irrespective of the number of lost symbols, $\underline{\sigma(X)}$ and $\omega(X)$ can be always found by 2t steps of computation in total. Also, $\sigma(X)$ where there is no lost symbol and the usual correction is carried out and the $\underline{\sigma(X)}$ where the lost data correction is carried out can be treated in exactly the same manner.

In the present method of configuration, two types of operation are carried out depending on the presence or absence of lost symbols, and the most significant coefficient of the $dR_p$-th order (p=2t) polynomial $\omega(X)$ which is obtained in any case is stored in $A_0$, and subsequently coefficients are sequentially stored in a descending order. Also, both of $\underline{\sigma(X)}$ obtained where a lost symbol such as $\epsilon>0$ exists and $\sigma(X)$ obtained where a lost symbol of $\epsilon=0$ does not exist become $(dR_p+1)$-th order polynomials and are obtained when the coefficients are sequentially stored in $A_P$ to $A_{2P}$ shown in FIGS. 3a to 3c from the most significant coefficient in the descending order.

Also, when the error pattern is calculated in the lost data correction, the correction is carried out using $\underline{\sigma(X)}$ and $\omega(X)$, whereby it becomes possible to use a common equation as a calculation equation of error patterns with respect to the lost data positions $U_i$ and error positions $X_i$. Also, the most significant coefficients among the coefficients of $\omega(X)$ and $\sigma(X)$ are stored in the registers $A_0$ and $A_P$, respectively and therefore calculation of the error pattern becomes extremely easy.

In this way, in the method of configuration F, the computation of the lost data correction can be realized by repeating 4t multiplication and addition operations per step by 2t steps. The number of multiplication and addition operations necessary in the present method of configuration is larger than the number of computations inherently necessary in the lost data correction, but the process of computation is simplified at the same time; a region for storing the coefficients of the lost data positions $U_i$ and lost data position polynomial u(X) etc. becomes unnecessary.

Due to the characteristic features as mentioned above, a decoder realizing lost data correction with a smaller circuit scale can be constituted when the present method of constitution is used. Also, since the configuration of the computation unit itself is simple, a high speed operation becomes possible. Further, the computation can be successively carried out, and therefore a throughput time required for the computation can be reduced.

However, the method of constitution F included a defect that registers for storing lost data positions such as $UD_1$ to $UD_P$ in the example shown in FIGS. 3a to 3c became separately necessary, and therefore the circuit scale was enlarged.

Also, naturally, the lost data positions $U_1$ to $U_P$ acting as the input in the lost data correction circuit of the method of configuration F require the lost data positions obtained by counting the header of the code as $\alpha^0$ with respect to the symbol series input in an inverse order from the symbol corresponding to the position of $\alpha^{n-1}$ as mentioned in the previous section.

However, the method of configuration F does not give a method of extraction of the lost data positions $U_i$ in the case where the code length varies for each code.

In the error correction of a code length n, concerning the error positions and lost data positions, in the usual case, the header of the code is considered to be $\alpha^0$ and the tail end of the code is considered to be $\alpha^{n-1}$.

Usually, 2t number of parity symbols in the code added to the information symbols exist at the positions corresponding to $\alpha^0$ to $\alpha^{2t-1}$. Accordingly, in the usual encode (parity generator), (n−2t) number of information symbols are input from the position of $\alpha^{n-1}$ to the position of $\alpha^{2t}$ in an inverse order, and the parity symbols are output as the result of computation with respect to these information symbols in an order corresponding to the positions of from $\alpha^{2t-1}$ to $\alpha^0$.

In this way, in the usual parity generation circuit, the symbols in the code are output in an inverse order from the symbol at the position of $\alpha^{n-1}$, and therefore in the error correction circuit on the reception side, desirably the code input in this inverse order can be processed as is. Where this is impossible, procedures for inverting the symbol series and lost data flags input in an inverse order using a storage element such as a memory becomes necessary as a pretreatment and thus the circuit scale is increased.

In the case of the usual lost data correction, the lost data positions are given by the lost data flags, which are bits of signal input together with the data. In the lost data correction, as the information of the lost data positions, $U_i$ indicating the positions in the code are necessary, and it is necessary to find the lost data positions $U_i$ from the lost data flags. Note, it is necessary to count also the lost data positions while defining the header as $\alpha^{n-1}$.

As an example, it is assumed that the header and tail of the code are indicated by start and end signals as shown in FIG. 24. Where the code length is fixed and predetermined as in FIG. 24, the header of the code is always the already known $\alpha^{n-1}$, and therefore they are counted in an order of from $\alpha^{n-1}$ to $\alpha^{n-2}$, $\alpha^{n-3}$, ..., $\alpha^0$ by using a circuit as shown in for example FIGS. 25a and 25b, to extract the positions indicated by the lost data flags, whereby the lost data positions $U_i$ can be easily obtained.

Figure 25A:
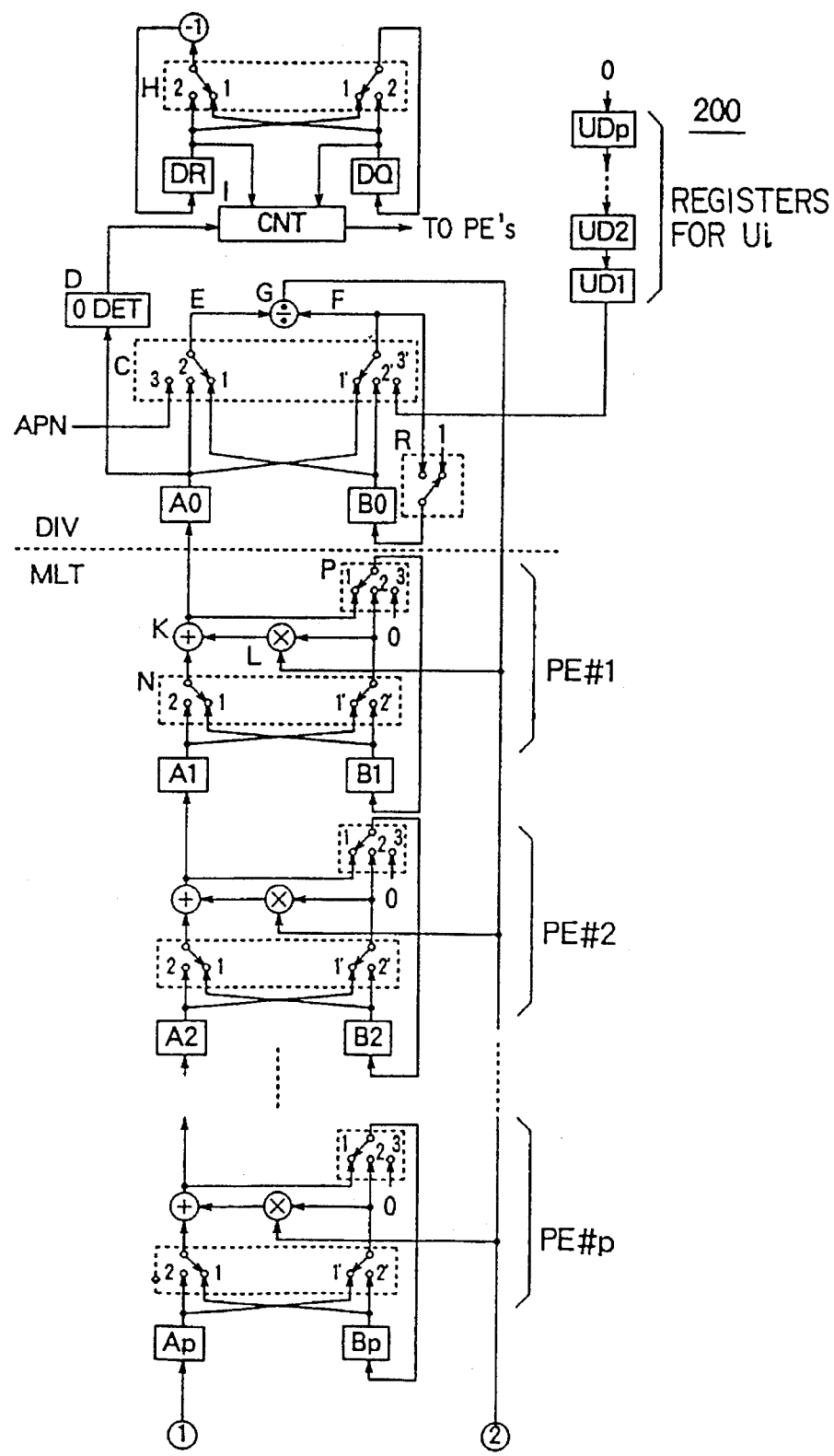
FIGS. 25a and 25b are views of a lost data correction circuit of a variable length code of a third embodiment of the present invention.
Figure 26:
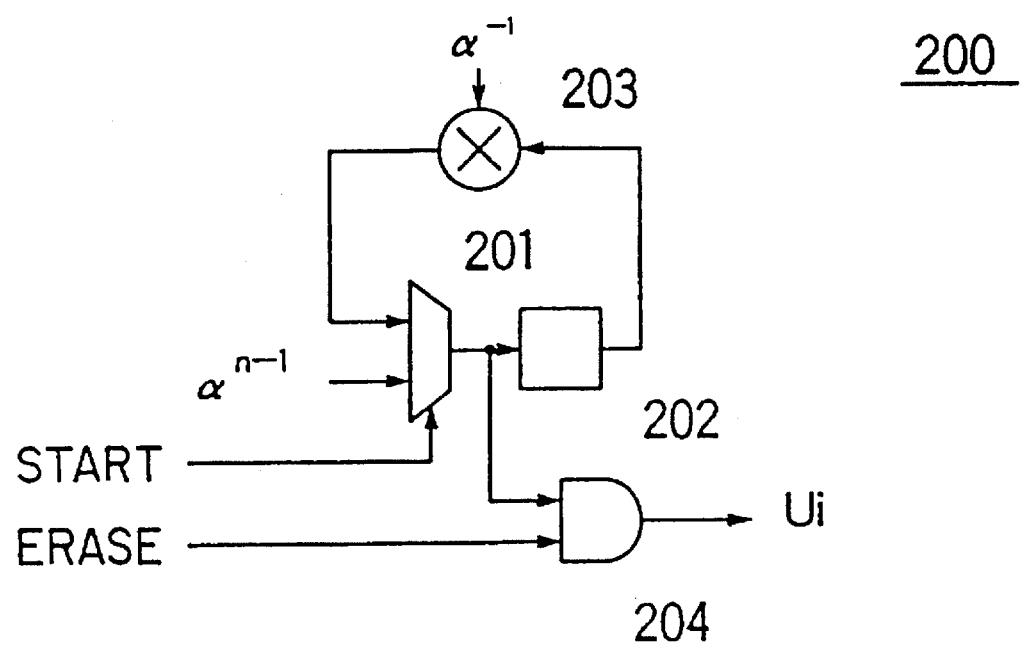

FIG. 26 shows the configuration of a unit circuit of the circuit (register for $U'_i$) which holds the inverse order lost data position $U'_i$ data which is shown in FIG. 25a and sequentially shifts the same.

The $U'_i$ register circuit 200 is constituted by an adder 201, a data holding register 202, a multiplier 203, and an AND gate 204.

When the start signal is applied to the adder 201, the output data $\alpha^{n-1}$ of the multiplier 203 is added, and the result of addition is held in the data holding register 202. The multiplication between the held addition result and data $\alpha^{-1}$ is carried out at the multiplier 203, and the result is applied to the adder 201. On the other hand, the result of addition in the adder 201 is applied to the AND gate 204, gated by the lost data signal, and output as $U_i$.

Figure 27:
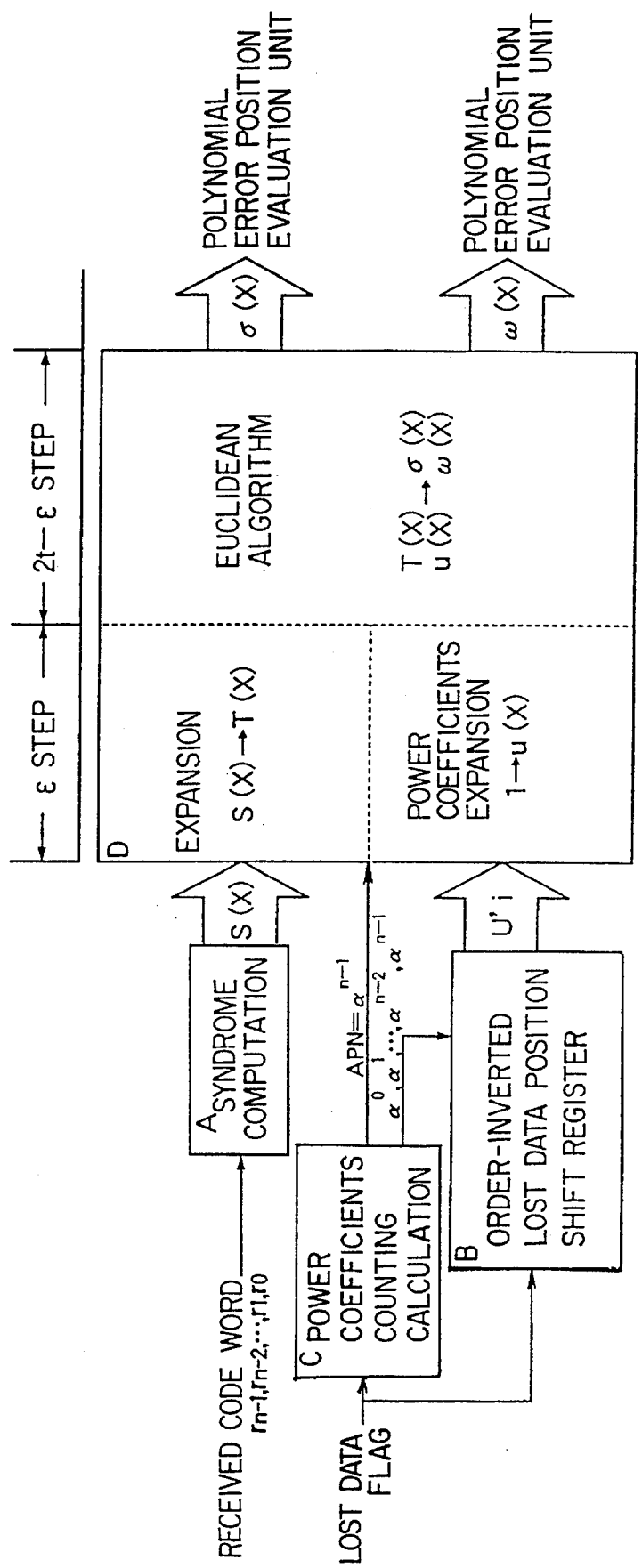
FIG. 27 is an overall structural view of the lost data correction circuit of a variable length code.
Figure 28:
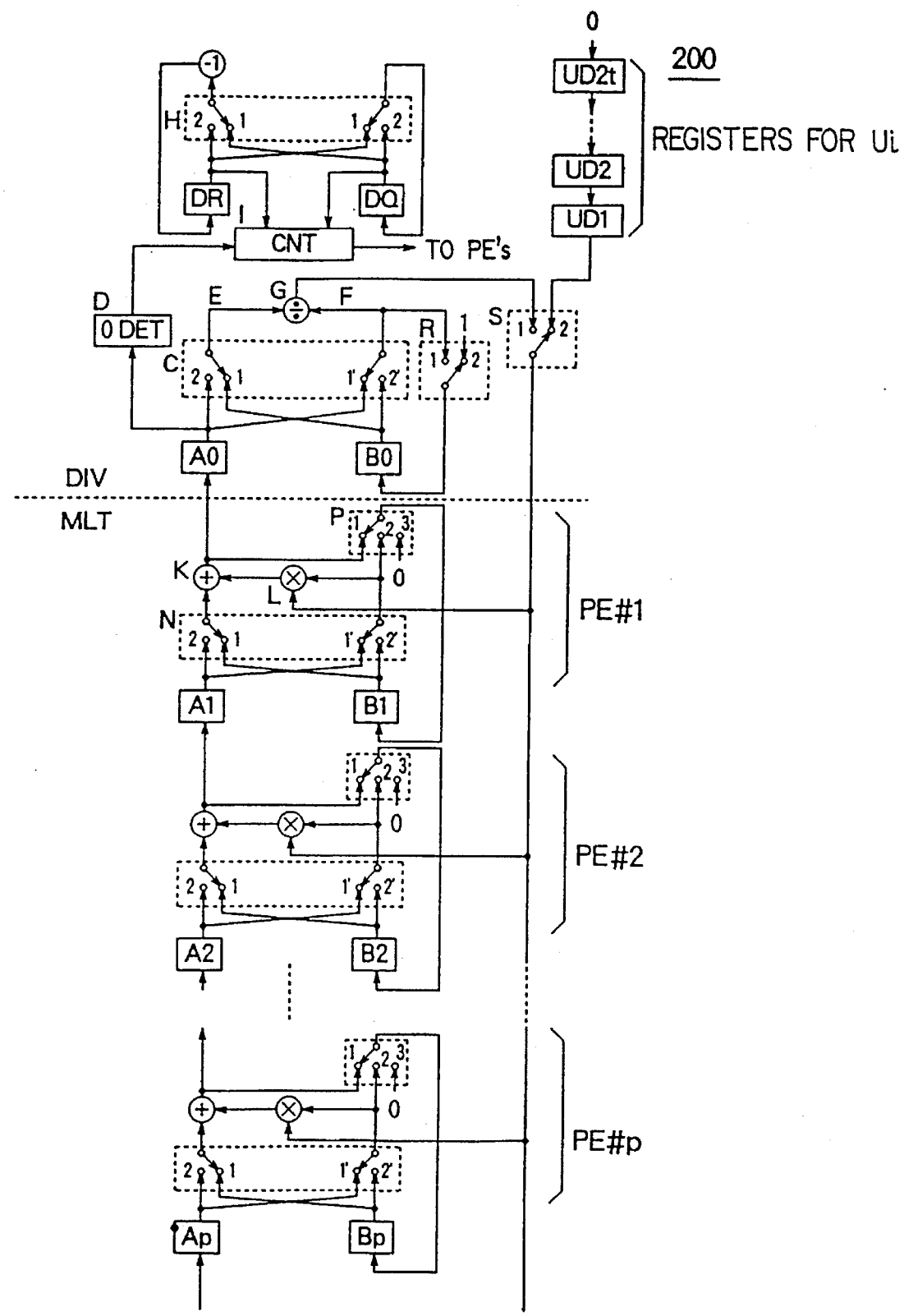
FIG. 28 is a view showing the initialized state in the lost data correction circuit of the third embodiment of the present invention.

However, in a variable code length lost data correction system, to which codes having different code lengths are input as shown in FIG. 27, the code length cannot be known until the end signal indicating the tail end of the code is input. Accordingly, this means that the lost data positions $U_i$ cannot be directly calculated so far as the code length is not already known by some method or another.

In the example of FIG. 27, the code length $n_1$ of the first code is equal to 8, and the code length $n_2$ of the next code is equal to 15. In this example, in any code, the third symbol when counting from the header of the code is the lost data symbol, but contrary to a fact that this position is $\alpha^5$ in the first code, the position becomes $\alpha^{12}$ in the next code, and therefore they differ.

As a method of resolving this, a method of inputting the code length from the outside for every code can be considered. However, depending on the method of use, there sometimes exists a case where the code length cannot be known until the end signal comes, and therefore a necessity of counting the series of data from the start signal to the end signal occurs. For this purpose, it becomes necessary to delay the data and lost data signal until the counting is ended, and therefore an excessive storage mechanism becomes necessary.

From the above, a lost data correction circuit which vary the code length for every code with a high efficiency without an addition of an excessive mechanism is demanded.

In the third embodiment, a method of configuration of a lost data correction circuit which can vary the code length for every code without an enlargement of size by improving the method of configuration F of the lost data correction circuit will be proposed.

The present method of configuration is almost the same as the method of configuration F in its configuration per se, but can easily cope with variable code lengths by improving the method of the polynomial computation of the first ε steps in the method of configuration F.

As mentioned in the previous section, the sequence of the symbols output from the usual parity generator is an inverse order of $\alpha^{n-2}$, $\alpha^{n-3}$, ..., $\alpha^1$, $\alpha^0$ from the symbol corresponding to the position of $\alpha^{n-1}$. Accordingly, in the lost data correction circuit on the reception side, correction which can be carried out with respect to the series of symbols of data input in this inverse order as they are is desirable from the viewpoint of the circuit scale.

However, the code length n is not known until all symbols in one code are received in the case where the code length is variable, and therefore the position $\alpha^{n-1}$ corresponding to the first symbol cannot be specified.

On the other hand, at a point of time when the input of all of the series of symbols in one code is completed, the number of input symbols (code length) n is known, and therefore $\alpha^{n-1}$ can be easily calculated.

Therefore, in the present method of configuration, not the lost data positions $U_i$ which were obtained by counting the lost data positions to be stored for the lost data correction in a correct order, but the lost data positions $U'_i$ which were counted in an inverse order of counting the header of the input symbol series as $\alpha^0$ are stored. From the inverse order lost data positions $U'_i$, and the $\alpha^{n-1}$ obtained at the completion of input of a code (hereinafter described as APN, i.e. APN=$\alpha^{n-1}$), the original lost data positions $U_i$ are obtained using an equation 92:

$$U_i = \frac{\alpha^{n-1}}{U'_i} \quad (i \leq 1 \leq \epsilon) \tag{92}$$

This situation will be explained using FIG. 24. The first code in FIG. 24 is a code having a code length such as n1=8. Following this, a second code having a code length such as $n_2$=15 is input. The input data is input from the position $\alpha^{n-1}$, and therefore the order becomes $\alpha^7$, $\alpha^6$, $\alpha^5$, ..., $\alpha^1$, and $\alpha^0$ at the first code. Also the second code is similarly input in an order of from $\alpha^{14}$ to $\alpha^0$. When it is assumed that the lost data signal of FIG. 24 indicates the lost data positions, there are two lost data positions at the first code, that is, $\alpha^5$ and $\alpha^2$, and there are three lost data position at the second code, that is, $\alpha^{12}$, $\alpha^7$, and $\alpha^3$.

However, both of the code lengths $n_1$ and $n_2$ are not known at the point of time when the input of data is started, and the code length is determined at first when the end signal indicating the ending of the code comes. Accordingly, where the code length varies, $U_i$ cannot be directly found unless $\alpha^{n-1}$ is known from the first.

Therefore, it is assumed that the header of the code is always counted as $\alpha^0$ for convenience, and lost data positions $U'_i$ in an inverse order are used.

Since the header of the code is always counted as $\alpha^0$, $U'_i$ can be directly found from the lost data signals. Namely, this is because the position $\alpha^0$ can be recognized at the point of time when the start signal is input. The inverse order lost data positions $U'_i$ counted in this order become $\alpha^2$ and $\alpha^5$ at the first code, and become $\alpha^2$, $\alpha^7$, and $\alpha^{11}$ at the second code. Subsequently, if $\alpha^{+1}$ is multiplied until the end signal is input, the APN (APN=$\alpha^{n-1}$) can be easily found. Then, the original forward order lost data position $U_i$ can be obtained by a simple division using equation 92. For example, this can be found as in the next equation for the first code:

$$U_1 = \frac{\alpha^7}{\alpha^2} = \alpha^5, U_2 = \frac{\alpha^7}{\alpha^5} = \alpha^2$$

$U_i$ for the second code can be similarly found as in the following equation:

$$U_1 = \frac{\alpha^{14}}{\alpha^2} = \alpha^{12}, U_2 = \frac{\alpha^{14}}{\alpha^7} = \alpha^7, U_3 = \frac{\alpha^{14}}{\alpha^{11}} = \alpha^3$$

In this way, in the computation for finding the original lost data positions $U_i$ from the $\epsilon$ number of inverse order lost data positions $U'_i$, $\epsilon$ division operations become necessary.

In the method of configuration F, computation for finding the lost data position polynomial u(X) and the correction syndrome polynomial T(X) from the syndrome polynomial S(X) and lost data positions $U_i$ necessary for the lost data correction is executed at the first $\epsilon$ steps, and a computation for finding the total error position polynomial $\sigma(X)$ and error evaluation polynomial $\omega(X)$ by the computation of the Euclidean mutual division method is executed at the (2t–$\epsilon$) steps.

Noting the first $\epsilon$ steps in the method of configuration F here, it is seen that, in the polynomial computation for finding the lost data position polynomial u(X) and correction syndrome polynomial T(X) during these $\epsilon$ steps, no divider is used.

Therefore, in the present method of configuration, it is proposed that the $\epsilon$ division operations for finding the forward order lost data positions $U_i$ from the inverse order lost data positions $U'_i$ is performed by carrying out the calculation of one lost data position per step by utilizing the divider not used in the first $\epsilon$ steps of computation in the method of configuration F, to find $U_i$, and then carrying out the polynomial computation using this.

By this improvement, a method of finding the lost data positions $U_i$, which becomes a problem in the case of $\epsilon > 0$, where a lost data symbol exists in the lost data correction of the variable code length, can be achieved by performing the division between the lost data positions $U'_i$ counted in the inverse order and the $\alpha^{n-1}$ (described as APN).

This division is carried out by using the divider not used in the first $\epsilon$ steps in the method of configuration F, and therefore the lost data correction having a variable code length can be realized with no increase of the circuit scale.

Figure 25B:
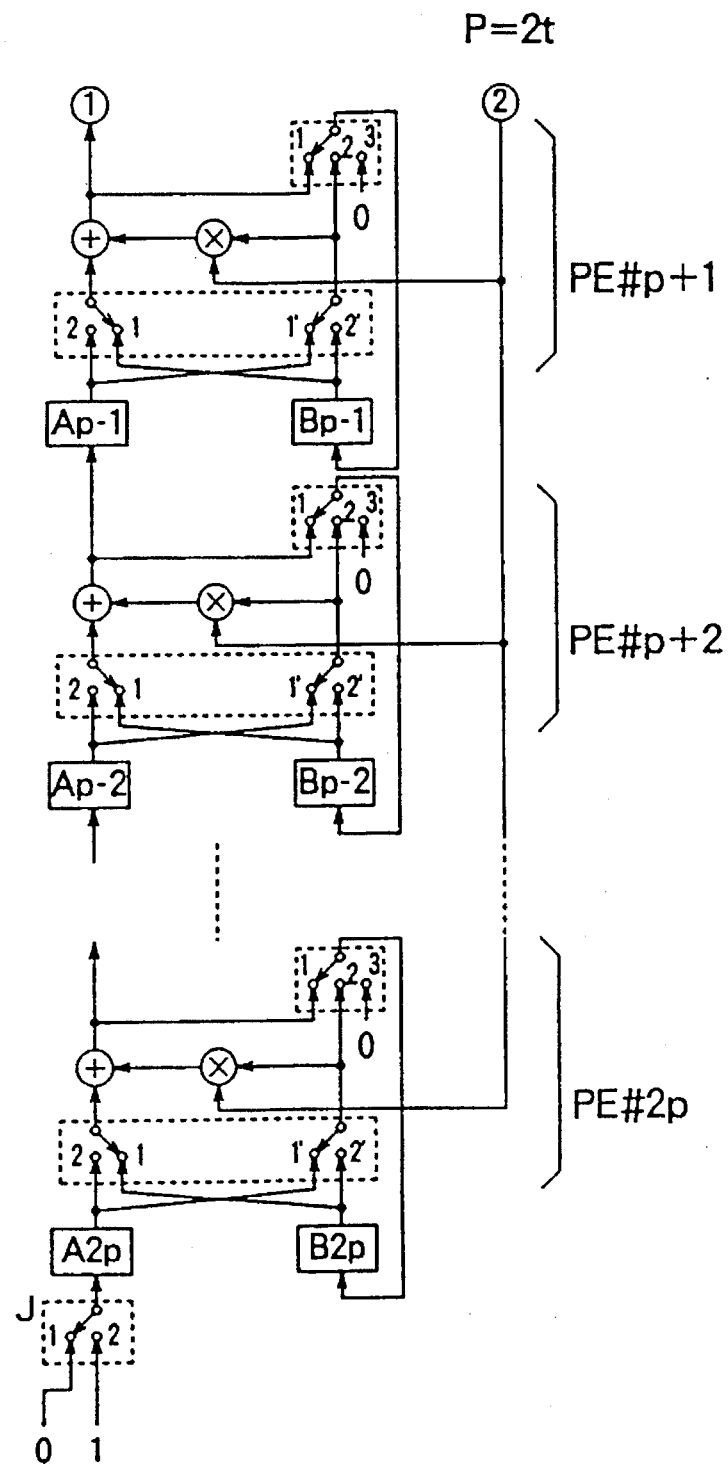

A conceptual view of the configuration of the method of configuration to be proposed is shown in FIGS. 25a and 25b. The fundamental construction of the present method of configuration is based on the method of configuration of the method of configuration F. Concretely, the example of construction shown in FIG. 23 and the example of configuration of the processing element shown in FIG. 3b are enhanced.

In the method of configuration F, as the storage region of the lost data positions, the registers $UD_1$ to $UD_P$ are provided. Among them, the lost data positions $U_i$ counted in the forward order are stored and shifted one by one per step and directly supplied to the computation units of the MLT, whereby the computation has been carried out.

An explanation will be simply made mainly for parts in the structural views of FIGS. 25a and 25b which is different from the method of configuration F. In the present example of configuration, based on the example of configuration of the method of configuration F shown in FIG. 23, a change is made to the outputs of the switching unit C and the lost data position storage registers $UD_1$.

Only one DIV exists in the configuration. G in the diagram is a dividing unit. Division such as E/F is carried out between the most significant coefficients of two polynomials in the Euclidean mutual division method. The results of this division are supplied to the computation units PE#1 to PE#p. The switching unit R is a switching unit which performs the initialization for the computation of the Euclidean mutual division method.

The registers DR and DQ in the DIV store the degrees (orders) $dR_i$ and $dQ_i$ of the most significant coefficients of the polynomials $R_i(X)$ and $Q_i(X)$ stored in the registers $A_0$ and $B_0$ when the computation of the modified Euclidean mutual division method is carried out. When the computation is actually carried out, the degrees (orders) of $R_i(X)$ and $Q_i(X)$ are expressed.

The control signal generation unit I of the DIV decides the operation of the computation which should be carried out in the computation units from the information such as the result of comparison of the registers DR and DQ, result of detection of "0" of the register $A_0$, the number of the computation steps at present, etc., and independently controls the computation units of MLT. The switching units C, H, N, P, R, and J are switched by the control signal from the control signal generation unit I.

The MLT is a unit for the multiplication and addition computation. 4t number of computation units are necessary for a system to which 2t parities are given in the present configuration in both of the computation of the first $\epsilon$ steps and in the computation of the next (2t–$\epsilon$) steps. Note, a case where computation units are not used in a multiplexed manner and each computation unit performs only one multiplication and addition with respect to one step of repetition is assumed.

Assume that, among the registers in FIGS. 25a and 25b, the group of registers $A_0, A_1, \ldots, A_{2P}$ on the left side in the figure is referred to as the A side registers, and the group of registers $B_0, B_1, \ldots, B_{2P}$ on the right side is referred to as the B side registers. When the DIV and MLT are combined, a total (4t+1) number of A side registers and a total of (4t+1) number of B side registers, i.e., (8t+2) in total registers are used. Simultaneously a 4t number of computation units are used. During the computation, coefficients of various polynomials are stored in the registers. The storage method of important coefficients is the same as that of the method of configuration F.

In the method of configuration proposed, the lost data positions $U'_1$ to $U'_P$ counted in the inverse order are stored in the lost data position storage registers $UD_1$ to $UD_P$, and a division with the $\alpha^{n-1}$ (described as APN) is carried out using the divider not used at the polynomial computation of the first $\epsilon$ steps in the method of configuration F, to find the $U_i$'s which are counted in the forward order. The polynomial computation is carried out using this.

In the example of configuration shown in FIGS. 25a and 25b based on the method of configuration proposed, the outputs of the lost data position storage register $UD_1$ are input to the F side of the divider G through the switching unit C. Moreover, also the APN is input to the E side of the divider G through the switching unit C. At the first $\epsilon$ steps of polynomial computation, the switching unit C is switched to the 3–3' side, whereby the computation indicated in equation 93 is carried out by the divider G.

$$U_i = \frac{\alpha^{n-1}}{U'_i} \quad (i \leq 1 \leq \epsilon) \tag{93}$$

The lost data positions $U_i$ counted in the forward order obtained as the result of this division are supplied to the computation units, and it becomes possible to correctly perform the polynomial computation of the first $\epsilon$ steps.

In the present method of configuration, in quite the same way as the method of configuration F, the computation process can be divided into the following two cases according to the presence or absence of lost data symbols.

TABLE 12

| Code | Content of operation | | Code |
|---|---|---|---|
| | Case of $\epsilon = 0$ | | |
| Initialization | Euclidean mutual division computation initialization | | EI |
| 1 ... 2t | Euclidean mutual division computation | $dR_i < dQ_i$ and $A_0 \neq 0$ | Cross mode | EC |
| | | $dR_i \geq dQ_i$ or $A_0 = 0$ | Normal mode | EN |

TABLE 13

| Step | Content of operation | | Code |
|---|---|---|---|
| | Case of $2t \geq \epsilon > 0$ | | |
| Initialization | Polynomial computation initialization | | PI |
| 1 ... $\epsilon$-1 | Polynomial multiplication | | PM |
| $\epsilon$ | | Euclidean mutual division computation initialization | PE |
| 1 ... 2t | Euclidean mutual division computation | $dR_i < dQ_i$ and $A_0 \neq 0$ | Cross mode | EC |
| | | $dR_i \geq dQ_i$ or $A_0 = 0$ | Normal mode | EN |

Note that, the case where $\epsilon = 2t$ can be considered to be a special case where not even one computation of Euclidean mutual division method is carried out in the case where the lost data symbol exists. This is summarized in the tables.

The operation of the present method of configuration proposed is different from the operation of the method of configuration F only in a point that the division is carried out from the lost data positions $U'_i$ counted in the inverse order in the PM and PE modes where $\epsilon > 0$ for performing the polynomial multiplication, and the polynomial computation is carried out while calculating the lost data positions $U_i$ counted in the forward order. The operation other than this is quite the same as that of the method of configuration F.

The computation necessary in each computation unit is the same as that of the method of configuration F, and therefore the same discussion as that of the configuration of the processing element of method of configuration F stands. Here, an explanation will be made by using the example of configuration of the processing element shown in FIG. 4, used in the example of the method of configuration F.

In the method of configuration of the computation unit of FIG. 4, four types of computations indicated by equation 58 to equation 61 become necessary in the same way as the configuration of the processing element which was necessary in the method of configuration F.

1) $X' = X \cdot Z + Y$ $Y' = X$ \hfill (58)

2) $X' = Y \cdot Z + X$ $Y' = Y$ \hfill (59)

3) $X' = Y' = X \cdot Z + Y$ \hfill (60)

4) $X' = X \cdot Z + Y$ $Y' = 0$ \hfill (61)

Accordingly, concerning the configuration of the computation unit, in the same way as the method of configuration F, it is sufficient if the configuration can perform these four types of computation. In the computation unit of FIG. 4, by switching the two switching units N and P as indicated in the next table, the computations of 1) to 4) mentioned above can be realized.

TABLE 14

| | | Switch | |
|---|---|---|---|
| No. | Computation | N | P |
| 1 | $X' = X \cdot Z + Y$, $Y' = X$ | 1-1' | 2 |
| 2 | $X' = Y \cdot Z + X$, $Y' = Y$ | 2-2' | 2 |
| 3 | $X' = Y' = X \cdot Z + Y$ | 1-1' | 1 |
| 4 | $X' = X \cdot Z + Y$, $Y' = 0$ | 1=1' | 3 |

Note that, to the input of the A side register at the final stage of the MLT, "0" or "1" is input by the switching unit J, and therefore the PE#2P at the final stage does not actually perform computation during the operation. Also the PE#p does not actually perform computation since the coefficient supplied from the register $A_p$ is always "0". Accordingly, the register $A_{2p}$ and the computation units PE#p and PE#2p are eliminated by a slight change of control, and a further simplification of the circuit is possible. However, they are included for the explanation of the principle of the present configuration.

Operation of Lost Data Correction Circuit Proposed

An explanation will be made next of the method of storing the coefficients of polynomials performing the computation, the initialization, and the method of computation. In the routine, the operation differs between a case where there is a lost data symbol ($\epsilon > 0$) and a case where there is no lost data symbol ($\epsilon = 0$). In the latter case, the same operation as that in the case of the previously reported method of configuration F is carried out, and therefore a detailed explanation is omitted here.

Operation 1) Where Lost Data Symbol Exists (ε>0)

In a case where a lost data symbol exists, the basic operation is the same as that in the method of configuration F. Namely, at the first ε steps, initially the calculations of u(X) and T(X) are simultaneously carried out, and u(X) and T(X) found as a result of this are used as the initial values, and the computation of the modified Euclidean mutual division method changing the initial values is carried out at the next (2t−ε) step. As mentioned in the method of configuration F, these two independent computations can be successively carried out.

The first ε steps of computation are carried out according to equation 34 and equation 47. The computation given by the recurrence formula of equation 34 and equation 47 can be rewritten to those as in equation 56 and equation 57.

$$u^{(i)}(X) = u^{(i-1)}(X) - X \cdot U_i \cdot u^{(i-1)}(X) \quad (56)$$

$$T^{(i)}(X) = T^{(i-1)}(X) - X \cdot U_i \cdot T^{(i-1)}(X) \pmod{X^p} \quad (57)$$

A coefficient storage method realizing the above computation will be explained next. This is the same as the method of configuration F, but will be simply explained.

Equation 56 and equation 57 mean that the polynomial obtained by multiplying the lost data position $U_i$ to the polynomial as a result of the shift in the polynomial per se and its coefficients to a higher significant bit by the amount of one order is added to $u^{(i-1)}(X)$ and $T^{(i-1)}(X)$.

Therefore, also in the conceptual views of the configuration of FIGS. 25a and 25b, in the same way as the case of the method of configuration F, the coefficients of $u^{(i)}(X)$ and $T^{(i)}(X)$ are stored in the A side registers, and the coefficients obtained by shifting the coefficients stored in the A side registers to lower significant bit by the amount of one order are stored in the B side registers.

The finally needed T(X) is the (2t−1)-th order polynomial, and therefore also the coefficients of $T^{(i)}(X)$ to be held in the middle of the computation may be the coefficients of the amount of the (2t−1)-th order. Accordingly, coefficients of $T^{(i)}(X)$ are sequentially stored in the registers $A_0, A_1, \ldots, A_{p-1}$ in the descending order from the (2t−1)-th order coefficient at the most significant bit.

The coefficients of $u^{(i)}(X)$ are stored in the A side registers following $T^{(i)}(X)$ from the register $A_p$ to the register $A_{2p}$ in the descending order in the same manner. The maximum degree of $u^{(i)}(X)$ is the 2t-th order, and therefore the number of coefficients becomes (2t+1). They are stored in (2t+1) registers of from the register $A_p$ to the register $A_{2p}$ in the descending order with respect to the T(X).

On the other hand, the group of B side registers store the coefficients stored in the A side register but shifting the same to the lower significant bit by the amount of one order. Namely, the coefficients stored in the register $A_0$ are stored also in the register $B_1$, and all following coefficients stored in $A_i$ are stored in $B_{i+1}$. Note that, it is assumed that "0" is put in $B_0$.

An explanation will be made next of the initialization.

Since $T^{(0)}(X)=S(X)$, the $S_{2t}$ is stored as the initial value in the register $A_0$ and subsequently until the $S_{2t-1}$ is stored in the register $A_{2t-1}$, all syndromes are stored.

Since $u^{(0)}(X)=1$, as the actual initialization, all registers of from $A_p$ to $A_{4t-1}$ are initialized to "0". "1" is given as the initialization value to only the register $A_{4t}$.

It is assumed that the coefficients of the group of the A side registers are stored in the group of the B side registers after shifting the same to a lower significant bit by the amount of one order. Note that, a circuit for a fine initialization is not essential, and therefore omitted.

On the other hand, ε lost data positions $U'_1$ to $U'_ε$ counted in the inverse order are stored in 2t number of the lost data position storage registers $UD_1$ to $UD_{2t}$, up to 2t at the maximum. The inverse order lost data positions which are stored are supplied from the register $UD_1$ to the divider through the switching unit C. Also, the $\alpha^{n-1}$ which indirectly represents the code length n is input to the input of the APN of FIGS. 25a and 25b.

The operation will be explained next.

After the storage of the coefficients and inverse order lost data positions and initialization as mentioned above, the polynomial computation of $T^{(i)}(X)$ and $u^{(i)}(X)$ is carried out by the first ε steps of computation. It is assumed that the coefficients of $T^{(i-1)}(X)$ and $u^{(i-1)}(X)$ are stored in the registers. In the first ε steps of the polynomial computation, the switching unit C is switched to the 3–3' side, and APN ($\alpha^{n-1}$) is input to the input of the E side of the divider G. Also, the lost data positions $U'_i$ counted in the inverse order are supplied from the lost data position storage register $UD_1$ to the F side input of the divider through the switching unit C. In the divider G, a computation that:

$$U_i = \frac{\alpha^{n-1}}{U'_i} \quad (i \leq 1 \leq \epsilon) \quad (65)$$

is carried out with respect to one lost data position per step, and the lost data positions $U'_i$ counted in the forward order obtained as the output are supplied to the computation units.

The switching unit N of each computation unit is switched to the 1–1' side and the switching unit P is switched to the 1 side.

From the above configuration, in each computation unit, a computation such as:

$$3) \; X' = Y' = X \cdot Z + Y \quad (60)$$

is carried out. Accordingly, with respect to the coefficients stored in the j-th register, a computation that:

$$A_j \times U_i + B_j$$

is carried out. In actuality, the same value as that in the register $A_{j-1}$ is put in the register $B_j$, and therefore a computation that:

$$A_j \times U_i + A_{j-1}$$

is carried out. The outputs of this are simultaneously stored in the two registers of the register $A_{j-1}$ and the register $B_j$. As a result of this computation, the coefficients of $T^{(i)}(X)$ and $u^{(i)}(X)$ are stored in the A side registers, and the coefficients shifted to the lower significant bit by one order are stored also on the B side.

The one step of polynomial computation is ended by this.

After this repetition is repeated ε times, $T^{(\epsilon)}(X)$ and $u^{(\epsilon)}(X)$ are obtained in the group of the A side registers. That is, $T_{2t}$ is stored in the register $A_0$ and subsequently the coefficients of the correction syndrome polynomial T(X) are stored in the A side registers in the descending order up to the register $A_{2t-1}$. Also, as the coefficients of the lost data position polynomial u(X), the 2t-th order coefficients are stored in the register $A_{2t}$, and subsequently (2t+1) number of coefficients are stored in the descending order until the 0-th order coefficient is stored in the register $A_{4t}$.

In this way, in the present method of configuration, the polynomial computation for the lost data correction can be carried out even from the lost data positions $U'_i$ counted in the inverse order and the APN.

When the first ε steps of polynomial computation is ended, the repetition of the modified Euclidean mutual division method is carried out using these stored coefficients as the initial values. This computation is carried out by basically the same method as that for the computation mentioned in the method of configuration F.

In the present configuration, the coefficients of $R_i(X)$ and $\gamma_i(X)$ in the computation of the modified Euclidean mutual division method are stored in the group of A side registers, and the coefficients of $Q_i$ and $\mu_i(X)$ are stored in the group of the B side registers in the descending order. At this time, the coefficients of $R_i(X)$ and $Q_i(X)$ are stored so that the $dR_i$-th order coefficient is positioned at the most significant bit.

This initialization in the computation of the Euclidean mutual division method stores the coefficients of the initial value $R_0(X)=T(X)$ of the $R_i(X)$ in the descending order in the group of the A side registers. $T_{2t}$ is stored in the register $A_0$ and subsequently $2t$ number of coefficients are stored up to the register $A_{2t-1}$. Following $R_0(X)$, in the A side registers, the coefficients of $\gamma_i(X)$ are stored.

In the case of the usual correction, as mentioned above, since the initial value is $\gamma_0(X)$ of $\gamma_i(X)$, it was preferred if the initial value from the register $A_{2t}$ to the register $A_{4t-1}$ was made "0", and only the register $A_{4t}$ was made "0".

In the changed lost data correction algorithm, since $\gamma_0(X)=u(X)$, it is sufficient if the initial values of the register $A_{2t}$ to the register $A_{4t}$ are replaced by the coefficients of $u(X)$. The $2t$-th order coefficients of $u(X)$ are stored in the register $A_{2t}$. Subsequently until "1", which is the 0-th order coefficient of $u(X)$, is stored in the register $A_{4t}$, the coefficients of $u(X)$ are stored in the descending order (power).

On the other hand, the initialization of the B side registers stores the coefficients of the initial value $Q_0(X)$ of $Q_i(X)$ which is equal to $X^{2t}$ in the descending order in the same way as the group of the A side registers. This can be realized if "1" is stored in the register $B_0$ and the coefficients of the register 1 to the register p other than this are made "0". Following $Q_0(X)$, in the B side registers, the coefficients of $\mu_i(X)$ are stored. Since $\mu_0(X)=0$, it is sufficient if the $B_0$ is made "0" among the B side registers and all registers other than this are made "0".

From the above description, it is seen that, after the first $\epsilon$ steps of computation are ended, the coefficients remaining in the A side registers are used as they are, and the computation of the Euclidean mutual division method can be continued. However, if the polynomial computation at the $\epsilon$-th step is carried out as it is, the coefficients stored in the A side registers are stored in the group of the B side registers after being shifted by the amount of one order.

Therefore, at the $\epsilon$-th step repetition, which is the last of the polynomial computations, it is necessary to perform the operation of preparing the coefficients of $X^{2t}$ and "0" which are the initial values of $Q_0(X)$ and $\mu_0(X)$ for performing the next computation of the modified Euclidean mutual division method in the B side registers. This can be realized by making $B_0$ equal "1" and initializing the registers following $B_1$ to all "0" without the storage of the coefficients of $T(X)$ as the result of computation in the B side register in the repeated computation at the $\epsilon$-th step. In actuality, by switching the switching unit P to the 3 side, with respect to the computation unit, a computation that:

4) $X'=X \cdot S+Y$ (61)

$Y'=0$ is carried out, whereby this can be easily realized. At this time, the switching unit R is switched to the 2 side and "1" is stored in $B_0$, and also DR and DQ which are the registers for storing $dR_i$ and $dQ_i$ are simultaneously initialized to $(2t-1)$ and $2t$, respectively.

In this way, after the initial values for the modified Euclidean mutual division method are set at the $\epsilon$-th step, the computations of the modified Euclidean mutual division method are sequentially carried out step by step over $(2t-\epsilon)$ steps.

An operation of the i-th step computation for performing the computation of the Euclidean mutual division method will be explained. Where the number $\epsilon$ of the lost data symbols is $2t$, $\omega(X)$ and $\underline{\sigma(X)}$ are found just by $2t$ polynomial computations, and therefore the computation of the Euclidean mutual division method of more than this becomes unnecessary. Therefore, assume here a case where lost data symbols of a number more than 1 and less than p exist. In such a case, at least one Euclidean mutual division method will be carried out after the polynomial computation.

First, it is detected at the 0-detector whether or not the $dR_{i-1}$-th order coefficient of $R_{i-1}(X)$ is "0". The operation mode is determined from the result of this and the relationship of magnitude between $DR_{i-1}$ and $DQ_{i-1}$.

Where $DR_{i-1}<DQ_{i-1}$ and the state that $A_0$ is not equal to 0 is notified, the mode becomes the cross mode, while becomes the normal mode in other cases. This is because, as mentioned as the prior art, the shifted mode in the modified Euclidean mutual division method actually can be treated as a normal mode in the case where the quotient from the divider G is "0".

When the mode is determined, the two switching units C and H existing in DIV are switched to cross (1–1') or normal (2–2') in accordance with the operation mode.

The value of the register $A_0$, that is, the $dR_{i-1}$-th order coefficient of $R_{i-1}(X)$, and the value of the register $B_0$, that is, the $dQ_{i-1}$-th order coefficient of $Q_{i-1}(X)$, are input to the divider G through the switching unit C. In the divider D, the division of E/F is carried out with respect to the input of E and F in the diagram, and the result of this is supplied to the computation units of the MLT.

On the other hand, in each computation unit of MLT, the computation is carried out in accordance with the operation mode decided at the DIV. During the computation of the Euclidean mutual division method, the 2 side is selected for the switching unit P.

In the case of the cross mode, the cross side (1–1') is selected for the switching unit N, and when the output of the divider is represented by Z in the processing element shown in FIG. 6, a computation such as:

1) $X'=X \cdot Z+Y$ $Y'=X$ (58)

is carried out.

In the case of the normal mode, the (2–2') is selected for the switching unit N, and a computation of equation 59 such as:

2) $X'=Y \cdot Z+X$ $Y'=Y$ (59)

is carried out.

The coefficients processed in the computation units are stored in the registers, and one step of computation is ended. At the j-th register, for the storage of the coefficients, the X' output of the (j+1)-th computation unit is stored in the A side register, and the Y' output of the j-th computation unit is stored in the B side register. Namely, this is represented as in the following equation:

$A'_j = X_{j+1}$ $B'_j = Y_j$

By repeating this routine (2t–ε) times, this can be found as:

$R_{2t-\epsilon}(X) = \omega(X)$ $\lambda_{2t-\epsilon}(X) = \hat{\sigma}(X)$

The degrees of the polynomials are $dR_i$ and $(dR_i+1)$, respectively. As the coefficients of ω(X), the $dR_i$-th order coefficient is stored in the register $A_0$, and subsequently the lower significant coefficients are stored in a descending order. Also, for the coefficient of σ(X), similarly, the $(dR_i+1)$-th order coefficient is stored in the register $A_{2t}$, and subsequently the lower significant coefficients are stored in a descending order (power).

An example of the operation where the lost data correction is carried out will be explained using an example.

In this example, a code given 2t=4 parities using the finite field $GF(2^4)$ defined using the irreducible polynomial $g(X)=X^4+X+1$ is used. In the case of usual correction, the error correction of 2 symbols at the maximum is possible, but in the case of lost data correction, the correction is possible within a range satisfying $\epsilon+2\nu \leq 2$. Also, an explanation will be made of an example wherein ε=2 and ν=1 while defining the code length n as n=15. The two original lost data positions are:

$U_1 = \alpha^{+0}$ $U_2 = \alpha^{+1}$ but the series of data actually input to the decoder is input in an order of $\alpha^{n-1}, \alpha^{n-2}, \ldots, \alpha^1, \alpha^0$, and therefore the inverse order lost data positions counting the header as $\alpha^{+0}$ becomes:

$U'_1 = \alpha^{n-1}/\alpha^{+1} = \alpha^{+14}/\alpha^{+1} = \alpha^{+13}$ $U'_2 = \alpha^{n-1}/\alpha^{+0} = \alpha^{+14}/\alpha^{+0} = \alpha^{+14}$ This will be input in an order of $U'_2$ and $U'_1$.

Assume now that the syndrome polynomial S(X) is found as:

$S(X) = \alpha^2 X^3 + \alpha^{14} X^2 + \alpha^4 X + \alpha^9$

When the error position polynomial σ(X) is derived from this syndrome polynomial S(X) using the modified Euclidean mutual division method, the following is obtained:

Step 1: Polynomial computation

The coefficients of the lost data position polynomial u(X) and the correction syndrome polynomial T(X) are found from the lost data positions $U_i$. The initialization is performed as:

$T^{(0)}(X) = S(X) = \alpha^2 X^3 + \alpha^{14} X^2 + \alpha^4 X + \alpha^9$ $u^{(0)}(X) = 1$ and the next computation is carried out:

$$\begin{aligned}
U_1 &= \alpha^{n-1}/U'_1 \\
&= \alpha^{+14}/\alpha^{+13} \\
&= \alpha^{+1}
\end{aligned}$$

$$\begin{aligned}
u^{(1)}(X) &= u^{(0)}(X) - X \cdot U_1 \cdot u^{(0)}(X) \\
&= 1 - X \cdot \alpha^{+1} \cdot 1 \\
&= \alpha^{+1} X + 1
\end{aligned}$$

$$\begin{aligned}
T^{(1)}(X) &= T^{(0)}(X) - X \cdot U_1 \cdot T^{(0)}(X) \pmod{X^4} \\
&= \alpha^2 X^3 + \alpha^{14} X^2 + \alpha^4 X + \alpha^9 - X \cdot \alpha^{+1} \cdot \\
&\quad (\alpha^2 X^3 + \alpha^{14} X^2 + \alpha^4 X + \alpha^9) \\
&= \alpha^2 X^3 + \alpha^{14} X^2 + \alpha^4 X + \alpha^9 - (\alpha^3 X^4 + \alpha^0 X^3 + \\
&\quad \alpha^5 X^2 + \alpha^{10} X) \\
&= \alpha^8 X^3 + \alpha^{12} X^2 + \alpha^2 X + \alpha^9
\end{aligned}$$

Step 2: Polynomial computation $$\begin{aligned}
U_2 &= \alpha^{n-1}/U'_2 \\
&= \alpha^{+14}/\alpha^{+14} \\
&= \alpha^{+0}
\end{aligned}$$

$$\begin{aligned}
u^{(2)}(X) &= u^{(1)}(X) - X \cdot U_2 \cdot u^{(1)}(X) \\
&= \alpha^0 X + 1 - X \cdot \alpha^{+0} \cdot (\alpha^1 X + 1) \\
&= \alpha^1 X^2 + \alpha^4 X + 1
\end{aligned}$$

$$\begin{aligned}
T^{(2)}(X) &= T^{(1)}(X) - X \cdot U_2 \cdot T^{(1)}(X) \pmod{X^4} \\
&= \alpha^8 X^3 + \alpha^{12} X^2 + \alpha^2 X + \alpha^9 - X \cdot \alpha^{+0} \cdot \\
&\quad (\alpha^8 X^3 + \alpha^{12} X^2 + \alpha^2 X + \alpha^9) \\
&= \alpha^8 X^3 + \alpha^{12} X^2 + \alpha^2 X + \alpha^9 - (\alpha^8 X^4 + \alpha^{12} X^3 + \\
&\quad \alpha^2 X^2 + \alpha^9 X) \\
&= \alpha^9 X^3 + \alpha^7 X^2 + \alpha^{11} X + \alpha^9
\end{aligned}$$

Step 3: Euclidean mutual division method and cross mode computation

The computation of the modified Euclidean mutual division method is carried out using T(X) and u(X) found in steps 1 and 2. The initialization is carried out as follows:

$dR_0 = 3$ $dQ_0 = 4$ $R_0(X) = T(X) = \alpha^9 X^3 + \alpha^7 X^2 + \alpha^{11} X + \alpha^9$ $Q_0(X) = X^4$ $\lambda_0(X) = u(X) = \alpha^1 X^2 + \alpha^0 X + 1$ $\mu_0(X) = 0$ Repeated computation is carried out as follows after the decision of the computation mode:

$$\left.\begin{aligned}
&dR_0 - dQ_0 = 3 - 4 = -1 < 0 \\
&\text{coefficient } \alpha^9 \text{ of } dR_0 - \text{order of } R_0(X),\ \alpha^9 \neq 0 \\
&\qquad\qquad\qquad\qquad\qquad\qquad \rightarrow \text{cross mode}
\end{aligned}\right\}$$

$$\begin{aligned}
R_1(X) &= Q_0(X) + (1/\alpha^9) \cdot R_0(X) \cdot X \\
&= X^4 + \alpha^6 (\alpha^9 X^3 + \alpha^7 X^2 + \alpha^{11} X + \alpha^9) \cdot X \\
&= \alpha^{13} X^3 + \alpha^2 X^2 + \alpha^0 X
\end{aligned}$$

$$\begin{aligned}
\lambda_1(X) &= \mu_0(X) + (1/\alpha^9)\lambda_0(X) X \\
&= 0 + \alpha^6 \cdot (\alpha^1 X^2 + \alpha^4 X + 1) \cdot X \\
&= \alpha^7 X^3 + \alpha^{10} X^2 + \alpha^6 X
\end{aligned}$$

$$Q_1(X) = R_0(X)$$
$$= \alpha^9 X^3 + \alpha^7 X^2 + \alpha^{11} X + \alpha^9$$
$$\mu_1(X) = \lambda_0(X)$$
$$= \alpha^1 X^2 + \alpha^4 X + 1$$
$$dR_1 = dQ_0 - 1 = 4 - 1 = 3$$
$$dQ_1 = dR_0 = 3$$

Step 4: Euclidean mutual division method and normal mode computation $$dR_1 - dQ_1 = 3 - 3 = 0 \geq 0 \rightarrow \text{normal mode}$$
$$R_2(X) = R_1(X) + (\alpha^{13}/\alpha^9) Q_1(X)$$
$$= \alpha^{13} X^3 + \alpha^2 X^2 + \alpha^0 X + \alpha^4(\alpha^9 X^3 + \alpha^7 X^2 + \alpha^{11} X + \alpha^9)$$
$$= \alpha^9 X^2 + \alpha^{13}$$
$$\lambda_2(X) = \lambda_1(X) + (\alpha^{13}/\alpha^9)\mu_1(X)$$
$$= \alpha^7 X^3 + \alpha^{10} X^2 + \alpha^6 X + \alpha^4 \cdot (\alpha^1 X^2 + \alpha^4 X + 1)$$
$$= \alpha^7 X^3 + \alpha^0 X^2 + \alpha^{14} X + \alpha^4$$
$$Q_2(X) = Q_1(X)$$
$$= \alpha^9 X^3 + \alpha^7 X^2 + \alpha^{11} X + \alpha^9$$
$$\mu_2(X) = \mu_1(X)$$
$$= \alpha^1 X^2 + \alpha^4 X + 1$$
$$dR_2 = dR_1 - 1 = 3 - 1 = 2$$
$$dQ_2 = dQ_1 = 3$$

Above, by the four step of repeated computation, $\hat{\sigma}(X)$ and $\omega(X)$ are found as in the following equation:

$$\omega(X) = R_2(X)$$
$$= \alpha^9 X^2 + \alpha^{13}$$
$$\hat{\sigma}(X) = \lambda_2(X)$$
$$= \alpha^7 X^3 + \alpha^0 X^2 + \alpha^{14} X + \alpha^4$$

By the above-mentioned four steps of computation, the $\sigma(X)$ and $\omega(X)$ looked for are found. The computation process in the case where this computation process is realized by the proposed method of configuration will be sequentially shown in FIGS. 29a to 33b.

Figure 29A:
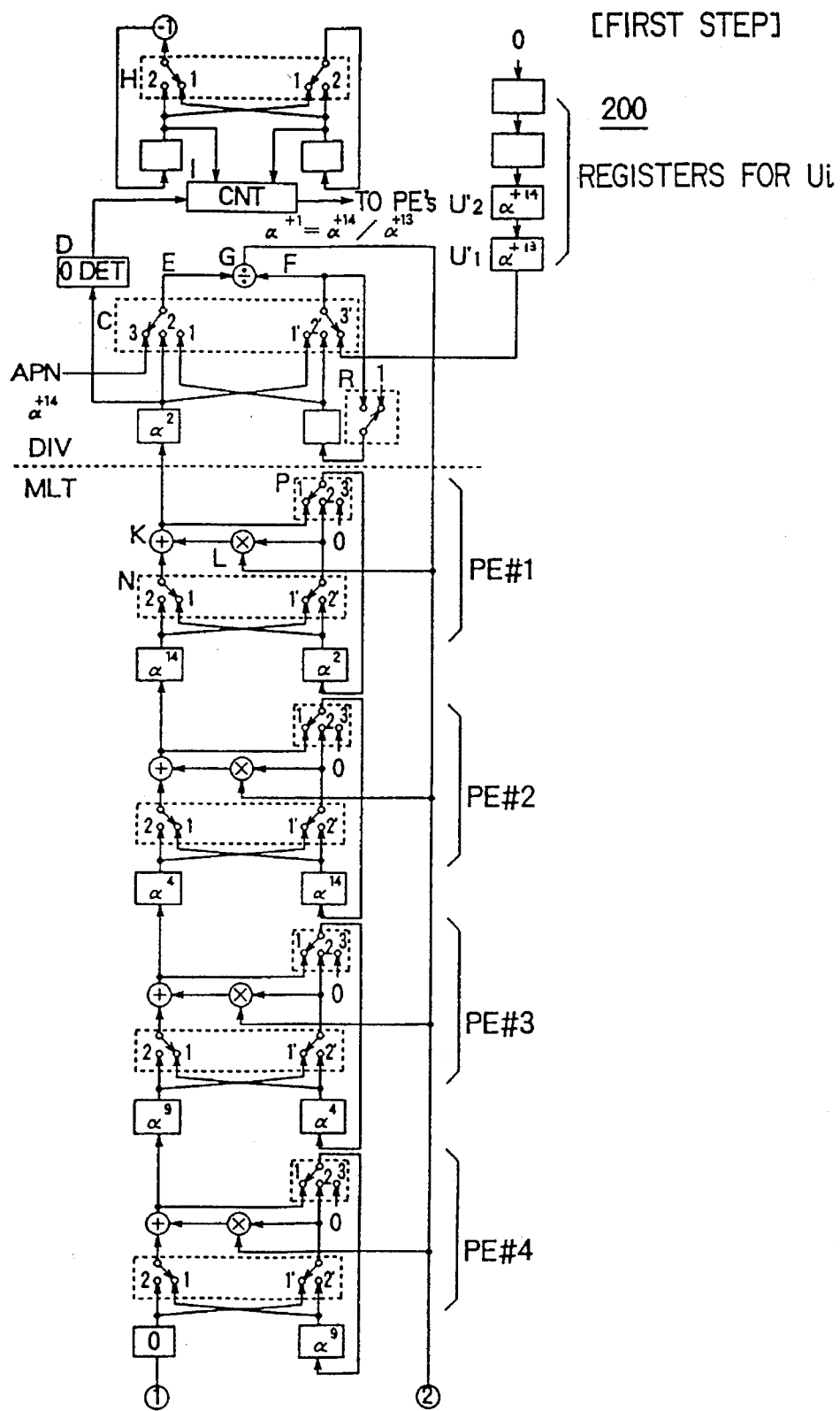
FIGS. 29a and 29b are views of the first step of operation of the lost data correction circuit of the third embodiment of the present invention.
Figure 29B:
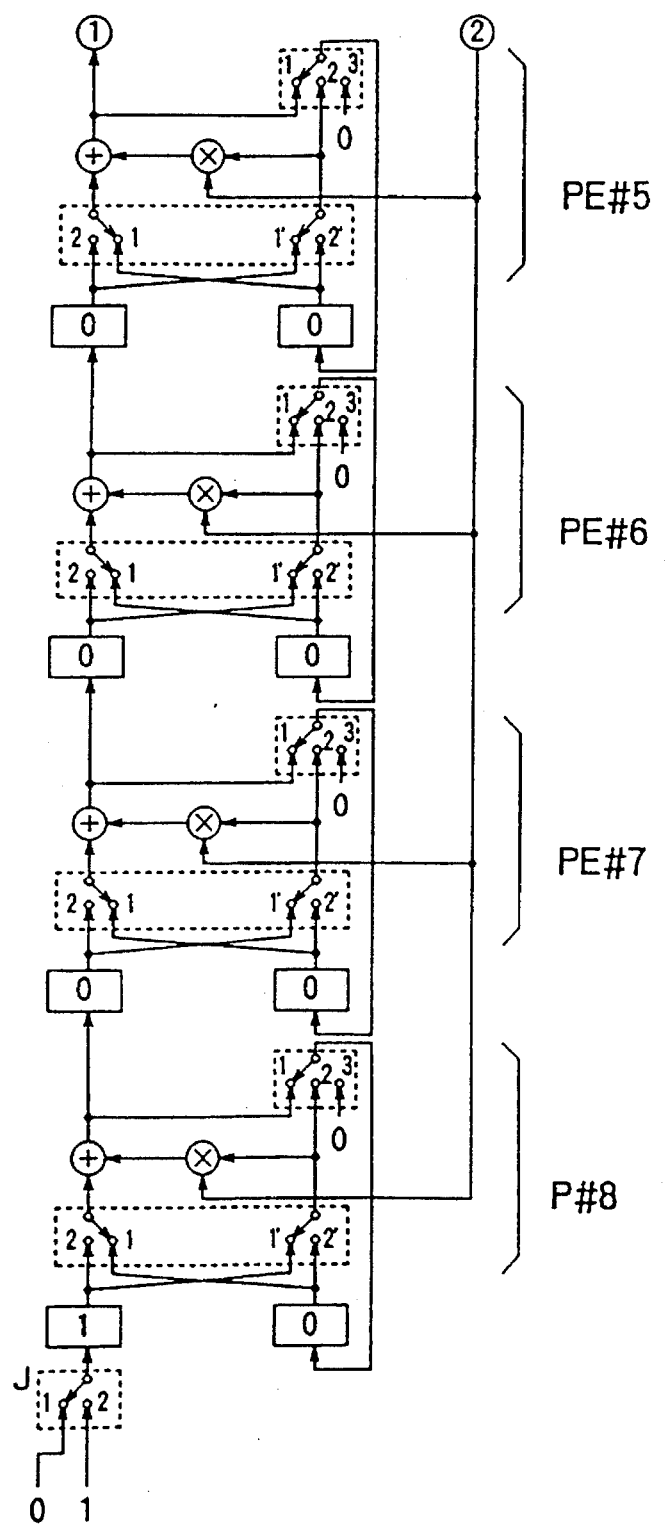

The registers of FIGS. 29a and 29b are already initialized. In this example, $\epsilon=2$, and therefore the initialization for the polynomial computation is carried out. The lost data position $sU'_1 = \alpha^{+13}$ and $U'_2 = \alpha^{+14}$ which are counted in the inverse order are sequentially stored in the register $UD_i$. The syndromes $S_1$ to $S_4$ which are the coefficients of $T^{(0)}(X)$ are stored in the registers $A_0$ to $A_3$, and these coefficients after shifted to the lower significant bit by one order are stored in the group of the B side registers. $A_4$ to $A_7$ and $B_5$ to $B_8$ are all "0" and "1" is stored in $A_8$.

In the operation of the first step shown in FIGS. 29a and 29b, the switching unit C is switched to the 3-3' side and the switching unit N is switched to the cross side 1-1'. The division between the inverse order lost data position $U'_1 = \alpha^{+13}$ and $APN = \alpha^{n-1}$ supplied from the register UD is carried out using the divider G, and by using the forward order lost data position $U_1 = \alpha^{+1}$ obtained as the result, a computation of:

$$T^{(1)}(X) = T^{(0)}(X) + \alpha^{+1} \cdot X \cdot T^{(0)}(X)$$

is carried out. Since X is multiplied at the second term in the right side, it is not necessary to calculate the coefficients of the term of $X^3$ of the $T^{(0)}(X)$. Accordingly, as the actual computation, the following:

$$\alpha^8 = \alpha^{14} \times \alpha^{-1} + \alpha^2$$
$$\alpha^{12} = \alpha^4 \times \alpha^{+1} + \alpha^{14}$$
$$\alpha^2 = \alpha^9 \times \alpha^{+1} + \alpha^4$$
$$\alpha^9 = 0 \times \alpha^{+1} + \alpha^9$$

four computations are carried out in PE#1 to PE#4, and the results are simultaneously stored in $A_0$ to $A_3$ and $B_1$ to $B_4$.

The computation for $u^{(1)}(X)$ is also carried out similarly. With respect to a computation of:

$$u^{(1)}(X) = u^{(0)}(X) + \alpha^{+1} \cdot X \cdot u^{(0)}(X)$$

$u^{(0)}(X) = 1$, and therefore a computation of:

$$\alpha^{+1} = \alpha^0 \times \alpha^{+1} + 0$$

is carried out at the PE#8, and the results are simultaneously stored in $A_7$ and $B_8$. At the time of the polynomial computation, "1" is supplied from the switching unit J to $A_8$.

Figure 30A:
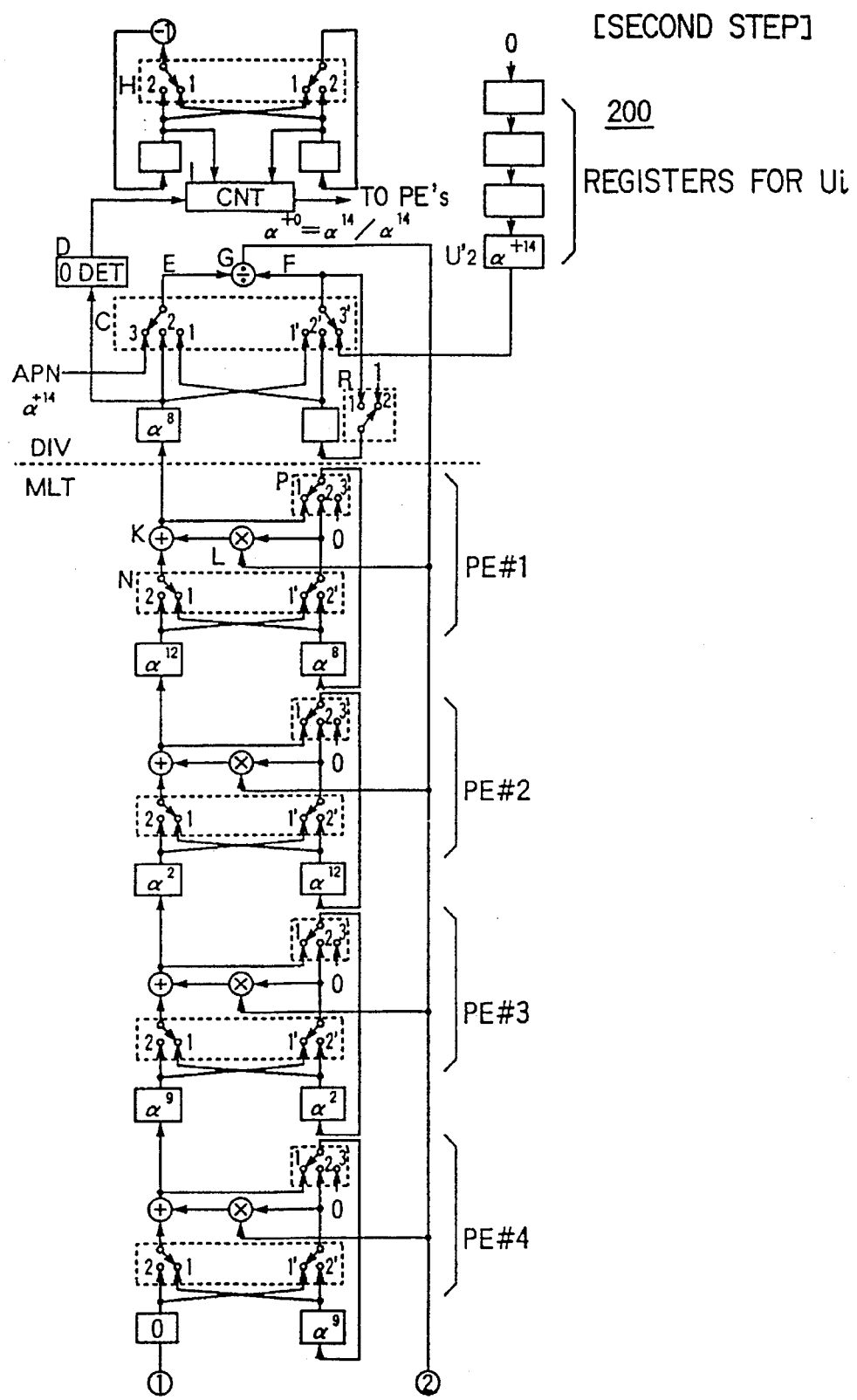
FIGS. 30a and 30b are views of the second step of operation of the lost data correction circuit of the third embodiment of the present invention.
Figure 30B:
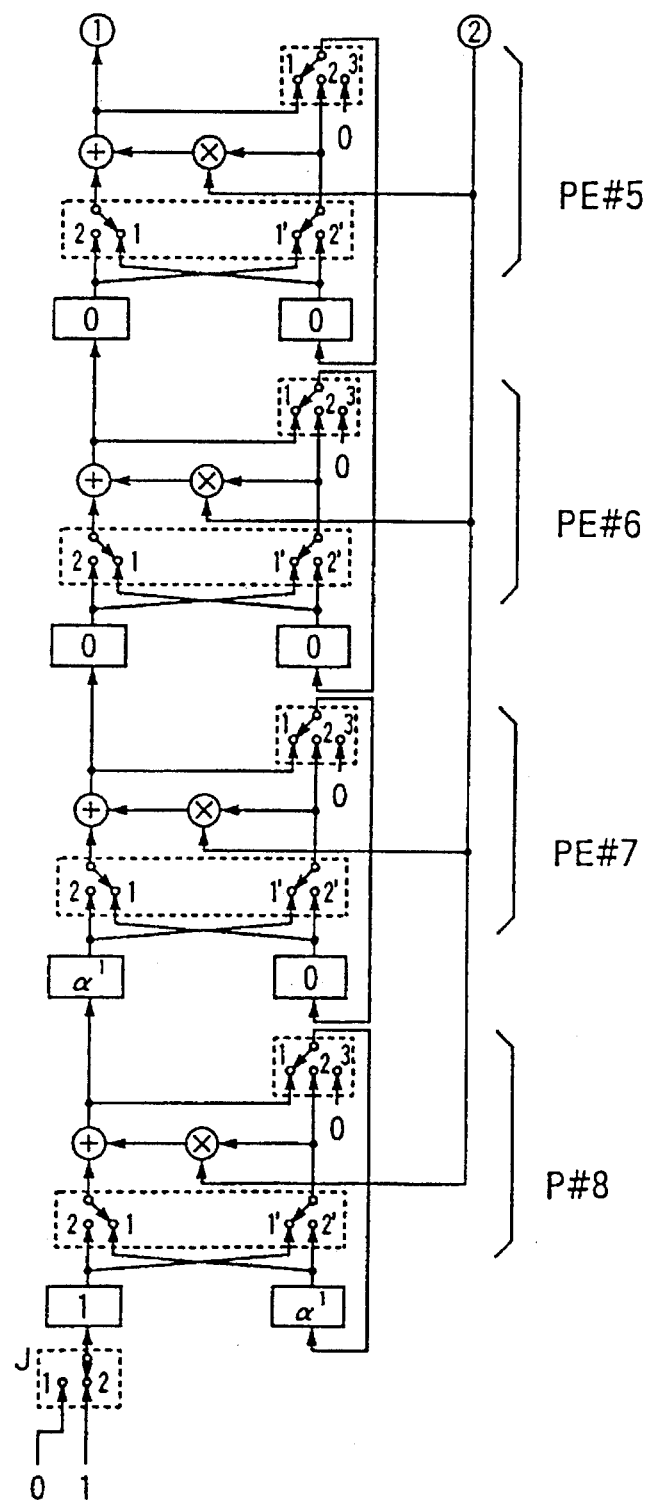

When the computation of the first step is ended, as shown in FIGS. 30a and 30b, the coefficients are stored. Also at the second step, the polynomial computation is carried out in the same way as the first step, but since $\epsilon=2$, it becomes the final step of the polynomial computation, and therefore the B side registers are simultaneously initialized to those for computation of Euclidean mutual division method.

Figure 31A:
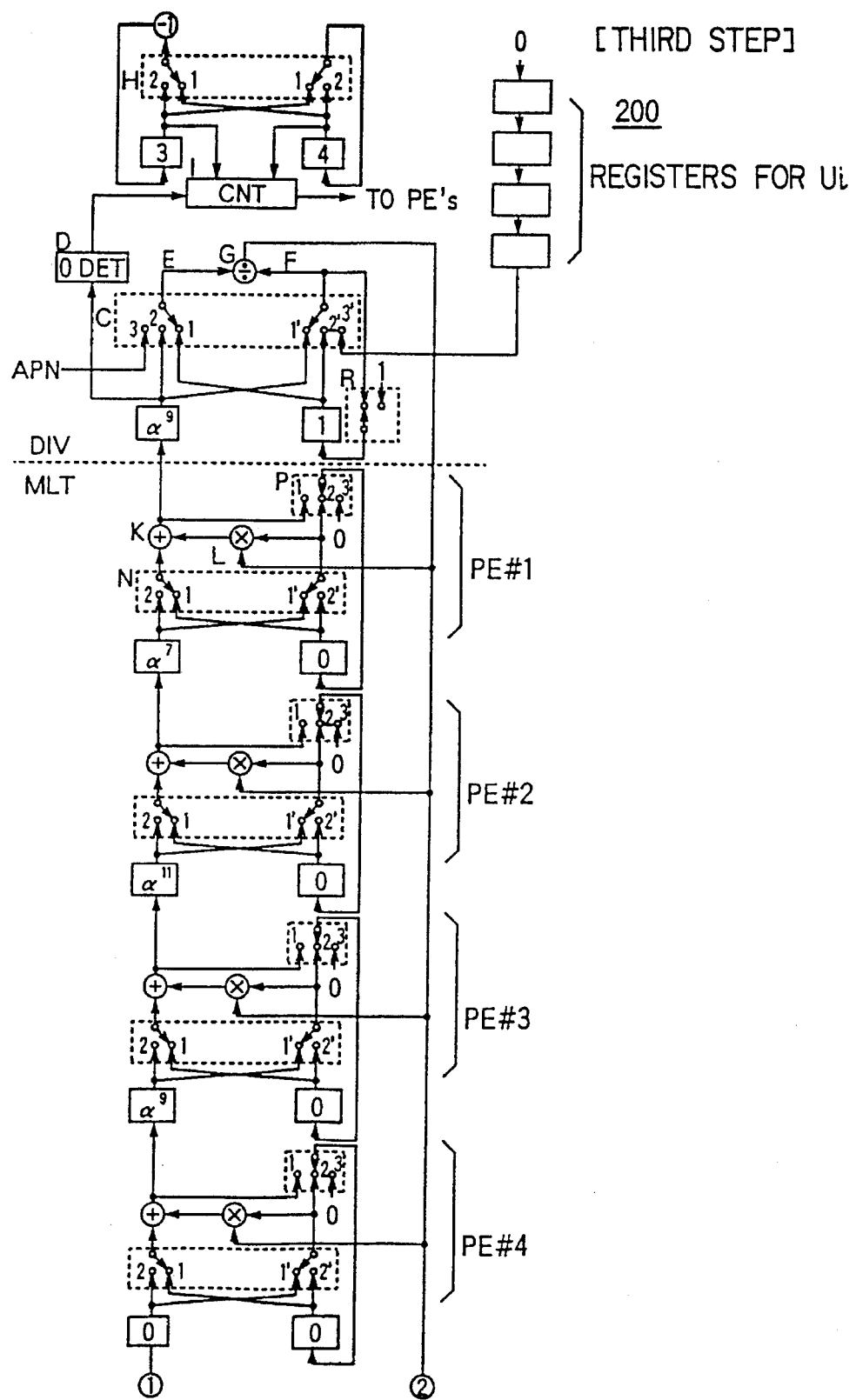
FIGS. 31a and 31b are views of the third step of operation of the lost data correction circuit of the third embodiment of the present invention.
Figure 31B:
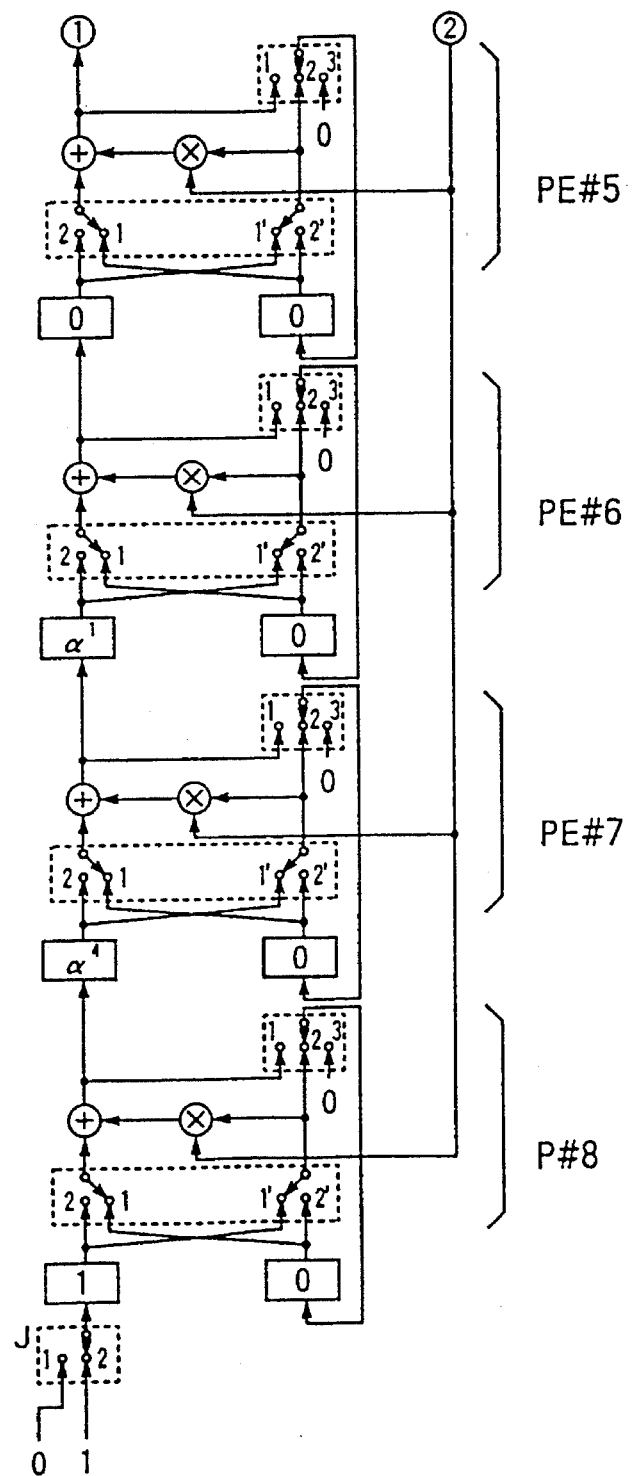

At the point of time of the end of the second step, the polynomial computation is ended, and T(X) and u(X) are found. In FIGS. 31a and 31b, the coefficients at the point of time of the end of the second step have been stored in the respective registers. The coefficients of $R_0(X) = T(X)$ are stored in the registers of from $A_0$ to $A_3$, and the coefficients of $\gamma_0(X) = T(X)$ are stored in the registers of from $A_4$ to $A_8$. On the other hand, the B side registers are initialized so that $Q_0(X)$ becomes equal to $X^p$ and $\mu_0(X)$ becomes equal to 0.

The values of $dR_0$ and $dQ_0$ are stored in the registers DR and DQ. In a computation step wherein the computation is actually carried out in the algorithm of the modified Euclidean mutual division method, $dR_0$ and $dQ_0$ respectively represent the degrees (order) of $R_0(X)$ and $Q_0(X)$. At the initialization of computation of the Euclidean mutual division method, the initial values of DR and DQ are made (2t–1) and 2t.

The computation of the third step carried out in FIGS. 31a and 31b is the same as the computation of the modified Euclidean mutual division method in the case of the usual correction. In FIGS. 31a and 31b, the value ($dR_0$) of the register DR is "3" and the value ($dQ_0$) of the register DQ is "4", and therefore the condition of DR<DQ is satisfied, and since the $dR_0$-th order coefficient of the $R_0(X)$ is $\alpha^9$, i.e., not zero, the operation mode becomes the cross mode. Therefore, the switching units C, H and N are switched to the cross side 2-2', a computation such as $1/\alpha^9$ is carried out at the divider G, and the division result $\alpha^6$ is output through the switching unit S to the computation units.

In one MLT, the computation of the cross mode is carried out. A computation for finding the $R_1(X)$ is represented by:

$$R_1(X) = Q_0(X) + (1/\alpha^9) \cdot R_0(X) \cdot X$$
$$= X^4 + \alpha^6(\alpha^9 X^3 + \alpha^7 X^2 + \alpha^{11} X + \alpha^9) \cdot X$$
$$= \alpha^{13} X^3 + \alpha^2 X^2 + \alpha^0 X$$

These three coefficients are realized when the following computation is carried out in the computation units of from PE#1 to PE#3.

$$\alpha^{13} = \alpha^7 \times \alpha^6 + 0$$

Figure 32A:
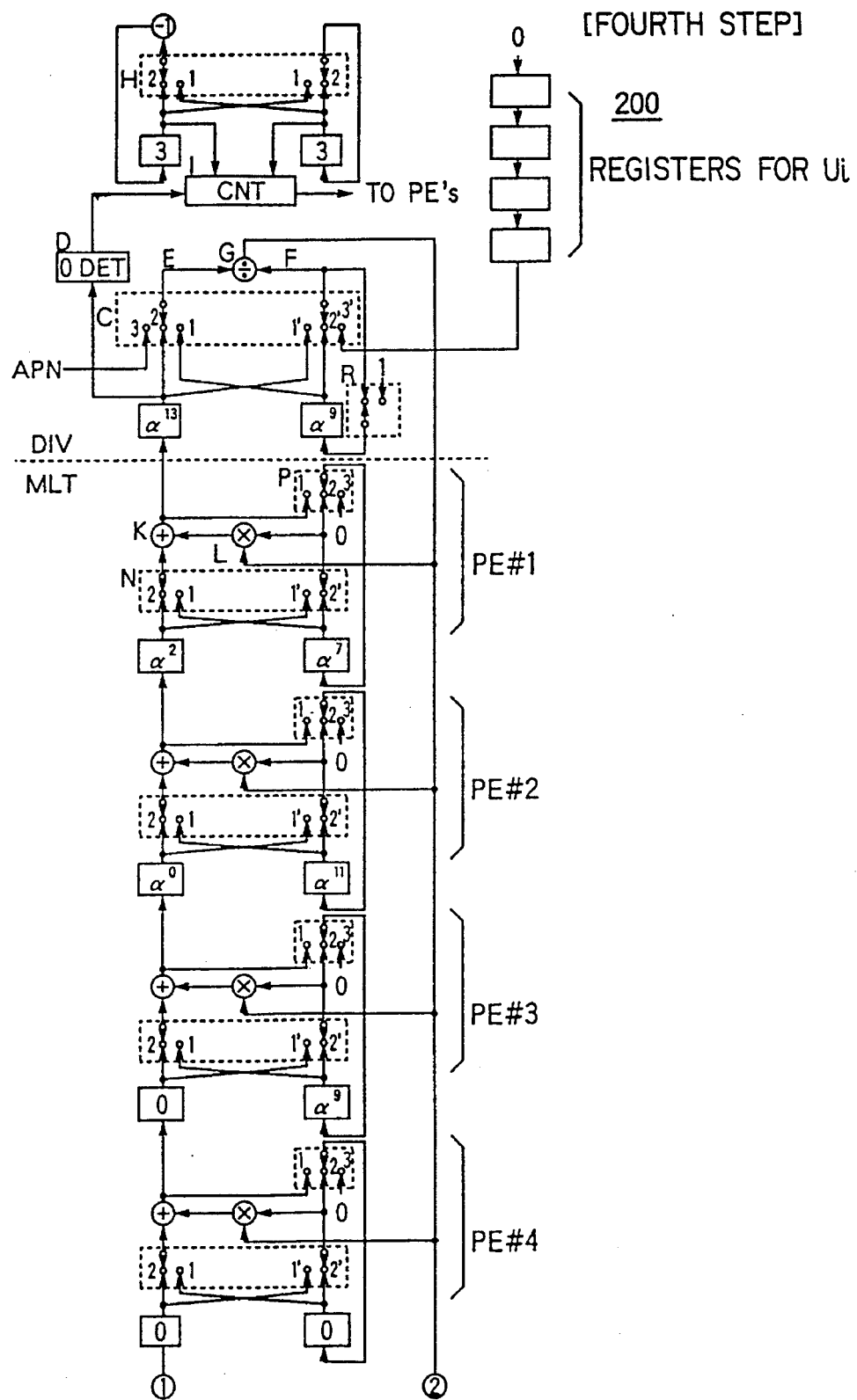
FIGS. 32a and 32b are views of the fourth step of operation of the lost data correction circuit of the third embodiment of the present invention.
Figure 32B:
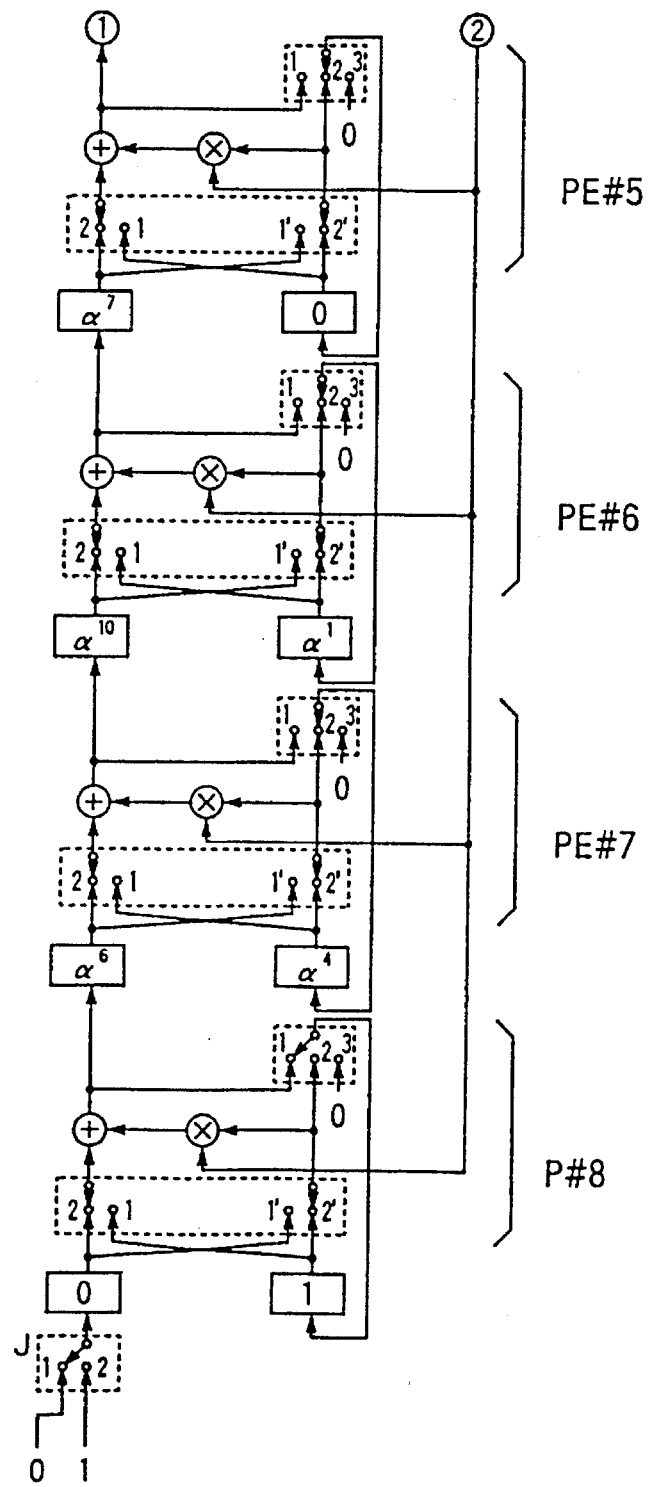

$\alpha^2 = \alpha^{11} \times \alpha^6 + 0$ $\alpha^0 = \alpha^9 \times \alpha^6 + 0$ Similarly, a calculation for finding $\gamma_1(X)$:

$$\begin{aligned}\lambda_1(X) &= \mu_0(X) + (1/\alpha^9)\lambda_0(X)X \\ &= 0 + \alpha^6 \cdot (\alpha^1 X^2 + \alpha^4 X + 1) \cdot X \\ &= \alpha^7 X^3 + \alpha^{10} X^2 + \alpha^6 X\end{aligned}$$

is realized when the following three coefficient computations are carried out at the PE#6 to PE#8:

$\alpha^7 = \alpha^1 \times \alpha^6 + 0$ $\alpha^{10} = \alpha^4 \times \alpha^6 + 0$ $\alpha^6 = 1 \times \alpha^6 + 0$ These calculated coefficients of $R_1(X)$ and $\gamma_1(X)$ are stored in the A side registers as shown in FIGS. 32a and 32b, and the coefficients of $Q_1(X) = R_0(X)$ and $\mu_1(X) = \gamma_0(X)$ are stored in the group of the B side registers.

Subsequently, in the fourth step of computation carried out in FIGS. 32a and 32b, the value (dR$_1$) of the register DR is "3" and the value (dQ$_1$) of the register DQ is "3", and therefore DR becomes equal to or larger than DQ, and the computation of the normal mode is carried out. Therefore, the switching units C, H, and N are switched to the normal side 1–1', a computation such as $\alpha^{13}/\alpha^9$ is carried out in the divider G, and the division result $\alpha^4$ is output through the switching unit S to the computation units.

The one MLT performs the computation of the normal mode. A calculation for finding the $R_2(X)$ is:

$$\begin{aligned}R_2(X) &= R_1(X) + (\alpha^{13}/\alpha^9) Q_1(X) \\ &= \alpha^{13} X^3 + \alpha^2 X^2 + \alpha^0 X + \alpha^4(\alpha^9 X^3 + \alpha^7 X^2 + \alpha^{11} X + \alpha^9) \\ &= \alpha^9 X^2 + \alpha^{13}\end{aligned}$$

Figure 33A:
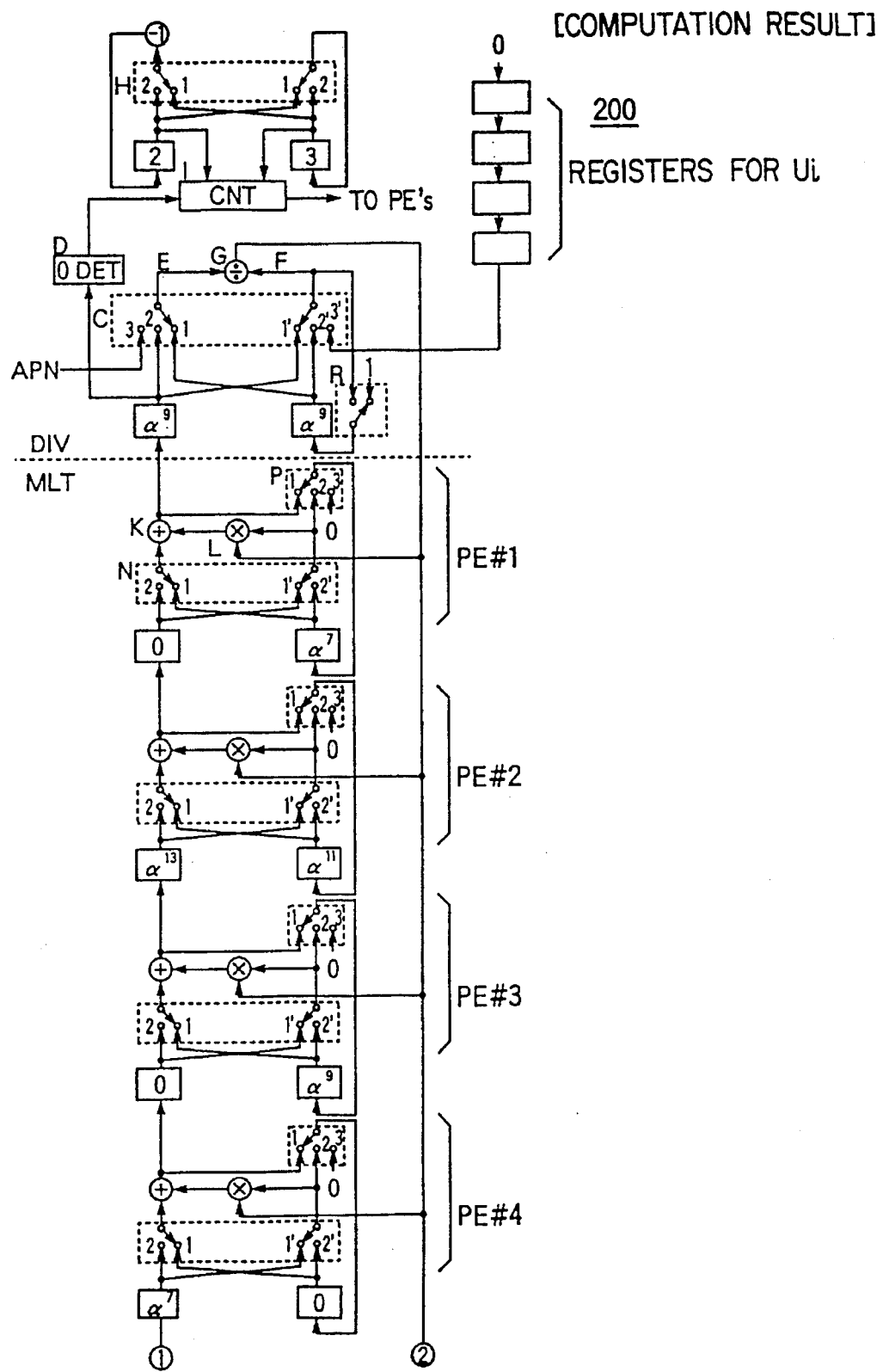
FIGS. 33a and 33b are views of the final step of operation of the lost data correction circuit of the third embodiment of the present invention.
Figure 33B:
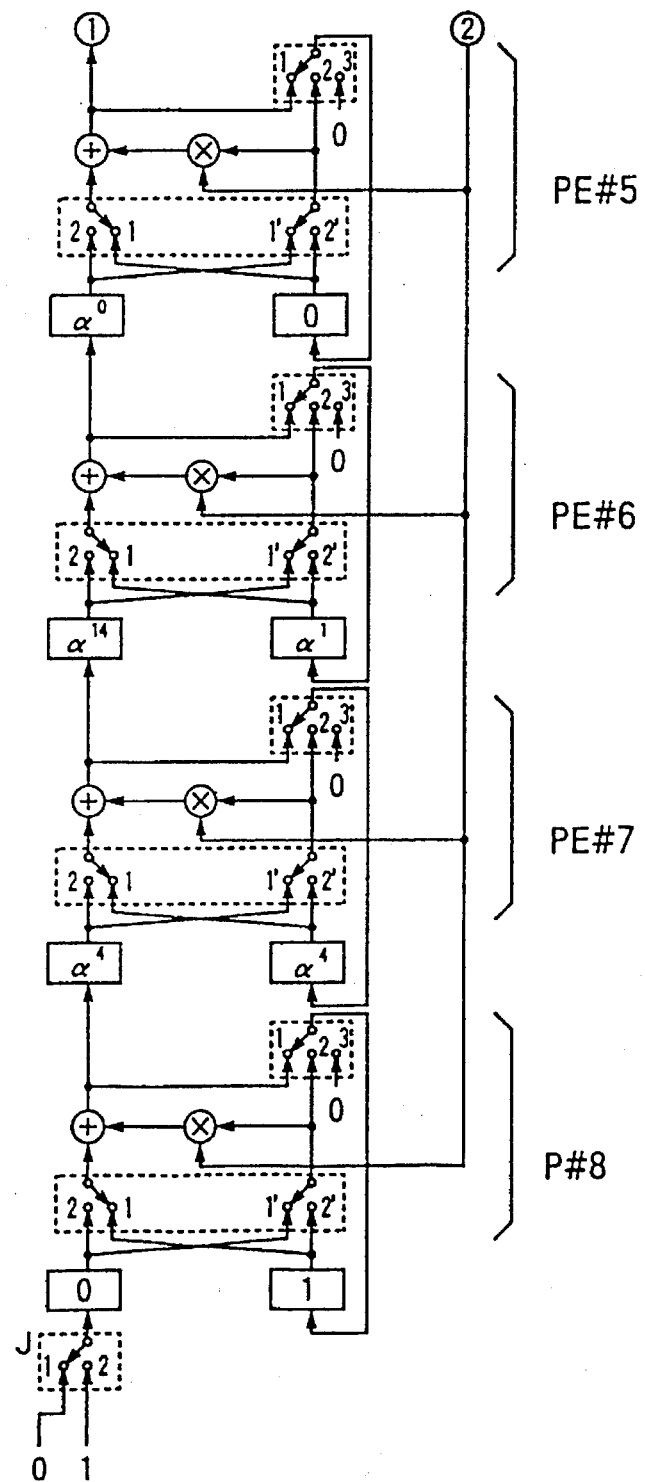

For finding these coefficients, in the computation units of from PE#1 to PE#3, the following three coefficient computations are carried out:

$\alpha^9 = \alpha^7 \times \alpha^4 + \alpha^2$ $0 = \alpha^{11} \times \alpha^4 + \alpha^0$ $\alpha^{13} = \alpha^9 \times \alpha^4 + 0$ Similarly, $\gamma_1(X)$ is found by a computation that:

$$\begin{aligned}\lambda_2(X) &= \lambda_1(X) + (\alpha^{13}/\alpha^9)\mu_1(X) \\ &= \alpha^7 X^3 + \alpha^{10} X^2 + \alpha^6 X + \alpha^4 \cdot (\alpha^1 X^2 + \alpha^4 X + 1) \\ &= \alpha^7 X^3 + \alpha^0 X^2 + \alpha^{14} X + \alpha^4\end{aligned}$$

and therefore this is realized when the following four coefficient computations are carried out at PE#5 to PE#8:

$\alpha^7 = 0 \times \alpha^4 + \alpha^7$ $\alpha^0 = \alpha^1 \times \alpha^4 + \alpha^{10}$ $\alpha^{14} = \alpha^4 \times \alpha^4 + \alpha^6$ $\alpha^4 = \alpha^0 \times \alpha^4 + 0$ The coefficients which are stored in the registers at the point of time when the four steps of computation are ended become those as shown in FIGS. 33a and 33b. In FIGS. 33a and 33b, it is seen that the coefficients of $\omega(X)$, $\alpha^9$, 0, and $\alpha^3$ are found in the registers $A_0$ to $A_2$, and the coefficients of $\underline{\sigma(X)}$, $\alpha^7$, $\alpha^0$, $\alpha^{14}$, and $\alpha^4$ are found in the registers $A_4$ to $A_7$.

Operation 2) Where Lost Data Symbol Does Not Exist ($\epsilon = 0$)

As already mentioned, the operation where the lost data symbol does not exist is the same as the case of the method of configuration F. Since they are quite the same, the explanation will be omitted.

Summary of Operation

As mentioned above, the present method of configuration can be constituted just by making a change to the switching unit C so that the APN=$\alpha^{n-1}$ and inverse order lost data positions $U'_i$ which depend upon the code length can be input as the input of the divider G in the method of configuration F.

Accordingly, also in the operation of the present method of configuration, in the same way as the method of configuration F, four operation modes of the initialization (EI) for the computation of the Euclidean mutual dividing method, initializations for Euclidean mutual division computation (EC, EN), and initialization (PI) for polynomial computation perform exactly the same processings as those in the method of configuration F, but in the operation mode in the case of polynomial computation (PM, PE), the computations carried out in the computation units are changed in accordance with the number of computation steps.

TABLE 15

| | Case of $\epsilon = 0$ | | |
|---|---|---|---|
| Step | Content of operation | | Code |
| Initialization | Euclidean mutual division computation initialization | | EI |
| 1 ... 2t | Euclidean mutual division computation | dR$_i$<dQ$_i$ and A$_0 \neq$0 | Cross mode | EC |
| | | dR$_i \geq$dQ$_i$ or A$_0$=0 | Normal mode | EN |

TABLE 16

| | Case of 2t $\geq \epsilon > 0$ | | |
|---|---|---|---|
| Step | Content of operation | | Code |
| Initialization | Polynomial computation initialization | | PI |
| 1 ... $\epsilon$−1 | Polynomial multiplication | | PM |
| $\epsilon$ | | Euclidean mutual division computation initialization | PE |
| 1 ... 2t | Euclidean mutual division computation | dR$_i$<dQ$_i$ and A$_0 \neq$0 | Cross mode | EC |
| | | dR$_i \geq$dQ$_i$ or A$_0$=0 | Normal mode | EN |

Note that, the case where $\epsilon=2t$ can be considered to be a special case where not even one computation of Euclidean mutual division method is carried out in the case where the lost data symbol exists. This is summarized in the tables.

The operation of the switching unit based on the present example of configuration will be summarized.

TABLE 17

| Operation Code | Switching unit | | | | | | |
|---|---|---|---|---|---|---|---|
| | C | H | N | S | J | P | R |
| PM | 3-3' | — | 1-1' | 2 | 2 | 1 | — |
| PE | 3-3' | — | 1-1' | 2 | 2 | 3 | 2 |
| EC | 1-1' | 1-1' | 1-1' | 1 | 1 | 2 | 1 |
| EN | 2-2' | 2-2' | 2-2' | 1 | 1 | 2 | 1 |

Note that, the present example of configuration shown in FIG. 4 and FIGS. 25a and 25b is merely one example. Various other examples of configuration can be considered in addition to this. Also, it must be added that the method of configuration of the processing element greatly differs along with this.

In lost data correction, it is necessary to find $U_i$ representing the position in the code of the lost data symbol by a finite field. The lost data positions are sequentially counted from the header of the code, but usually they are input from the symbols at the tail end of the code for convenience in the configuration of the encoder. Accordingly, where the code length varies, how the lost data position counted in the forward order represented by the finite field is to be found becomes a problem.

The third embodiment proposes a method which preliminarily stores the values of $APN=\alpha^{n-1}$ known from the lost data positions counted in the inverse order and the code length, improves the method of configuration F, and performs the computation while finding the forward order lost data positions by using the divider not used at the computation of the polynomials. According to the present method of configuration, even in a case where the code length of the input codes varies for every code, the lost data correction can be easily realized just by applying a slight correction to the method of configuration F.

The present method of configuration basically performs the same operation as that in the method of configuration F, but enables the reduction of the storage region by sharing the lost data position storage region which was redundant in the method of configuration F and the coefficient storage region for calculating the lost data position polynomial u(X).

From the above-mentioned characteristic features, if the present method of configuration is used, a decoder realizing the lost data correction without a redundant circuit can be constituted also with respect to a code having a varied code length while maintaining the high speed operation property of the method of configuration F. Of course, also the characteristic feature that the computation can be successively carried out is retained as it is.

In the above, particularly, as the preferred embodiment, the Reed-Solomon code was exemplified and the embodiments of the method of correcting lost data and lost data correction circuit of the present invention were explained, but the method of correcting lost data and of the present invention and circuit thereof are not restricted to the Reed-Solomon code and can be applied to other various systems performing the lost data correction using the Euclidean mutual division method.

According to the present invention, a method of correcting lost data which can perform processing at high speed and a circuit thereof are provided.

Also, according to the present invention, it is possible to modify the lost data correction circuit to a simple circuit configuration.

According to the present invention, by simultaneously performing the calculations of the lost data position polynomial u(X) and correction syndrome polynomial T(X) which are necessary for the lost data correction, a method of correcting lost data and a circuit thereof with a high efficiency are provided.

Also, according to the present invention, by commonly using the lost data position storage region and the coefficient storage region of polynomials for calculating the lost data position polynomial u(X) when the polynomial computation required for the lost data correction is carried out during the first $\epsilon$ steps, the storage regions are reduced.

According to the present invention, a method of correcting lost data which can perform the lost data correction with a high efficiency by using the inverse order lost data positions $U'_i$ and the data $\alpha^{n-1}$ (APN) obtained at the completion of input with respect to a variable length code can be provided.

Also, according to the present invention, the division of $U'_i/APN$ is carried out using the divider not used in the first $\epsilon$ steps, whereby a circuit for performing lost data correction of a variable length code is provided without a complex circuit configuration.

Many widely different embodiments of the present invention may be constructed without departing from the spirit and scope of the present invention, and it should be understood that the present invention is not restricted to the specific embodiments described above.

What is claim is:

1. A lost data correction circuit for correcting lost data of a signal encoded by a predetermined coding method, comprising:

a signal division unit; and a plurality of serial-connected computation units operatively connected to said division unit, wherein provision is made of a plurality of registers as a storage region of lost data positions, the lost data positions being supplied via a first switching unit to said computation units by shifting the lost data positions which are stored therein and used as multiplication coefficients, and further, wherein the number of parity symbols is 2t, where, t is a positive integer, and the number of correctable symbols is t, and said circuit comprises 4t number of computation units and (8t+2) number of data storage circuits, and successively computes 2t steps in total to obtain said corrected error position polynomial and said error evaluation polynomial.

2. The lost data correction circuit of claim 1, wherein the predetermined coding method includes Reed-Solomon encoding.

3. A lost data correction circuit for correcting lost data of a signal encoded by a predetermined coding method, comprising:

a signal division unit; and a plurality of serial-connected computation units operatively connected to said division unit, wherein provision is made of a plurality of registers as a storage region of lost data positions, the lost data positions being supplied via a first switching unit to said computation units by shifting the lost data positions which are stored therein and used as multiplication coefficients, and further, wherein the division unit includes a divider for performing a predetermined division between the most significant coefficients of two polynomials in a Euclidean mutual division method, and wherein the output of the division unit is switched to the output of the storage register of the lost data positions by the first switching unit and supplied to each of the plurality of computation units.

4. The lost data correction circuit of claim 3, wherein the division unit further includes a second switching unit for performing initialization for the computation by the Euclidean mutual division method.

5. The lost data correction circuit of claim 4, wherein the division unit includes two registers arranged in parallel, the registers storing the data of the degrees (orders) of the most significant coefficient of the polynomials when performing the computation by the Euclidean mutual division method.

6. The lost data correction circuit of claim 5, wherein the division unit includes a control signal generation unit which evaluates the computation to be performed in the computation units from results of comparison of the two registers in the division unit, results of detection of the non value of the register, and the number of steps of computation at present, and independently controls the plurality of computation units.

7. The lost data correction circuit of claim 4, wherein each computation unit is formed as a multiplication and addition computation unit, and comprises 4t number of computation units for a system to which 2t number of parities are added to the data in both a first step and a next step.

8. The lost data correction circuit of claim 7, wherein the multiplication and addition computation unit includes a plurality of computation units, and further, wherein each computation unit is constituted by a multiplier, an adder, and a switch, and performs a computation on a finite field.

9. The lost data correction circuit of claim 8, wherein there are 4t number of computation units.

10. A lost data correction circuit for correcting lost data of a signal coded by a predetermined encoding method, comprising:

4t computation units, where t is an integer and 2t indicates the number of parity symbols added to the signal; and
  8t+2 number of data holding circuits, wherein the correction circuit performs a two-step computation to calculate a corrected error position polynomial and an error evaluation polynomial which are used to correct the lost data.

11. The lost data correction circuit of claim 10, wherein the predetermined coding method includes non-two-dimensional BCH encoding.

12. The lost data correction circuit of claim 10, further comprising:

a circuit for changing said lost data position to an inverse order lost data position and shifting the same one by one position per step, wherein the circuit for changing the lost data position to an inverse order divides the shifted data by a symbol length expressed on a Galois field at the completion of the input, to convert the same to the forward order lost data position.

13. The lost data correction circuit of claim 12, wherein the division of the position data at the completion of input by the inverse order lost data position is carried out using a divider.

14. A lost data correction circuit for correcting lost data of a signal coded by a predetermined encoding method, comprising:

means for calculating a correction syndrome S(X) from the coded data;

means for calculating power coefficients from an input lost data flag;

means for calculating a lost data position polynomial u(X) by expanding the power coefficients; and means for performing a data correction computation based on a Euclidean mutual division method for the lost data position polynomial u(X) and a corrected syndrome polynomial T(X), to thereby calculate a lost data pattern and the lost data position, wherein the means for performing the data correction computation further comprises:

4t computation units, where t is an integer and 2t indicates the number of parity symbols added to the signal.

15. The lost data correction circuit of claim 14, wherein the calculation of the correction syndrome and the lost data position polynomial are carried out in $\epsilon$ steps, where, $\epsilon$ is the number of lost data symbols, and further wherein the computation based on the Euclidean mutual division method is carried out in the subsequent ($2t-\epsilon$) steps, where, 2t is the number of parity symbols.

16. The lost data correction circuit of claim 15, wherein an inverse order lost data position polynomial derived from inverting the order of the input lost data flags is calculated, and further wherein the inverse order lost data position polynomial is divided by the data at the completion of input, thereby determining a forward order lost data position polynomial.

* * * * *